United States Patent [19]
Takashima

[11] Patent Number: 5,903,492
[45] Date of Patent: May 11, 1999

[54] SEMICONDUCTOR MEMORY DEVICE AND VARIOUS SYSTEMS MOUNTING THEM

[75] Inventor: Daisaburo Takashima, Yokohama, Japan

[73] Assignee: Kabushiki Kaisha Toshiba, Kawasaki, Japan

[21] Appl. No.: 08/872,874

[22] Filed: Jun. 10, 1997

[30] Foreign Application Priority Data

Jun. 10, 1996 [JP] Japan .................................. 8-147452
Jan. 8, 1997 [JP] Japan .................................. 9-001115

[51] Int. Cl.$^6$ .......................... G11C 11/22; G11C 11/24; G11C 7/02
[52] U.S. Cl. .......................... 365/145; 365/149; 365/207; 365/210
[58] Field of Search .................................. 365/145, 149, 365/207, 208, 210, 230.03, 222

[56] References Cited

U.S. PATENT DOCUMENTS

| | | | |
|---|---|---|---|
| 5,029,128 | 7/1991 | Toda | 365/145 |
| 5,307,304 | 4/1994 | Saito et al. | 365/145 |
| 5,373,463 | 12/1994 | Jones, Jr. | 365/145 |
| 5,383,150 | 1/1995 | Nakamura et al. | 365/145 |
| 5,517,445 | 5/1996 | Imai et al. | 365/145 |
| 5,592,646 | 1/1997 | Thomas | 365/145 |

FOREIGN PATENT DOCUMENTS 3-40298 2/1991 Japan .
6-140597 5/1994 Japan .

OTHER PUBLICATIONS

K. Sunouchi, et al., "A Surrounding Gate Transistor(SGT) Cell for 64/256Mbit DRAMs", IEDM, Dec. 1989, pp. 23–26.

T. Hasegawa, et al., "An Experimental DRAM with a NAND–Structured Cell", IEEE International Solid–State Circuits Conference, Feb. 24, 1993, pp. 46–47.

T. Sumi, et al., "A 256kb Nonvolatile Ferroelectric Memory at 3V and 100ns", IEEE International Solid–State Circuits Conference, Feb. 18, 1994, pp. 268–269.

H. Koike, et al., "A 60ns 1Mb Nonvolatile Ferroelectiric Memory with Non–Driven Cell Plate Line Write/Read Scheme", IEEE International Solid–State Circuits Conference, Feb. 10, 1996, pp. 368–369.

K. Takeuchi, et al., "Half–Vcc Plate Nonvolatile DRAMs with Ferroelectric Capacitors", Jeice Trans. Electron., vol. E79–C, No. 2, Feb. 1996, pp. 234–242.

Primary Examiner—David C. Nelms
Assistant Examiner—Trong Phan
Attorney, Agent, or Firm—Oblon, Spivak, McClelland, Maier & Neustadt, P.C.

[57] ABSTRACT

A computer system is characterized by comprising a microprocessor for performing various arithmetic processing operations, an input/output device connected to said microprocessor to send/receive data to/from an external device; and a semiconductor memory device connected to said microprocessor to store data, wherein said semiconductor memory device includes a plurality of memory cells each having a transistor having a source terminal and a drain terminal and a ferroelectric capacitor having a first terminal connected to said source terminal and a second terminal connected to said drain terminal, a predetermined number of memory cells are connected in series, and a select transistor is connected to at least one terminal of said series connected portion to constitute a memory cell block, and a plurality of memory cell blocks are arranged to constitute a cell array.

86 Claims, 155 Drawing Sheets

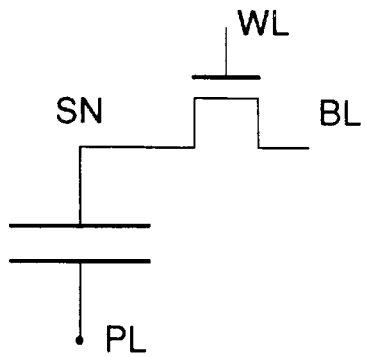
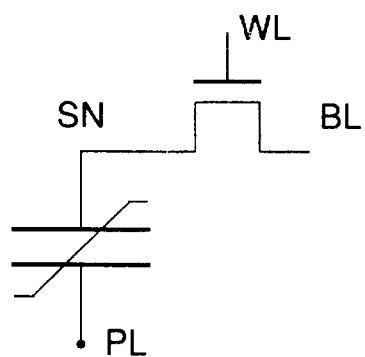
FIG.1A (PRIOR ART)
FIG.1B (PRIOR ART)
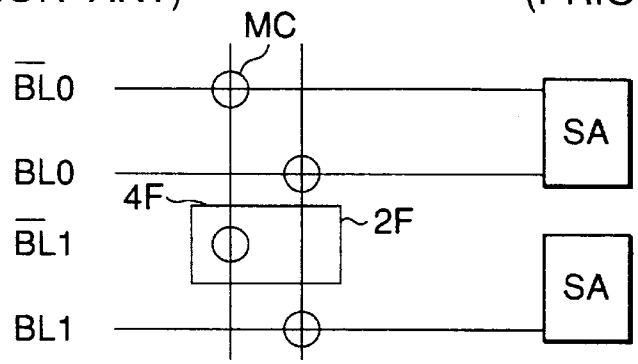
FIG.1C (PRIOR ART)
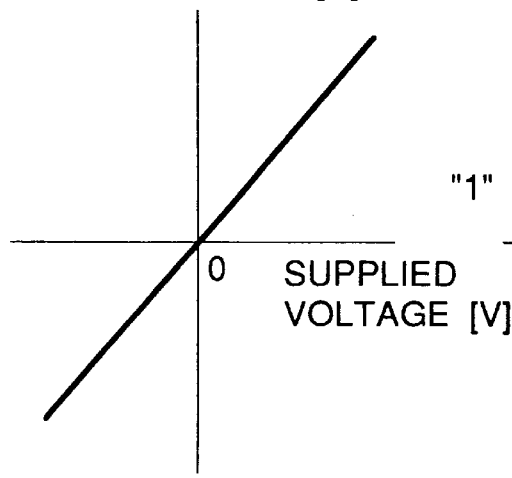
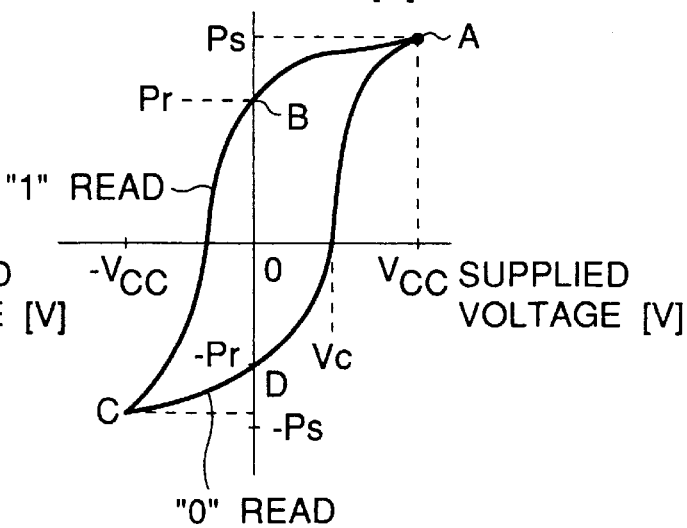
FIG.2A (PRIOR ART)
FIG.2B (PRIOR ART)

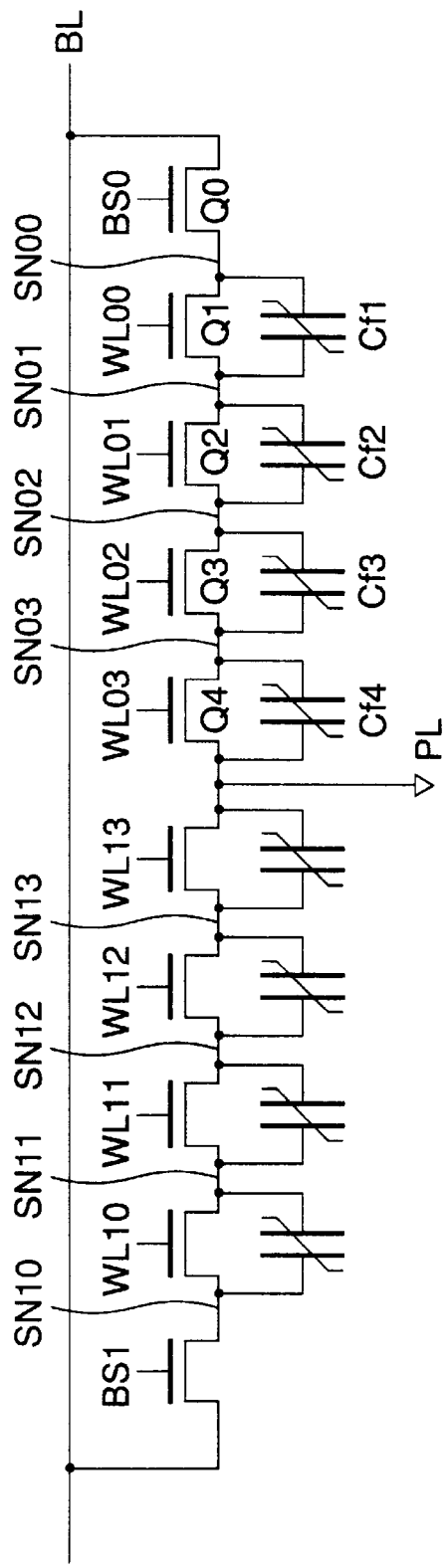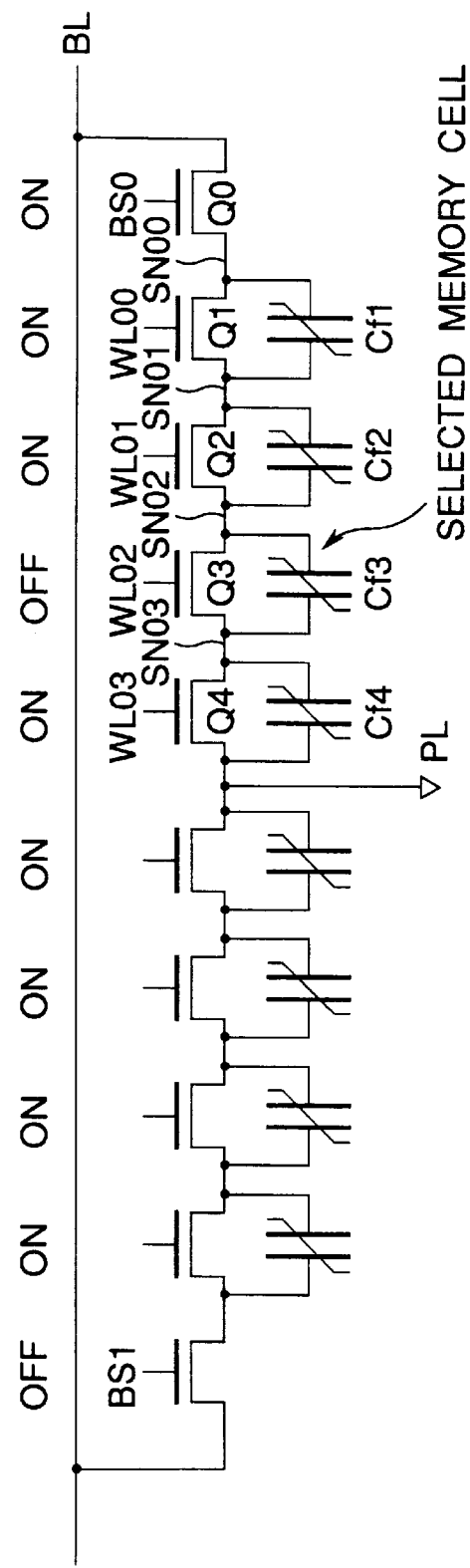

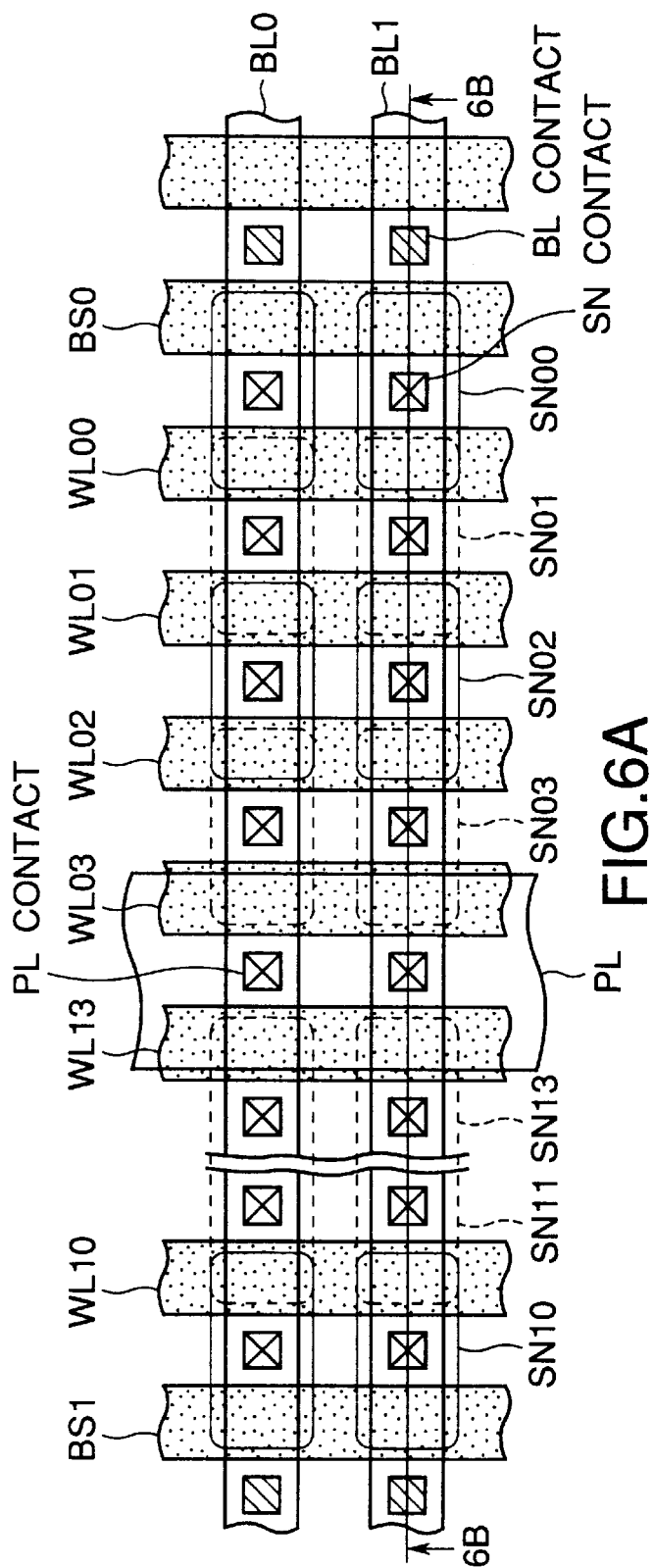
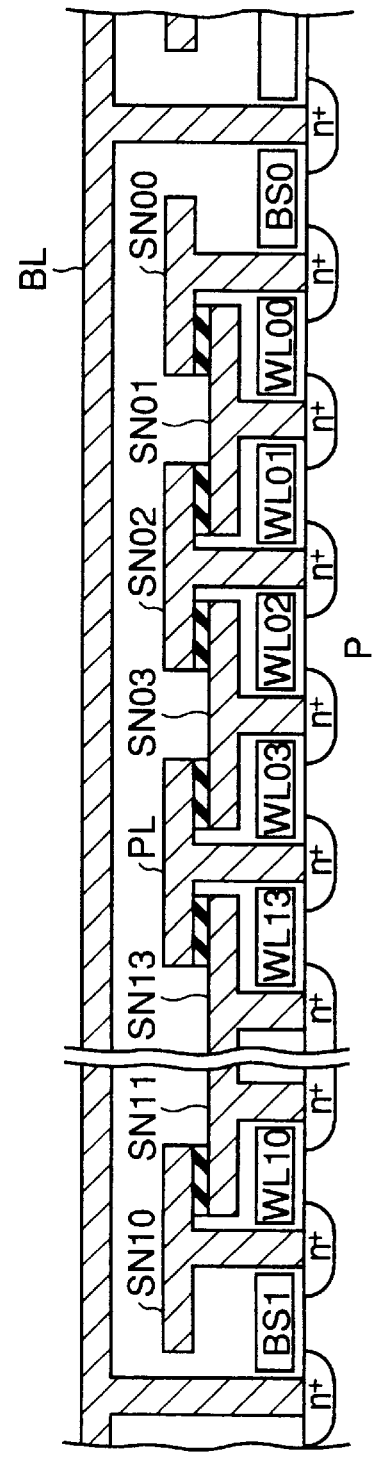
FIG.6A
FIG.6B

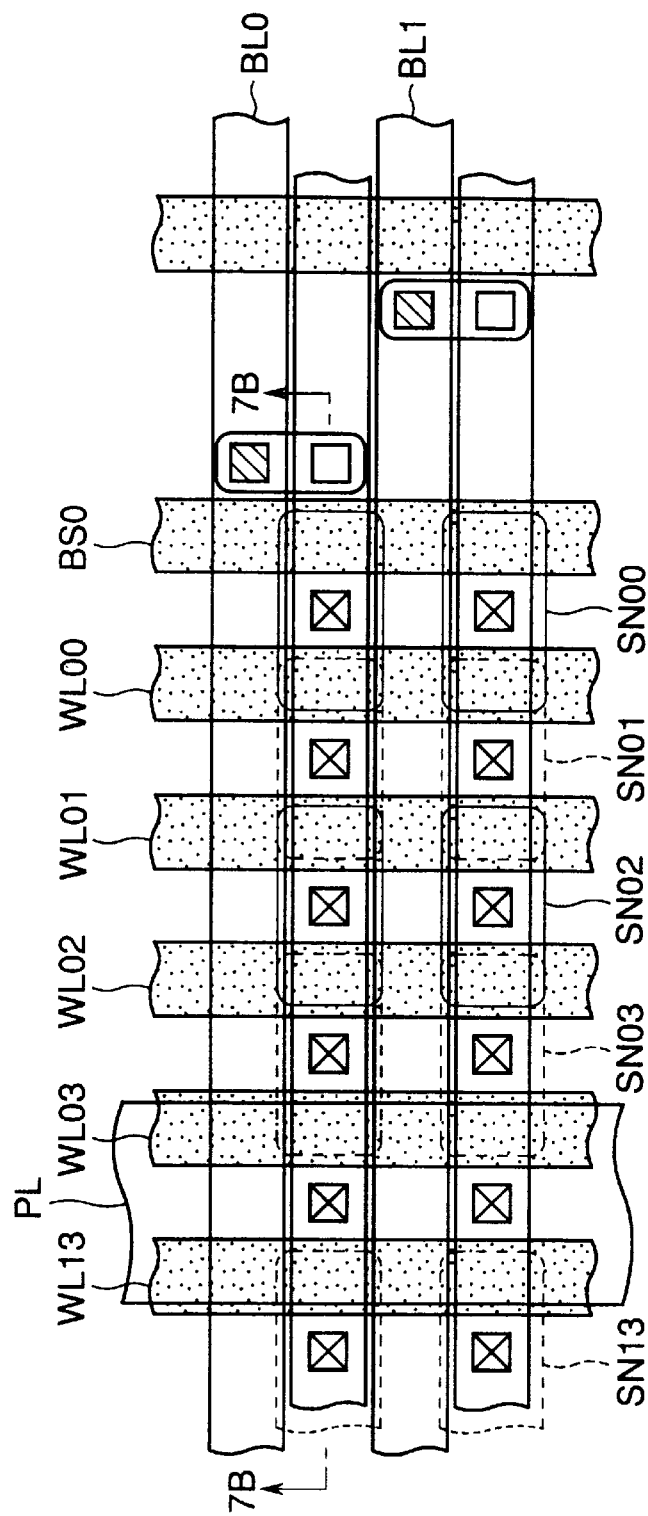
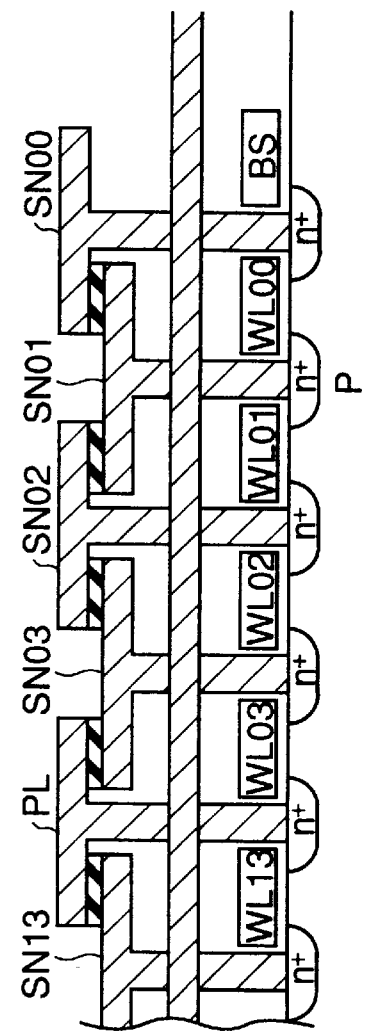
FIG.7A
FIG.7B

DIGITAL IMAGE INPUT DEVICE

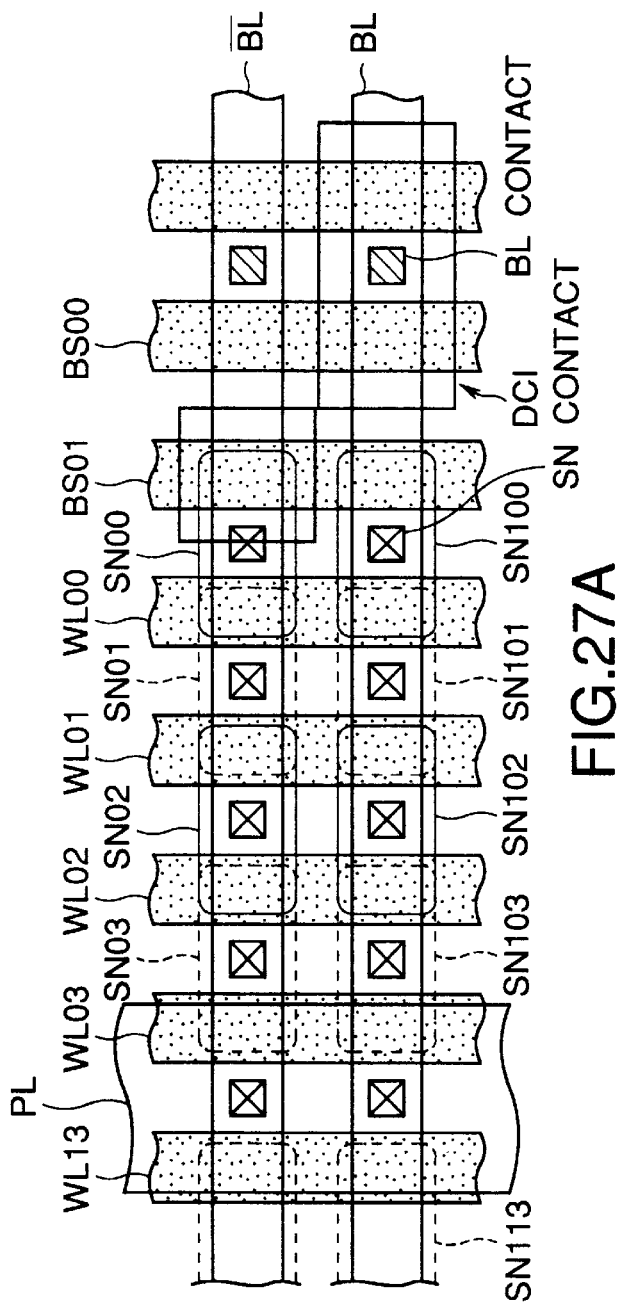
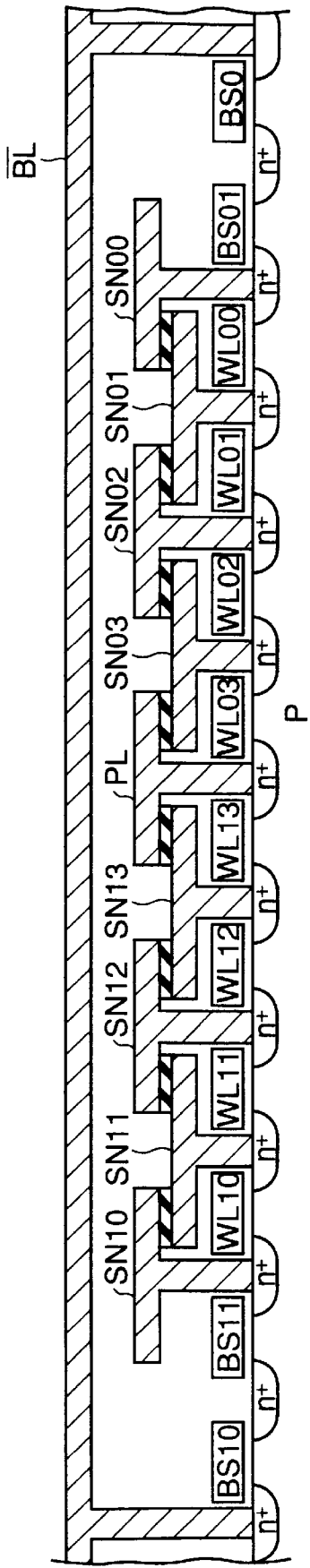
FIG. 27A
FIG. 27B

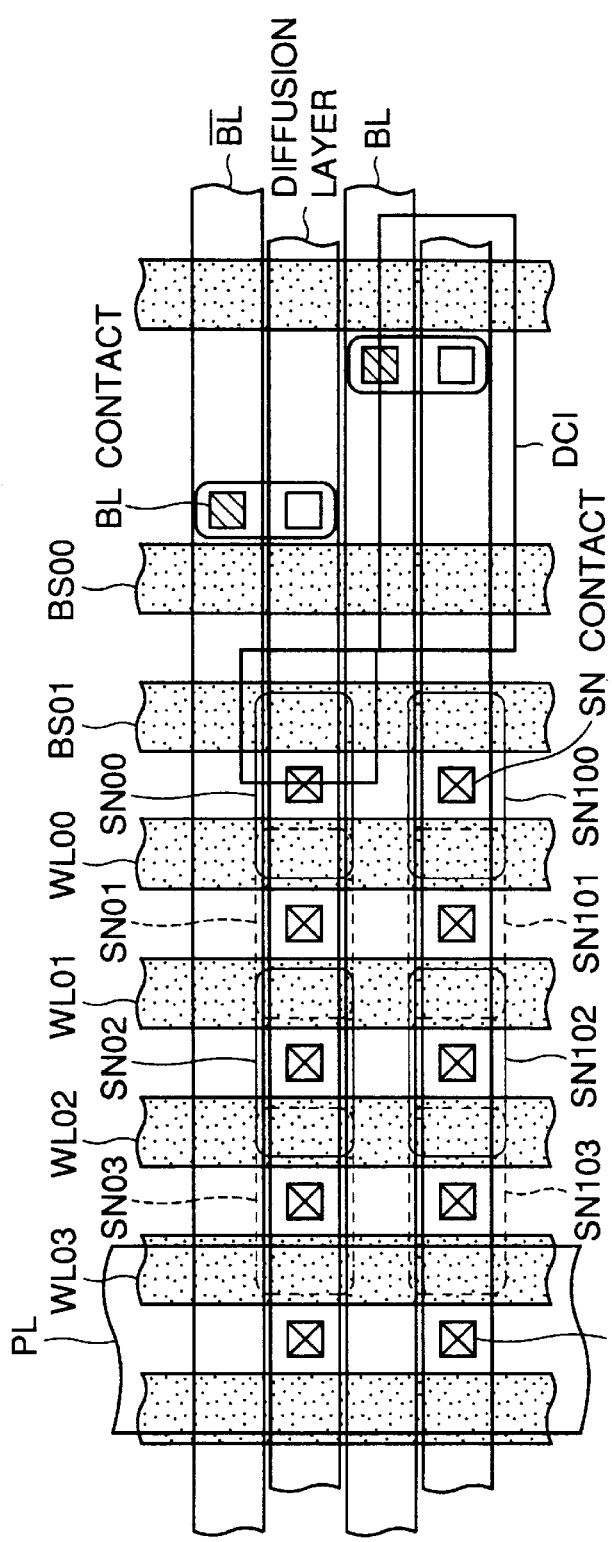
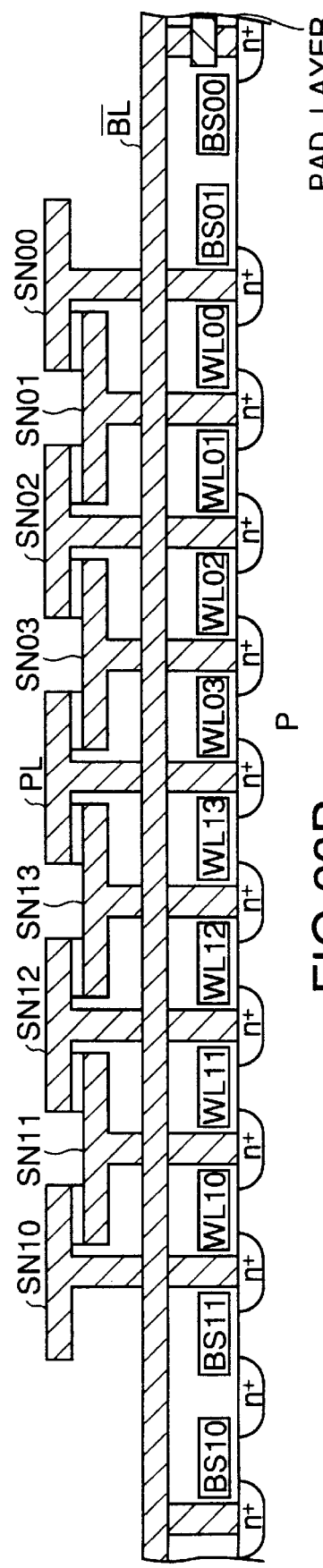
FIG. 28A
FIG. 28B

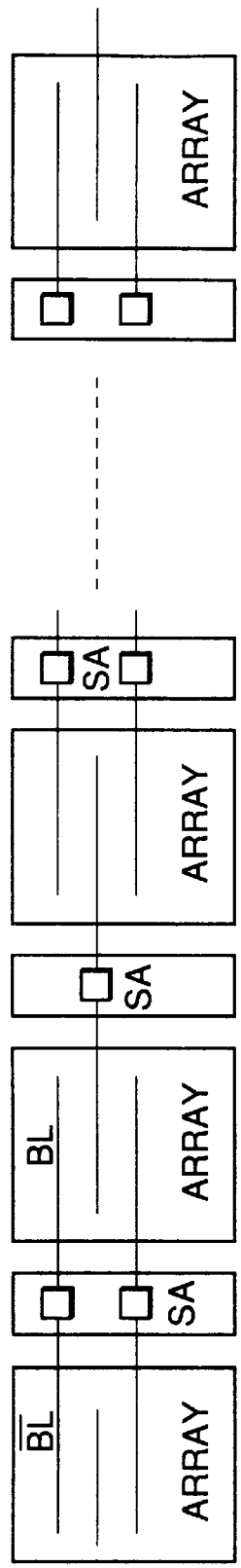
FIG.30A
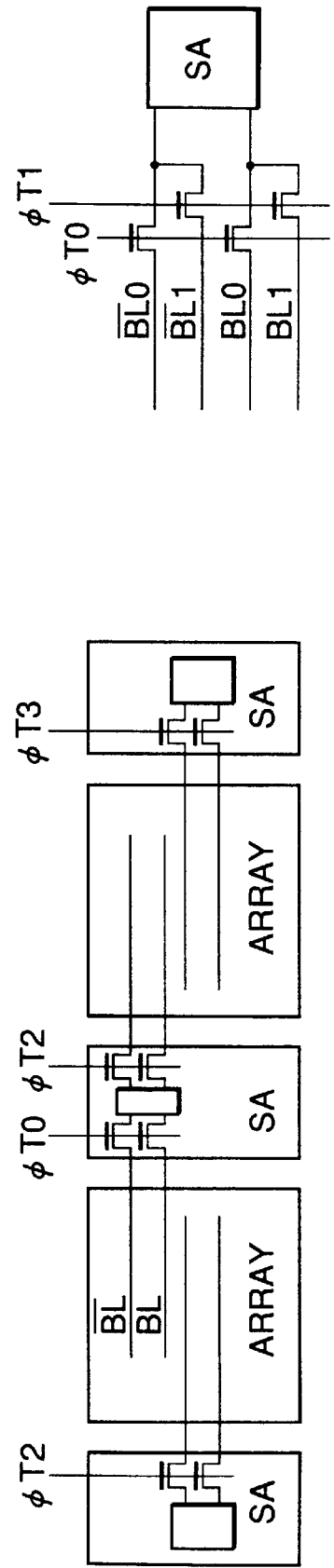
FIG.30C
FIG.30B

| | CHIP SIZE (COST) | | | TRANSISTOR STRUCTURE (EASE FOR PROCESS) | READ/WRITE METHOD (FLEXIBILITY) | NOISE (RELIABILITY) | (NO-)NONVOLATILE (PORTABILITY) |
|---|---|---|---|---|---|---|---|
| | CELL SIZE | BL CAPACITY | CHIP SIZE (BL CAPACITY = CONSTANT) | | | | |
| CONVENTIONAL 4F² CELL | ◎ 4F² | △ LARGE (256WL/BL) | △ 75~90% | × STACK Tr TFT | ◎ RANDOM ACCESS | ◎ SMALL (2-LAYER FOLDED BL) | USABLE NONVOLATILE CELL |
| CONVENTIONAL NAND CELL | ◎ 4.5~5F² (4~2NAND) | ○ MIDDLE (512WL/BL) | ○ 71~74% | ◎ PLANER Tr | × BLOCK ACCESS | ◎ SMALL (FOLDED BL BY ADDING BS) | USABLE NONVOLATILE CELL |
| PRESENT INVENTION | ◎ 4.5~5F² | ◎ SMALL (1024WL/BL) | ◎ 62.5~64% | ◎ PLANER Tr | ◎ RANDOM ACCESS | ◎ SMALL | NONVOLATILE CELL |
| CONVENTIONAL 8F² CELL | × 8F² | ○ MIDDLE (512WL/BL) | × 100% | ◎ PLANER Tr | ◎ RANDOM ACCESS | ◎ SMALL (FOLDED BL) | USABLE NONVOLATILE CELL |

CONDITION  IN 100% CHIP (MEMORY CELL 60%, SA 20%, PERIPHERAL CIRCUIT 20%)

NOTE) BL IS MADE TO DOUBLE LAYERED COST INCREASES 7%

NOTE) NESTING≦4

FIG.36

| | PLATE ELECTRODE DRIVING (SPEED, POWER) | REFRESH OPERATION (POWER, BUSY RATE) |
|---|---|---|
| CONVENTIONAL FRAM CASE 1 | EXIST ✗ | UNNECESSARY ◎ |
| CONVENTIONAL FRAM CASE 2 | $\frac{1}{2} V_{CC}$ FIXED ◎ | NECESSARY ✗ |
| PRESENT INVENTION | $\frac{1}{2} V_{CC}$ FIXED ◎ | UNNECESSARY ◎ |

FIG.37

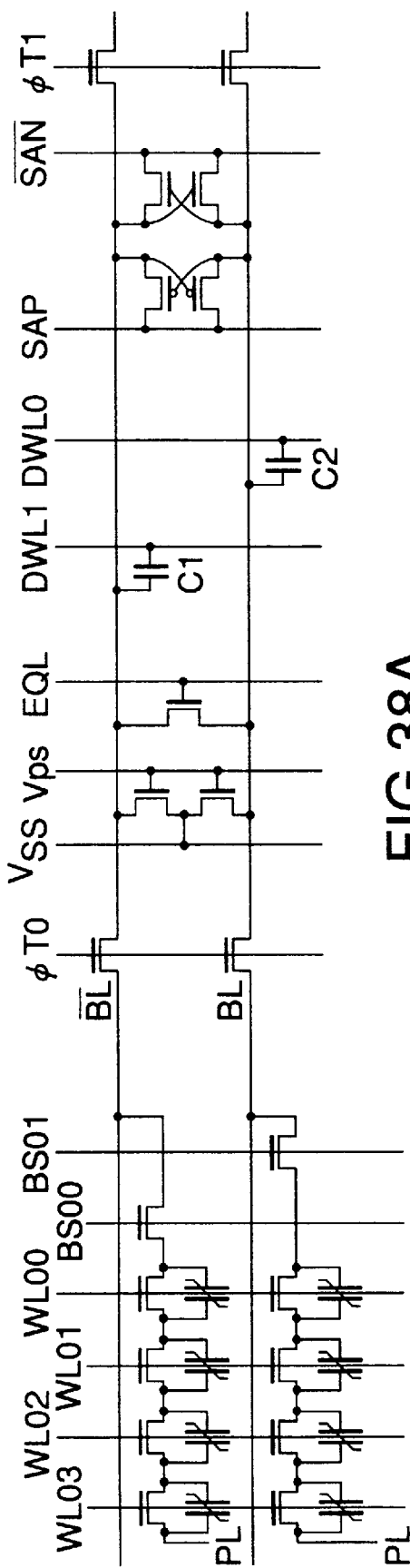
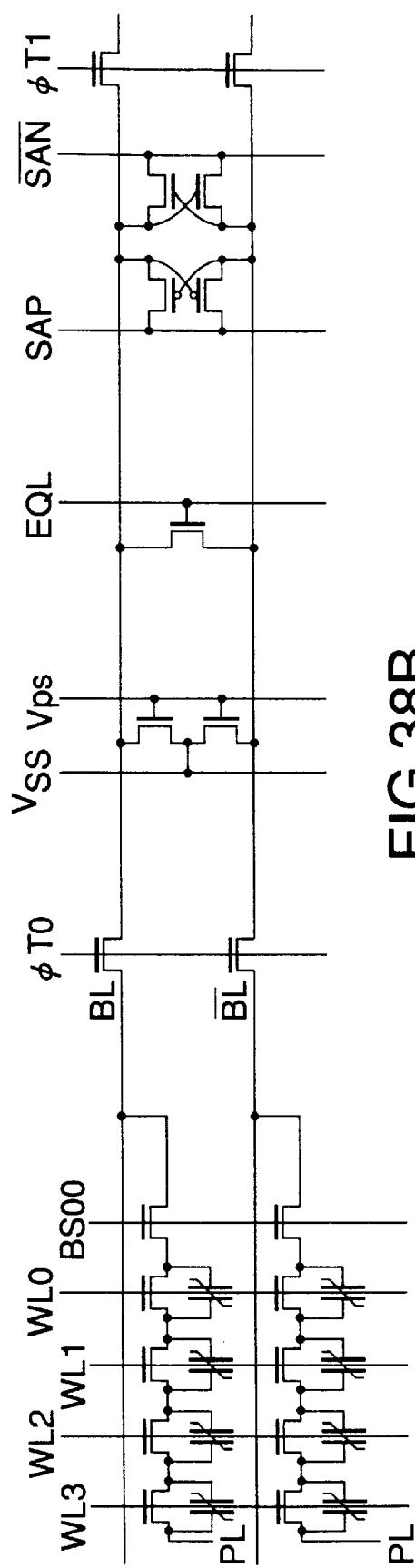
FIG.38A
FIG.38B

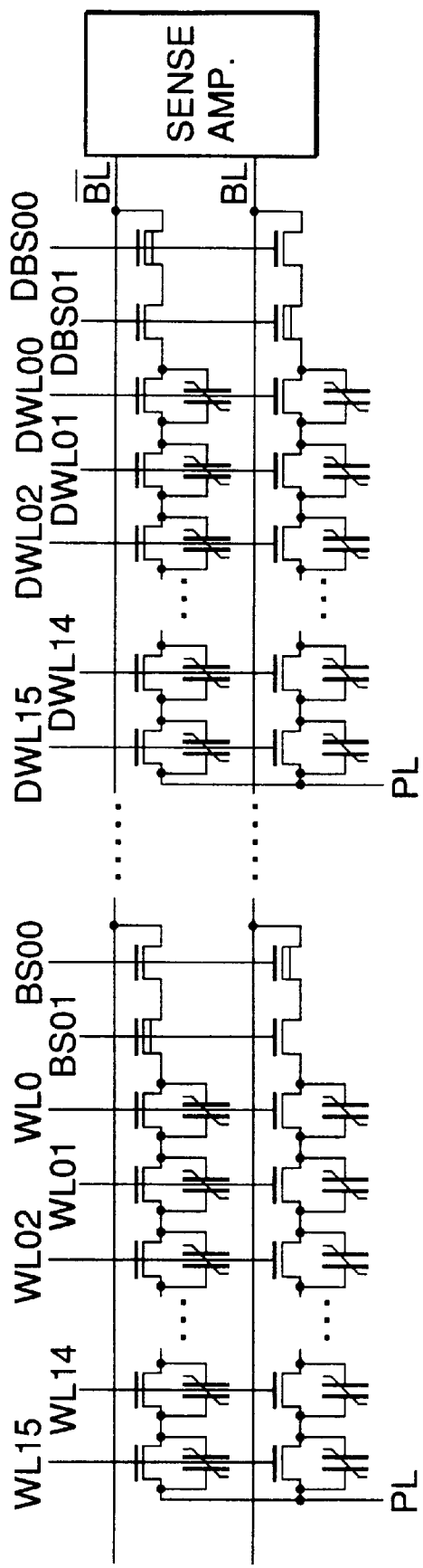
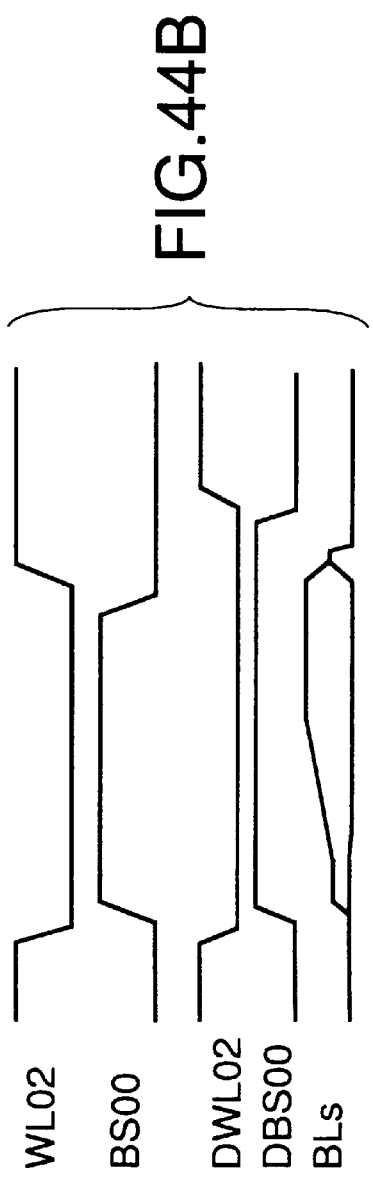
FIG.44A
FIG.44B

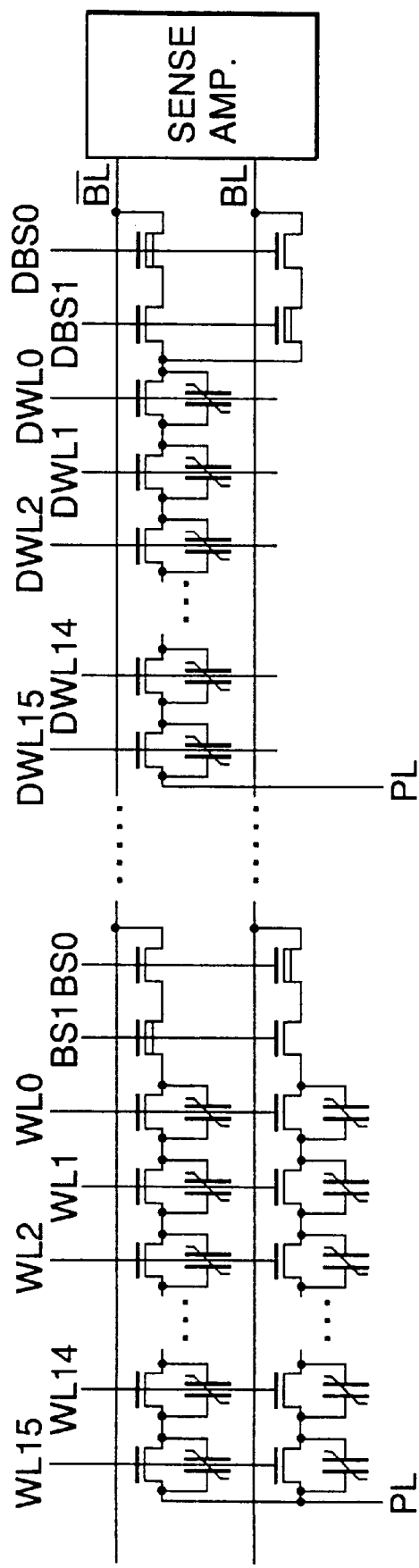
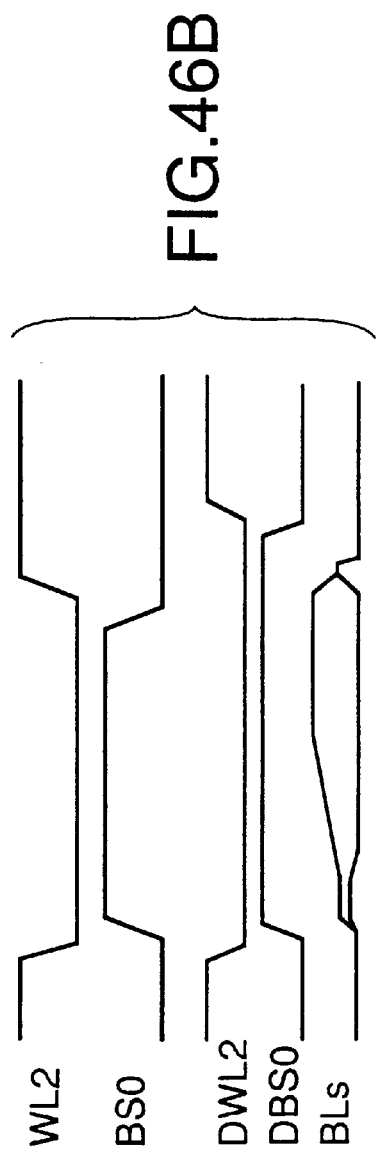
FIG.46A
FIG.46B

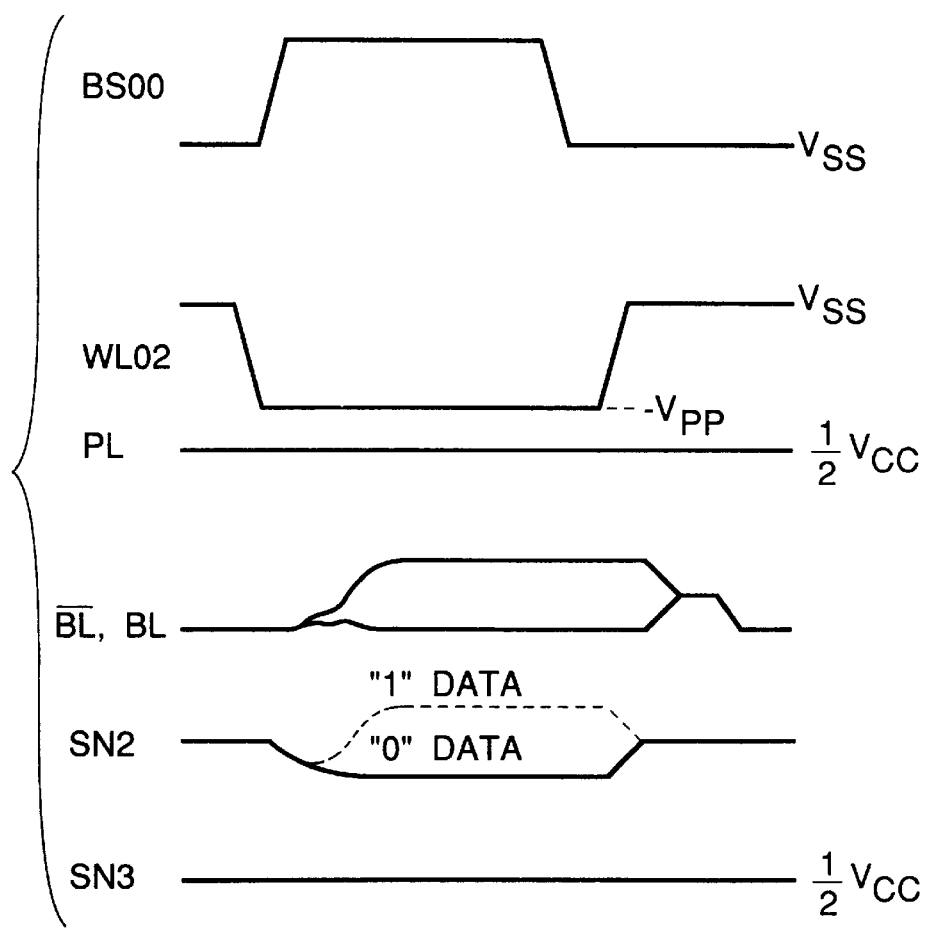

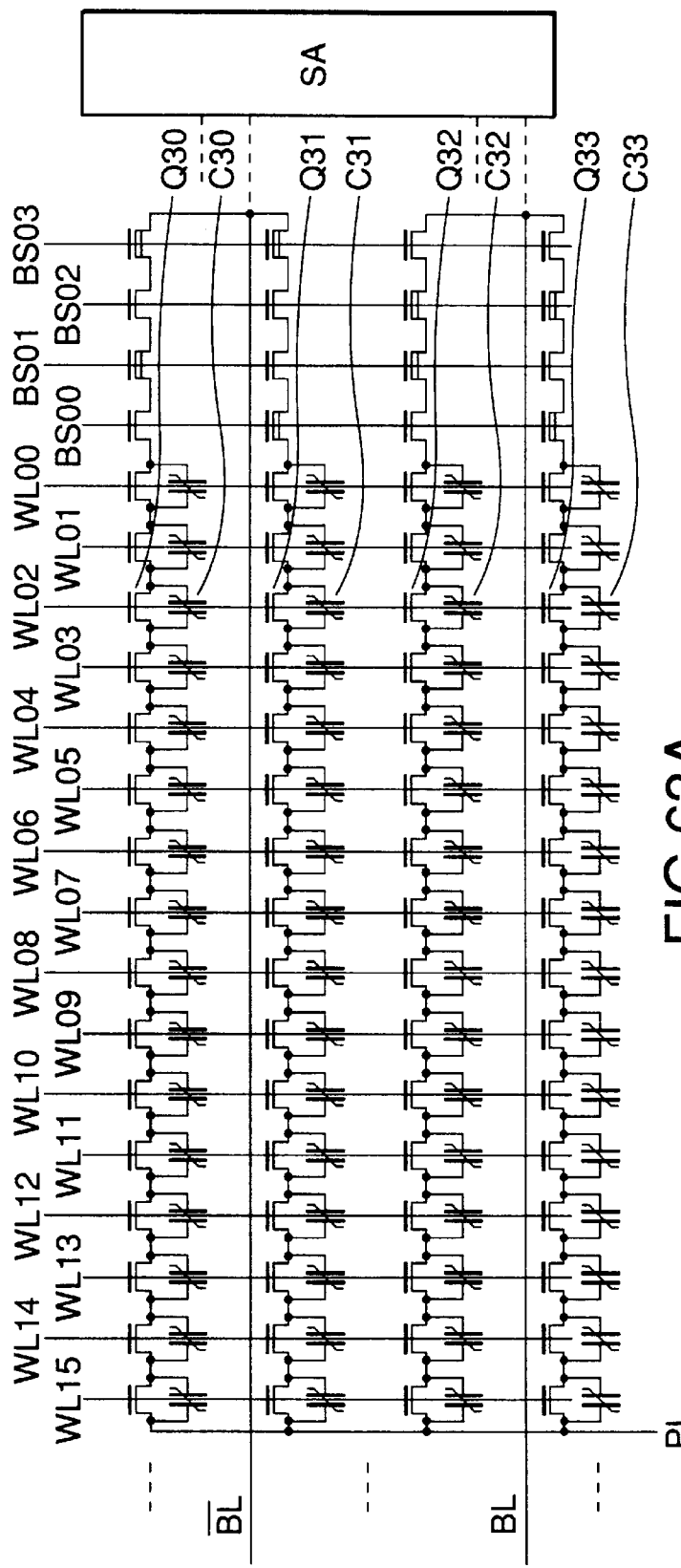
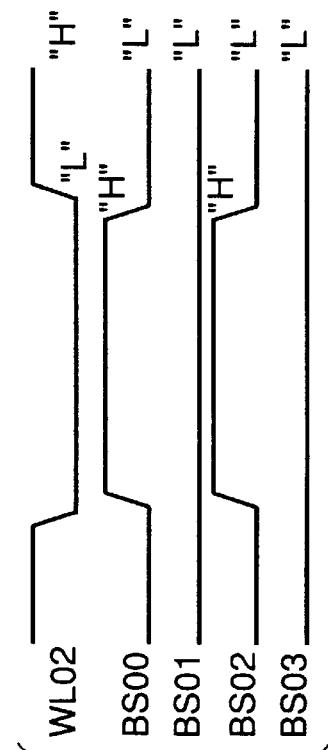
FIG.63A
FIG.63B

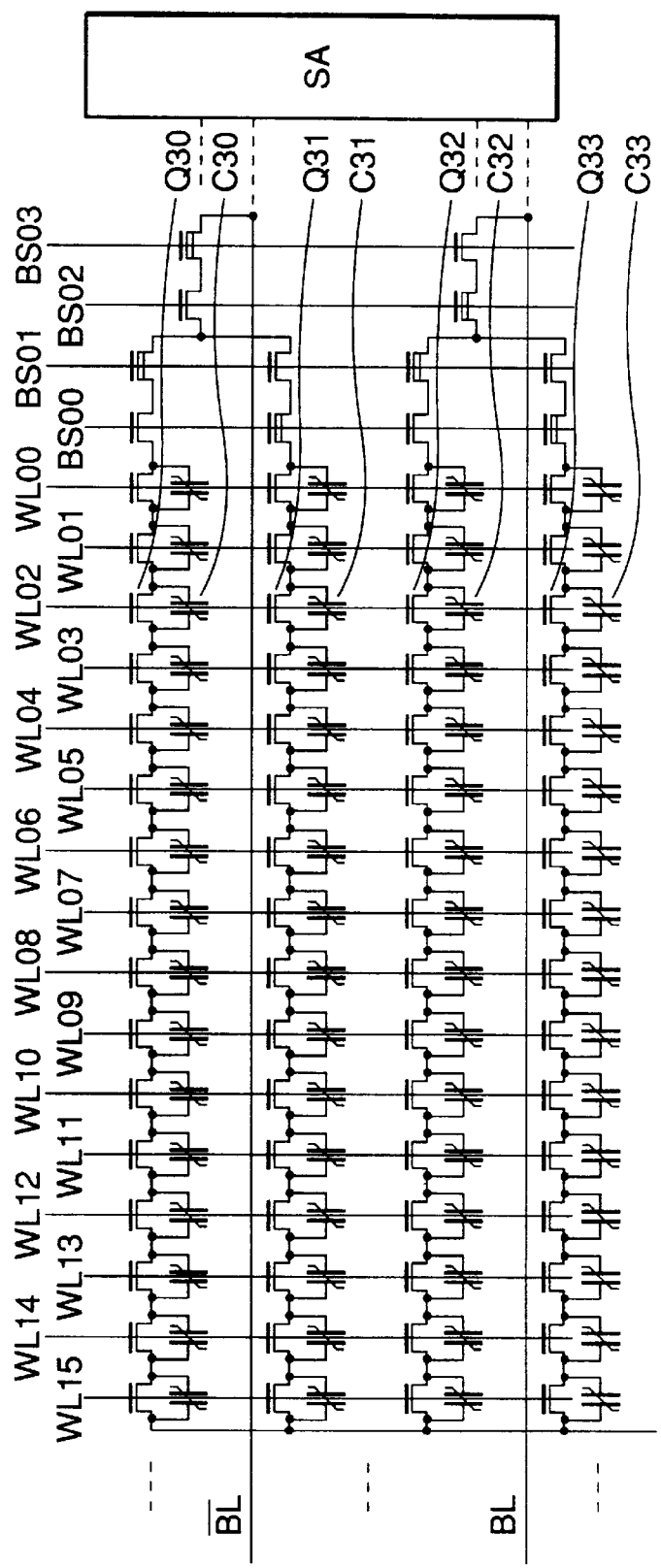
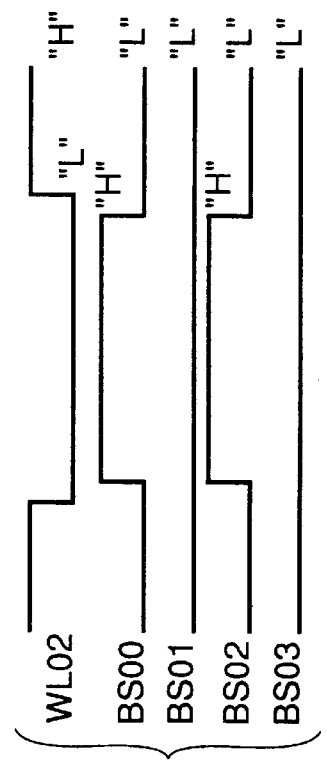
FIG.64A
FIG.64B

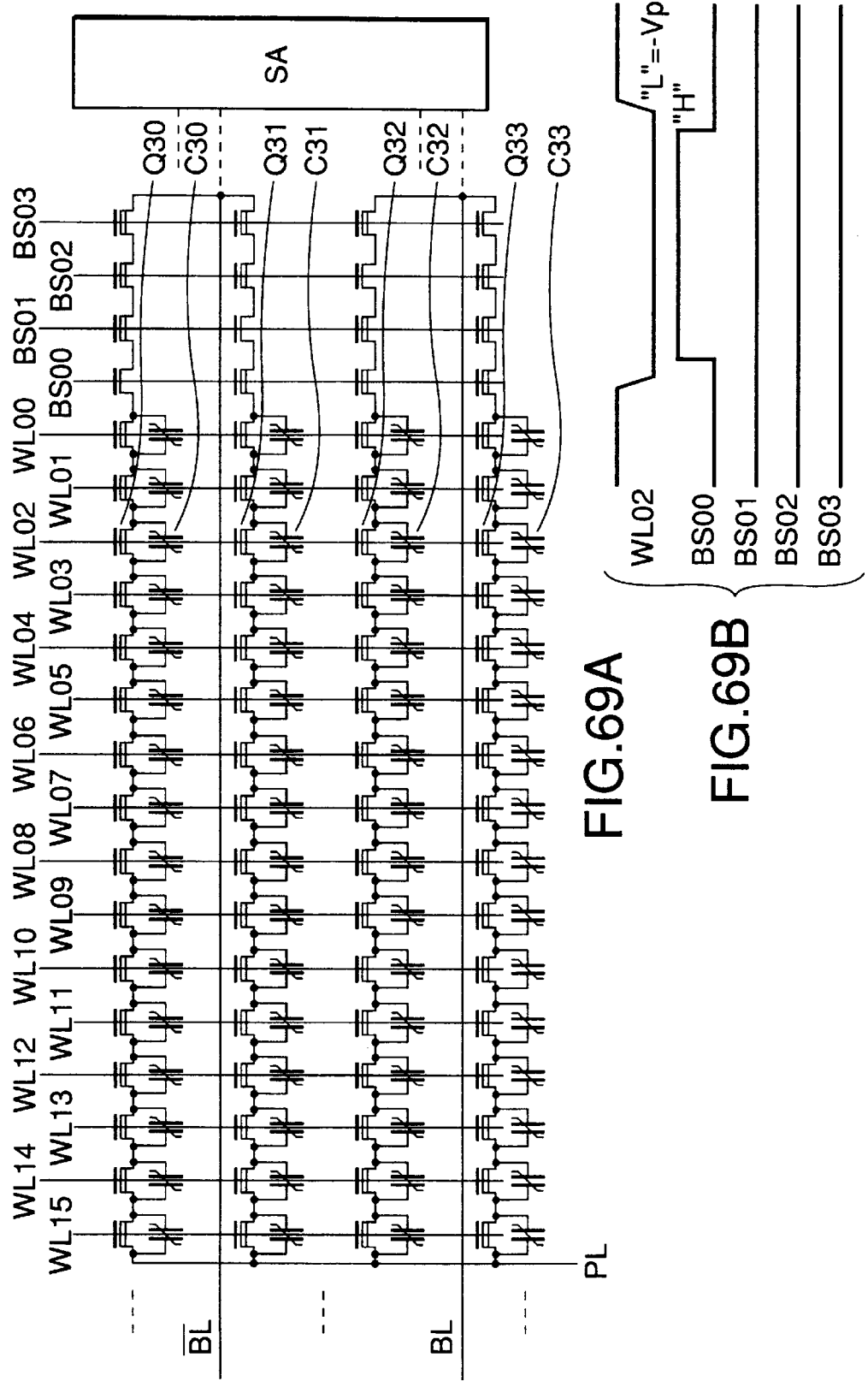

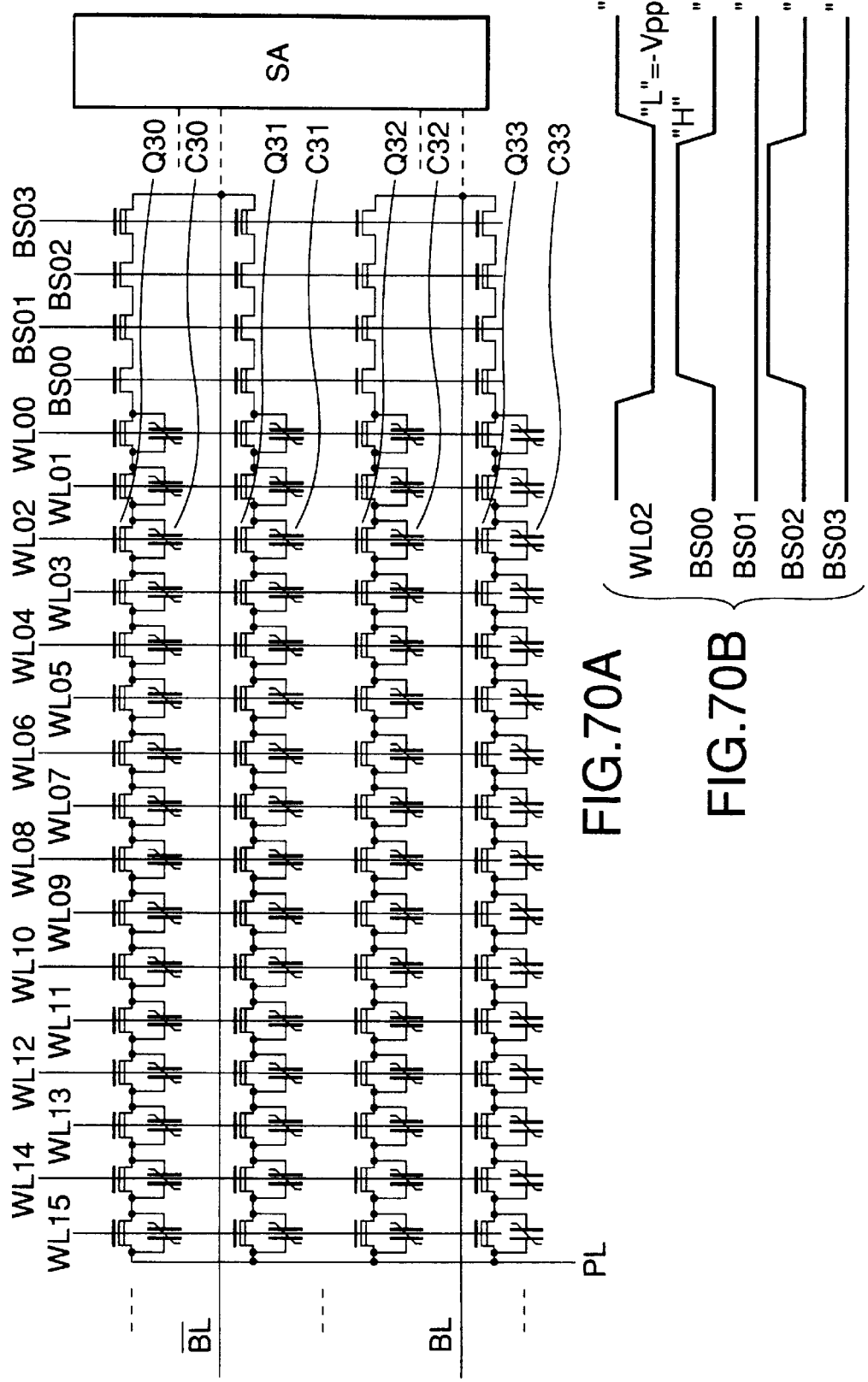

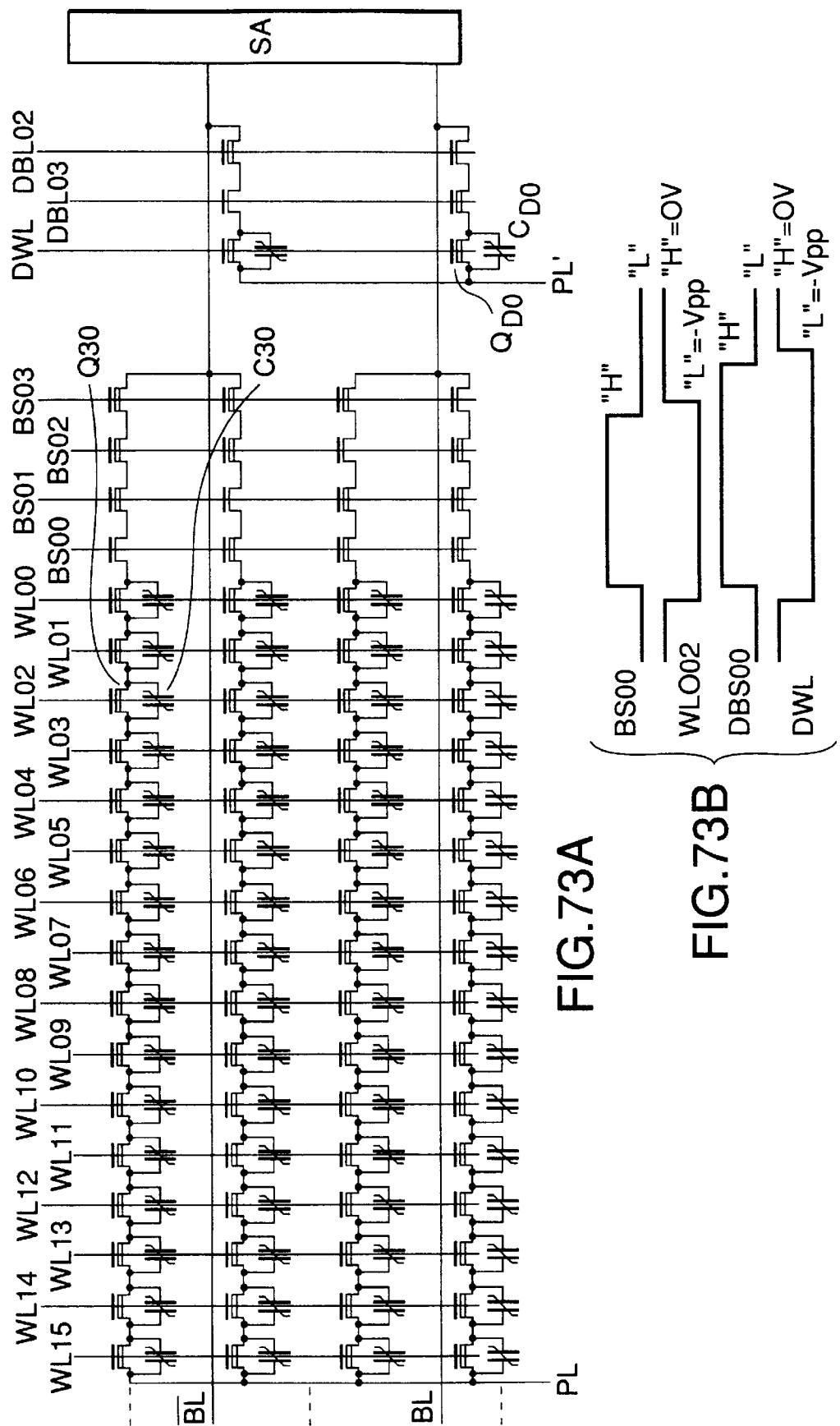

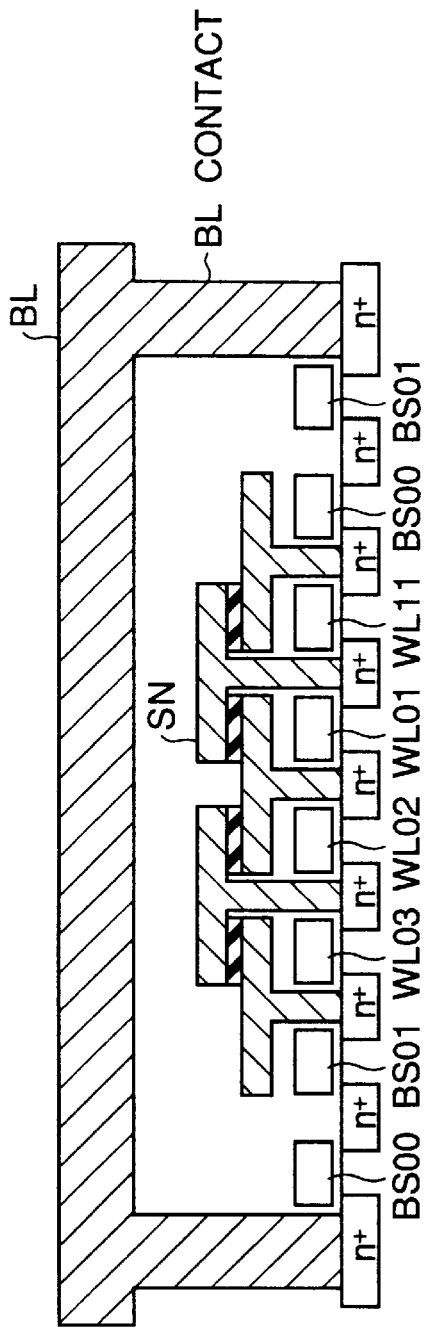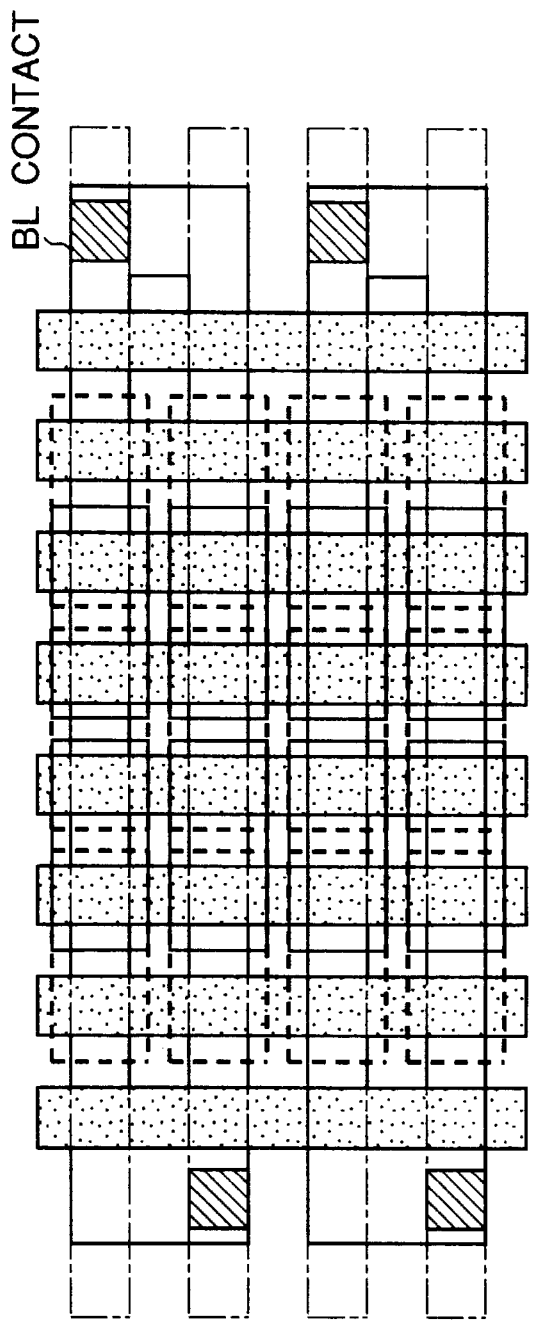

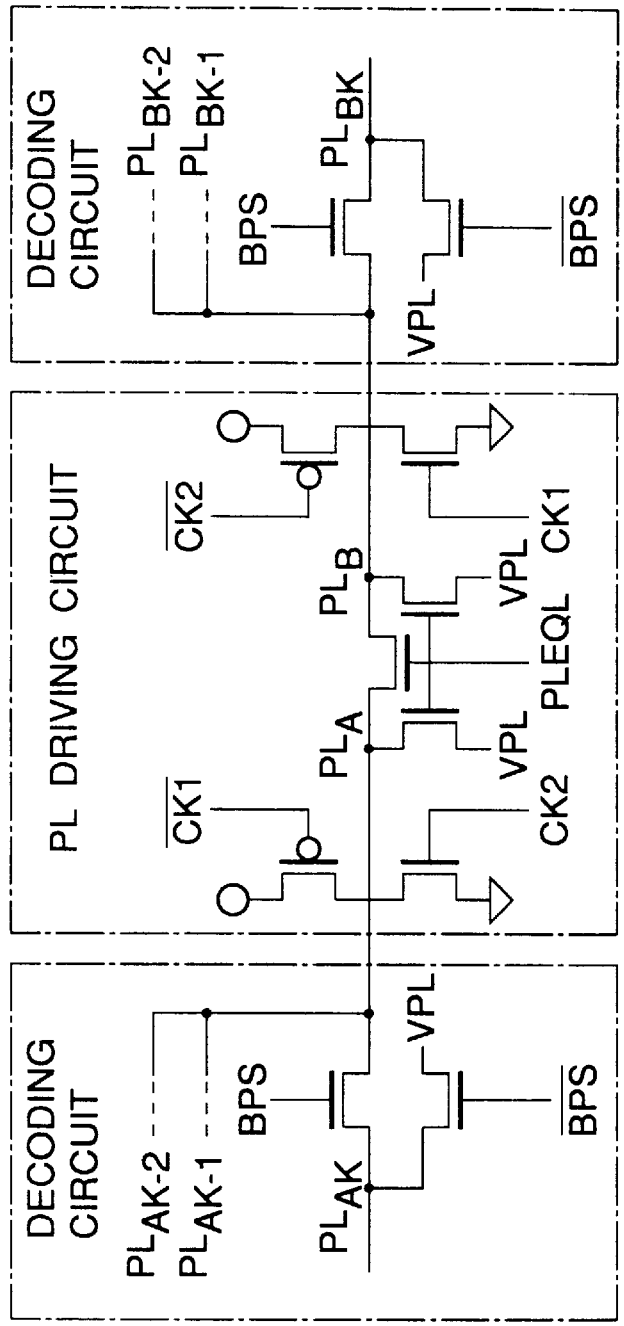
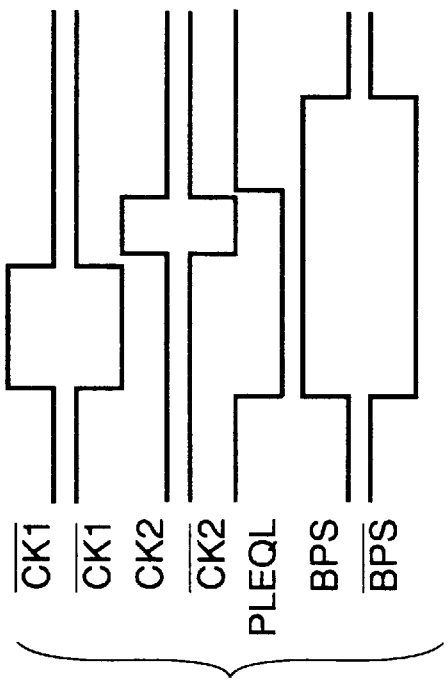
FIG.120A
FIG.120B

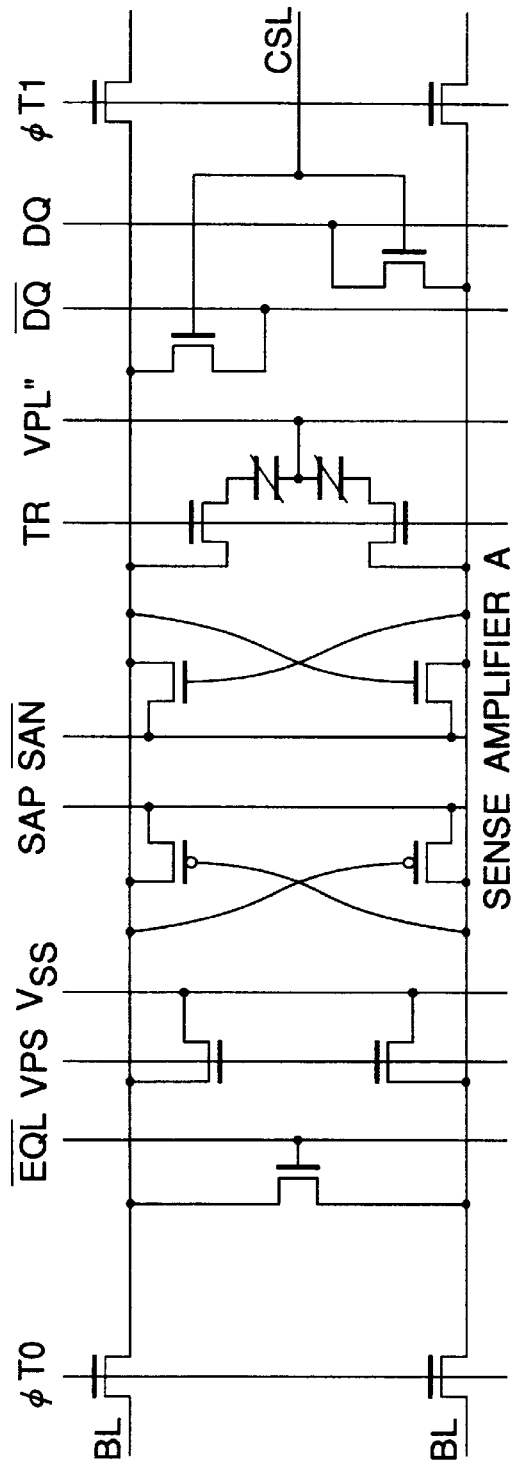
FIG.122A SENSE AMPLIFIER A
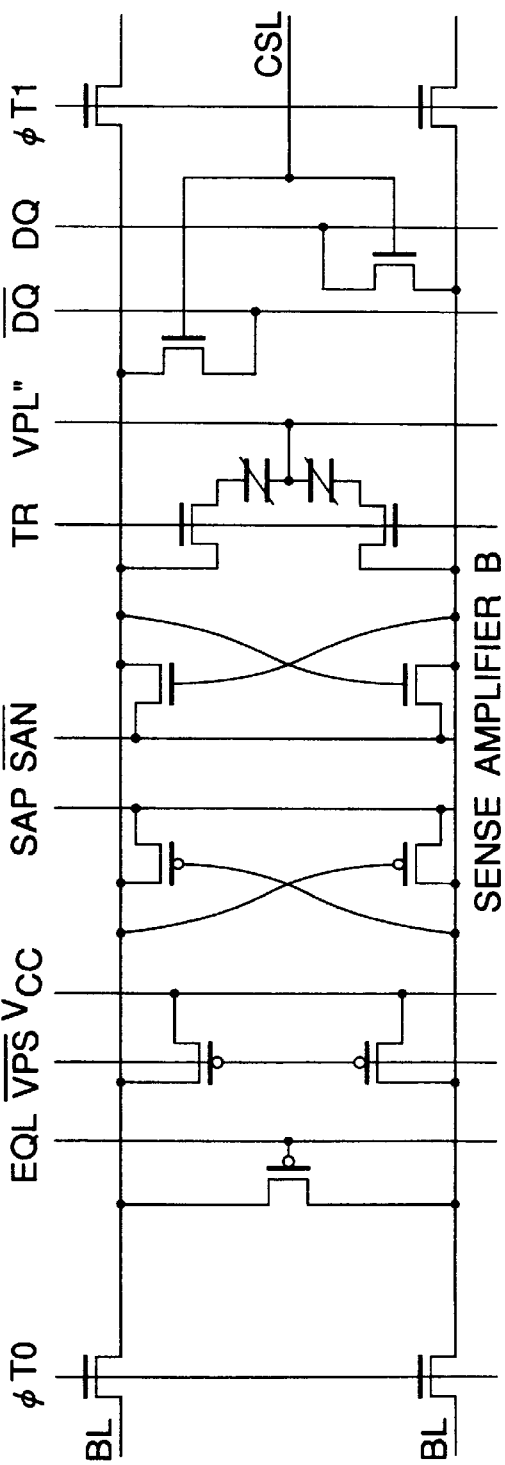
FIG.122B SENSE AMPLIFIER B

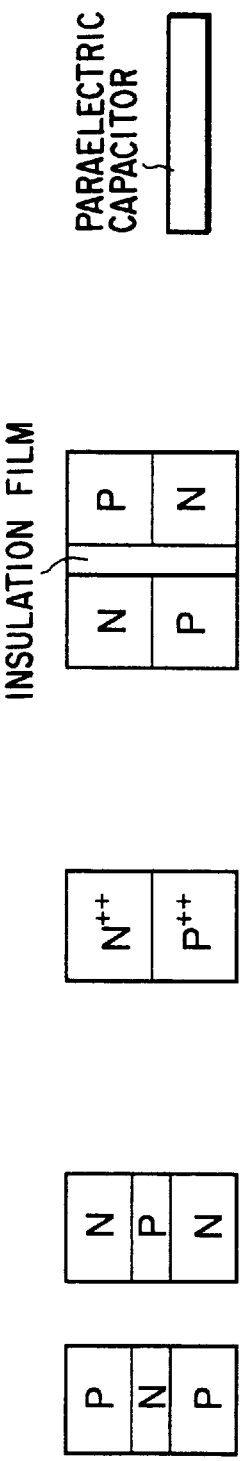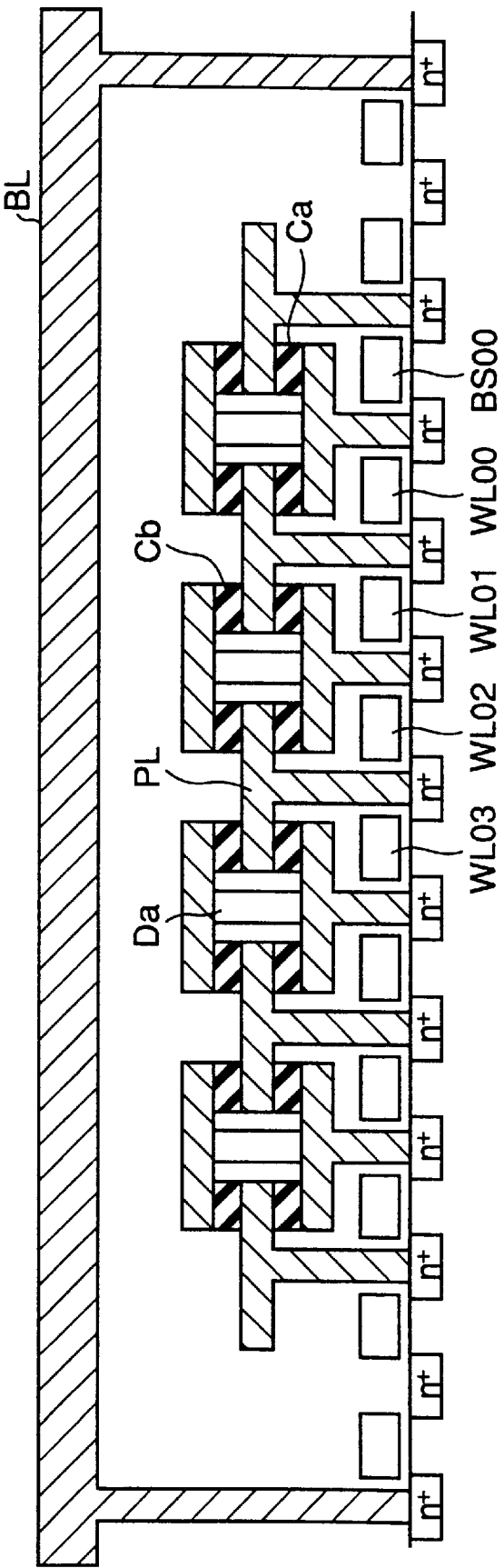

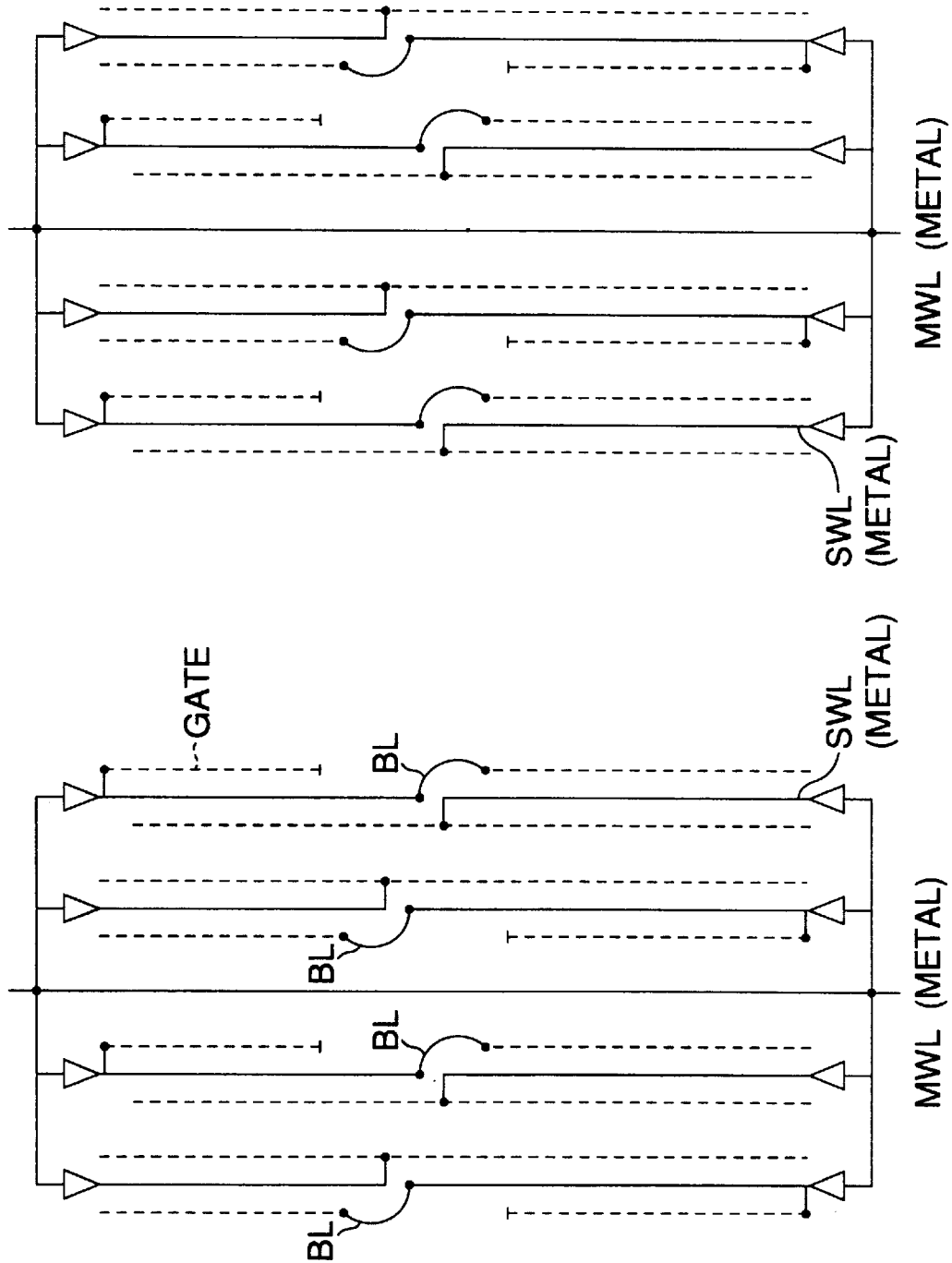

FIG.153

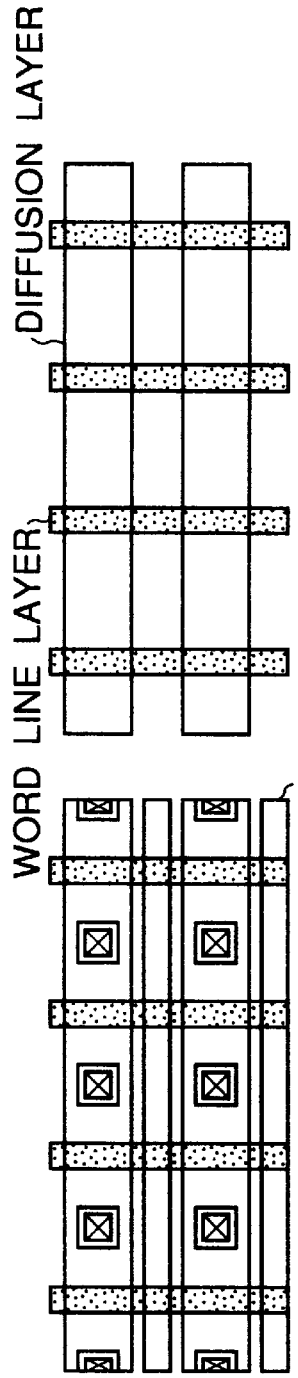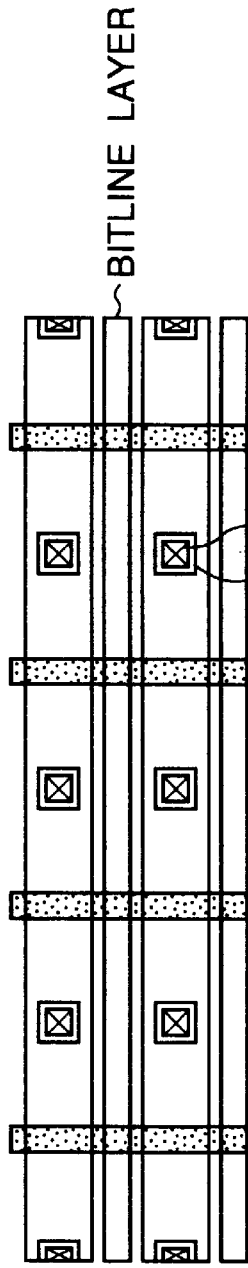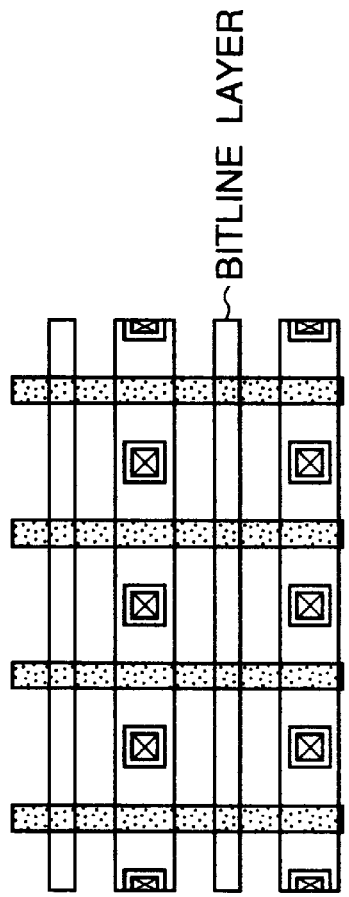
FIG.164D  FIG.164C  FIG.164B  FIG.164A

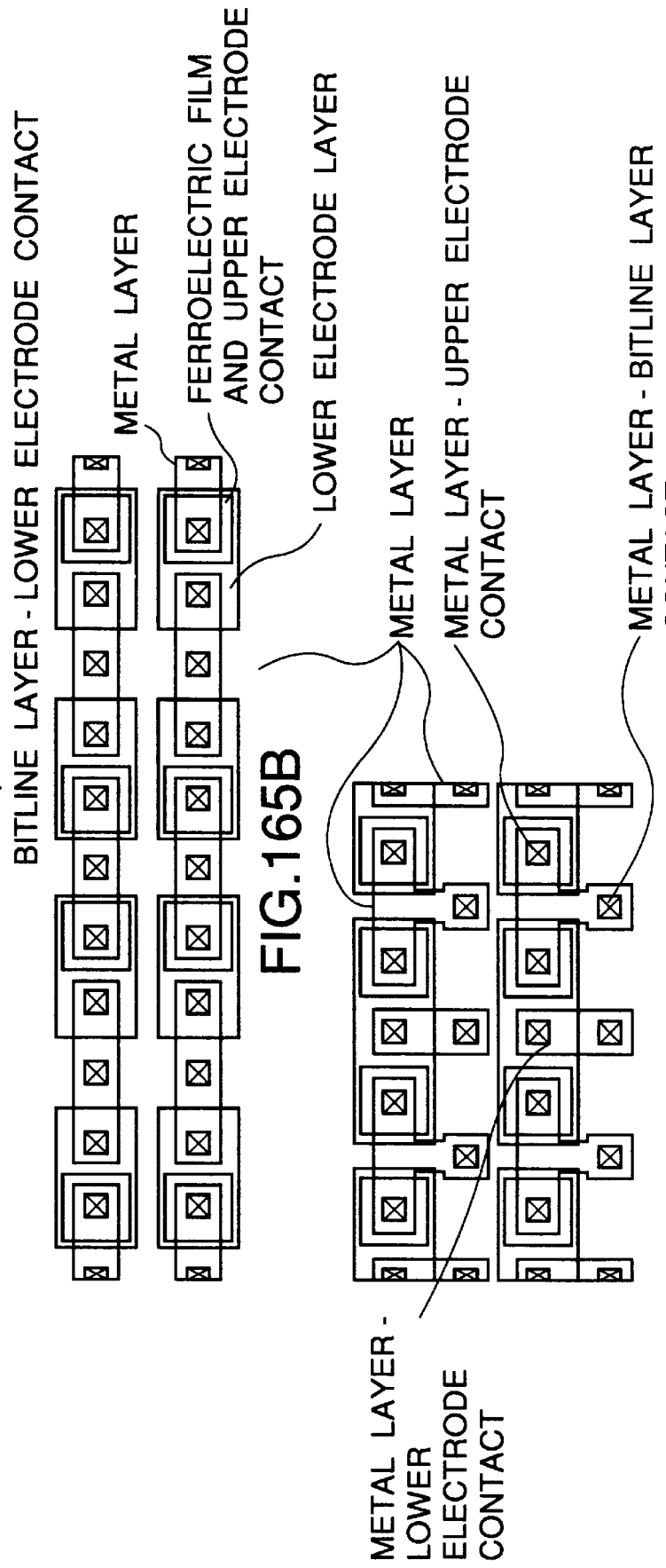

SEMICONDUCTOR MEMORY DEVICE AND VARIOUS SYSTEMS MOUNTING THEM

BACKGROUND OF THE INVENTION

The present invention relates to a nonvolatile semiconductor memory device using a ferroelectric capacitor, a method of driving the same, and various systems each having the semiconductor memory device.

In recent years, a nonvolatile memory (FRAM) using a ferroelectric capacitor has received a great deal of attention as one of semiconductor memories. Since the FRAM is advantageous in that it is nonvolatile, the number of times of rewrite access is $10^{12}$, the read/write time almost equals that of a DRAM, and it can operate at a low voltage of 3 to 5V, the FRAMs may replace all memory markets.

Along with developments, the cell size of the FRAM has been reduced by simplifying and micropatterning the cell structure, as in development of DRAMs. FIG. 1A shows the memory cell of a conventional DRAM having a 1-transistor/1-capacitor structure. FIG. 1B shows the memory cell of a conventional FRAM having a 1-transistor/1-capacitor structure. Reference symbol WL denotes a word line; BL, a bit line; SN, a storage node; and PL, a plate electrode.

The FRAM memory cell basically has the same structure as that of the DRAM. The FRAM is different from the DRAM in the following two points. (1) Although the DRAM uses a dielectric without any spontaneous dielectric polarization as a capacitor, the FRAM uses a ferroelectric capacitor. (2) In the DRAM, the plate electrode at one terminal of the capacitor is fixed at (½)Vcc. However, in the FRAM, the plate electrode potential is changed within the range of 0V to Vcc.

For (2), however, the scheme of changing the plate electrode potential is being replaced with a scheme of fixing the plate electrode at (½)Vcc.

Therefore, the FRAM equals the DRAM except for (1). The FRAM also has the same cell array structure as that of the DRAM. The FRAM has a folded bit line (BL) structure as shown in FIG. 1C. The minimum cell size at this time is represented as follows:

$$2F \times 4F = 8F^2$$

In FIG. 1C, reference symbol MC denotes a memory cell; SA, a sense amplifier; and F, a minimum processing size. $\overline{BL}$ and BL in FIG. 1C denote a bit line pair.

The principle of the operation of the FRAM will be briefly described with reference to FIGS. 2A and 2B.

In the DRAM, the cell transistor is turned on, and Vcc or a voltage of 0V is applied to the cell capacitor to write charges, thereby storing store data "0" or "1". In reading, the cell transistor is turned on to read out the charges. In the DRAM, the accumulated charges (polarization value [C]) are proportional to the voltage applied across the cell capacitor, as shown in FIG. 2A. For this reason, when the applied voltage becomes 0V due to a leakage current at the p-n junction of the cell transistor or the like, the polarization value also becomes 0 C, and the information is destroyed.

In the FRAM, however, the polarization characteristics have a hysteresis. A case wherein, after power-ON, the plate (PL) voltage is 0V, the storage node (SN) potential is 0V, and data "0" has been written in the cell will be considered. Since the plate electrode potential is 0V, and the storage node potential is 0V, the voltage applied to the ferroelectric capacitor is 0V, and the polarization value is at a position D of the remnant polarization (=–Pr) in FIG. 2B. When the memory cell data is to be read out, the bit line (BL) potential is precharged to 0V, the cell transistor is turned on, and the plate electrode voltage is raised to Vcc. Since the bit line capacity is larger than the storage node capacity, a voltage –Vcc is applied between the bit line and the plate electrode. The polarization value changes from the point D to a point C, so that a potential corresponding to the small saturation polarization difference Ps–Pr is read out to the bit line.

When data "1" has been written in the cell, the voltage –Vcc is applied between the bit line and the plate electrode, as in the above-described case. Accordingly, polarization inversion from a point B to the point C occurs, and charges in a large amount corresponding to Ps+Pr are read out to the bit line.

The reference bit line potential is raised to the potential at which charges corresponding to Ps are read out. In reading the data "1", a potential difference corresponding to (Ps+Pr)–(Ps)=Pr is generated between the reference bit line and the bit line. In reading the data "0", a potential difference corresponding to (Ps–Pr)–(Ps)=–Pr is generated between the reference bit line and the bit line. This result (potential difference) is amplified by the sense amplifier. The readout result is amplified by the sense amplifier. For the data "1", the bit line is set at Vcc. For the data "0", the bit line is set at 0V.

To rewrite the memory cell data, the plate electrode voltage is lowered to 0V again. At this time, the data "0" returns from the point C to the point D at BL–PL=0V, and the data "1" returns from the point C to the point D and then polarization-inverted to a point A at BL–PL=Vcc. Thereafter, the cell transistor is turned off. The data "1" moves from the point A to the point B when the storage node potential lowers to 0V due to the leakage current and stops at the point B. FIG. 3A shows the series of operations.

The largest difference between the operation of the FRAM and that of the DRAM is as follows. In the FRAM, no data is read out only by turning on the cell transistor and short-circuiting the bit line BL and the storage node SN. No charges are removed unless the direction of polarization is reversed to that for writing the charges between the bit line BL (storage node SN) and the plate electrode PL. Accordingly, a plate electrode operation with a large load capacity is required, and read/write access takes a long time. This is the disadvantage of the FRAM.

To solve this problem, the scheme of fixing the plate electrode potential at (½)Vcc is proposed, as described above. FIGS. 3B and 3C show the operations of these schema. In recall after power-ON (on the left side of FIGS. 3B and 3C), the plate electrode PL is precharged to (½)Vcc, and the bit line BL is precharged to 0V. The word line WL is selected to turn on the cell transistor. At this time, a voltage of –(½)Vcc is applied between the bit line BL and the plate electrode PL. As shown in FIG. 2B, the data "1" is polarization-inverted from the point B to the point C, the data "0" moves from the point D to the point C without polarization inversion, and the accumulated charges are read out to the bit line BL. The information "0" or "1" is read out depending on the presence/absence of polarization inversion. The readout result is amplified by the sense amplifier. For the data "1", the bit line BL is set at Vcc. For the data "0", the bit line BL is set at Vss. A voltage of (½)Vcc=BL–PL or a voltage of (–½)Vcc=BL–PL is applied to the cells. The data "1" moves from the point C to the point A, the data "0" stays at the point C, and the data is written.

The scheme shown in FIG. 3B slightly differs from that shown in FIG. 3C in the subsequent operation. In FIG. 3B, after the bit line BL is equalized to (½)Vcc (more specifically, the data "1" moves from the point A to the point B, and the data "0" moves from the point C to the point D), the word line WL is closed to return the bit line potential to 0V. Even when the bit line BL is equalized, the data stays at the point B or D, so the data is not destroyed. This operation reversely exploits the characteristics of the ferroelectric capacitor. In FIG. 3C, after the word line WL is closed, the bit line BL is equalized to (½)Vcc (more specifically, the data "1" stays at the point A, and the data "0" stays at the point C). For reading after recall, the charge difference (Ps–Pr) between the point A and the point B or between the point C and the point D is used, as in the DRAM (the degradation in the amount of the remnant polarization Pr due to the fatigue caused by polarization inversion in reading is suppressed).

The scheme shown in FIG. 3B or 3C is more advantageous than that shown in FIG. 3A in that the operation speed in access time or cycle time does not degrade unlike the scheme of changing the plate electrode potential, so that a high-speed operation is enabled. On the other hand, the scheme shown in FIG. 3B or 3C is more disadvantageous than that shown in FIG. 3A in that the voltage (coercive voltage Vc) necessary for polarization inversion must be (½)Vcc or less (this problem is solved by reducing the size of the ferroelectric film). Additionally, the FRAM has a large disadvantage in that a refresh operation is required, like the DRAM (the refresh operation increases the stand-by current or generates a busy rate).

In the scheme shown in FIG. 3B, the storage node SN of the cell is at (½)Vcc in the stand-by state. When the storage node potential becomes lower than (½)Vcc due to the leakage current at the p-n junction or the like, the data "1" moves from the point B to the point C, and the data is destroyed. Accordingly, the refresh operation must be performed to select the word line WL and write the potential of (½)Vcc in the storage node SN every a predetermined period in the stand-by state, as shown on the right side of FIG. 3B.

In the scheme shown in FIG. 3C, the storage node SN is set at Vcc or 0V in the stand-by state. When the storage node potential becomes lower than Vcc due to the leakage current at the p-n junction or the like, the data "1" moves from the point A to the point B, and then to the point C, and the data is destroyed. In this case, since the normal operation is the same as that of the DRAM, the data is destroyed upon moving to the point B. Accordingly, the refresh operation must be performed to select the word line WL and read/sense/rewrite the data every predetermined period in the stand-by state, like the DRAM, as shown on the right side of FIG. 3C.

For the conventional DRAMs, various cells are developed to realize a cell size smaller than $8F^2$. A stacked-type transistor or stacked-type TFT (Thin Film Transistor) is used to realize a size of $4F^2$, or cell transistors are connected in series, and capacitors are connected between the cell transistors and the plate electrode PL, thereby realizing a size of about $4F^2$ (NAND cell).

Since the equivalent circuit of the FRAM is basically the same as that of the DRAM, an FRAM having a size of $4F^2$ can be realized with the same cell structure as that of the DRAM. The FRAM also has the same problems as those of the DRAM. The stacked-type transistor or stacked-type TFT can hardly be realized because the manufacturing process is more complex than that for a conventional planar transistor having a size of $8F^2$, which can be easily manufactured. In the FRAM, these cells are basically realized as trench cells in which a transistor is formed after the ferroelectric capacitor process. Therefore, the permittivity of the ferroelectric capacitor decreases due to the heat process in the transistor manufacturing process.

The NAND cell can be manufactured using a planar transistor and can have a stack cell structure in which the capacitor is formed after the transistor process. In the NAND cell, however, cell data must be sequentially read out from cells closer to the bit line BL or must be sequentially written in cells farther from the bit line BL. This degrades the random access properties as an important point of a general-purpose memory and allows only block read/write access.

As described above, in the conventional FRAM, when a memory cell having a size of $4F^2$ smaller than $8F^2$ is to be realized, the process becomes complex for, e.g., the stacked-type transistor, or the random access properties of a general-purpose memory degrade for, e.g., a NAND cell. Additionally, the conventional FRAM cannot simultaneously realize the high-speed operation of the scheme of fixing the plate electrode potential and omission of the refresh operation.

Various systems having semiconductor memories have examined replacement of the conventional DRAM with the FRAM. However, such examinations have not reached a practical level yet because of the above-described problems unique to the FRAM.

SUMMARY OF THE INVENTION

It is an object of the present invention to provide a semiconductor memory device which can realize a memory cell having a size (e.g., $4F^2$) smaller than $8F^2$ without using any stacked-type transistor or the like and also maintain a random access function.

It is another object of the present invention to provide a semiconductor memory device which can simultaneously realize a high-speed operation by fixing the plate potential and the omission of a refresh operation.

It is still another object of the present invention to provide various systems which can improve the system performance by mounting the semiconductor memory device.

(Arrangement)

To solve the above problems, the present invention employs the following arrangements.

(1) A computer system comprises: a microprocessor for performing various arithmetic processing operations; an input/output device connected to said microprocessor to send/receive data to/from an external device; and a semiconductor memory device connected to said microprocessor to store data, wherein said semiconductor memory device includes a plurality of memory cells each having a transistor having a source terminal and a drain terminal and a ferroelectric capacitor having a first terminal connected to said source terminal and a second terminal connected to said drain terminal, a predetermined number of memory cells are connected in series, and a select transistor is connected to at least one terminal of said series connected portion to constitute a memory cell block, and a plurality of memory cell blocks are arranged to constitute a cell array.

(1-1) The computer system includes a controller for the semiconductor memory device.

(2-1) The computer system includes a volatile RAM.

(1-3) The computer system includes a ROM.

(2) An IC card comprises an IC chip having a semiconductor memory device, wherein said semiconductor memory device includes a plurality of memory cells each having a transistor having a source terminal and a drain terminal and a ferroelectric capacitor having a first terminal connected to said source terminal and a second terminal connected to said drain terminal, a predetermined number of memory cells are connected in series, and a select transistor is connected to at least one terminal of said series connected portion to constitute a memory cell block, and a plurality of memory cell blocks are arranged to constitute a cell array.

(3) A digital image input system comprises: an image input device for inputting image data; a data compression device for compressing the input image data; a semiconductor memory device for storing the compressed image data; an output device for outputting the compressed image data; and a display device for displaying one of the input image data and the compressed image data, wherein said semiconductor memory device includes a plurality of memory cells each having a transistor having a source terminal and a drain terminal and a ferroelectric capacitor having a first terminal connected to said source terminal and a second terminal connected to said drain terminal, a predetermined number of memory cells are connected in series, and a select transistor is connected to at least one terminal of said series connected portion to constitute a memory cell block, and a plurality of memory cell blocks are arranged to constitute a cell array.

(3-1) The digital image input system has a function as a digital camera.

(3-2) The digital image input system has a function as a digital video camera.

(4) A memory system comprises: a semiconductor memory device for storing data; and an input/output device connected to said semiconductor memory device to send/receive data to/from an external device, wherein said semiconductor memory device includes a plurality of memory cells each having a transistor having a source terminal and a drain terminal and a ferroelectric capacitor having a first terminal connected to said source terminal and a second terminal connected to said drain terminal, a predetermined number of memory cells are connected in series, and a select transistor is connected to at least one terminal of said series connected portion to constitute a memory cell block, and a plurality of memory cell blocks are arranged to constitute a cell array.

(4-1) The memory system includes a controller for controlling the semiconductor memory device.

(4-2) Memory information includes images such as cinema, music and instruction, and game software, OA software, OS software, dictionaries, and map information.

(5) A system LSI chip comprises: a core section for performing various processing operations; and a semiconductor memory device for storing data, wherein said semiconductor memory device includes a plurality of memory cells each having a transistor having a source terminal and a drain terminal and a ferroelectric capacitor having a first terminal connected to said source terminal and a second terminal connected to said drain terminal, a predetermined number of memory cells are connected in series, and a select transistor is connected to at least one terminal of said series connected portion to constitute a memory cell block, and a plurality of memory cell blocks are arranged to constitute a cell array.

(5-1) The core section is an MPU.

(5-2) According to (5-1), the semiconductor memory device is used as a micro-code memory.

(5-3) According to (5-1), the semiconductor memory device is used as an instruction cache memory.

(5-4) According to (5-1), the semiconductor memory device is used as a data cache memory.

(5-5) According to (5-1), the semiconductor memory device is used as a data memory.

(5-6) The core section is an image processing section for performing image processing.

(5-7) According to (5-6), the semiconductor memory device is used as an image data memory.

(5-8) The core section is a logic section for performing various logic calculations.

(5-9) The LSI chip is a logic variable LSI chip.

(5-10) According to (5-9), the semiconductor memory device is used as a logic synthesis information memory.

(5-11) According to (5-9), the semiconductor memory device is used as a logic connection information storage memory.

(5-12) According to (5-9), the semiconductor memory device is used as an interconnection information storage memory.

(6) A mobile computer system comprises: a microprocessor for performing various arithmetic processing operations; an input device connected to said microprocessor to input data; a radio wave sending/receiving device connected to said microprocessor to send/receive data to/from an external device; an antenna connected to said sending/receiving device; a display device connected to said microprocessor to display necessary information; and a semiconductor memory device connected to said microprocessor to store data, wherein said semiconductor memory device includes a plurality of memory cells each having a transistor having a source terminal and a drain terminal and a ferroelectric capacitor having a first terminal connected to said source terminal and a second terminal connected to said drain terminal, a predetermined number of memory cells are connected in series, and a select transistor is connected to at least one terminal of said series connected portion to constitute a memory cell block, and a plurality of memory cell blocks are arranged to constitute a cell array.

(6-1) The mobile computer system has a function as a mobile phone.

(6-2) The mobile computer system has a function as a mobile TV phone.

(6-3) The mobile computer system has a function as a mobile TV and a mobile video.

(6-4) The mobile computer system has a function as a mobile computer display.

(7) A semiconductor memory device comprises: a plurality of memory cells each having a transistor having a source terminal and a drain terminal and a ferroelectric capacitor having a first terminal connected to said source terminal and a second terminal connected to said drain terminal, wherein said plurality of memory cells are arranged to constitute a cell array.

(8) A semiconductor memory device comprises: a plurality of memory cells each having a transistor having a source terminal and a drain terminal and a ferroelectric capacitor having a first terminal connected to said source terminal and a second terminal connected to said drain terminal, wherein said plurality of memory cells are connected in series to constitute a memory cell block, and a plurality of memory cell blocks are arranged to constitute a cell array.

(9) According to (8), said memory cell block includes a select transistor connected to at least one terminal of said plurality of series connected memory cells.

(9-1) The two terminals of the memory block are connected to adjacent bit lines, respectively.

(9-2) According to (9-1), the adjacent bit lines constitute a bit line pair and are connected to a sense amplifier.

(9-3) According to (9-1) and (9-2), the select transistor is constituted by a plurality of select transistors connected in series.

(10) A semiconductor memory device comprises: a plurality of memory cells each having a transistor having a source terminal and a drain terminal and a ferroelectric capacitor having a first terminal connected to said source terminal and a second terminal connected to said drain terminal, wherein said plurality of memory cells are connected in series, and a select transistor is connected to at least one terminal of said series connected portion to constitute a memory cell block, one terminal of said memory cell block is connected to a bit line, and the other terminal is connected to a plate electrode.

(10-1) An open bit line structure is formed by a bit line pair of adjacent cell arrays.

(10-2) One-bit information is stored in two memory cells connected to two bit lines of the same cell array, and a folded bit line structure is formed by a bit line pair.

(10-3) In the stand-by state after power-ON, all the plurality of transistors in the memory block are in ON state, and the select transistor is in OFF state.

(10-4) In selecting an arbitrary memory cell in the memory block, the select transistor is turned on while turning off the transistor of the selected cell, and keeping the transistors of the remaining cells ON.

(10-5) The plate electrode potential is fixed at (½)Vcc or a constant voltage after power-ON in both the stand-by state and active state. In addition, no cell data refresh operation is performed.

(10-6) The plate electrode potential is set at 0V in the stand-by state after power-ON and changed within the range of 0V and Vcc in reading/writing data from/into selecting a cell.

(10-7) The bit line is precharged to 0V before cell data is read out.

(10-8) The bit line is precharged to Vcc before cell data is read out.

(10-9) The dummy cell has the same circuit structure as that of the memory cell in the memory block.

(10-10) The capacitor area of the dummy cell is 1.5 to 3 times larger than that of a normal cell.

(10-11) The dummy cell uses a paraelectric capacitor.

(10-12) The ferroelectric capacitor of each memory cell is constituted by connecting a plurality of ferroelectric capacitors in parallel.

(10-13) The ferroelectric capacitor of each memory cell is constituted by connecting a plurality of ferroelectric capacitors having different thicknesses in parallel.

(10-14) The ferroelectric capacitor of each memory cell is constituted by connecting a plurality of ferroelectric capacitors having different coercive voltages in parallel.

(10-15) The ferroelectric capacitor of each memory cell is constituted by connecting a plurality of ferroelectric capacitors and at least one capacitor and p-n junction voltage drop element.

(10-16) The ferroelectric capacitor of each memory cell is constituted by connecting a plurality of ferroelectric capacitors and at least one resistance element.

(10-17) The ferroelectric capacitor of each memory cell is constituted by connecting a first ferroelectric capacitor and a resistance element in series, and connecting a second ferroelectric capacitor to the series connected elements in parallel.

(10-18) According to (10-12) to (10-17), each of the plurality of ferroelectric capacitors of each memory cell stores 1-bit information.

(10-19) According to (10-14) and (10-15), each of the plurality of ferroelectric capacitors of each memory cell stores 1-bit information, and 1-bit data is read out from or written in each of the plurality of ferroelectric capacitors by changing the voltage to be applied to the ferroelectric capacitor.

(10-20) According to (10-14) and (10-15), each of the plurality of ferroelectric capacitors of each memory cell stores 1-bit information. In reading, a low voltage is applied to the ferroelectric capacitor to read out polarization charges of one of the plurality of ferroelectric capacitors, and the readout information is stored outside the cell array. Next, the applied voltage is raised to read out polarization charges of one of the remaining ferroelectric capacitors. In writing, the voltage is sequentially lowered and applied to the ferroelectric capacitors in an opposite order to that in reading, thereby performing writing.

(10-21) According to (10-12) to (10-17), the sense amplifier has a temporary storage memory.

(10-22) According to (10-13), the difference in thickness among the ferroelectric capacitors is preferably 3 or more times.

(10-23) According to (10-14), the difference in coercive voltage among the ferroelectric capacitors is preferably 3 or more times.

(11) According to (10), wherein said select transistors includes first and second select transistors connected in series.

(11-1) An open bit line structure is formed by a bit line pair of adjacent cell arrays.

(11-2) A bit line pair of the same cell array are used to turn on only the first and second select transistors connected to one of the two bit lines in reading/writing cell data, thereby forming a folded bit line structure.

(11-3) In the stand-by state after power-ON, all the plurality of transistors in the memory blocks are ON, and one of the first and second select transistors is OFF.

(11-4) In selecting an arbitrary memory cell in the memory block, both the first and second select transistor are turned on while turning off the transistor of the selected cell, and keeping the transistors of the remaining cells ON.

(11-5) The plate electrode potential is fixed at (½)Vcc or a constant voltage after power-ON in both the stand-by state and active state. In addition, no cell data refresh operation is performed.

(11-6) The plate electrode potential is set at 0V in the stand-by state after power-ON and changed within the range of 0V and Vcc in reading/writing data in selecting a cell.

(11-7) The bit line is precharged to 0V before cell data is read out.

(11-8) The bit line is precharged to Vcc before cell data is read out.

(11-9) The dummy cell has the same circuit structure as that of the memory cell in the memory block.

(11-10) The capacitor area of the dummy cell is 1.5 to 3 times larger than that of a normal cell.

(11-11) The dummy cell uses a paraelectric capacitor.

(11-12) The ferroelectric capacitor of each memory cell is constituted by connecting a plurality of ferroelectric capacitors in parallel.

(11-13) The ferroelectric capacitor of each memory cell is constituted by connecting a plurality of ferroelectric capacitors having different thicknesses in parallel.

(11-14) The ferroelectric capacitor of each memory cell is constituted by connecting a plurality of ferroelectric capacitors having different coercive voltages in parallel.

(11-15) The ferroelectric capacitor of each memory cell is constituted by connecting a plurality of ferroelectric capacitors and at least one voltage drop element.

(11-16) The ferroelectric capacitor of each memory cell is constituted by connecting a plurality of ferroelectric capacitors and at least one resistance element.

(11-17) The ferroelectric capacitor of each memory cell is constituted by connecting a first ferroelectric capacitor and a resistance element in series, and connecting a second ferroelectric capacitor to the series connected elements in parallel.

(11-18) According to (11-12) to (11-17), each of the plurality of ferroelectric capacitors of each memory cell stores 1-bit information.

(11-19) According to (11-12) to (11-15), each of the plurality of ferroelectric capacitors of each memory cell stores 1-bit information, and 1-bit data is read out from or written in each of the plurality of ferroelectric capacitors by changing the voltage to be applied to the ferroelectric capacitor.

(11-20) According to (11-13) and (11-14), each of the plurality of ferroelectric capacitors of each memory cell stores 1-bit information. In reading, a low voltage is applied to the ferroelectric capacitor to read out polarization charges of one of the plurality of ferroelectric capacitors, and the readout information is stored outside the cell array. Next, the applied voltage is raised to read out polarization charges of one of the remaining ferroelectric capacitors. In writing, the voltage is sequentially lowered and applied to the ferroelectric capacitors in an opposite order to that in reading, thereby performing writing.

(11-21) According to (11-12) to (11-17), the sense amplifier has a temporary storage memory.

(11-22) According to (11-13), the difference in thickness among the ferroelectric capacitors is preferably 3 or more times.

(11-23) According to (11-14), the difference in coercive voltage among the ferroelectric capacitors is preferably 3 or more times.

(12) According to (10), said select transistors includes first to fourth select transistors connected in series, one terminal of each of two memory cell blocks is connected to the same bit line, and the other terminal is connected to said plate electrode.

(12-1) A bit line pair of the same cell array are used to turn on all of four series connected select transistors only in one of four cell blocks connected to the bit line pair in reading/writing cell data, thereby forming a folded bit line structure.

(12-2) In the stand-by state after power-ON, all the plurality of transistors in the memory block are ON, and one of the first to fourth select transistors are OFF.

(12-3) In selecting an arbitrary memory cell in the memory block, all the first to fourth select transistors are turned on while turning off the transistor of the selected cell, and keeping the transistors of the remaining cells ON.

(12-4) The plate electrode potential is fixed at (½)Vcc or a constant voltage after power-ON in both the stand-by state and active state. In addition, no cell data refresh operation is performed.

(12-5) The plate electrode potential is set at 0V in the stand-by state after power-ON and changed within the range of 0V and Vcc in reading/writing data in selecting a cell.

(12-6) The bit line pitch is twice the cell pitch.

(12-7) The dummy cell has the same circuit structure as that of the memory cell in the memory block.

(12-8) The capacitor area of the dummy cell is 1.5 to 3 times larger than that of a normal cell.

(12-9) The dummy cell uses a paraelectric capacitor.

(12-10) The ferroelectric capacitor of each memory cell is constituted by connecting a plurality of ferroelectric capacitors in parallel.

(12-11) The ferroelectric capacitor of each memory cell is constituted by connecting a plurality of ferroelectric capacitors having different thicknesses in parallel.

(12-12) The ferroelectric capacitor of each memory cell is constituted by connecting a plurality of ferroelectric capacitors having different coercive voltages in parallel.

(12-13) The ferroelectric capacitor of each memory cell is constituted by connecting a plurality of ferroelectric capacitors and at least one voltage drop element.

(12-14) The ferroelectric capacitor of each memory cell is constituted by connecting a plurality of ferroelectric capacitors and at least one resistance element.

(12-15) The ferroelectric capacitor of each memory cell is constituted by connecting a first ferroelectric capacitor and a resistance element in series, and connecting a second ferroelectric capacitor to the series connected elements in parallel.

(12-16) According to (12-10) to (12-15), each of the plurality of ferroelectric capacitors of each memory cell stores 1-bit information.

(12-17) According to (12-10) to (12-13), each of the plurality of ferroelectric capacitors of each memory cell stores 1-bit information, and 1-bit data is read out from or written in each of the plurality of ferroelectric capacitors by changing the voltage to be applied to the ferroelectric capacitor.

(12-18) According to (12-10) and (12-13), each of the plurality of ferroelectric capacitors of each memory cell stores 1-bit information. In reading, a low voltage is applied to the ferroelectric capacitor to read out polarization charges of one of the plurality of ferroelectric capacitors, and the readout information is stored outside the cell array. Next, the applied voltage is raised to read out polarization charges of one of the remaining ferroelectric capacitors. In writing, the voltage is sequentially lowered and applied to the ferroelectric capacitors in an opposite order to that in reading, thereby performing writing.

(12-19) According to (12-10) to (12-15), the sense amplifier has a temporary storage memory.

(12-20) According to (12-11), the difference in thickness among the ferroelectric capacitors is at least 3 or more times.

(12-21) According to (12-12), the difference in coercive voltage among the ferroelectric capacitors is at least 3 or more times.

(13) A semiconductor memory device comprises: a plurality of memory cells, said memory cell being constituted by a first transistor having a source terminal and a drain terminal, a first ferroelectric capacitor which has a first terminal connected to said source terminal of said first transistor and a second terminal connected to said drain terminal and stores first data, a second transistor connected in series to said first transistor, and a second ferroelectric capacitor which is connected in parallel to a series connected portion of said first and second transistors and stores second data, said memory cell storing 2-bit data, wherein said plurality of memory cells are connected in series, and one or more select transistors are connected to at least one terminal of said series connected portion to constitute a memory cell block, and a plurality of memory cell blocks are arranged to constitute a cell array.

(14) According to any one of (7) to (14), a dummy cell in a dummy cell block corresponding to a memory cell block has a transistor, and a ferroelectric or paraelectric capacitor connected between a source and drain terminals of said transistor, said dummy cell block is constituted by connecting a plurality of dummy cells in series and connecting at least one first and at least one second select transistors connected in series to one terminal of said series connected portion, the other terminal of said first select transistor is connected to a first bit line, and the other terminal of said second select transistor is connected to a second bit line.

(14-1) An area of a capacitor of the dummy cell is 1.5 to 3 or more times.

(15) A method of driving a semiconductor memory device which comprises a plurality of memory cells each having a transistor having a source terminal and a drain terminal and a ferroelectric capacitor having a first terminal connected to said source terminal and a second terminal connected to said drain terminal, a predetermined number of memory cells being connected in series to constitute a memory cell block, and has a random access function, comprises the steps of: the first step of turning on transistors of said plurality of memory cells in said memory cell block; and the second step of setting a transistor of any one of said plurality of memory cells in said memory cell block in an OFF state to select the memory cell, and writing/reading data in/from said selected cell.

(16) A method of driving a semiconductor memory device which comprises a plurality of memory cells each having a transistor having a source terminal and a drain terminal and a ferroelectric capacitor having a first terminal connected to said source terminal and a second terminal connected to said drain terminal, a predetermined number of memory cells being connected in series to constitute a memory cell block, and has a random access function, comprises the steps of: the first step of turning on transistors of said plurality of memory cells in said memory cell block; the second step of setting a transistor of any one of said plurality of memory cells in said memory cell block in an OFF state to select the memory cell, and applying, to said selected memory cell, a voltage higher than a first minimum coercive voltage of coercive voltages of said ferroelectric capacitors, thereby reading out information stored in said ferroelectric capacitor having the first coercive voltage; the third step of writing a voltage higher than the first coercive voltage in said selected memory cell; the fourth step of applying a voltage higher than a second coercive voltage higher than the first coercive voltage to said selected memory cell, thereby reading out information stored in said ferroelectric capacitor having the second coercive voltage; and the fifth step of writing a voltage higher than the second coercive voltage in said selected memory cell.

(16-1)Reading/writing of data is performed in the order of the first step, the second step, the fourth step, the fifth step, the third step, and the first step.

(16-2) Writing of data is performed in the order of the first step, the fifth step, the third step, and the first step.

As a method of manufacturing a semiconductor memory device of the present invention, the following arrangement is preferably employed.

(1) Ferroelectric capacitors are formed after formation of cell transistors, and thereafter, bit lines are formed.

(2) Bit lines are formed after formation of cell transistors, and thereafter, ferroelectric capacitors are formed.

(3) In formation of the ferroelectric capacitor, a ferroelectric film is formed on a lower electrode, and an upper electrode is formed on the resultant structure.

(4) The lower electrode of the ferroelectric capacitor contains Pt, Ti, and the like.

(5) The ferroelectric capacitor contains Bi, Sr, Ta, O, and the like, Pb, Zr, Ti, O, and the like, or Ba, Sr, Ti, O, and the like.

(6) The electrode of the ferroelectric capacitor contains Ir or $IrO_2$, or Si, Ru, O, and the like.

(7) For the lower electrode of the ferroelectric capacitor, an Si plug is formed on a diffusion layer, and a Ti/TiN/Pt layer is formed on the resultant structure.

(8) A $TiO_2$ layer is formed on the upper electrode of the ferroelectric capacitor, and an $SiO_2$ layer is formed on the resultant structure.

(9) The ferroelectric capacitor has a single crystal structure.

(10) The lattice constants of the ferroelectric capacitor and the upper or lower electrode are different from each other, so that a distortion is generated therebetween.

(11) Electrode nodes at the two terminals of the ferroelectric capacitor are simultaneously formed, and the ferroelectric film is formed between the two electrode nodes. The ferroelectric film is formed by CVD or MOCVD.

(12) The ferroelectric film is formed in a direction perpendicular or parallel to the wafer surface.

In the present invention, the following arrangement is preferable.

(1) A plurality of ferroelectric capacitor layers are stacked on the Si surface.

(2) The memory cell transistor is a depletion-type transistor.

(3) According to (2), in the stand-by state or power-OFF state, the potential of a word line as the gate of the cell transistor is 0V.

(4) In turning on the power supply, a negative potential is applied to the substrate.

(5) A substrate bias generation circuit for applying a negative potential to the substrate in turning on the power supply is formed on the chip.

(6) In turning on the power supply, the word line potential is applied, and then the plate potential is raised to (½)Vcc.

(7) In turning off the power supply, the plate potential is lowered to 0V, and then the word line potential is lowered to 0V.

(8) In turning off the power supply, the plate potential is lowered to 0V, and then the word line potential is lowered to 0V. Thereafter, the power supply is turned off.

(9) Four electrode layers contacting the source/drain diffusion layer of the cell transistor are stacked above the word line. The first and third layers are connected. A capacitor is formed between the second electrode layer and a layer formed by the first and third electrode layers. Another capacitor is formed between the third and fourth electrode layers.

(10) The bit line consists of W, Al or Cu.

(11) The bit line is arranged between adjacent ferroelectric capacitors along the word line.

(12) The bit line is formed under the ferroelectric capacitor.

(13) The bit line is formed above the ferroelectric capacitor.

(14) The upper electrode of the ferroelectric capacitor is connected to the source or drain terminal of the cell transistor through an Al interconnection.

(15) A PL (plate) electrode of the normal cell is changed in a range of 0V to Vcc, and a PL of the dummy cell is fixed to Vcc/2 or a constant voltage.

(16) The plate electrode is changed in a constant voltage range.

(17) The plate electrode is snapped by the Al or Cu wiring.

(Advantage)

The conventional FRAM has a structure as an extension of the conventional DRAM. In the present invention, the cell transistor and the ferroelectric capacitor are connected in parallel, unlike the prior art using a series connected structure. In addition, in the present invention, a plurality of memory cells are connected in series, one terminal of the series connected cells is connected to the plate electrode, and the other terminal is connected to the bit line through the select transistor.

With this structure, in the stand-by state, the gate of the cell transistor is ON, and two terminals of the ferroelectric capacitor are short-circuited because of the parallel connection and set at an equipotential. According to the conventional DRAM concept, this structure absolutely destroys accumulated information. In the ferroelectric memory, however, data is not destroyed even when the potential difference between the storage node SN and the plate electrode is set at 0V. That is, charges are not read out unless the polarization direction is reversed to that for writing. The present invention conversely exploits this unique problem of the FRAM as an advantage.

In the present invention, in the stand-by state, the two terminals of the ferroelectric capacitor are always short-circuited regardless of the operation of fixing the plate potential or changing the plate potential within the range of 0V to Vcc. Even in case of a leakage current at the p-n junction or the like, the potential difference between the two terminals of the ferroelectric capacitor is 0V, and charges corresponding to the remnant polarization amount are kept held. No polarization inversion occurs, so the data is not destroyed. Even when the cutoff current of the cell transistor or the leakage current of the ferroelectric capacitor has a large value, the cell information is not destroyed. As a result, a high-speed operation can be performed while fixing the plate potential, and simultaneously the refresh operation can be omitted, unlike the prior art.

A case wherein one of the plurality of series connected cells is to be selected will be considered. Assume that, from four series connected cells, the second cell from the plate electrode, i.e., the third cell from the bit line is to be selected. In this case, only the cell transistor of the selected memory cell is turned off, and the select transistor is turned on. The first, third, and fourth cell transistors from the plate electrode are equivalently kept ON. For this reason, one terminal of the ferroelectric capacitor of the selected memory cell is electrically connected to the plate electrode, and the other terminal is electrically connected to the bit line. Apparently, in the circuit of the present invention, the cell transistor of the conventional ferroelectric memory corresponds to the select transistor, and the ferroelectric capacitor directly corresponds to the ferroelectric capacitor. Therefore, the present invention can cope with both the conventional scheme of fixing the plate electrode at (½)Vcc and the scheme of changing the plate electrode potential within the range of 0V to Vcc.

When data is to be read/written in selecting the second memory cell from the plate electrode, the cell transistors of the unselected cell, i.e., the first, third, and fourth cells from the plate electrode are ON, and the potential between the two terminals of the ferroelectric capacitor is set at 0V, so the cell data is not destroyed. As a result, in the present invention, although the memory cells are connected in series, data can be read/written from/into an arbitrary cell. Not block access as in the conventional NAND cell but perfect random access is enabled.

In the conventional NAND cell, when the number of series connected cells increases, the bit line capacity can be decreased. However, when the number of series connected cells is too large, and data is to be read out from a cell far from the bit line, the bit line capacity increases by an amount corresponding to other cell capacities from the bit line to the target read cell. This conversely increases the bit line capacity.

In the present invention, however, the number of series connected cells can be considerably increased, and the bit line capacity can be largely decreased. This is because the two terminals of the ferroelectric capacitor of an unselected cell are short-circuited, and the capacity of the ferroelectric capacitor does not electrically appear. In addition, when the gate of the select transistor is connected to a signal line different from that of the gate of a select transistor connected to the other one of the bit line pair, no cell data is read out to the reference bit line, so that a folded bit line structure capable of reducing noise can be realized. As described above, according to the present invention, random read/write access is enabled, the bit line capacity can be decreased, and the array noise can be reduced.

For the cell structure, the gate of the cell transistor can be formed in the minimum processing size (F), and the diffusion layer and the active region for channel formation can be formed in the minimum processing size (F). Therefore, a planar transistor which can be easily manufactured can be used, and the cell size can be reduced to a size represented as follows:

$$2F \times 2F = 4F^2.$$

The ferroelectric capacitor is formed by extracting source and drain electrodes of the cell transistor upward from the diffusion layer region between the gates after formation of the transistor. One of the electrodes is used as the lower electrode of the ferroelectric capacitor, and the other is used as the upper electrode of the ferroelectric capacitor. With this structure, the ferroelectric capacitor can be connected in parallel to the cell transistor in a stack structure.

The above effects will be summarized. In the conventional nonvolatile FRAM, facilitation of manufacturing and realization of high integration cannot be simultaneously realized while maintaining the random access function, like the conventional DRAM. However, the present invention can simultaneously realize all these functions. In addition, reduction of the bit line capacity and noise reduction are also enabled. Furthermore, the high-speed operation can be maintained while employing the scheme of fixing the plate potential at (½)Vcc, and simultaneously, the refresh operation can be omitted, although it is impossible in the conventional FRAM.

When the semiconductor memory device of the present invention is applied to various systems such as a computer system, an IC card, a digital image input system, a memory system, a system LSI chip, and a mobile computer system, the performance of each system can be improved using the advantages of the semiconductor memory device. More specifically, the semiconductor memory device of the present invention can omit the refresh operation and perform a high-speed operation, and also increase the density. Therefore, the semiconductor memory device can be applied to a high-speed system having low power consumption, or a high-speed system which requires a high-temperature operation. The semiconductor memory device can also be applied to a system in a heavy stress environment or a system which requires a large-capacity memory.

As has been described above in detail, according to the present invention, the transistor and the ferroelectric capacitor are connected in parallel to constitute a memory cell of the FRAM. With this structure, a memory cell having a size (e.g., $4F^2$) smaller than $8F^2$ without using any stacked-type transistor can be realized, and simultaneously, the random access function can be maintained.

In addition, using the scheme of fixing the plate potential at ($\frac{1}{2}$)Vcc, a high-speed operation as in the DRAM can be maintained, and simultaneously, the refresh operation can be omitted.

Furthermore, the bit line capacity can be decreased. In modifications, noise reduction, relaxation of the bit line rule or sense amplifier rule, reduction of the number of sense amplifiers, an increase in readout signal amount, and storage of multi-bit data in a cell with a size of $4F^2$ are enabled.

The ferroelectric memory of the present invention can operate at a high speed and omit the refresh operation. Therefore, the ferroelectric memory can be applied to a high-speed system having low power consumption, or a high-speed system which requires a high-temperature operation. The semiconductor memory device can also be applied to a system which requires a high density in a heavy stress environment or a system which requires a large-capacity memory.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIGS. 1A to 1C are circuit diagrams showing the memory cell structures of conventional DRAM and FRAM;

FIGS. 2A and 2B are graphs showing the polarization characteristics of the DRAM and FRAM, respectively, with respect to an applied voltage;

FIGS. 5A and 5B are equivalent circuit diagrams showing the basic structures of the FRAM according to the first embodiment;

FIGS. 6A and 6B are plan and sectional views, respectively, showing a cell structure for realizing the circuit structure shown in FIG. 4;

FIGS. 7A and 7B are plan and sectional views, respectively, showing a cell structure for realizing the circuit structure shown in FIG. 4;

FIGS. 27A and 27B are plan and sectional views, respectively, showing a cell structure for realizing the circuit structure shown in FIG. 26;

FIGS. 28A and 28B are plan and sectional views, respectively, showing another cell structure for realizing the circuit structure shown in FIG. 26;

FIGS. 30A to 30C are block diagrams showing the schematic structure of an FRAM according to the 21st embodiment;

FIG. 36 is a table summarizing the major effects of the present invention;

FIG. 37 is a table summarizing the major effects of the present invention;

FIGS. 38A and 38B are circuit diagrams showing the structure of a sense amplifier portion so as to explain an FRAM according to the 23rd embodiment;

FIGS. 44A and 44B are views showing another structure of a dummy cell block shown in FIGS. 42A and 42B;

FIGS. 46A and 46B are a circuit diagram and a timing chart, respectively, showing a cell array equivalent circuit including a dummy cell according to the 26th embodiment;

FIG. 53 is a chart showing signal waveforms so as to explain the operations of the 30th and 31st embodiments;

FIGS. 63A and 63B are a circuit diagram and a timing chart, respectively, showing an equivalent circuit of an FRAM according to the 39th embodiment;

FIGS. 64A and 64B are a circuit diagram and a timing chart, respectively, showing an equivalent circuit of an FRAM according to the 40th embodiment;

FIGS. 69A and 69B are a circuit diagram and a timing chart, respectively, showing an equivalent circuit of an FRAM according to the 43rd embodiment;

FIGS. 70A and 70B are a circuit diagram and a timing chart, respectively, showing an equivalent circuit of an FRAM according to the 44th embodiment;

FIGS. 73A and 73B are a circuit diagram and a timing chart, respectively, showing an equivalent circuit of an FRAM according to the 47th embodiment;

FIGS. 89A and 89B are sectional and plan views, respectively, showing the device structure of an FRAM according to the 60th embodiment;

FIGS. 120A and 120B are a detailed circuit diagram and a timing chart, respectively, of the plate electrode driving scheme shown in FIGS. 118A and 118B;

FIGS. 121A and 121B are charts showing operations applicable to the plate electrode driving scheme shown in FIGS. 118A to 120B;

FIGS. 122A and 122B are circuit diagrams of sense amplifiers applicable to the plate electrode driving scheme shown in FIGS. 118A to 120B;

FIGS. 123A and 123B are charts showing operations applicable to the plate electrode driving scheme shown in FIGS. 118A to 120B;

FIG. 124 is a sectional view showing the device structure of an FRAM according to the 82nd embodiment;

FIG. 125 is a sectional view showing the device structure of an FRAM according to the 83rd embodiment;

FIGS. 126A and 126B are sectional views showing the device structure of an FRAM according to the 84th embodiment;

FIGS. 127A and 127B are an equivalent circuit diagram of an FRAM according to the 85th embodiment and a sectional view of the device structure, respectively;

FIG. 128 is an equivalent circuit diagram of an FRAM according to the 86th embodiment;

FIG. 129 is a sectional view showing the device structure of an FRAM according to the 87th embodiment;

FIG. 130 is an equivalent circuit diagram of an FRAM according to the 88th embodiment;

FIG. 131 is a sectional view showing the device structure of an FRAM according to the 89th embodiment;

Figure 132:
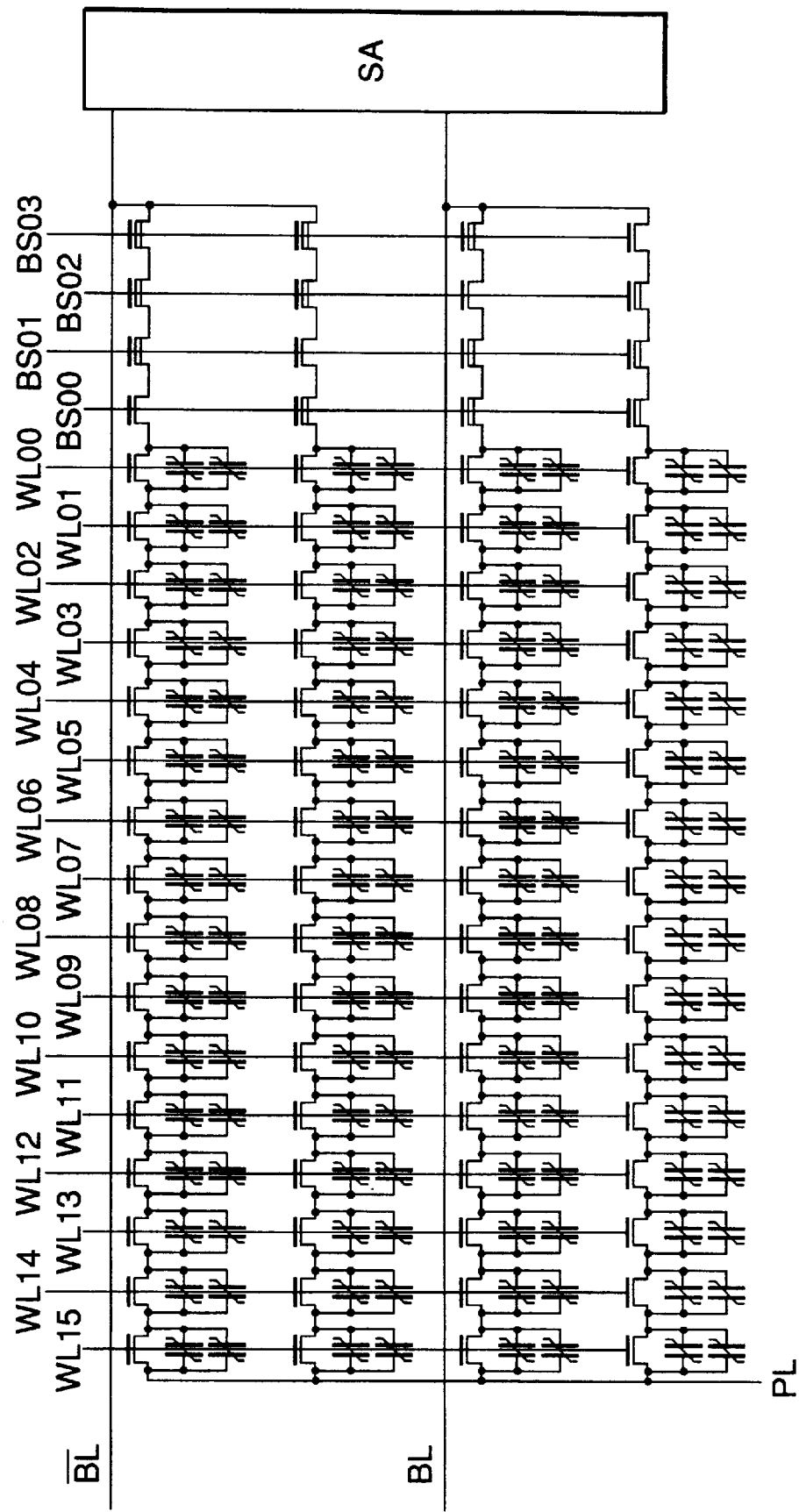
Figures 133A, 133B:
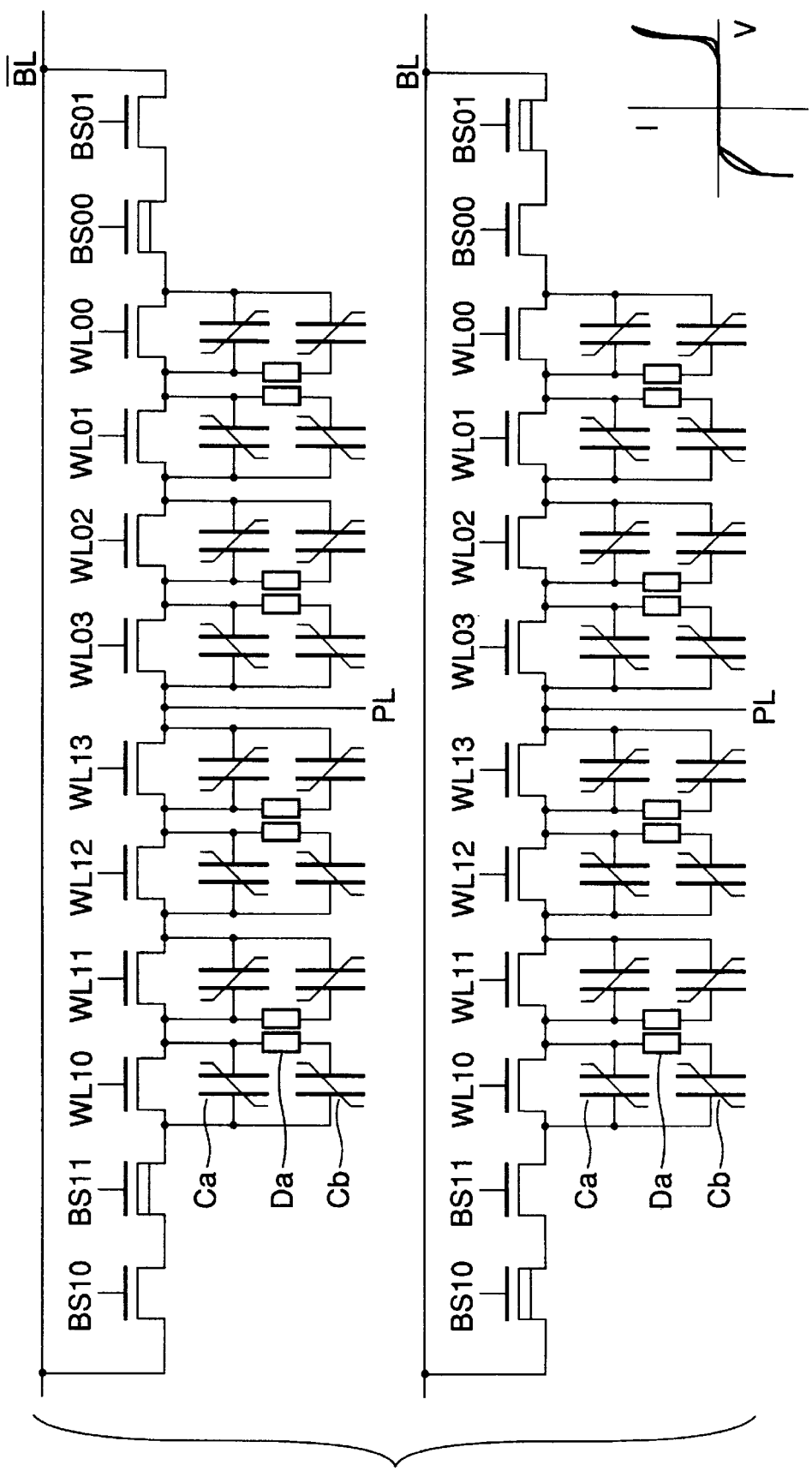
Figure 135:
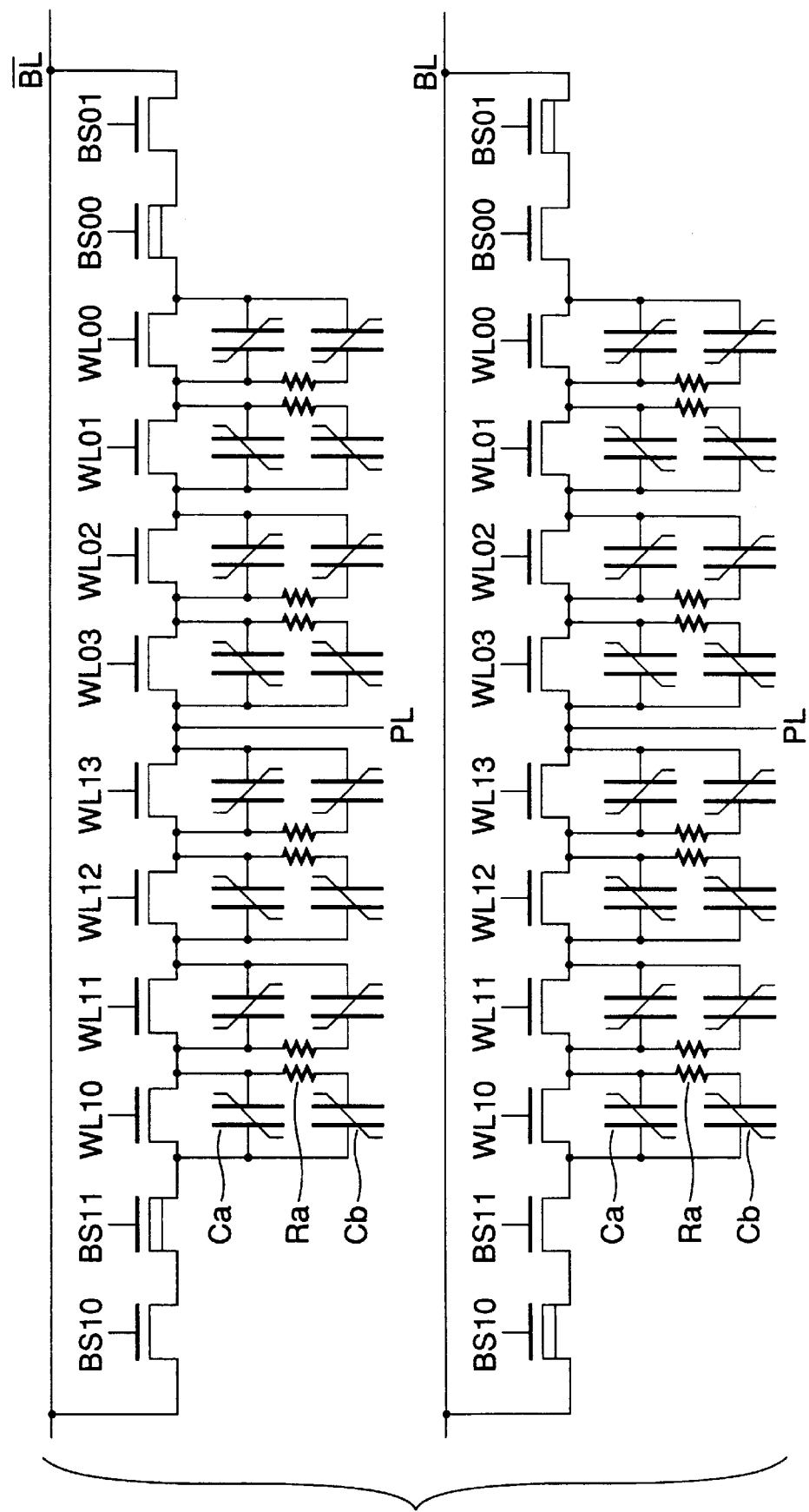
Figure 136:
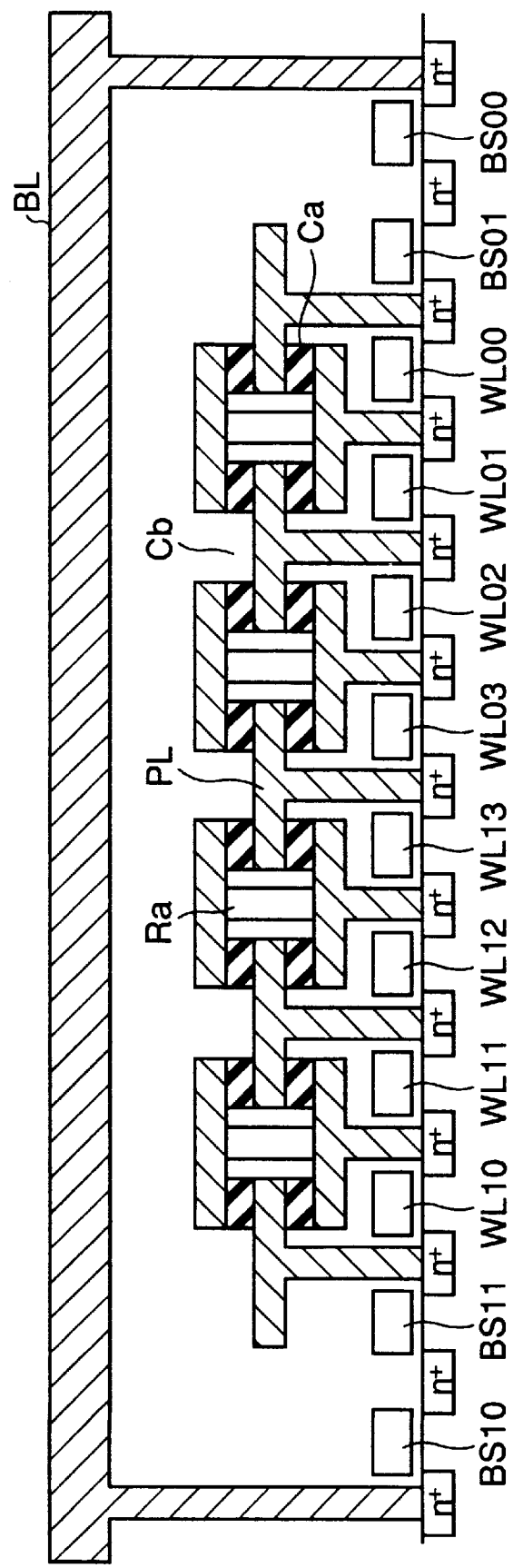
Figure 137:
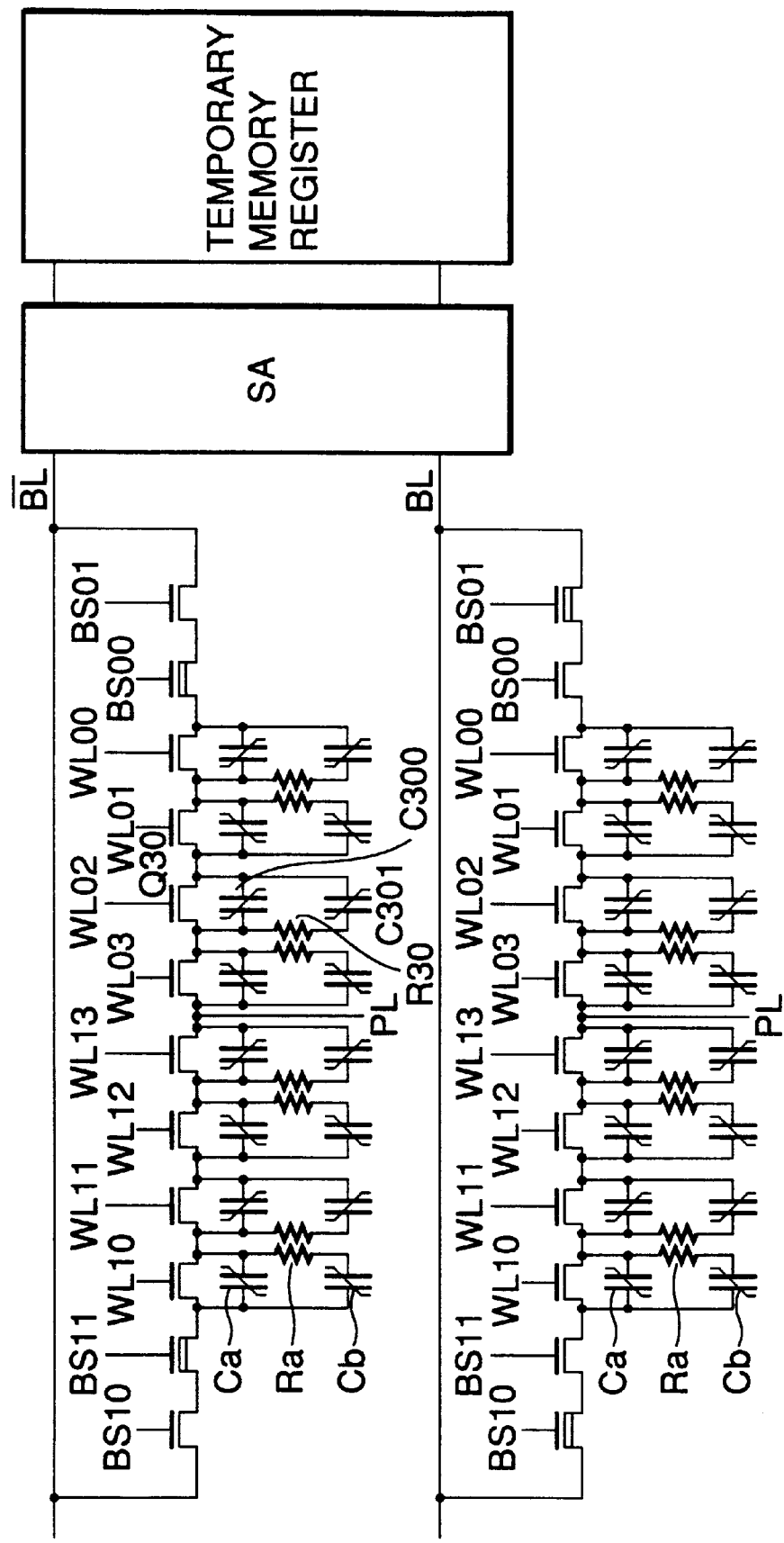
Figure 138:
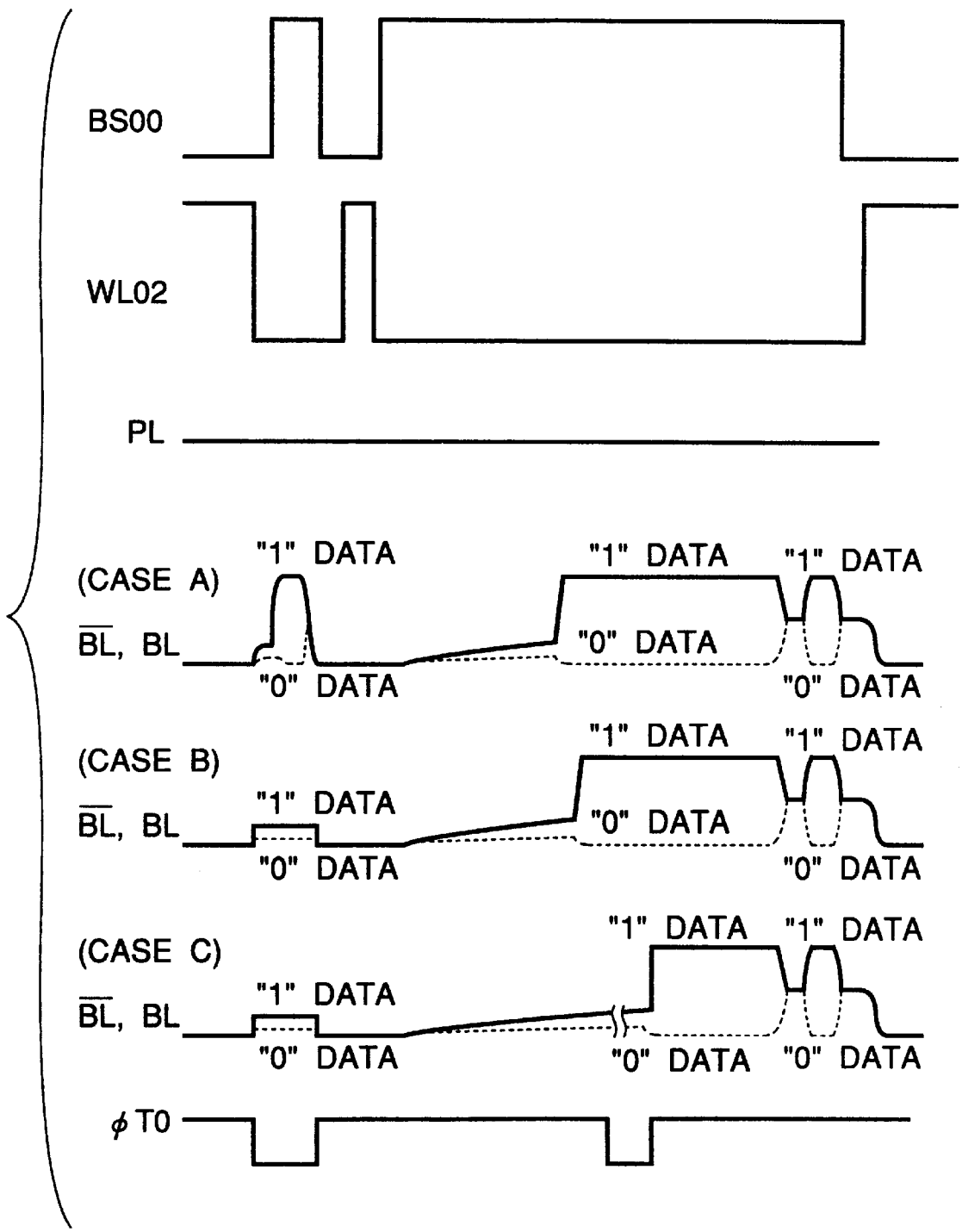
Figure 139A:
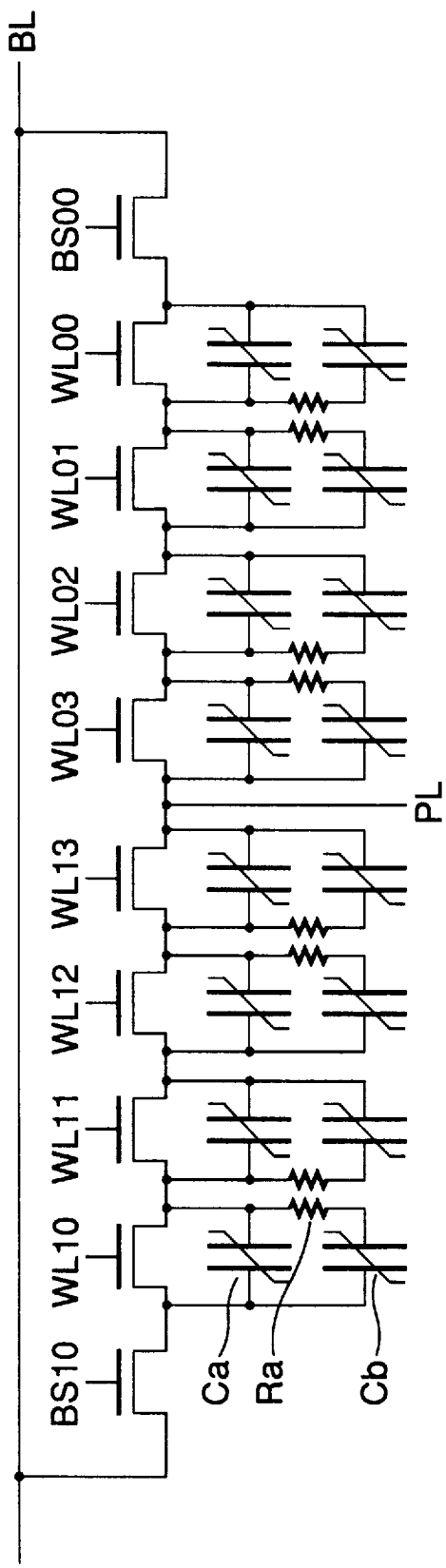
Figure 139B:
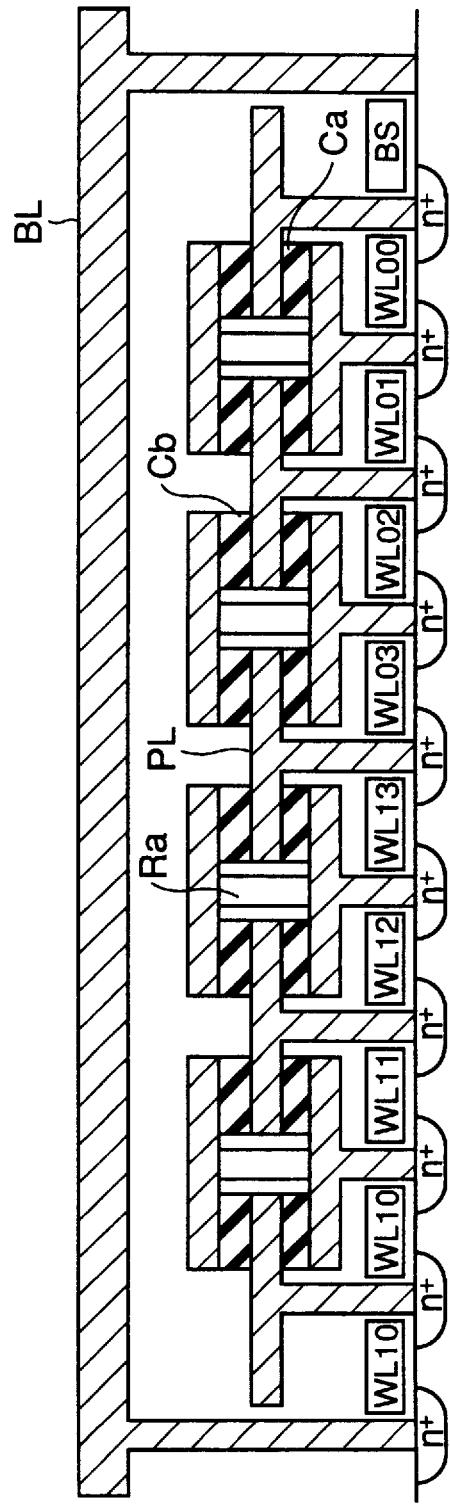
Figure 140A:
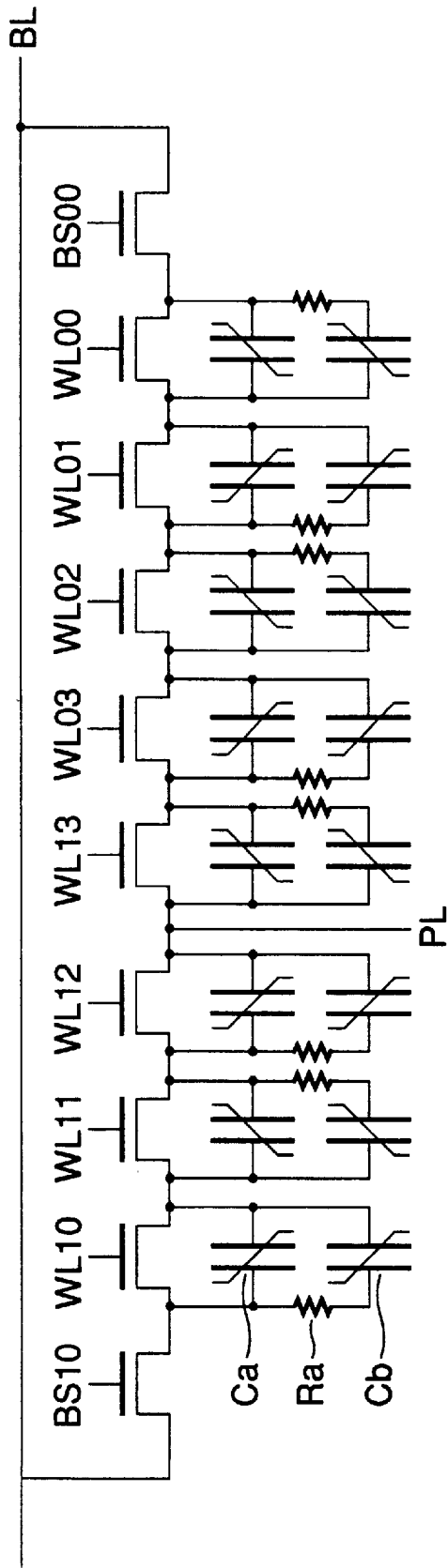
Figure 140B:
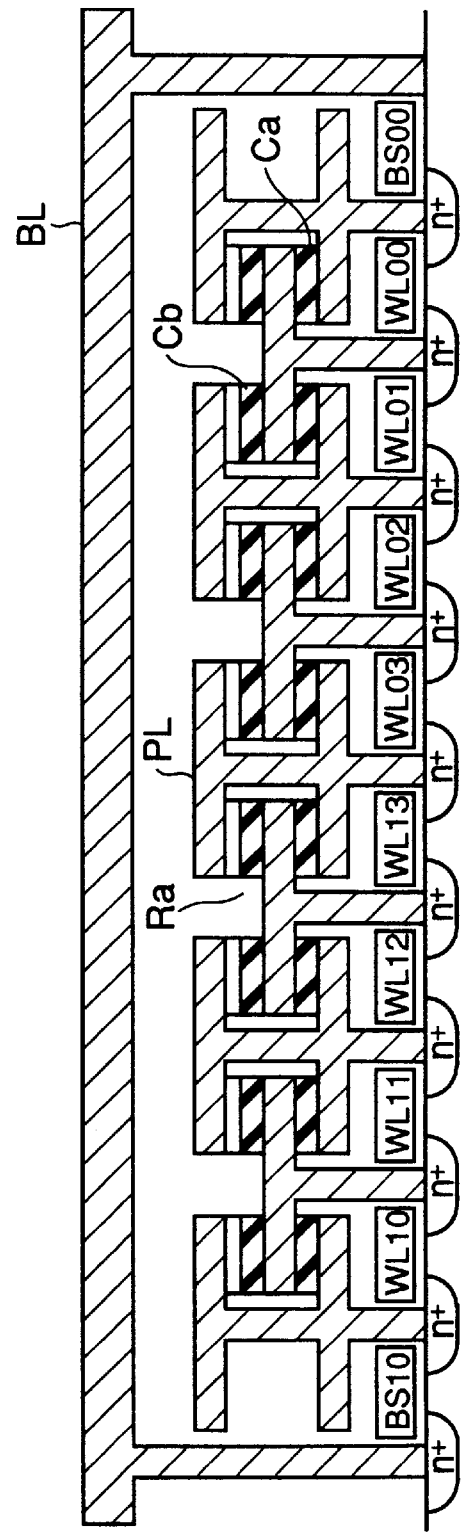
Figure 141A:
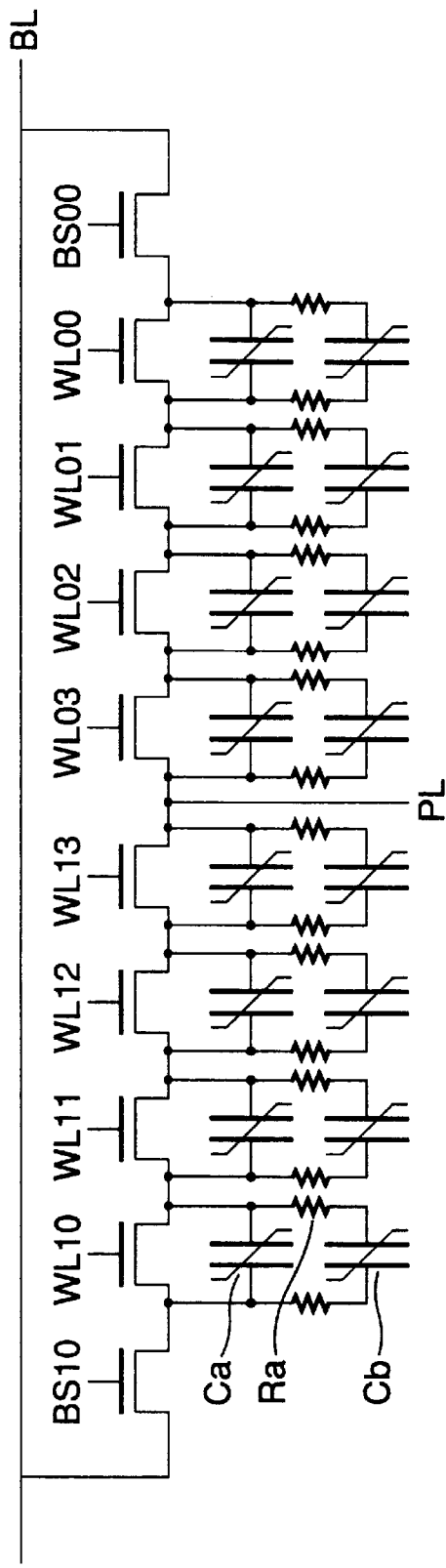
Figure 141B:
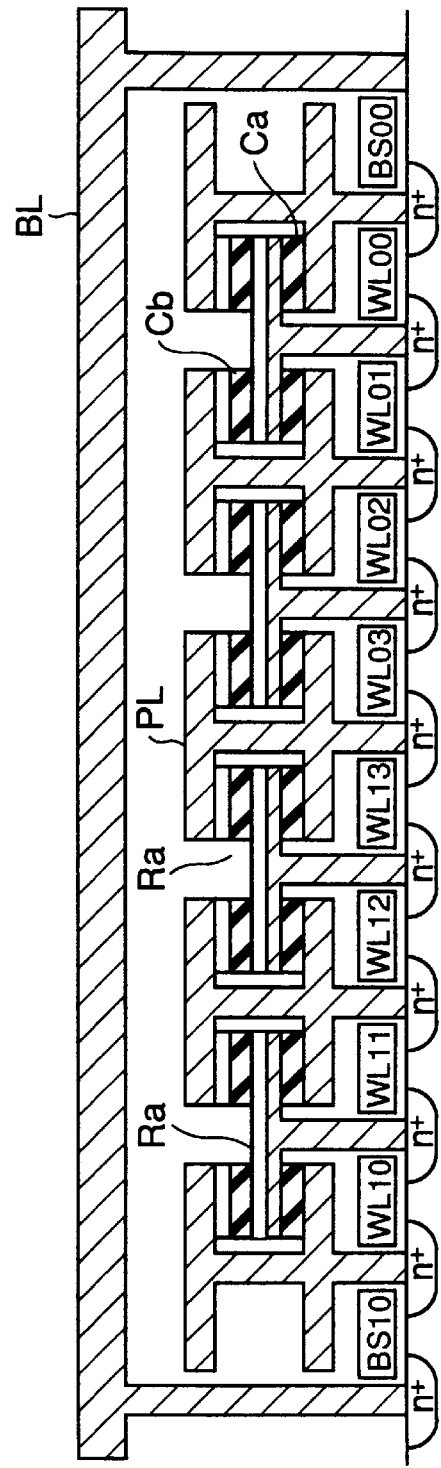
Figure 142:
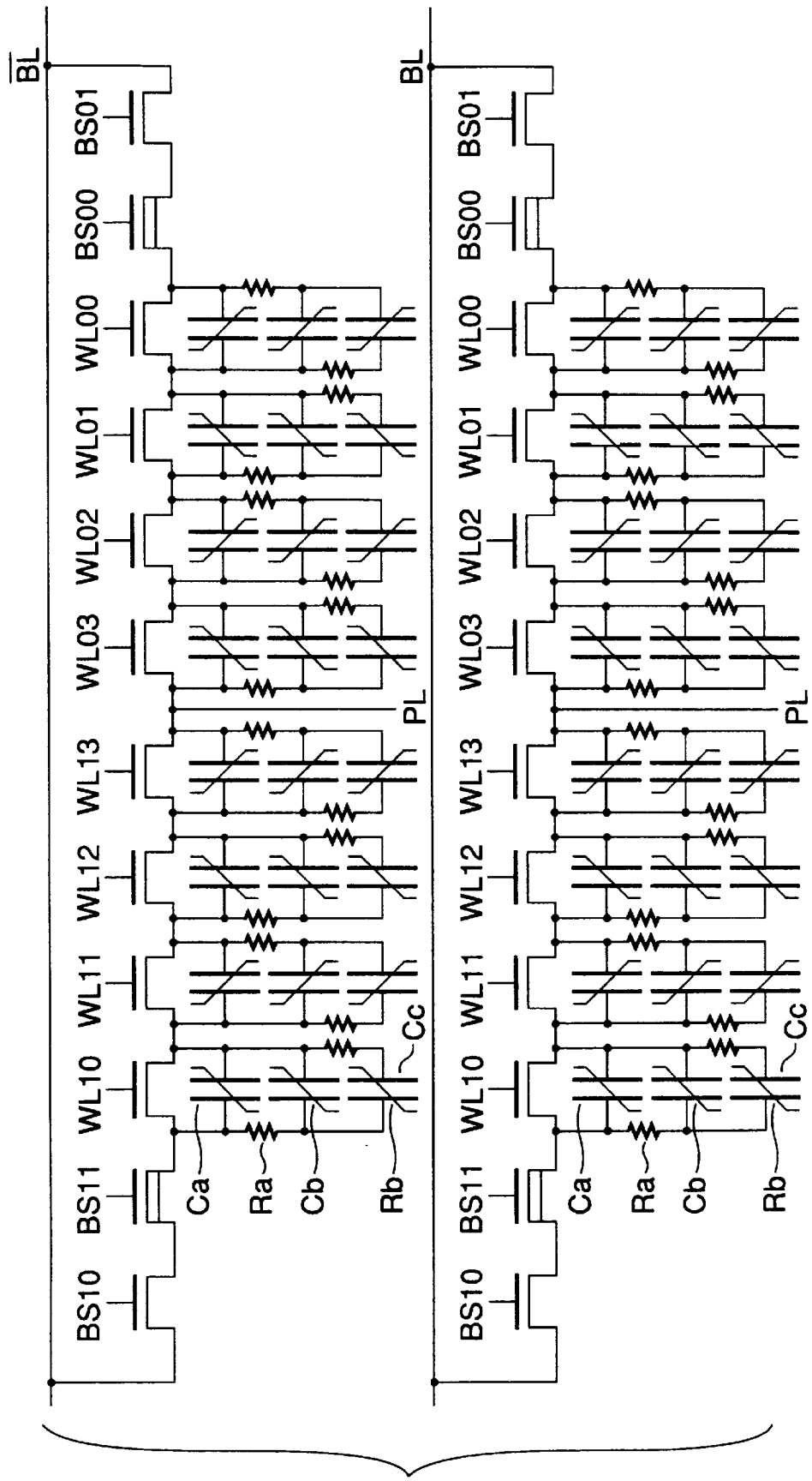
Figure 143:
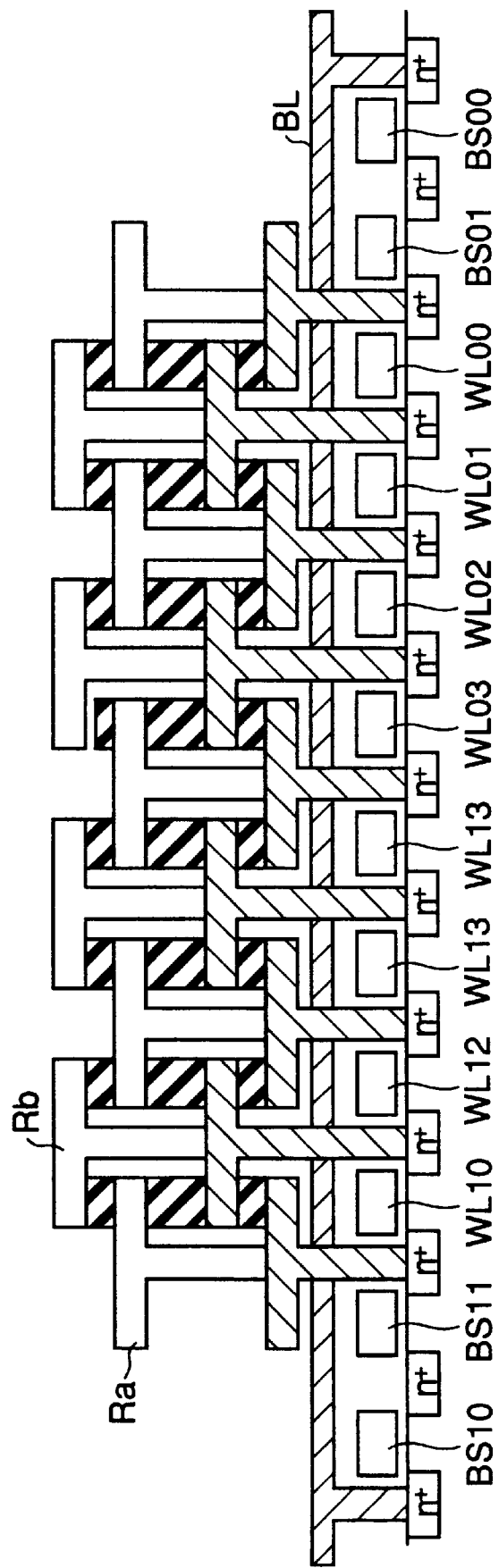
Figure 144:
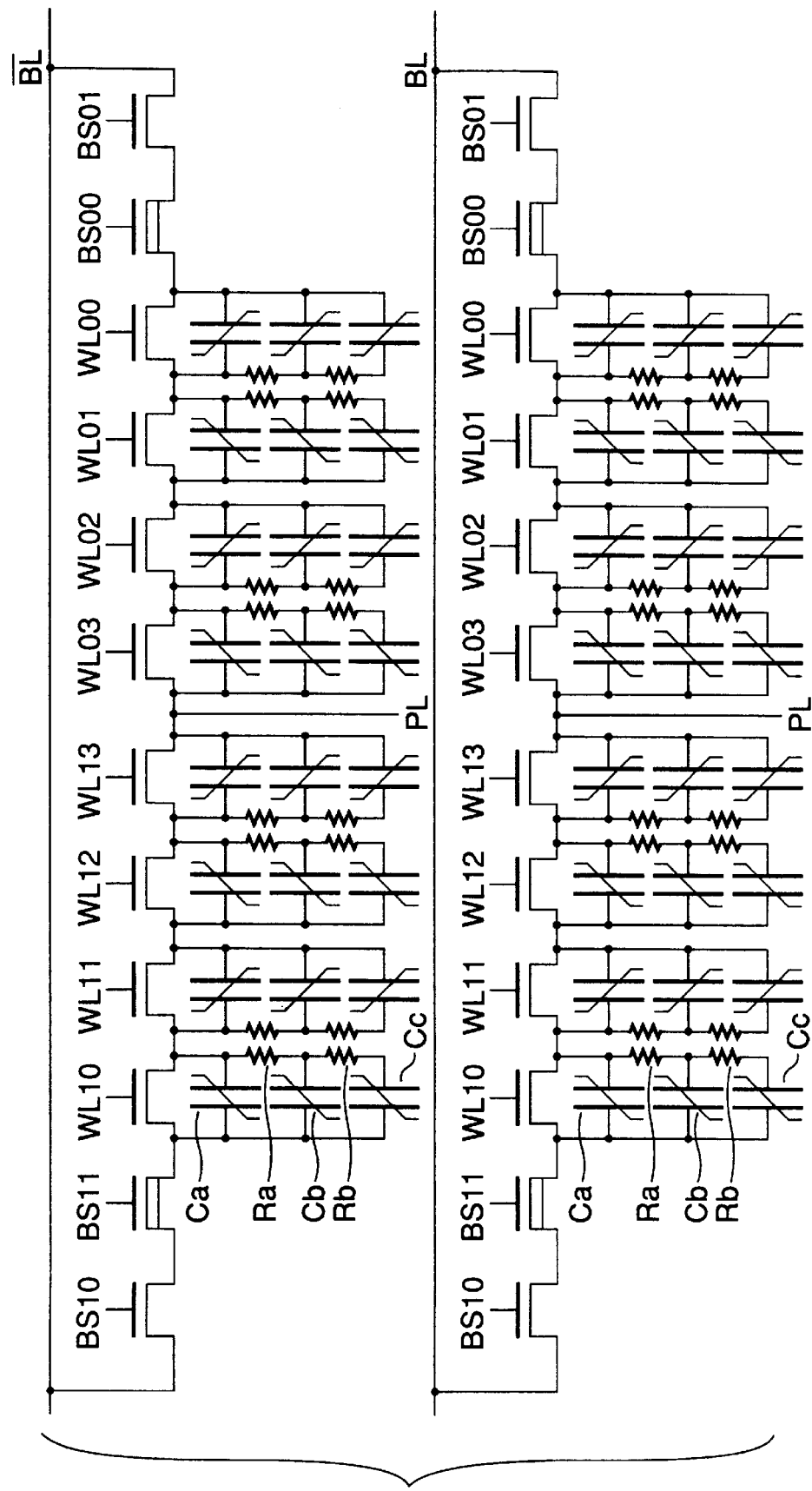
Figure 145:
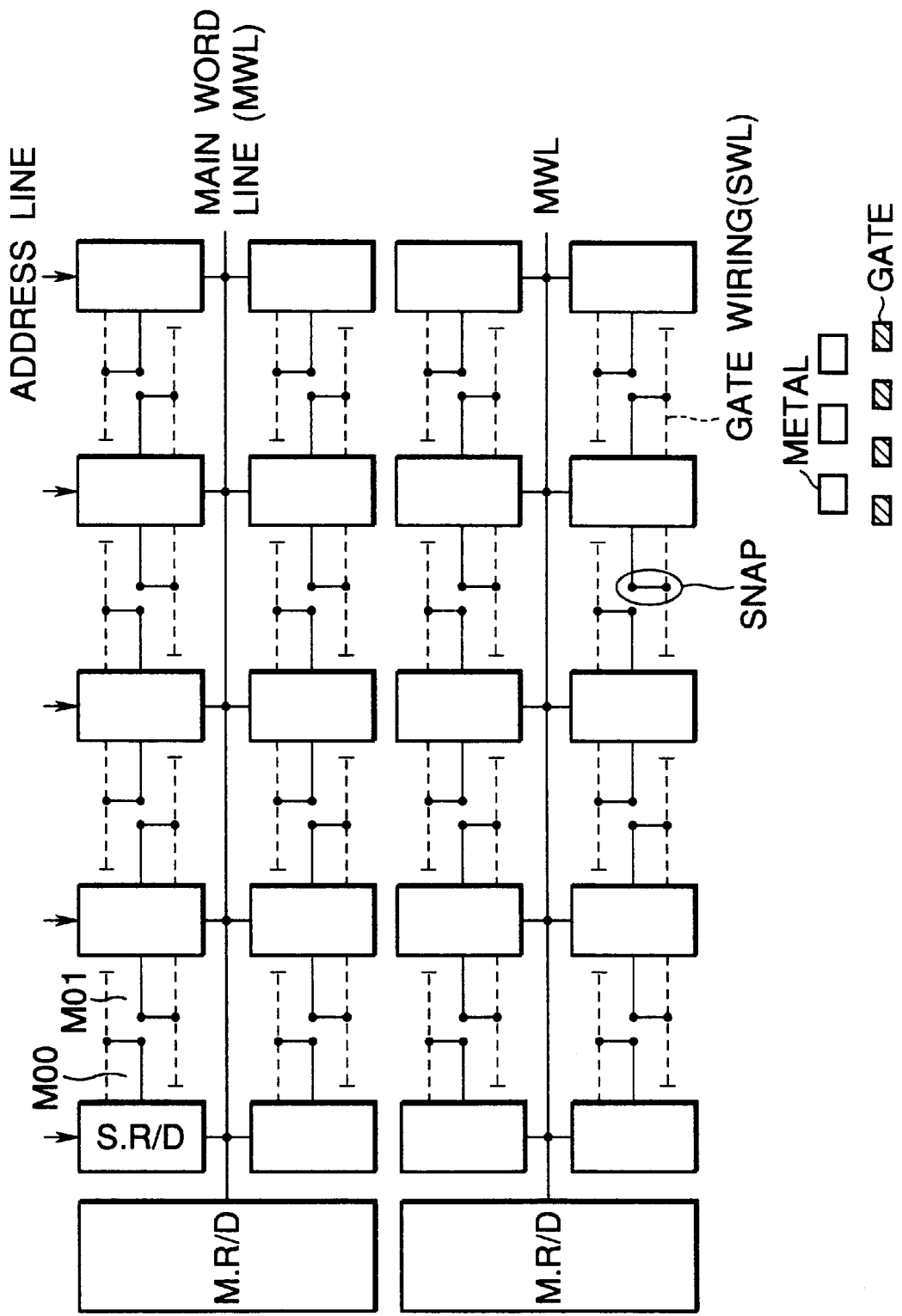
Figure 146:
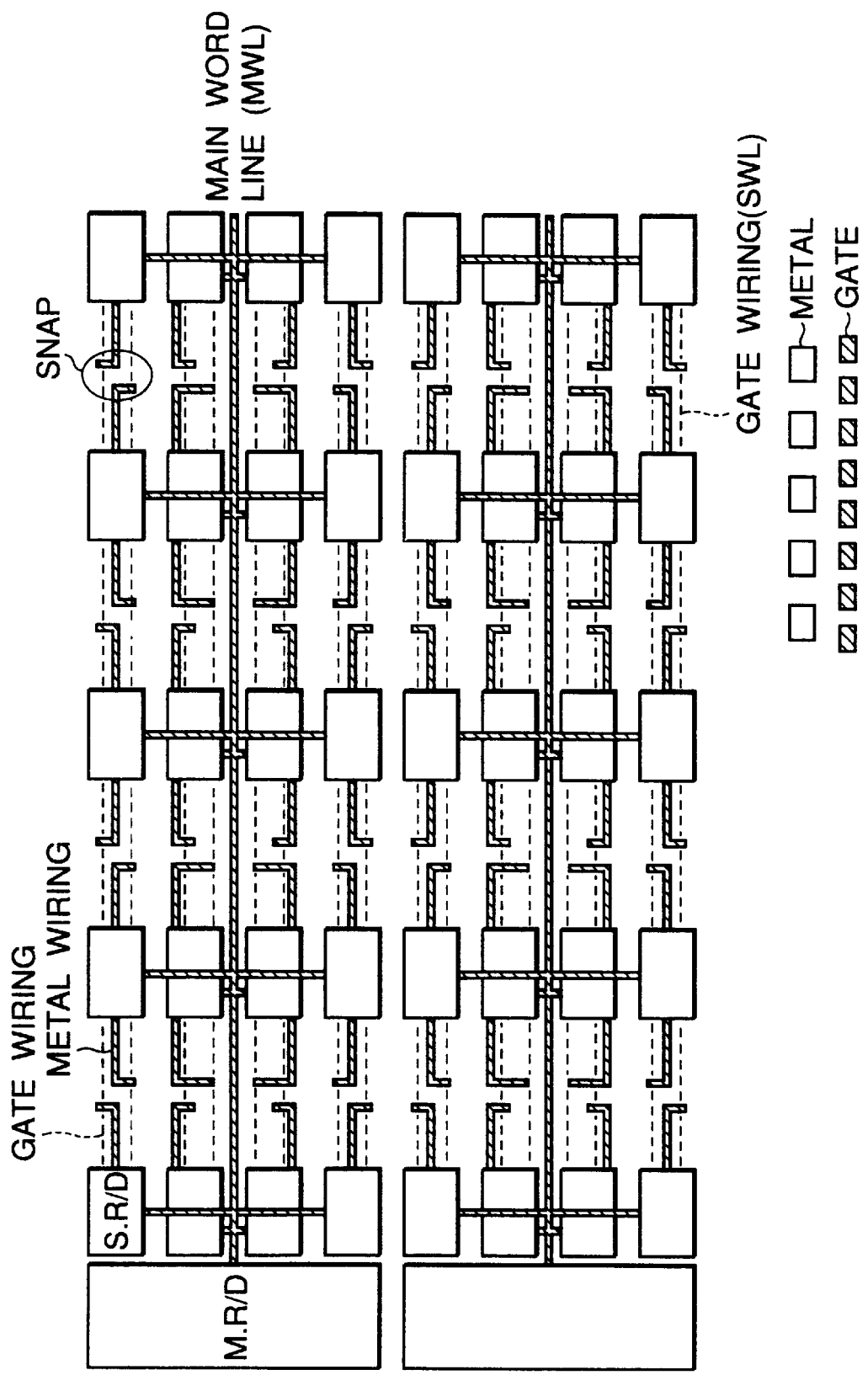
Figure 148A:
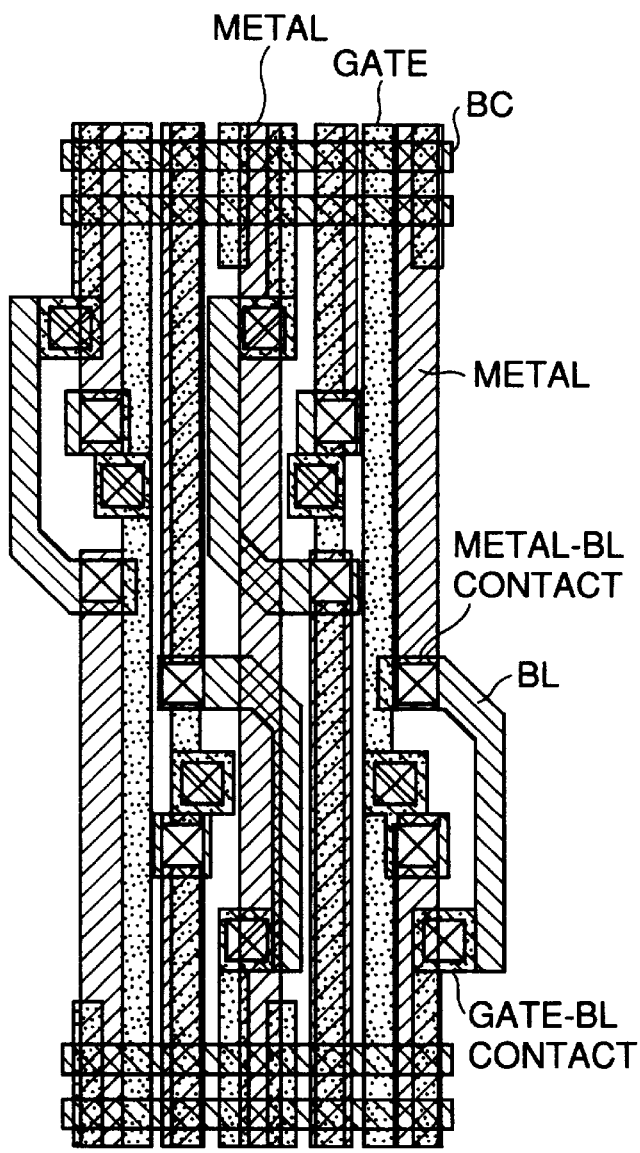
Figure 148B:
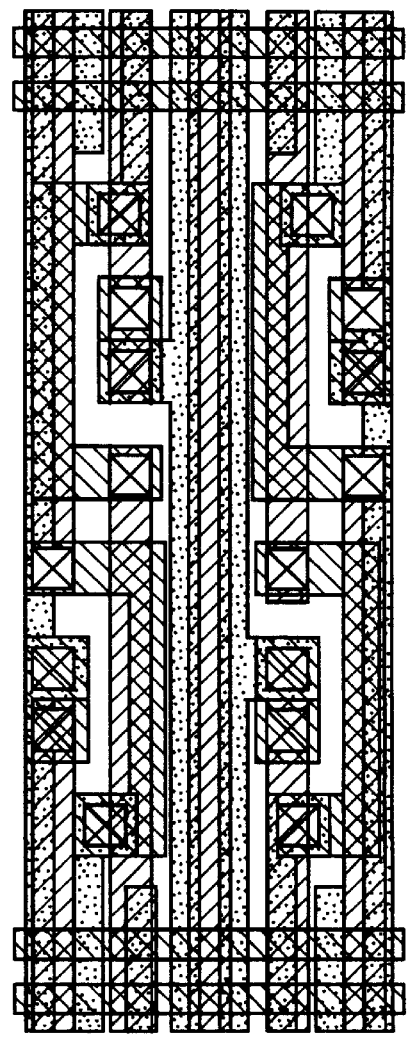
Figure 149A:
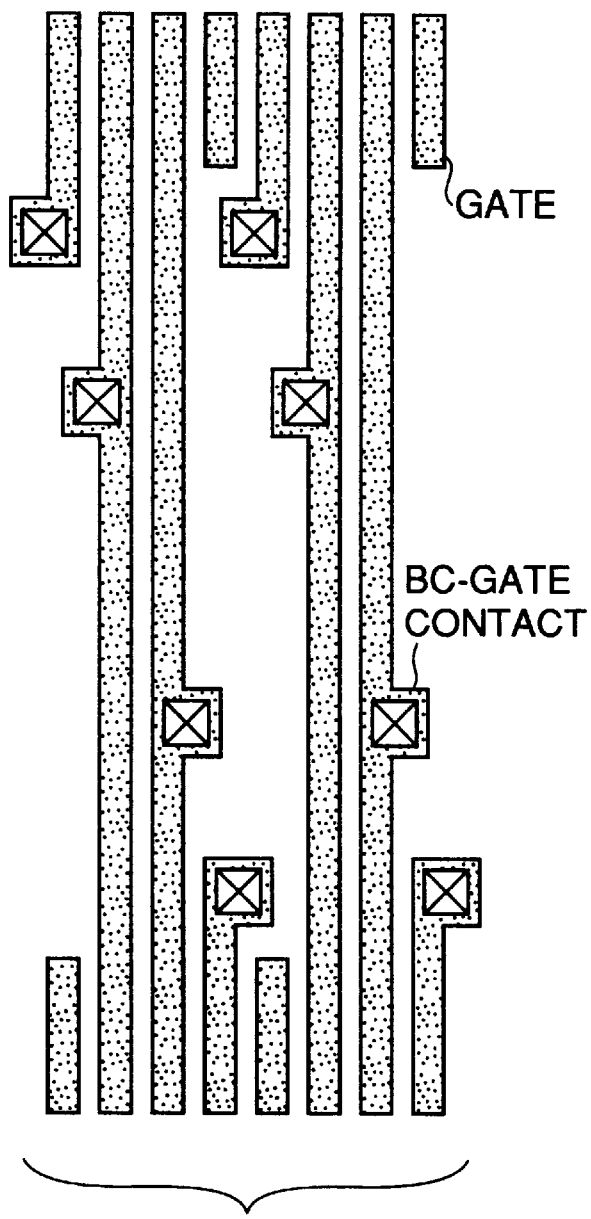
Figure 149B:
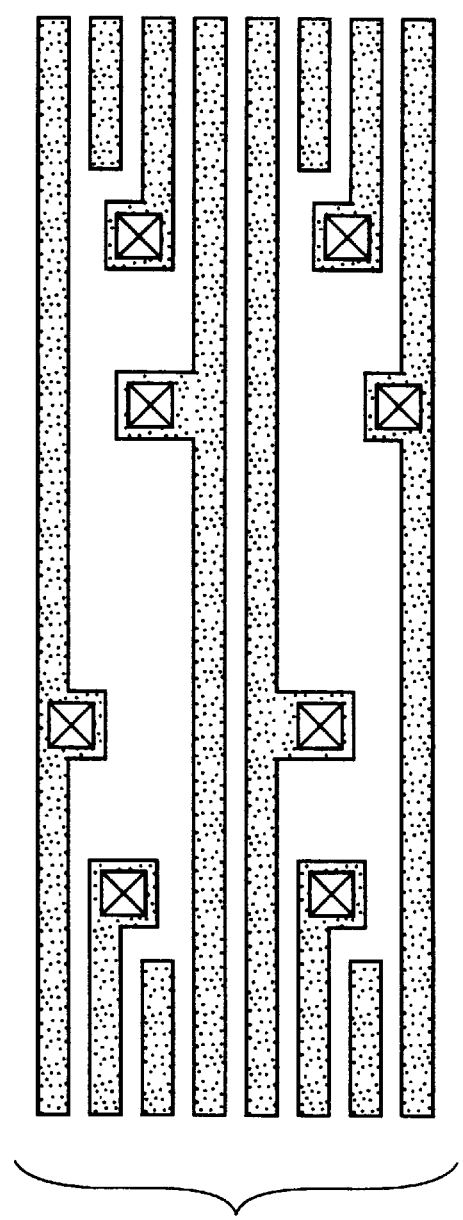
Figure 150A:
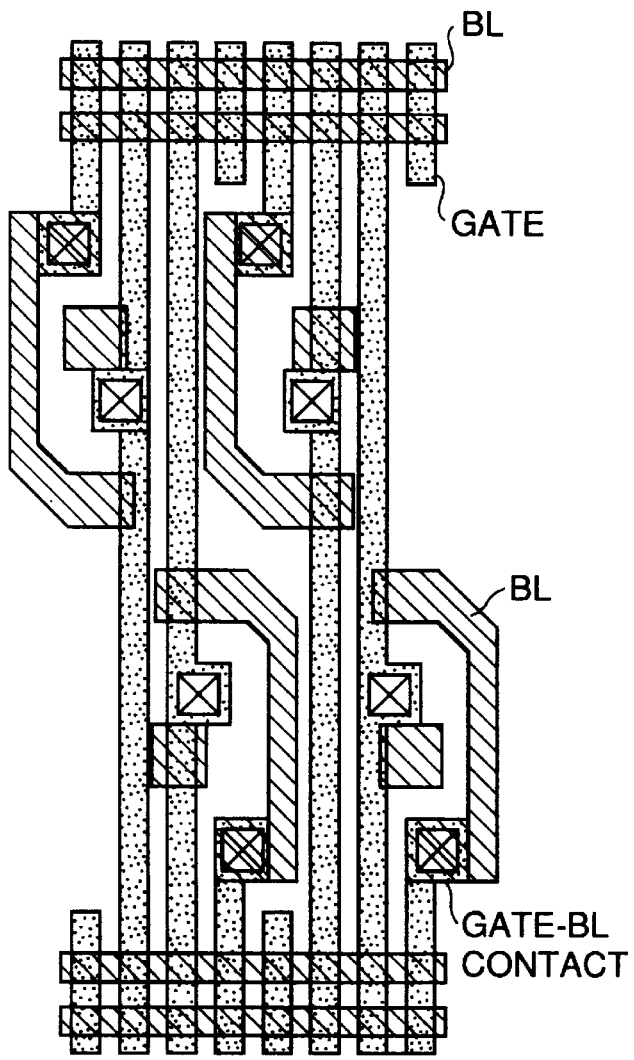
Figure 150B:
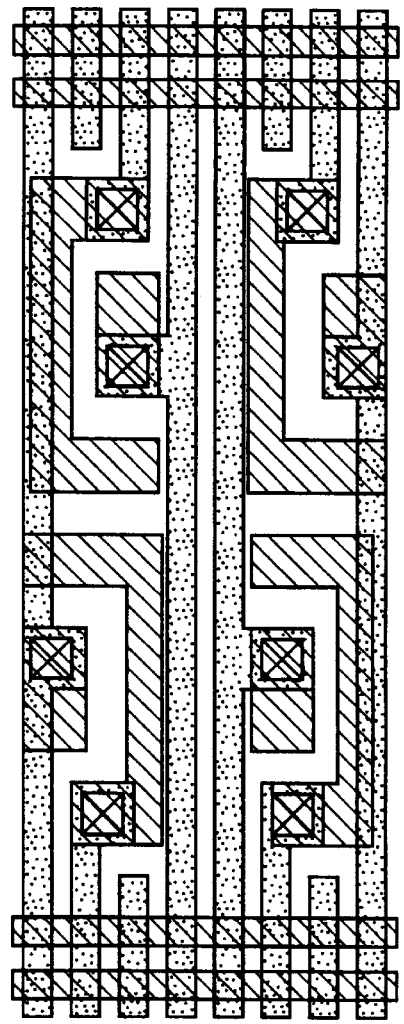
Figure 151A:
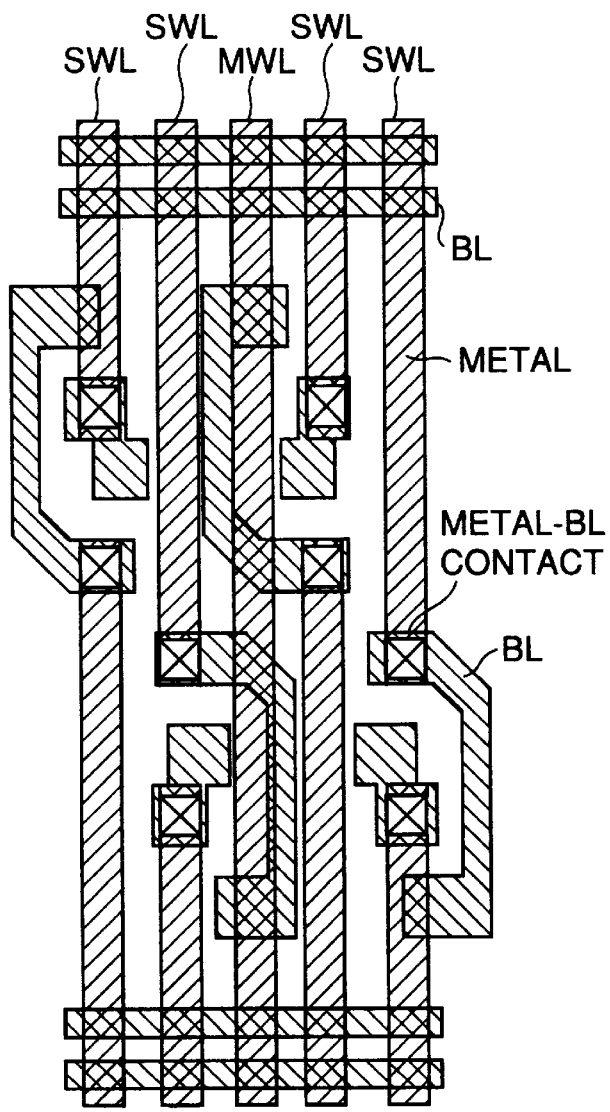
Figure 151B:
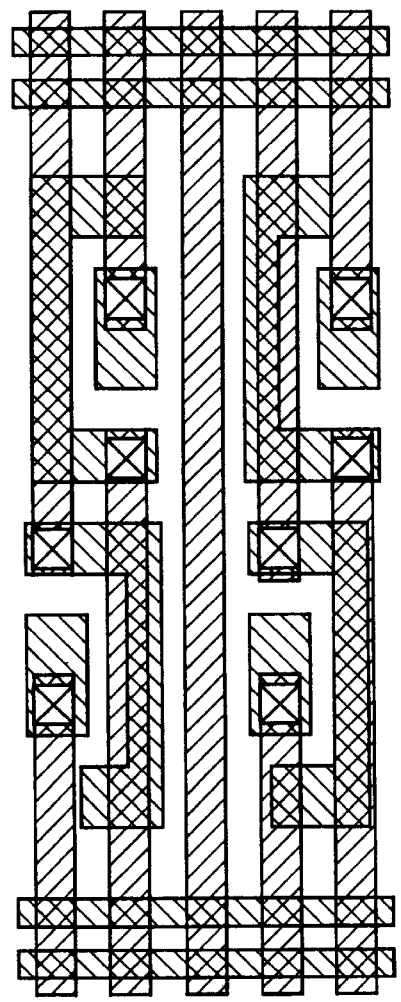
Figure 152:
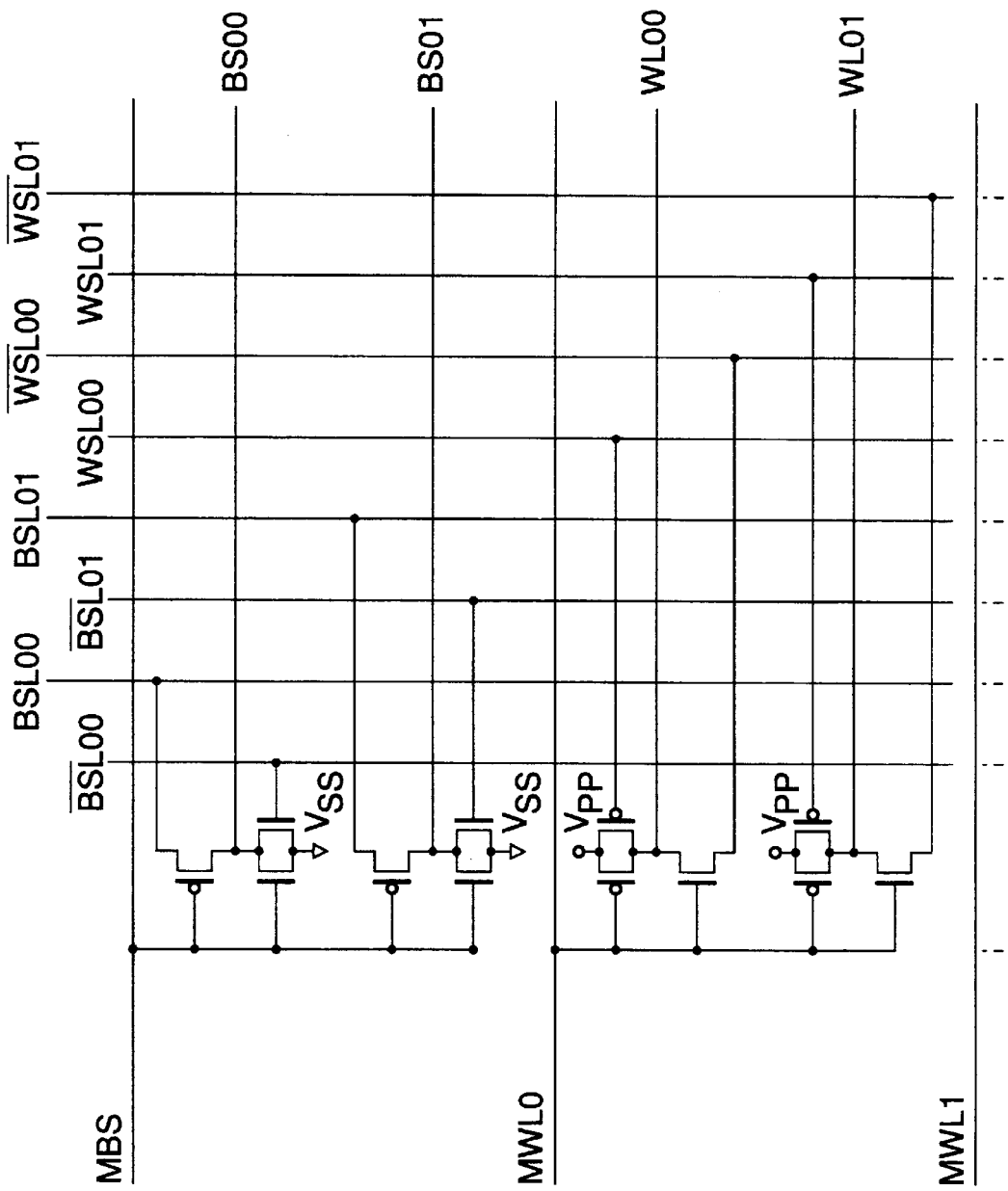
Figure 154:
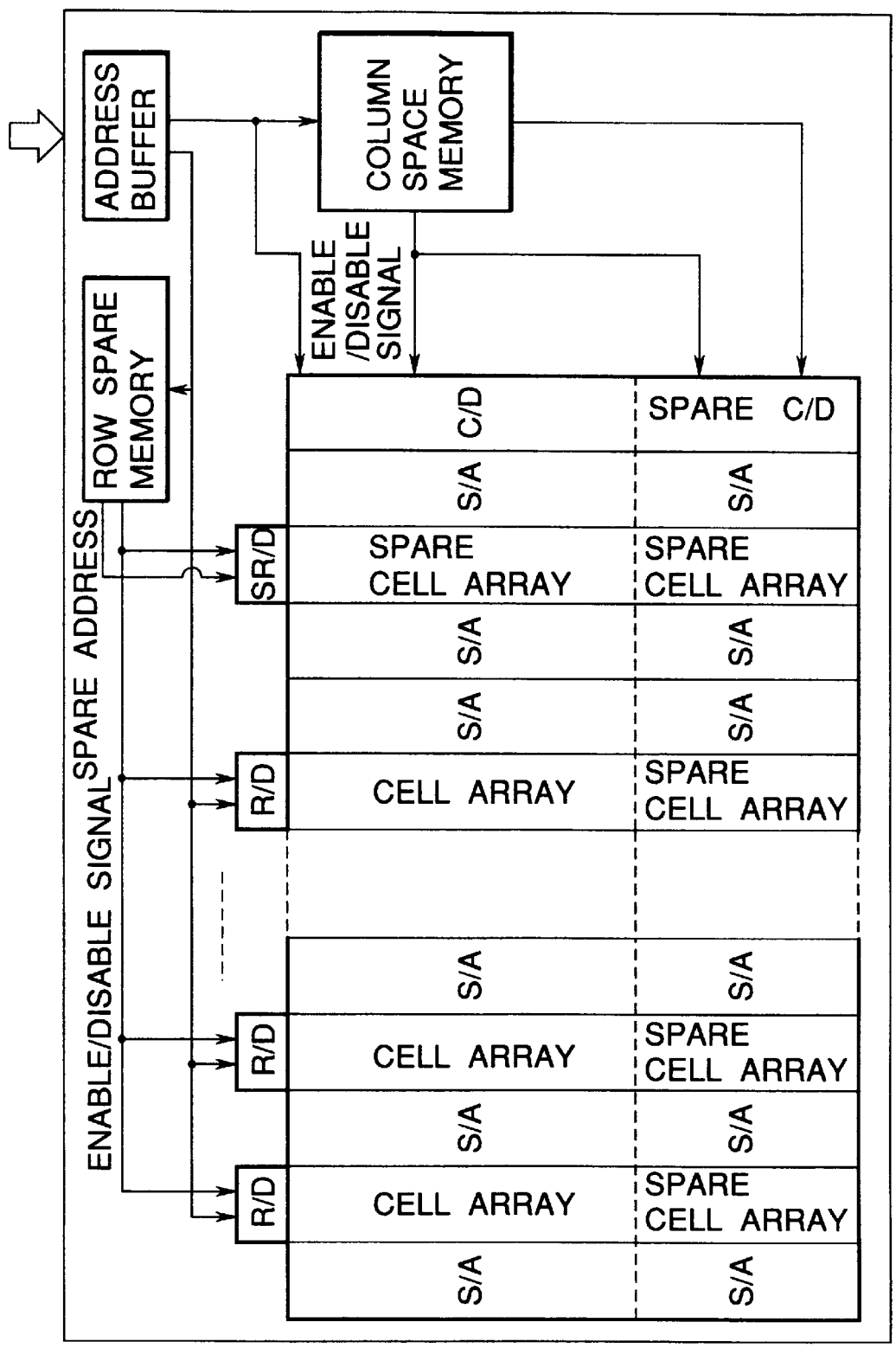
Figure 155:
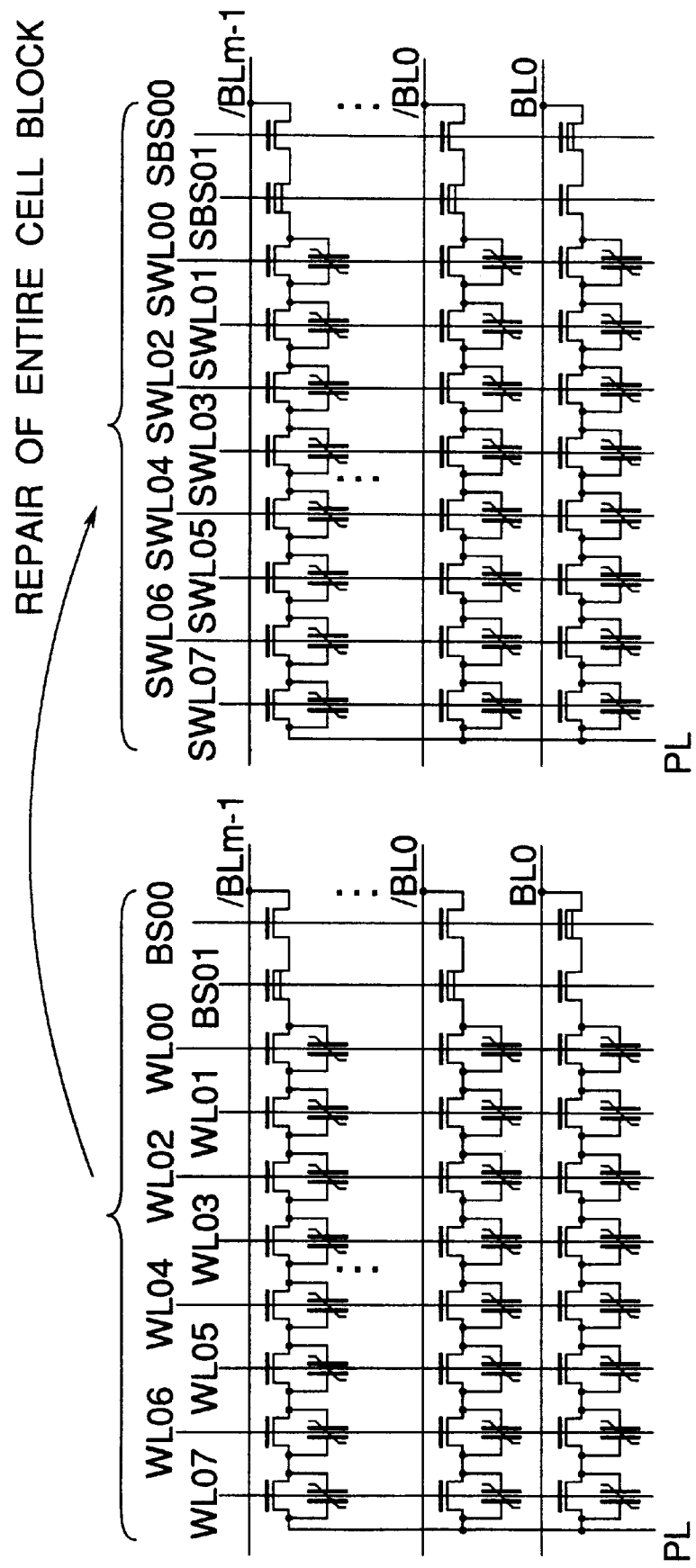
Figure 156:
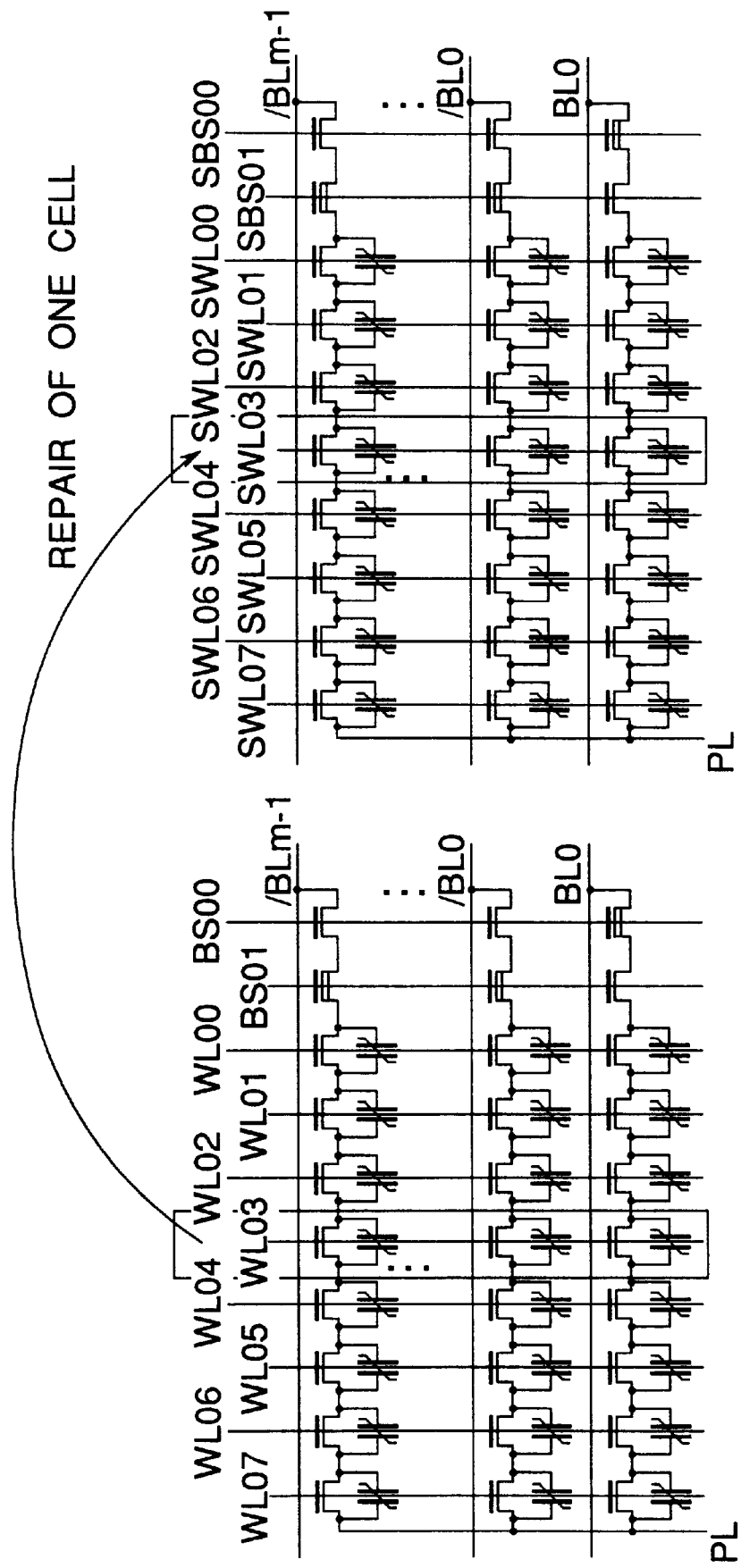
Figure 157:
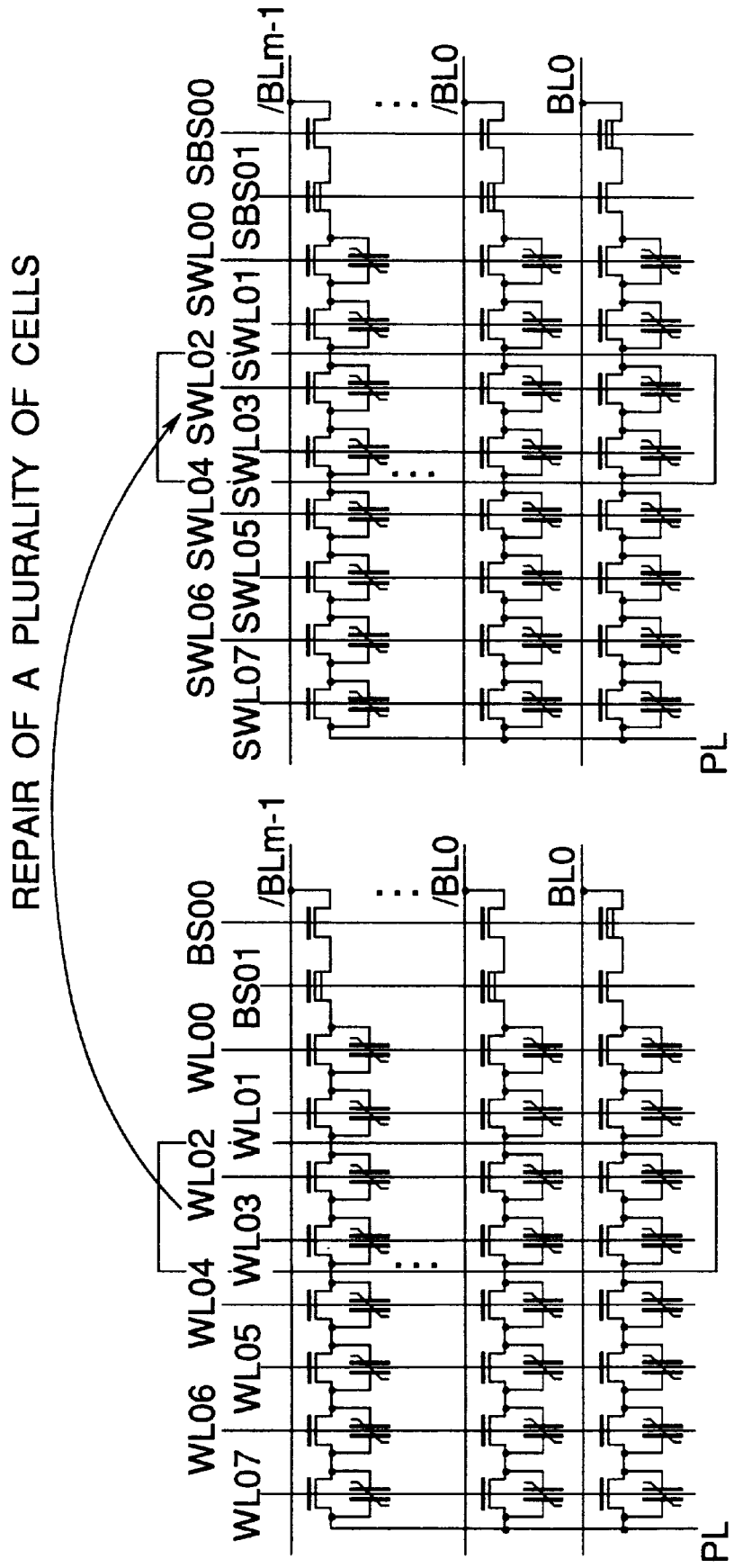
Figure 158:
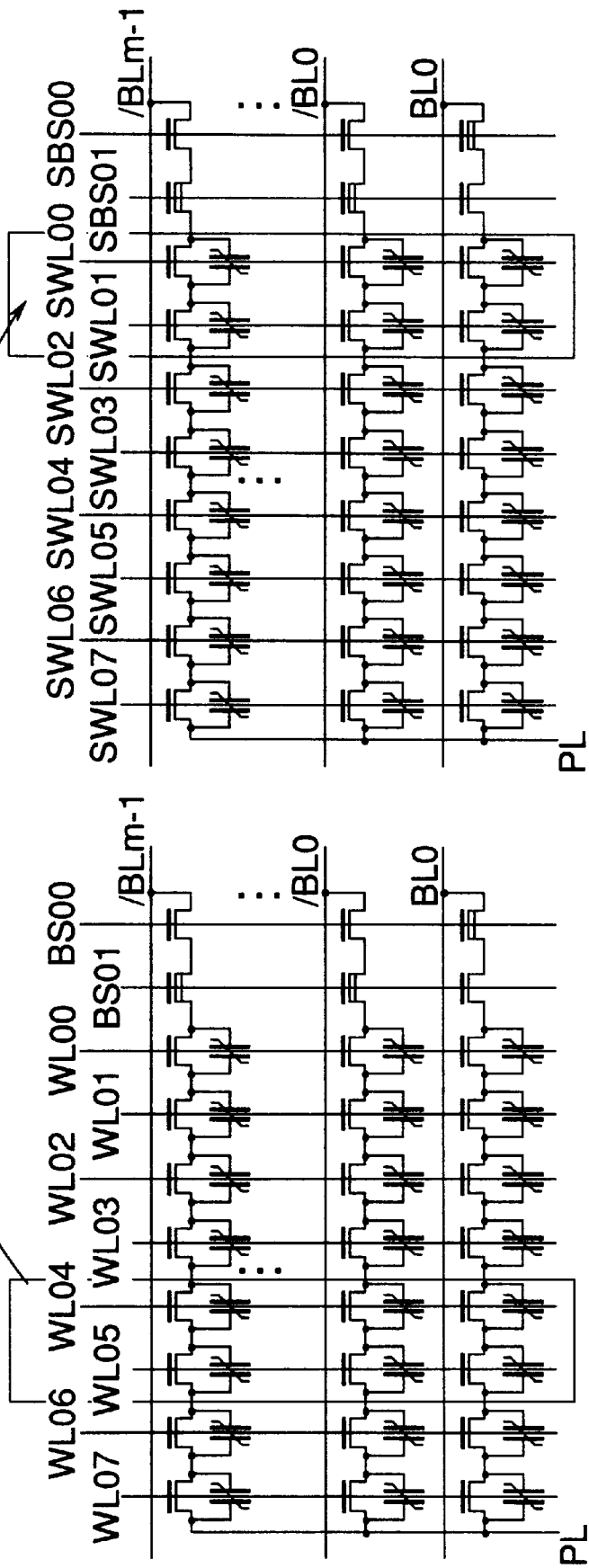
Figure 159:
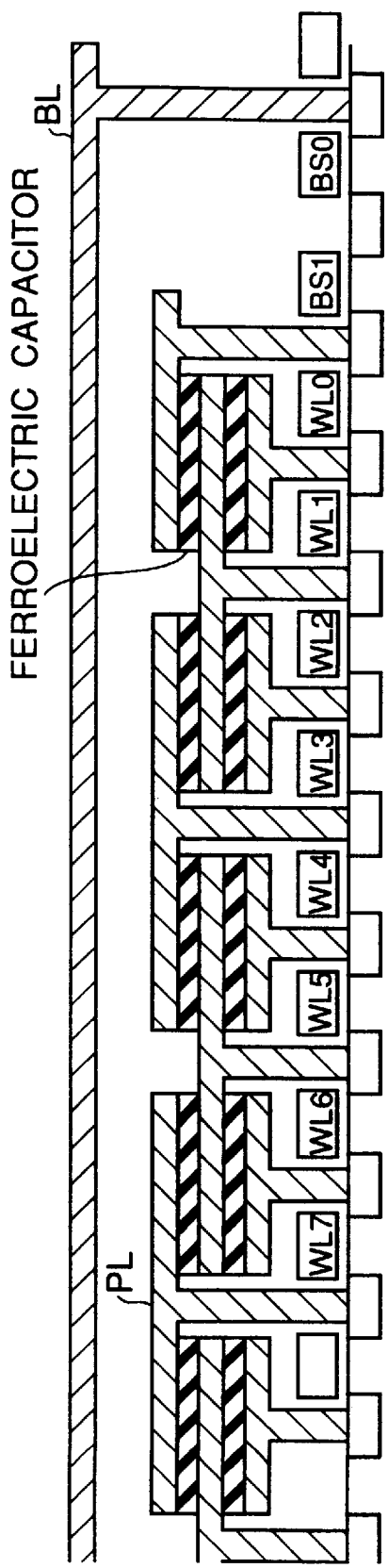
Figure 160:
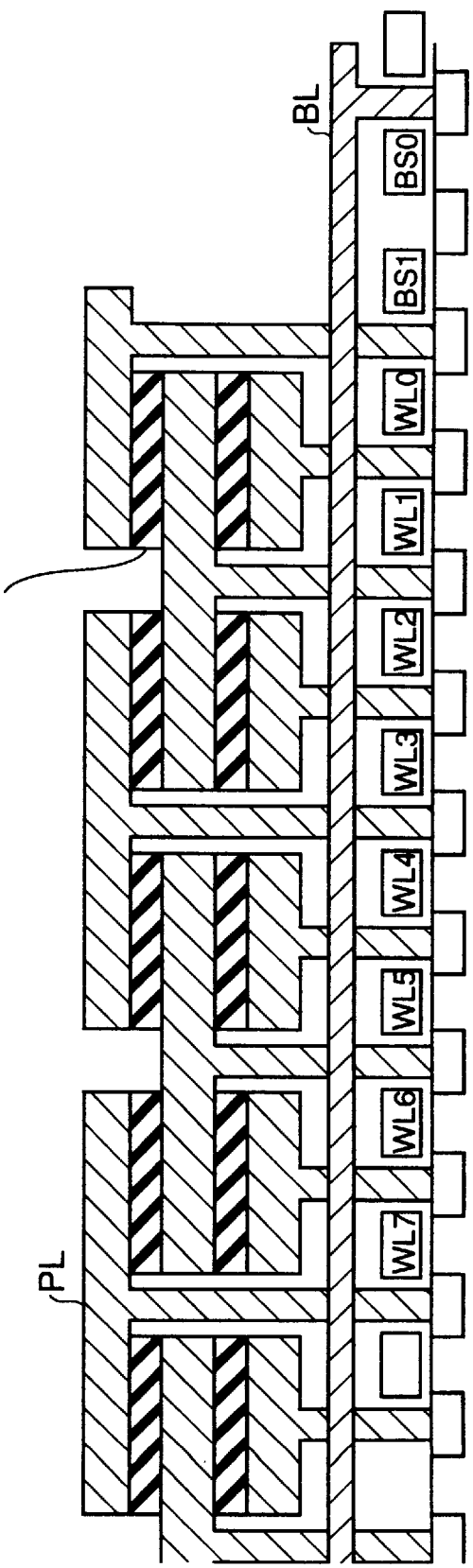
Figure 161:
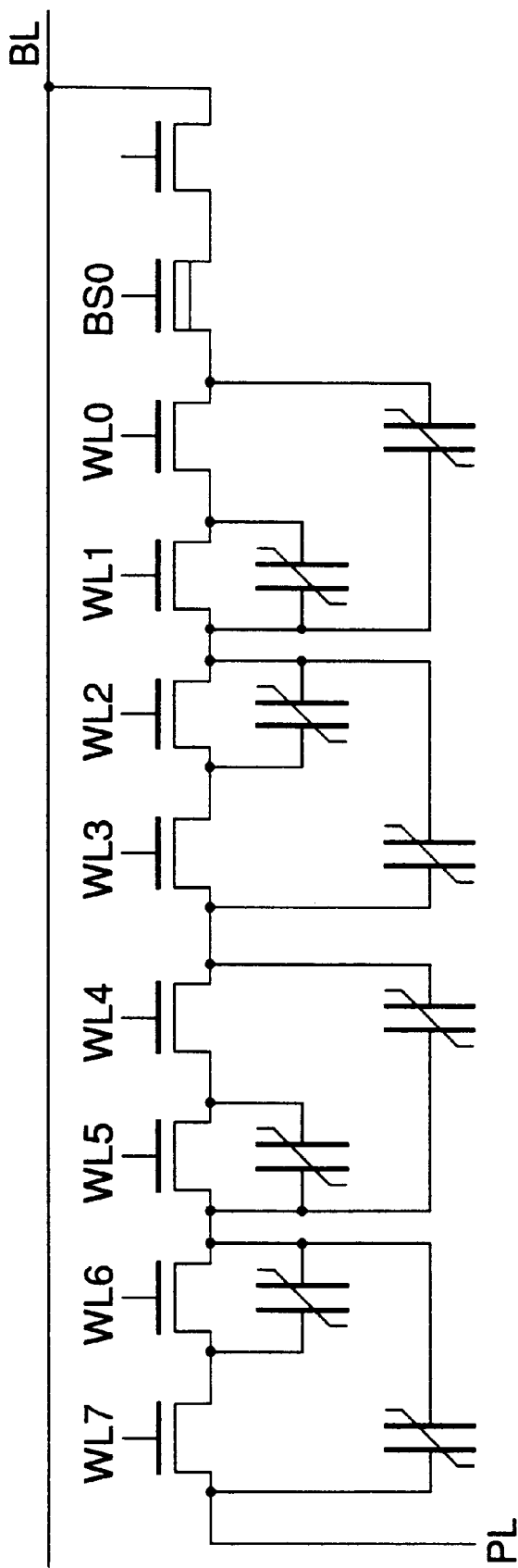
Figure 162:
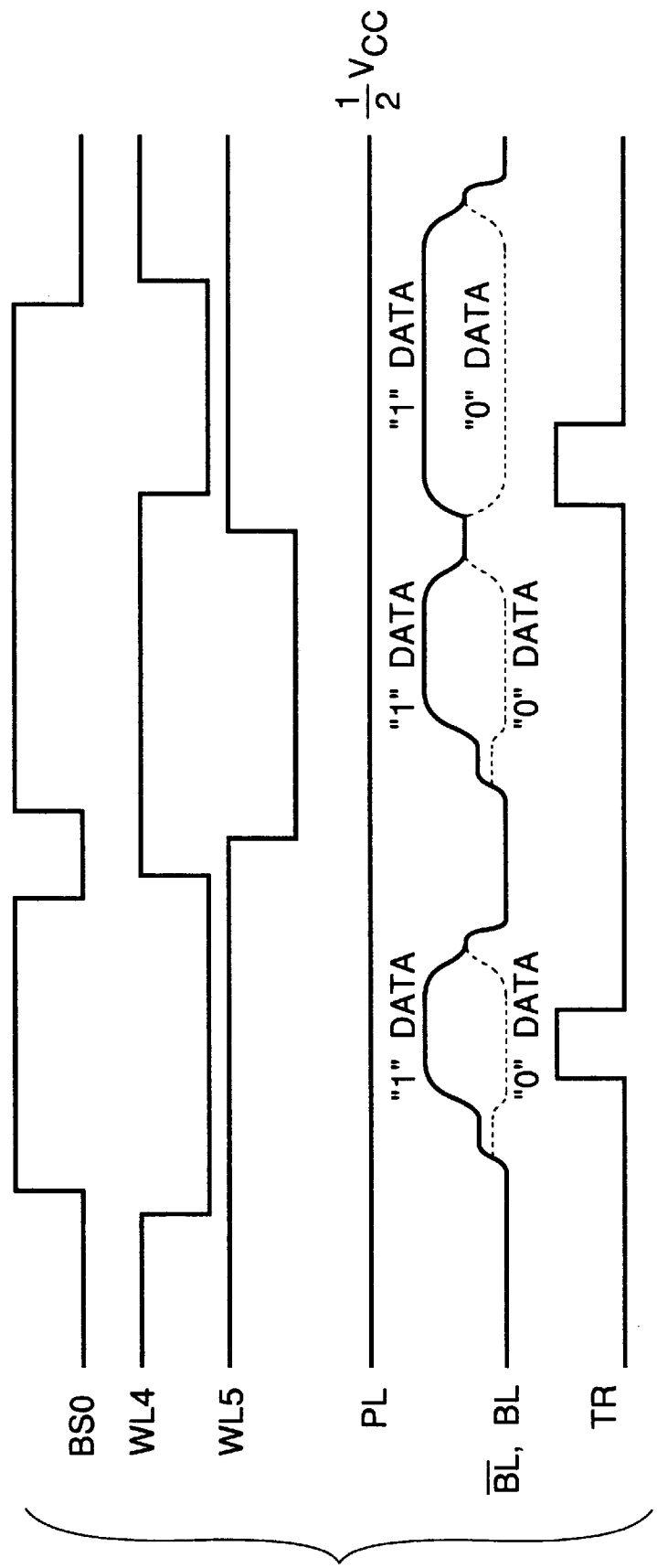
Figure 167:
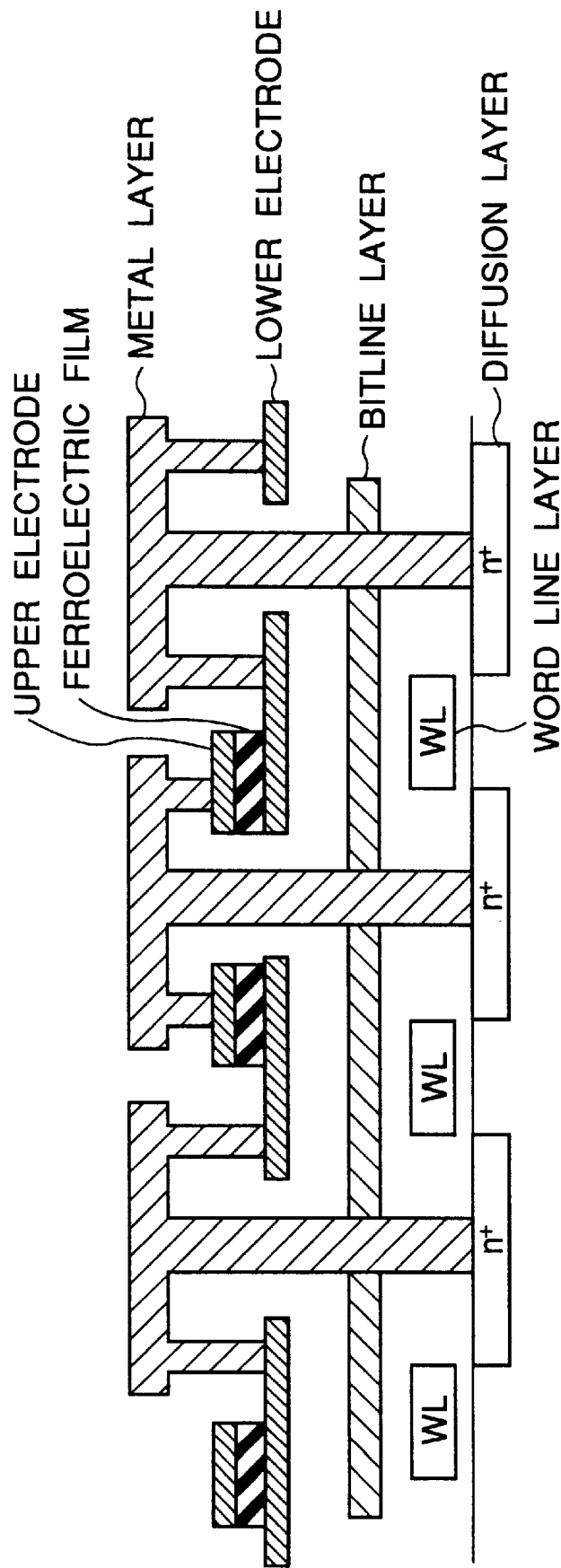
Figure 168A:
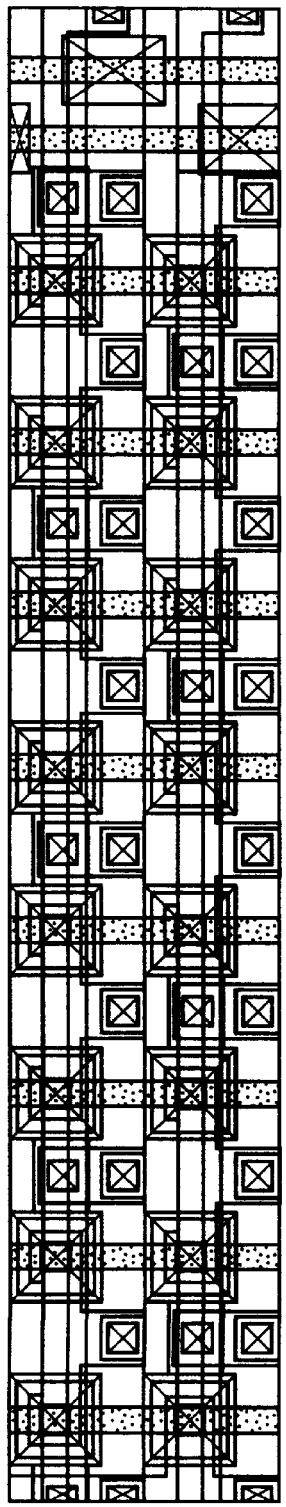
Figure 168B:
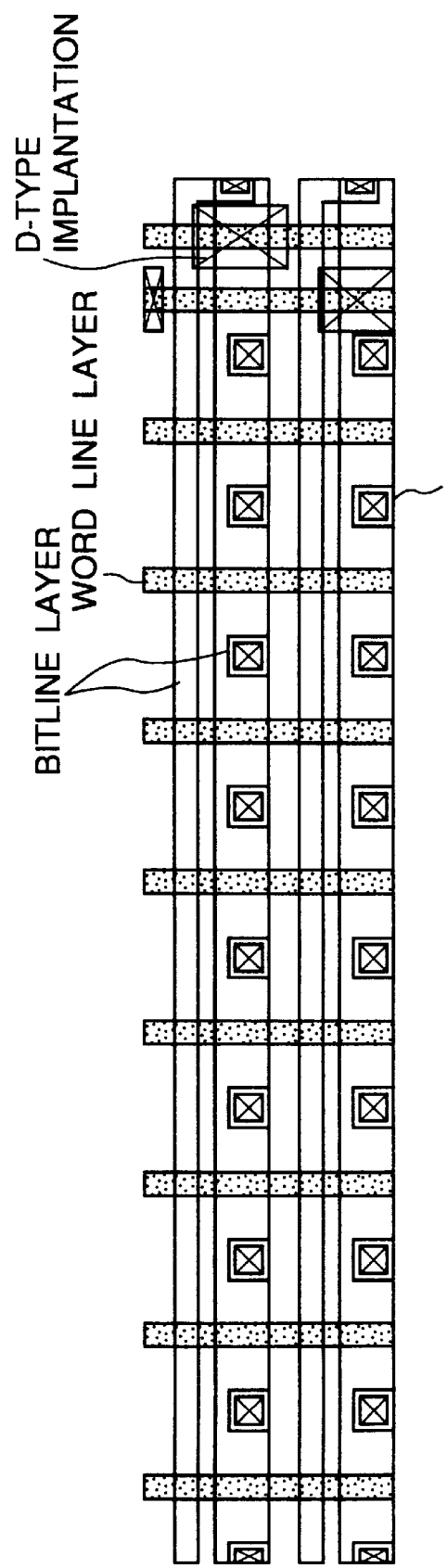
Figure 168C:
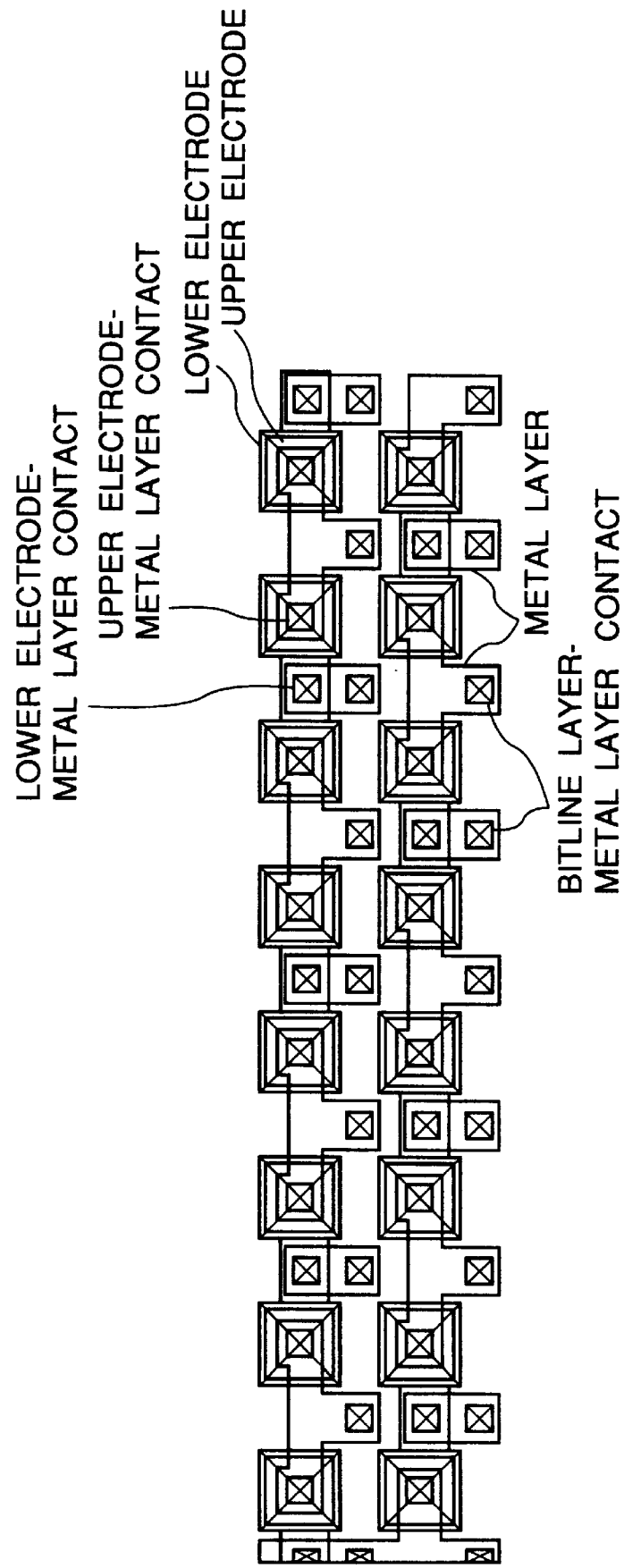
Figure 169A:
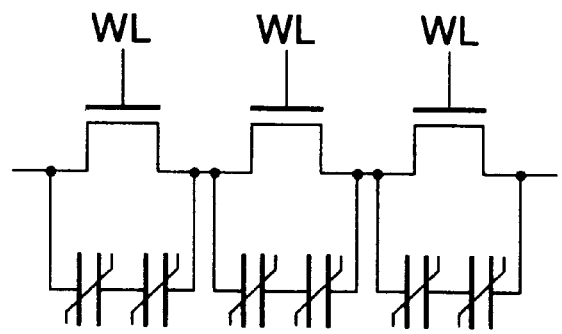
Figure 169B:
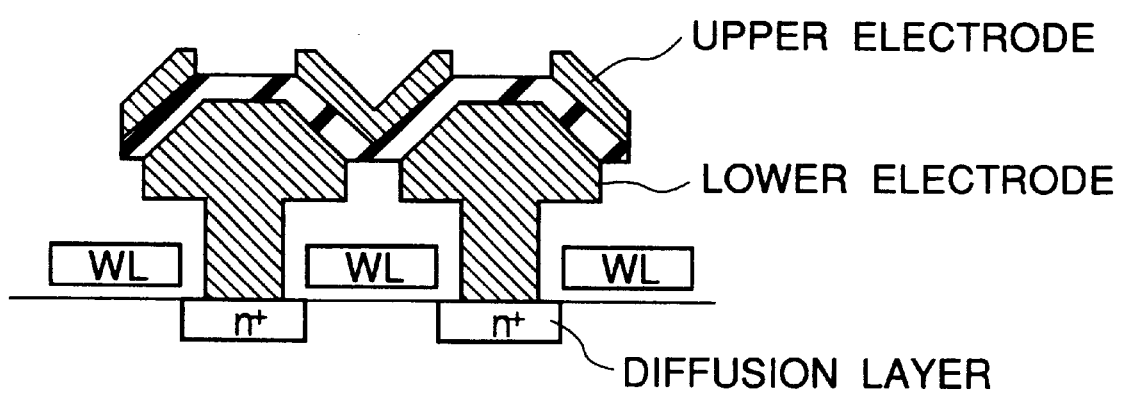

FIG. 132 is an equivalent circuit diagram of an FRAM according to the 90th embodiment;

FIGS. 133A and 133B are an equivalent circuit diagram and a graph, respectively, showing an FRAM according to the 91st embodiment;

FIGS. 134A to 134E are sectional views showing the device structure of an FRAM according to the 92nd embodiment;

FIG. 135 is an equivalent circuit diagram of an FRAM according to the 93rd embodiment;

FIG. 136 is a sectional view showing the device structure of an FRAM according to the 94th embodiment;

FIG. 137 is an equivalent circuit diagram of an FRAM according to the 95th embodiment;

FIG. 138 is a timing chart showing the operation of an FRAM according to the 96th embodiment;

FIGS. 139A and 139B are an equivalent circuit diagram of an FRAM according to the 97th embodiment and a sectional view of the device structure, respectively;

FIGS. 140A and 140B are an equivalent circuit diagram of an FRAM according to the 98th embodiment and a sectional view of the device structure, respectively;

FIGS. 141A and 141B are an equivalent circuit diagram of an FRAM according to the 99th embodiment and a sectional view of the device structure, respectively;

FIGS. 142 is an equivalent circuit diagram of an FRAM according to the 100th embodiment;

FIG. 143 is a sectional view showing the device structure of an FRAM according to the 101st embodiment;

FIG. 144 is an equivalent circuit diagram of an FRAM according to the 102nd embodiment;

FIG. 145 is a circuit diagram showing the word line structure of an FRAM according to the 103rd embodiment;

FIG. 146 is a circuit diagram showing the word line structure of an FRAM according to the 104th embodiment;

FIGS. 147A and 147B are circuit diagrams showing connection of the word line structure of an FRAM according to the 105th embodiment;

FIGS. 148A and 148B are plan views showing the layout of the subarray central portion of the word line structure of an FRAM according to the 106th embodiment;

FIGS. 149A and 149B are plan views showing part of the layout of the subarray central portion of the word line structure of the FRAM according to the 106th embodiment;

FIGS. 150A and 150B are plan views showing part of the layout of the subarray central portion of the word line structure of the FRAM according to the 106th embodiment;

FIGS. 151A and 151B are plan views showing part of the layout of the subarray central portion of the word line structure of the FRAM according to the 106th embodiment;

FIG. 152 is a circuit diagram showing the circuit of the sub-row decoder of the word line structure of an FRAM according to the 107th embodiment;

Figure 153:
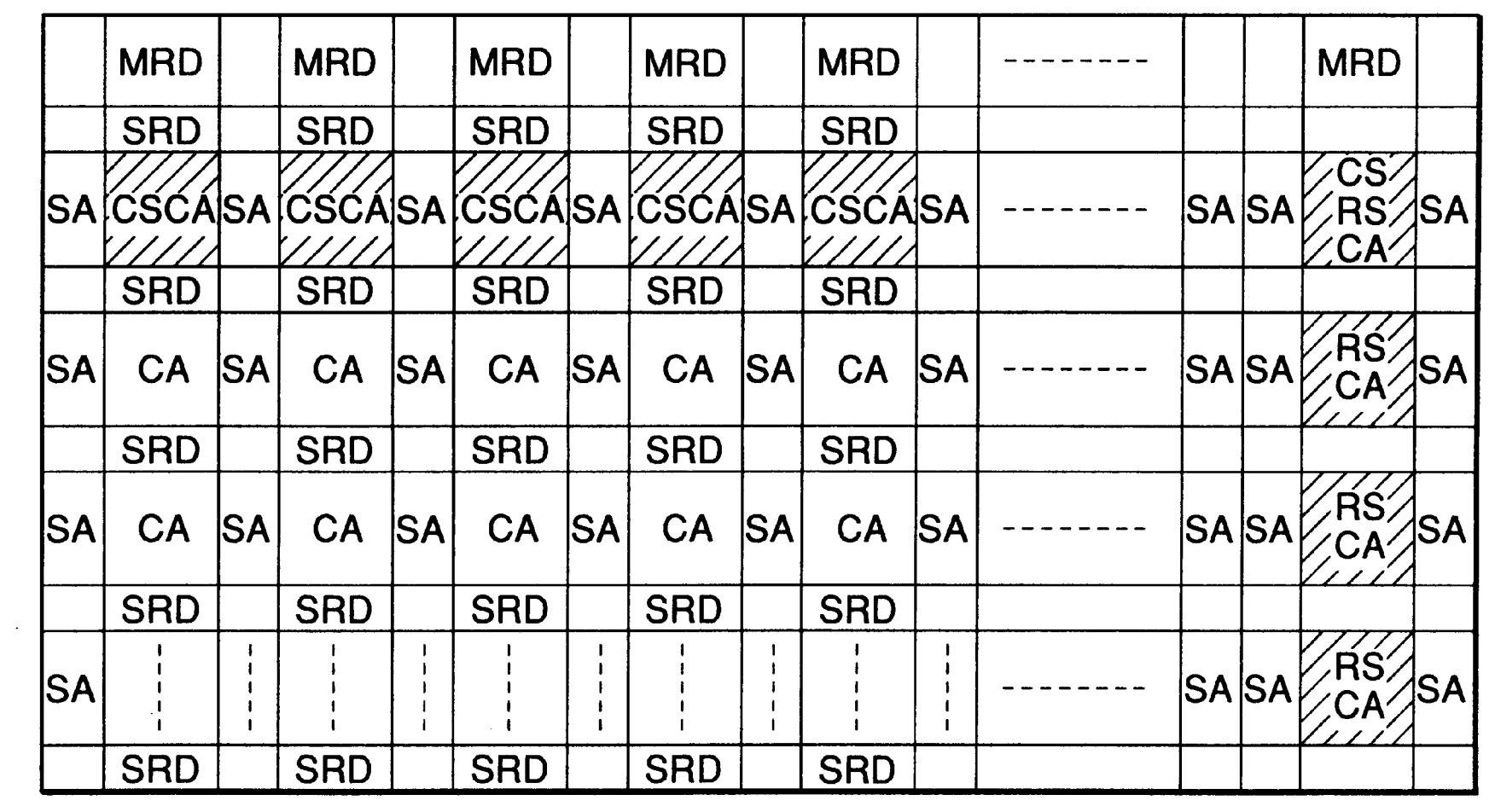

FIG. 153 is a block diagram of a cell array block including a spare array in an FRAM according to the 108th embodiment;

FIG. 154 is a block diagram of a cell array block including a redundancy spare circuit in an FRAM according to the 109th embodiment;

FIG. 155 is an equivalent circuit diagram of an FRAM according to the 110th embodiment;

FIG. 156 is a circuit diagram for explaining a method of replacing a defect memory cell in an FRAM according to the 111th embodiment;

FIG. 157 is a circuit diagram for explaining a method of replacing a defect memory cell in an FRAM according to the 112th embodiment;

FIG. 158 is a circuit diagram for explaining a method of replacing a defect memory cell in an FRAM according to the 113th embodiment;

FIG. 159 is a sectional view showing the device structure of an FRAM according to the 114th embodiment;

FIG. 160 is a sectional view showing another device structure of the FRAM according to the 114th embodiment;

FIG. 161 is an equivalent circuit diagram of the FRAM according to the 114th embodiment;

FIG. 162 is a timing chart showing the operation of the FRAM according to the 114th embodiment;

FIGS. 163A to 163D are plan views of memory cells of an FRAM according to the 115th embodiment;

FIGS. 164A to 164D are plan views showing the partial layouts of the memory cells shown in FIGS. 163A to 163D, respectively;

FIGS. 165A to 165D are plan views showing the partial layouts of the memory cells shown in FIGS. 163A to 163D, respectively;

FIGS. 166A to 166D are sectional views of the memory cells shown in FIGS. 163A to 163D, respectively;

FIG. 167 is a sectional view of the memory cells shown in FIGS. 163A to 163D;

FIG. 168A is a plan view of a memory cell of an FRAM according to the 116th embodiment;

FIG. 168B is a plan view showing partial layout of the memory cell shown in FIG. 168A;

FIG. 168C is a plan view showing partial layout of the memory cell shown in FIG. 168A; and FIG. 169A and 169B are an equivalent circuit diagram and a sectional view, respectively, showing a memory cell structure according to the 117th embodiment.

DETAILED DESCRIPTION OF THE INVENTION

The embodiments of the present invention will be described below with reference to the accompanying drawing.

(First Embodiment)

Figure 3A:
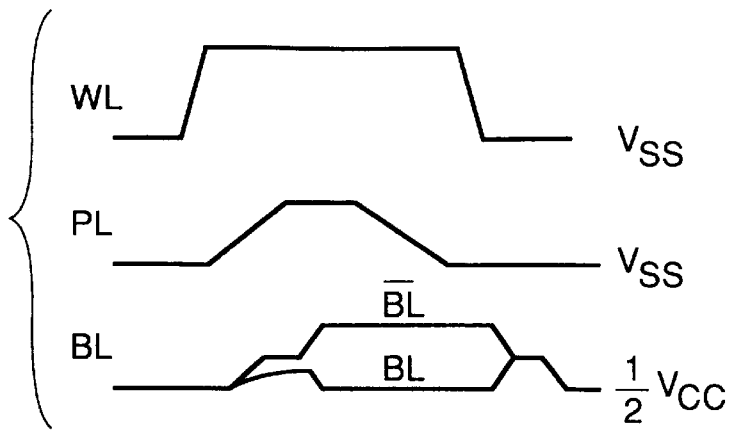
FIGS. 3A to 3C are charts showing signal waveforms so as to explain the operation of the conventional FRAM.
Figure 3B:
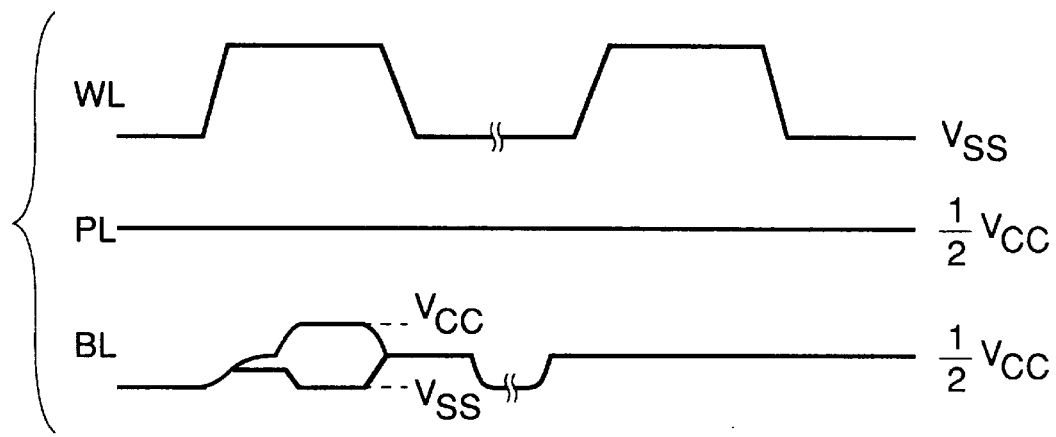
Figure 3C:
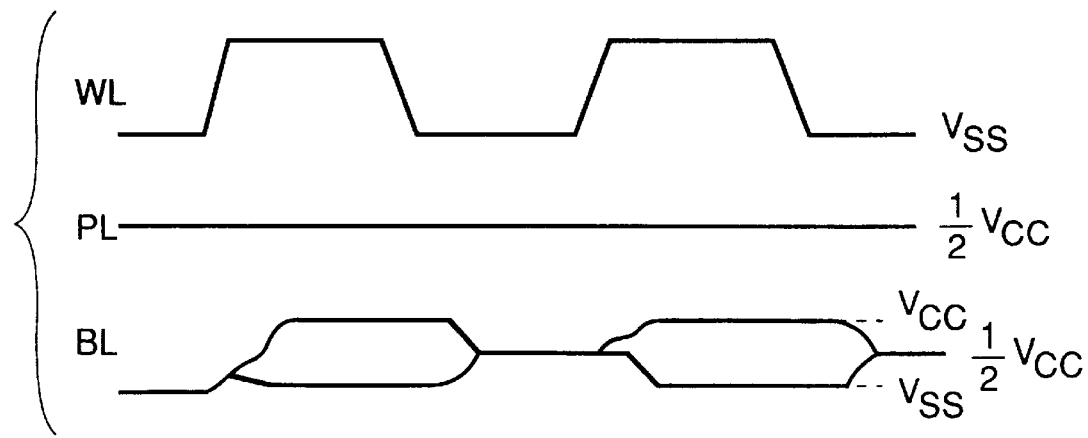
Figure 4:
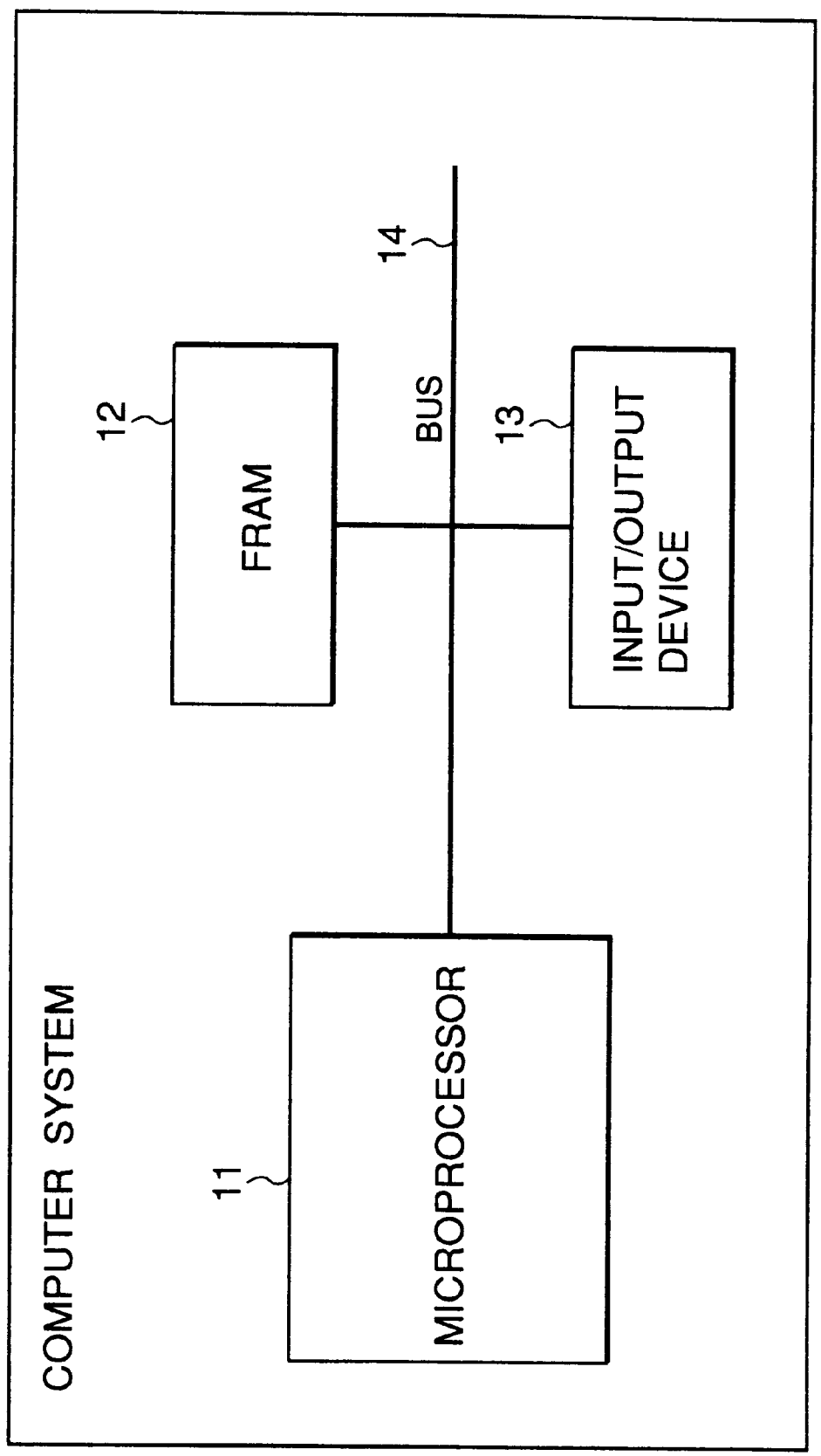
FIG. 4 is a block diagram showing a computer system having an FRAM according to the first embodiment.

FIG. 4 is a block diagram showing the basic structure of a computer system according to the first embodiment of the present invention;

This system is constituted by a microprocessor 11 for performing various arithmetic processing operations, a non-volatile semiconductor memory device 12 connected to the microprocessor 11 through a bus 14 to store data, and an input/output device 13 connected to the microprocessor 11 through the bus 14 to transmit/receive data to/from an external device.

In this embodiment, the semiconductor memory device (FRAM) of the present invention is mounted in the computer system. The FRAM used in this embodiment will be described below in detail.

FIGS. 5A and 5B are circuit diagrams showing the basic structure of the FRAM used in this embodiment. FIGS. 5A and 5B show an equivalent circuit corresponding to eight memory cells. Referring to FIG. 5A, reference symbol BL denotes a bit line; PL, a plate electrode; WLij, a word line; and SNij, a cell node. Q0 denotes a select transistor, and a signal BSi of the gate of the select transistor Q0 represents a block selection line. Q1 to Q4 denote memory cell transistors. Cf1 to Cf4 each represented by adding a hook mark to a normal capacitor mark denote ferroelectric capacitors. Note that a memory using a ferroelectric capacitor according to the present invention will be referred to as a ferroelectric memory hereinafter.

In a memory cell of the conventional FRAM, a cell transistor as an extension of the conventional DRAM and a ferroelectric capacitor are connected in series with each other. In this embodiment, this concept is largely changed. More specifically, the cell transistor is connected to the ferroelectric capacitor in parallel to constitute a memory cell. For example, the cell transistor Q3 and the ferroelectric capacitor Cf3 are connected to constitute a memory cell, thereby storing information "0" or "1". Similarly, the cell transistor Q1 and the ferroelectric capacitor Cf1, the cell transistor Q2 and the ferroelectric capacitor Cf2, and the cell transistor Q4 and the ferroelectric capacitor Cf4 are connected to constitute memory cells.

The four memory cells are connected in series to form a memory group (memory block). One terminal of this memory block is connected to the cell plate electrode PL, and the other terminal is connected, via the select transistor for selecting this block, to the bit line BL for reading/writing data.

FIG. 5A shows two memory blocks on the left and right sides, respectively. One memory cell may be used to store binary data "0" or "1". Alternatively, multivalued data or analog data may be stored without any problem.

The operation of the FRAM of this embodiment will be described. In the stand-by state, all word lines WL00 to WL03 and WL10 to WL13 are set at "H" level. Block selection lines BS0 and BS1 are set at "L" level. At this time, the gates of all the cell transistors are ON. The two terminals of each ferroelectric capacitor are electrically short-circuited by the cell transistor connected in parallel to the capacitor and set at an equipotential. For example, in the cell constituted by the cell transistor Q3 and the ferroelectric capacitor Cf3, cell nodes SN03 and SN02 are set at an equipotential.

If the conventional DRAM has the above structure, accumulated information is destroyed. However, in the ferroelectric memory, the data is not destroyed even when the potential difference between the accumulation node SN and the plate electrode PL is set at 0V. This embodiment reversely exploits at maximum the problem unique to the ferroelectric memory that charges are not read out unless the direction of polarization at which the data has been written is reversed. More specifically, in FIG. 2B, the data "1" does not move from the point B where the remnant polarization Pr is present, and the data "0" does not move from the point D where the remnant polarization −Pr is present.

In term of electrical properties, all cell nodes SN00 to SN03 and SN10 to SN13 are set at the same potential as the plate (PL) potential in the stand-by state. In this embodiment, regardless of fixing the plate electrode potential at (½)Vcc or changing the potential within the range of 0V to Vcc, the two terminals of each ferroelectric capacitor are always short-circuited in the stand-by state for a long time. Therefore, even when there is a leakage current at the p-n junction of the cell transistor, the potential difference between the two terminals of the ferroelectric capacitor is 0V. Charges corresponding to the remnant polarization amount are kept held, so the ferroelectric capacitor never cause polarization inversion to destroy the data.

In the FRAM of the present invention, the cell transistor may have a cutoff current larger than that of the conventional DRAM or FRAM having a DRAM mode. This facilitates manufacturing of the transistor. In addition, the leakage current of the ferroelectric capacitor may also be large. In the conventional FRAM having only the FRAM mode, when the bit line potential varies within the range of 0V to Vcc, the potential of the cell node of an unselected memory cell varies through the cell transistor, and the data is destroyed. In this embodiment, however, no problem is posed because the cell transistor is ON at that time. Even when the cutoff current of the select transistor is large, the data is never destroyed.

When the transistor is ON in the unselected state, a software error caused by the potential difference between the ferroelectric capacitors due to collected charges generated upon irradiation of a radiation such as an α-ray is less likely to take place because the ferroelectric capacitors are short-circuited by the cell transistor in the ON state, unlike the conventional cell, so that the reliability can be largely improved. In the conventional cell, the storage node is floating. Therefore, when the cell transistor is ON in the unselected state, the device is influenced by noise such as a parasitic capacity coupling caused by the operation of the selected memory cell. However, such an influence can be prevented by the present invention.

As described above, in this embodiment, even when the scheme of fixing the plate electrode potential at (½)Vcc is employed to realize the high-speed operation, the cell node potential does not lower due to the leakage current. Consequently, the refresh operation can be omitted, unlike the prior art. Additionally, even when the cutoff current of the cell transistor is large, i.e., when the threshold value is lowered, pieces of information in the remaining cells are not destroyed.

A case wherein one of the plurality of series connected cells is to be selected will be considered. Assume that, of the four series connected cells of the memory block on the right side of FIG. 5A, the second cell from the plate electrode PL, i.e., the third cell (Q3, Cf3) from the bit line BL is to be selected. This operation is shown in FIG. 5B. First, the word line WL02 of the selected memory cell (Q3, Cf3) is set at "L" to turn off only the cell transistor Q3. Next, the block selection line BS0 of the selected memory block is set at "H" to turn on only the select transistor Q0.

In term of equivalent circuit, the first, third, and fourth cell transistors Q4, Q2, and Q1 from the plate electrode PL are ON, and the selected second cell transistor Q3 is OFF. One terminal of the ferroelectric capacitor Cf3 of the selected memory cell is electrically connected to the plate electrode PL, and the other terminal is electrically connected to the bit line BL through the select transistor Q0. In the circuit of this embodiment, apparently in term of equivalent circuit, the cell transistor of the conventional ferroelectric memory corresponds to the select transistor Q0, and the conventional ferroelectric capacitor directly corresponds to the cell transistor Q3.

More specifically, in reading/writing, this one memory block corresponds to the conventional one cell constituted by one transistor and one ferroelectric capacitor. The remaining cell transistors or the remaining ferroelectric capacitors in the memory block appear to be invisible. For this reason, the same structure as that of the prior art can be employed for reading/writing in portions other than the memory block. This structure corresponds to both the conventional scheme of fixing the plate electrode at (½)Vcc and the conventional scheme of changing the plate electrode potential within the range of 0V to Vcc.

For example, when the scheme of fixing the plate electrode at (½)Vcc is employed, and cell data is to be read out, the bit line BL is precharged to 0V in advance. Since a bit line capacity Cb is larger than the cell capacity (capacity of the ferroelectric capacitor Cf3), a voltage of about (−½)Vcc=(bit line voltage)−(plate electrode voltage) is applied across the ferroelectric capacitor Cf3. In FIG. 2B, the data "1" moves from the point B to the point C with polarization inversion, and the data "0" moves from the point D to the point C without polarization inversion.

For the data "1", charges corresponding to Ps+Pr are read out to the bit line BL. For the data "0", charges corresponding to Ps−Pr are read out to the bit line BL. The potential of the reference bit line constituting the bit line pair is raised by a potential equal to the potential at which charges corresponding to Ps are read out. For the data "1", a potential difference corresponding to Ps+Pr−Ps=Pr is generated between the bit line pair. For the data "0", a potential difference corresponding to Ps−Pr−Ps=−Pr is generated between the bit line pair. This potential difference is amplified by the sense amplifier. For the data "1", the bit line BL is set at Vcc.

For the data "0", the bit line BL is set at Vss. This result is rewritten in the ferroelectric capacitor of the selected memory cell.

At this time, the data "0" stays at the point C, and the data "1" moves from the point C to the point D, and then to the point A with polarization inversion. Thereafter, the block selection line BS0 is set at "L" to turn off the select transistor Q0, and the word line WL02 is set at "H". The two terminals of the ferroelectric capacitor of the selected memory cell (Q3, Cf3) are short-circuited. The data "1" returns from the point A to the point B, and the data "0" returns from the point C to the point D.

In reading/writing in the memory selected state, the cell transistors of the first, third, and fourth unselected memory cells (Q4 and Cf4, Q2 and Cf2, Q1 and Cf1) from the plate electrode PL are ON to set the two terminals of the ferroelectric capacitors at 0V. For this reason, the data is not destroyed. As a result, in this embodiment, reading/writing from/in an arbitrary one of the cells is enabled although the cells are connected in series. This allows not block access as in the conventional NAND cell but perfect random access.

FIGS. 6A and 6B show a cell structure for realizing the circuit structure shown in FIGS. 5A and 5B. FIG. 6A is a plan view, and FIG. 6B is a sectional view taken along a line 6B—6B in FIG. 6A. This is a stack cell structure in which the ferroelectric capacitors are formed after formation of the cell transistors, and more particularly, a bit line post-forming cell structure in which the bit lines are formed after formation of the ferroelectric capacitors.

In this cell structure, the gate layer of the cell transistor can be formed in the minimum processing size (F), and the diffusion layer or the active region for channel formation can also be formed in the minimum processing size (F). Therefore, a planar transistor which can be easily manufactured is formed. In addition, the cell size can be reduced a size represented below:

$$2F \times 2F = 4F^2$$

Each cell node has a size of 3F×1F. The ferroelectric capacitor is formed in a region having a size of F×F where adjacent cell nodes SN overlap each other. The plate electrode PL has a width of 3F and is extended along the word line. The cell size including the selection gate is as follows:

$$(10F \times 2F)/4 = 5F^2$$

The cell transistor is formed on a p-type substrate or a p-type well. For the ferroelectric capacitor, after the transistor is formed, the source and drain electrodes of the cell transistor are formed above the n$^+$-type diffusion layer region (n$^-$-type region may be used) between the gates. One of the electrodes is used as the lower electrode of the ferroelectric capacitor, and the other is used as the upper electrode. The memory cell (Q3, Cf3) uses the electrode on the storage node SN03 side as the lower electrode, and the electrode on the storage node SN02 side as the upper electrode. This relationship is reversed for the adjacent cell. That is, the relationship between the upper and lower electrodes is alternately reversed.

With this stack cell structure, the ferroelectric capacitor and the cell transistor can be connected in parallel. The plate electrode PL at the end of the memory block may be formed by extending the same upper electrode interconnection as that of the storage node SN02 or SN00. The process cost does not increase, unlike the conventional FRAM. Note that various modifications can be made. For example, the positions of the upper and lower electrodes may be changed, a PMOS cell transistor may be used, or the shape of the ferroelectric capacitor of the cell constituted by SOI may be changed. In the conventional FRAM, a snap of the WL and the like by the Al and Cu wiring can be performed. In this case, it is difficult to snap the WL by the Al and Cu wiring because the WL is arranged near the PL in the conventional FRAM. In the present invention, since the PL is arranged in a part of the cell region, by broadening the PL region, the WL and PL can be snapped by the single layer of the Al or Cu wiring, thereby an RC delay can be extremely reduced when the PL driving method is employed.

FIGS. 7A and 7B show another cell structure for realizing the circuit structure shown in FIGS. 5A and 5B. FIG. 7A is a plan view, and FIG. 7B is a sectional view taken along a line 7B—7B in FIG. 7A. This is a stack cell structure in which the ferroelectric capacitors are formed after formation of the cell transistors, and more particularly, a bit line pre-forming cell structure in which the bit lines are formed before formation of the ferroelectric capacitors.

Each cell node has a size of 3F×1F. The ferroelectric capacitor is formed in a region having a size of F×F where the cell nodes SN overlap each other. The plate electrode PL has a width of 3F and is extended along the word line. To form the ferroelectric capacitors after formation of the bit lines, the cell nodes must be pulled up from portions between the bit lines BL.

In this example, an extension pad is used at a bit line die conductor (the connection portion between the bit line BL and the select transistor), and the active area (diffusion layer, channel portion) is formed to be shifted by a ½ pitch with respect to the bit line BL. Consequently, the cell size is represented as follows:

$$2F \times 2F = 4F^2$$

The size including the selection gate is represented as follows:

$$(11F \times 2F)/4 = 5.5F^2$$

When the select transistor is formed to be oblique with respect to the bit line BL, the size becomes close to 5F$^2$.

The computer system shown in FIG. 4, which uses the FRAM having the new structure, can obtain the following effects.

(1) Since the cell size can be ½ the conventional cell size, a memory with a large capacity can be mounted at the same cost.

(2) At the same memory capacity, the space can be saved because of the small chip size, and the density can be increased.

(3) Since the chip size is small, the device is resistant to a stress.

(4) Even when the plate potential fixing scheme which enables an operation at a speed as high as that of the conventional DRAM is employed, no refresh operation is required. For this reason, a high-speed operation can be performed at a low power consumption.

(5) Even when the specifications such as the ferroelectric capacitor leakage or p-n junction leakage are too strict, the high-speed operation can be easily realized because the refresh operation is not required to hold the data for a long time.

(6) Since the refresh operation can be omitted, the leakage need not be worried about. Since an operation in a high-temperature environment is enabled, a high-speed operation in the high-temperature environment can be expected.

(7) Since the ferroelectric capacitor of an unselected memory cell is always ON through the cell transistor, the device is resistant to a sudden power failure.

In the conventional FRAM, data holding can hardly be realized. When the plate driving scheme is employed, the high-speed operation can hardly be performed, so it is difficult to employ the conventional FRAM as the main memory of a computer. However, the FRAM of this embodiment enables an application as, e.g., a main memory which requires the high-speed operation on the basis of (5). On the basis of (4), the FRAM can be applied to the main memory of a mobile computer system which requires a low power consumption and high-speed operation. In addition, the FRAM can be applied to the main memory of a small computer system which is poor in heat dissipation properties due to (6). On the basis of (1) and (2), a compact main memory having a large capacity can be realized.

Problems such as a large degradation in performance, an increase in cost, and an increase in system size are posed in a system to which the conventional FRAM can hardly be applied or the conventional FRAM is forcibly applied. However, all such problems can be solved by using the FRAM of the present invention. The conventional computer system has three memories, i.e., a RAM, a ROM, and a nonvolatile memory. However, since the FRAM of this embodiment is nonvolatile and operates at a high speed, all necessary memories can be replaced with the FRAM of this embodiment. In addition, since the FRAM of the present invention is nonvolatile and realizes the same operation speed as that of the conventional DRAM, the DRAM can be replaced with the FRAM.

(Second Embodiment)

Figure 8:
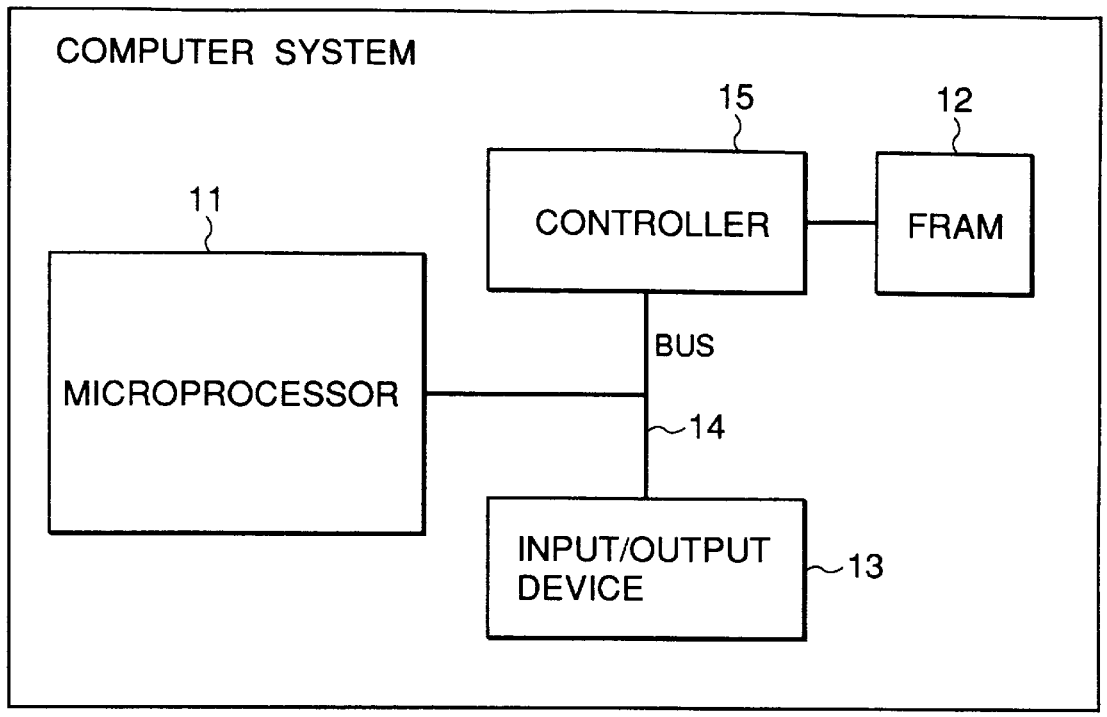
FIG. 8 is a block diagram showing a computer system according to the second embodiment.

FIG. 8 is a block diagram showing the basic structure of a computer system according to the second embodiment. The same reference numerals as in FIG. 4 denote the same parts in FIG. 8, and a detailed description thereof will be omitted.

In this embodiment, a controller 15 for controlling an FRAM 12 is added to the structure shown in FIG. 4. More specifically, the FRAM 12 is connected to a bus 14 through the controller 15.

In this structure as well, the same effects as in the first embodiment can be obtained. The controller 15 of this embodiment allows to omit a refresh control signal generation circuit, so that the cost can be reduced.

(Third Embodiment)

Figure 9:
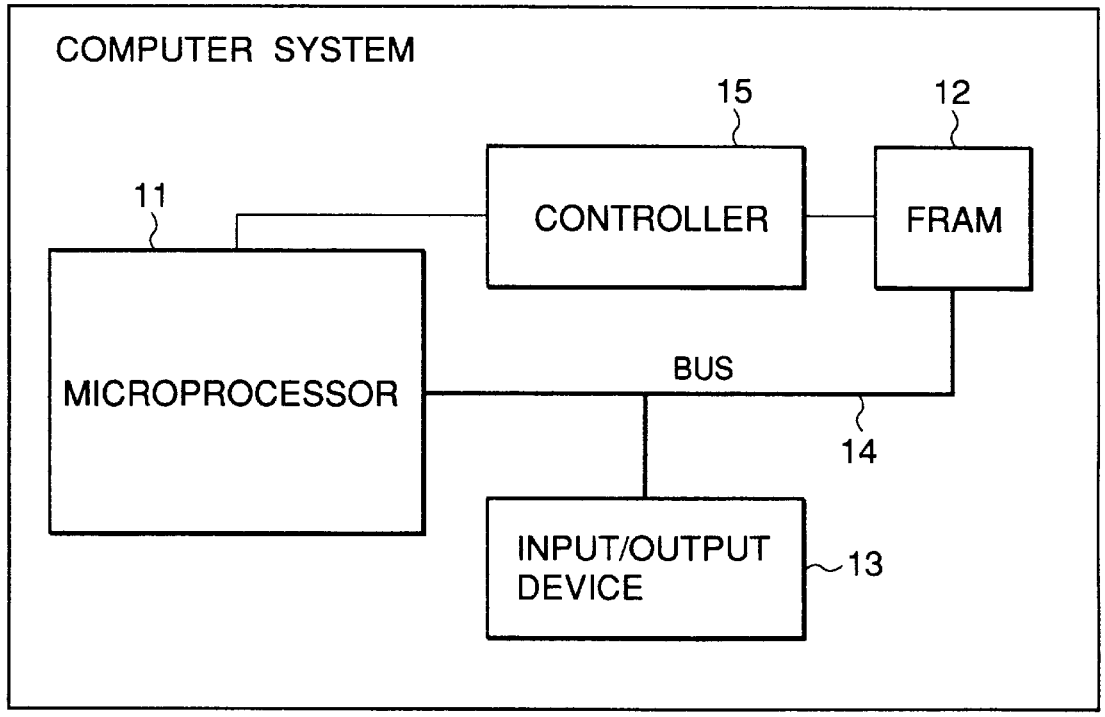
FIG. 9 is a block diagram showing a computer system according to the third embodiment.

FIG. 9 is a block diagram showing the basic structure of a computer system according to the third embodiment. The same reference numerals as in FIG. 8 denote the same parts in FIG. 9, and a detailed description thereof will be omitted.

This embodiment is different from the second embodiment in that the I/O of an FRAM 12 is directly connected to a system bus 14. The system can be freely constituted.

In this structure as well, the same effects as in the first embodiment can be obtained. A controller 15 of this embodiment allows to omit a refresh control signal generation circuit, so that the cost can be reduced.

(Fourth Embodiment)

Figure 10:
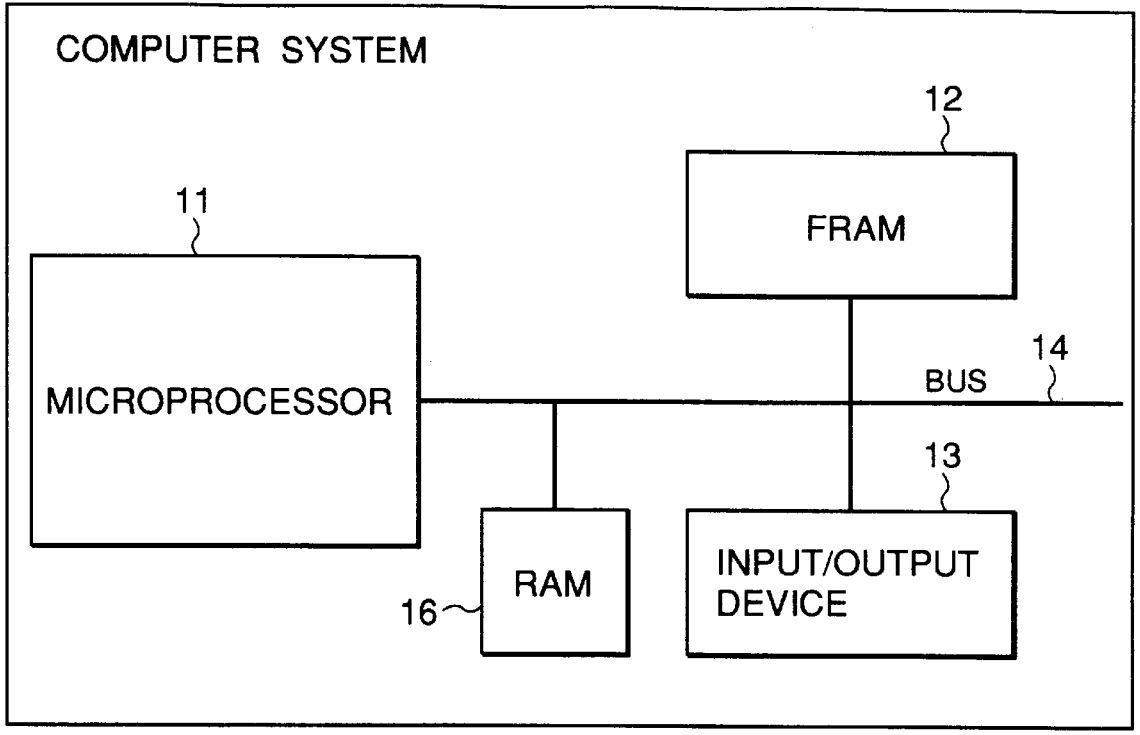
FIG. 10 is a block diagram showing a computer system according to the fourth embodiment.

FIG. 10 is a block diagram showing the basic structure of a computer system according to the fourth embodiment. The same reference numerals as in FIG. 4 denote the same parts in FIG. 10, and a detailed description thereof will be omitted.

In this embodiment, a RAM 16 is arranged in addition to the structure shown in FIG. 4. More specifically, the RAM 16 is connected to a bus 14.

In this structure as well, the same effects as in the first embodiment can be obtained. In this embodiment, the RAM 16 is arranged. Therefore, this embodiment can be applied even when the number of times of rewrite access in an FRAM 12 is limited, and a RAM is required, or a high-speed SRAM or high-speed DRAM is used as a RAM.

(Fifth Embodiment)

Figure 11:
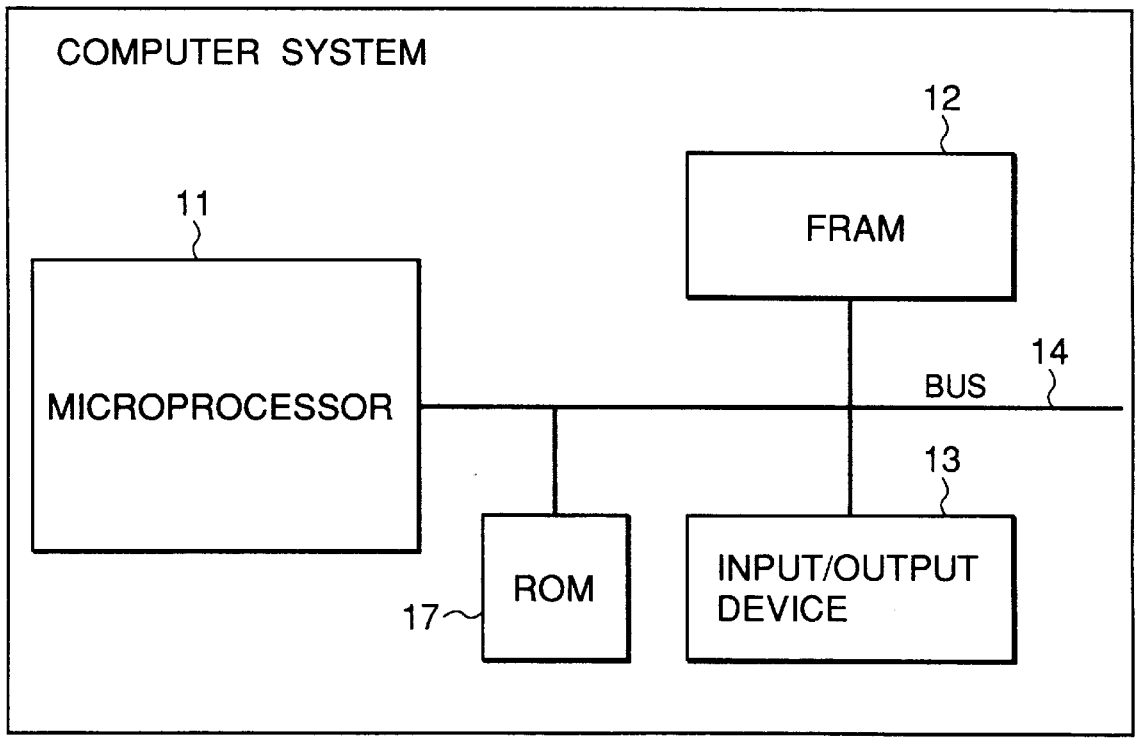
FIG. 11 is a block diagram showing a computer system according to the fifth embodiment.

FIG. 11 is a block diagram showing the basic structure of a computer system according to the fifth embodiment of the present invention. The same reference numerals as in FIG. 4 denote the same parts in FIG. 11, and a detailed description thereof will be omitted.

In this embodiment, a ROM 17 is arranged in addition to the structure shown in FIG. 4. More specifically, the ROM 17 is connected to a bus 14.

In this structure as well, the same effects as in the first embodiment can be obtained. In this embodiment, the ROM 17 is arranged. Therefore, when OS or kanji data which need not be rewritten is stored in the ROM 17, the cost can be reduced.

(Sixth Embodiment)

Figure 12:
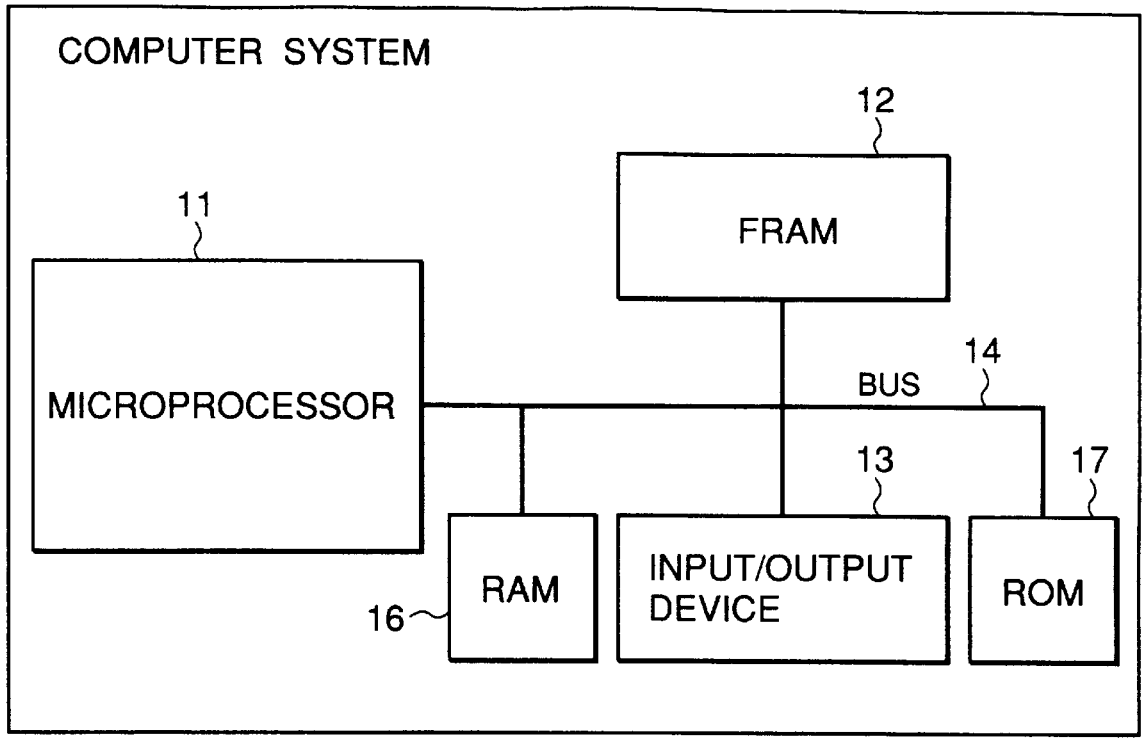
FIG. 12 is a block diagram showing a computer system according to the sixth embodiment.

FIG. 12 is a block diagram showing the basic structure of a computer system according to the sixth embodiment of the present invention. The same reference numerals as in FIG. 4 denote the same parts in FIG. 12, and a detailed description thereof will be omitted.

In this embodiment, a RAM 16 and a ROM 17 are arranged in addition to the structure in FIG. 4. More specifically, the RAM 16 and the ROM 17 are connected to a bus 14.

In this structure as well, the same effects as in the first embodiment can be obtained. As in the fourth embodiment, the RAM 16 is arranged. For this reason, this embodiment can be applied even when the number of times of rewrite access in an FRAM 12 is limited, and a RAM is required, or a high-speed SRAM or high-speed DRAM is used as a RAM. As in the fifth embodiment, the ROM 17 is also arranged. Therefore, when OS or kanji data which need not be rewritten is stored in the ROM 17, the cost can be reduced.

(Seventh Embodiment)

Figure 13:
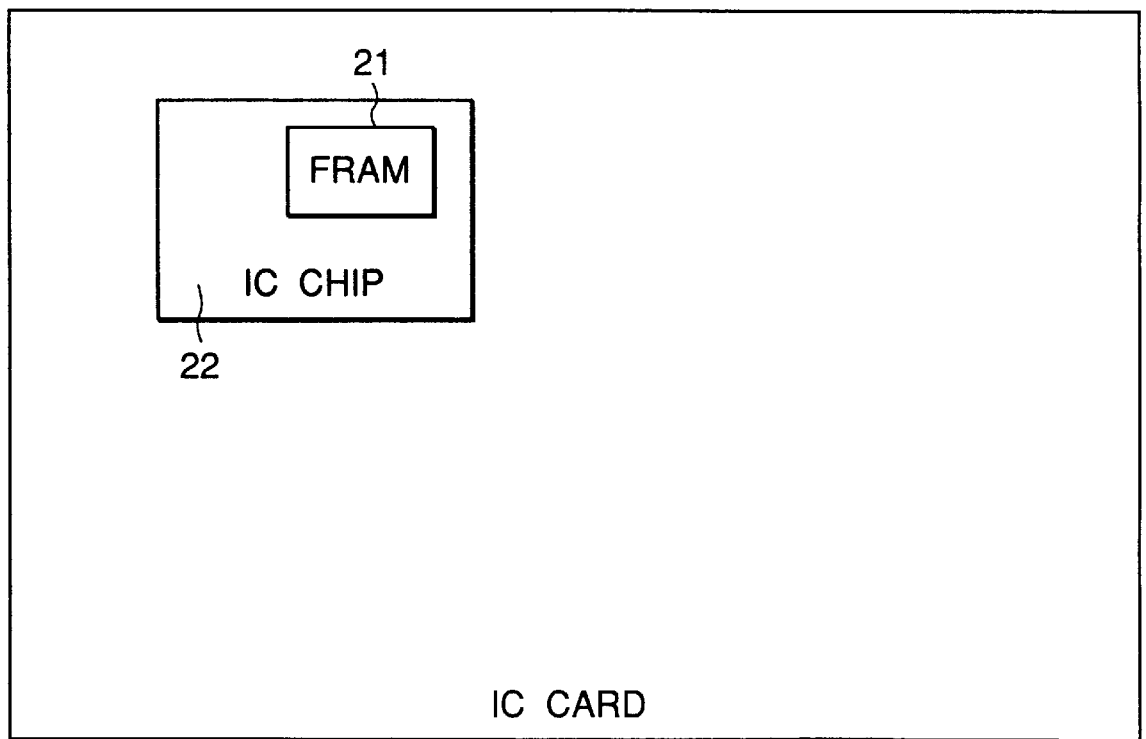
FIG. 13 is a schematic view showing an IC card having an FRAM according to the seventh embodiment.

FIG. 13 is a schematic view showing the basic structure of an IC card according to the seventh embodiment.

This IC card is constituted by setting an IC chip 22 having an FRAM 21 on an IC card main body 20.

In this embodiment, the semiconductor memory device (FRAM) of the present invention is mounted in an IC card. Details of the FRAM used in this embodiment are the same as in the first embodiment, and a detailed description thereof will be omitted.

In the IC card having the FRAM of the present invention, the reliability of the IC card with respect to a stress can be largely increased, or large-capacity data storage can be realized under the same stress/pressure resistance conditions on the basis of (3) described in the first embodiment. For a normal IC card, the IC chip size cannot be 25 mm$^2$ or more because of the stress limitation, and a solution to this problem is very important.

It is important for the IC card to realize a low power consumption, high reliability, and a high-speed operation. When the present invention is applied, the performance can be improved on the basis of (4) to (7) of the first embodiment. In the conventional FRAM, a large time lag is generated after power-ON or at the time of power-OFF for the recall operation. This embodiment also provides the following effect: (8) The time lag is not generated so that a high-speed response is enabled. Therefore, the speed of response of the IC card after insertion or the speed of response of card removal can be increased.

(Eighth Embodiment)

Figure 14:
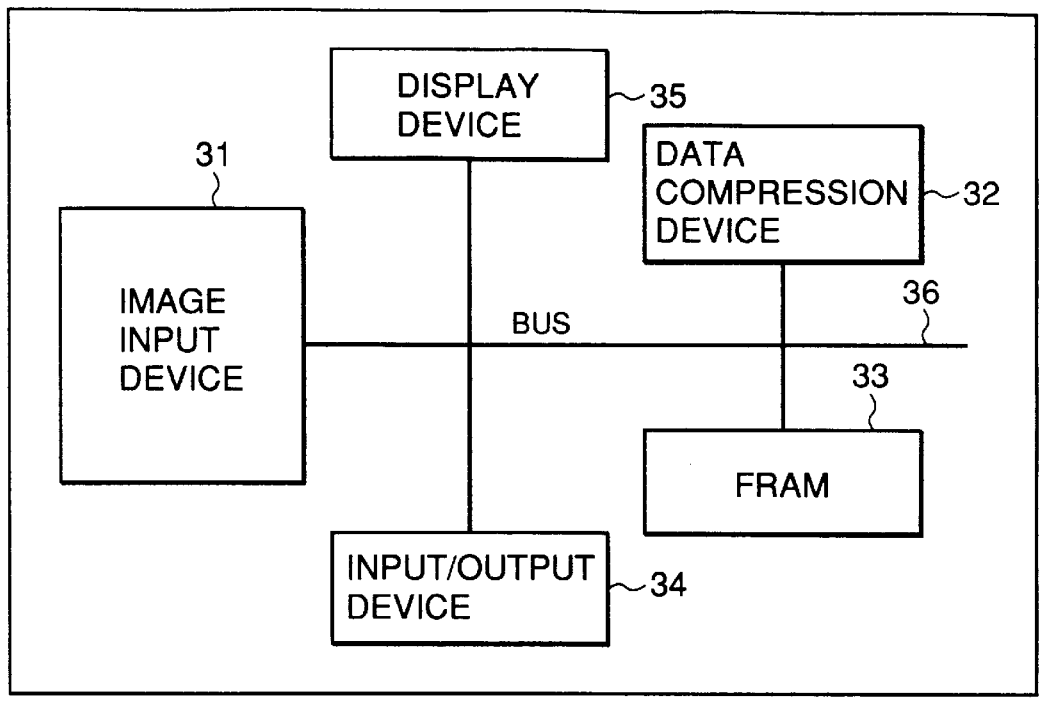
FIG. 14 is a block diagram showing a digital image input system having an FRAM according to the eighth embodiment.

FIG. 14 is a block diagram showing the basic structure of a digital image input system according to the eighth embodiment of the present invention.

This system is constituted by an image input device 31 such as a CCD image pickup device and a CMOS sensor for inputting image data, a data compression device 32 for compressing the input image data, an FRAM 33 for storing the compressed image data, an input/output device 34 for outputting the compressed image data or inputting image data, a display device 35 such as an LCD for displaying the input image data or compressed image data, and a system bus 36 for connecting these devices.

In this embodiment, the semiconductor memory device (FRAM) of the present invention is mounted in a digital image input system such as a digital camera or digital video camera. Details of the FRAM used in this embodiment are the same as in the first embodiment, and a detailed description thereof will be omitted.

The digital image input system using the FRAM of the present invention can store large-volume image data due to (1) and (2) described in the first embodiment. On the basis of (4) and (5) of the first embodiment, compressed data can be stored at a high speed while a low power consumption which is important for a mobile system is achieved to prolong the service life of the battery. Conventionally, a high-speed primary RAM such as a buffer is necessary. However, when the FRAM of the present invention is used, the RAM such as a buffer can be omitted. Due to (6) of the first embodiment, the reliability of a high-temperature operation performed outdoors in fine weather can also be improved.

(Ninth Embodiment)

Figure 15:
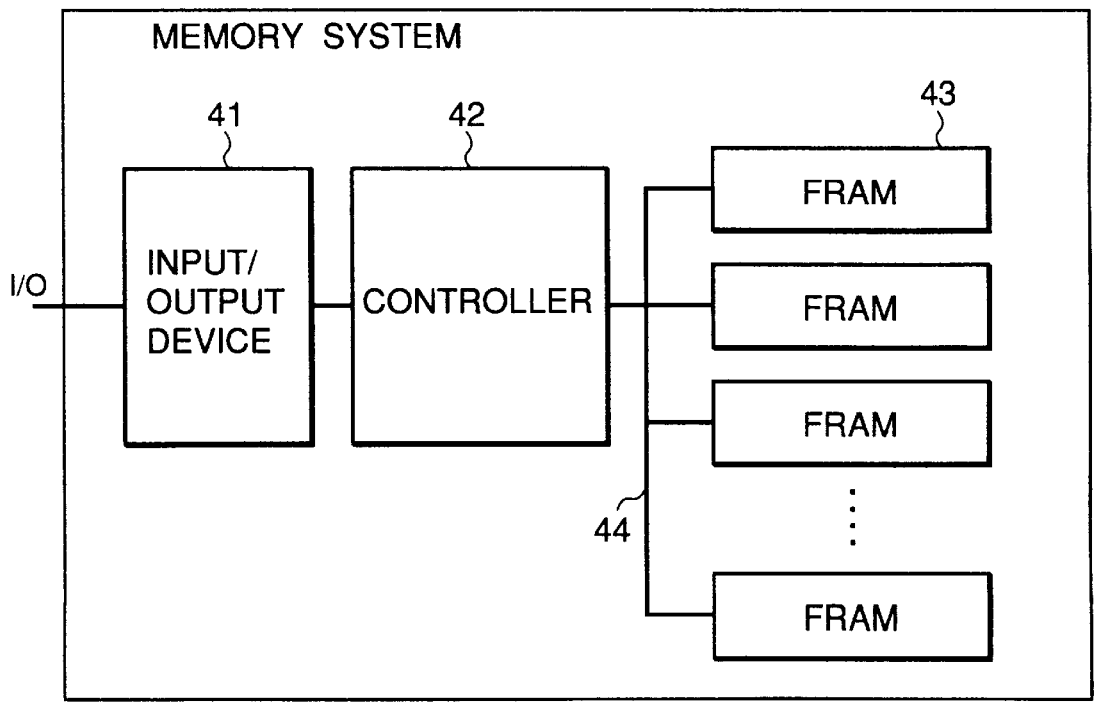
FIG. 15 is a block diagram showing a memory system having an FRAM according to the ninth embodiment.

FIG. 15 is a block diagram showing the basic structure of a memory system according to the ninth embodiment of the present invention.

This system is constituted by a plurality of FRAMs 43 for storing data, an input/output device 41 for transmitting data between these FRAMs 43 and an external device, a controller 42 arranged between the FRAMs 43 and the input/output device 41, and a system bus 44.

In this embodiment, the semiconductor memory device (FRAM) of the present invention is applied to a memory system as a substitute of a memory card or a hard disk. Details of the FRAM used in this embodiment are the same as in the first embodiment, and a detailed description thereof will be omitted.

In the memory system using the FRAM of the present invention, because of (1) and (2) described in the first embodiment, large-volume image data can be stored in a compact device. The FRAM achieves a high-speed operation and a low power consumption on the basis of (4) and (5) of the first embodiment. When the FRAM is used as a memory or an expanded memory of a mobile device or the like, the service life of the battery can be prolonged. In accordance with (7) of the first embodiment, the memory system is resistant to a sudden power failure. In addition, ECC control is enabled by the controller.

(10th Embodiment)

Figure 16:
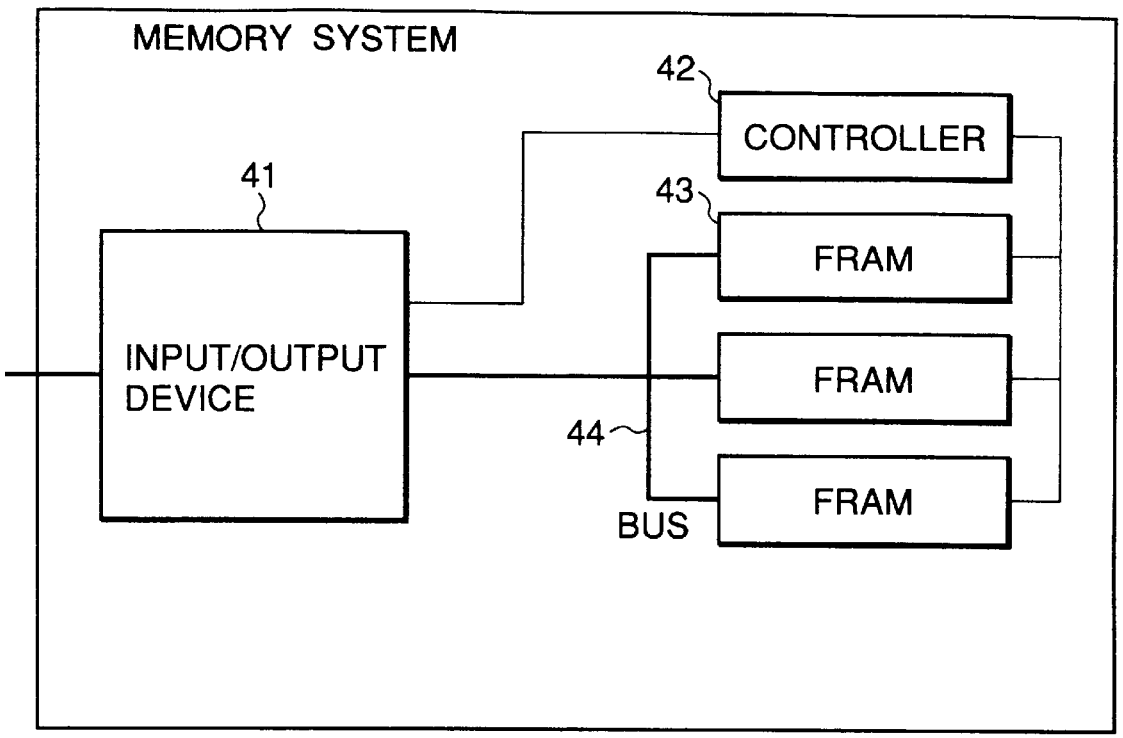
FIG. 16 is a block diagram showing a memory system according to the 10th embodiment.

FIG. 16 is a block diagram showing the basic structure of a memory system according to the 10th embodiment of the present invention. The same reference numerals as in FIG. 15 denote the same parts in FIG. 16, and a detailed description thereof will be omitted.

This embodiment is different from the ninth embodiment in that FRAMs 43 are directly connected to an input/output device 41, and a controller 42 is arranged independently of a bus 44. In this structure as well, the same effects as in the ninth embodiment can be obtained.

(11th Embodiment)

Figure 17:
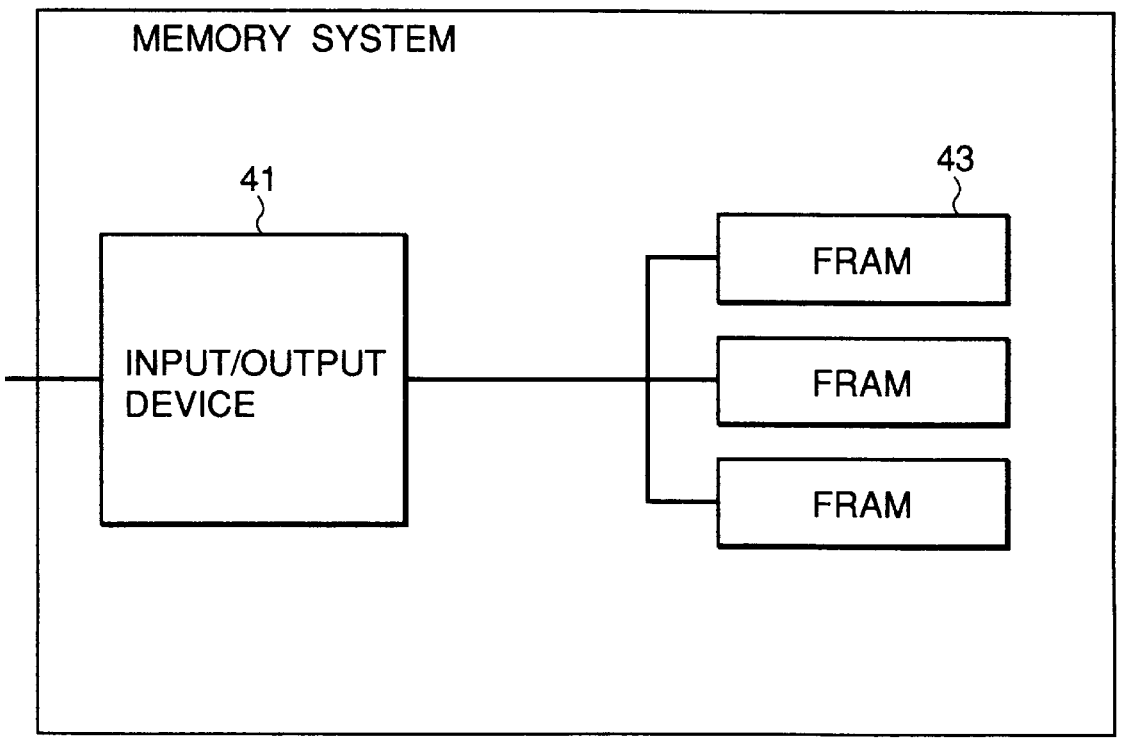
FIG. 17 is a block diagram showing a memory system according to the 11th embodiment.

FIG. 17 is a block diagram showing the basic structure of a memory system according to the 11th embodiment of the present invention. The same reference numerals as in FIG. 15 denote the same parts in FIG. 17, and a detailed description thereof will be omitted.

This embodiment is different from the ninth embodiment in that the controller 42 is omitted, and the memory system is realized with the minimum structure of an input/output device 41 and FRAMs 43.

In this structure as well, the same effects as in the ninth embodiment can be obtained. In addition, since the system structure is simple, the cost can be further reduced.

(12th Embodiment)

Figure 18:
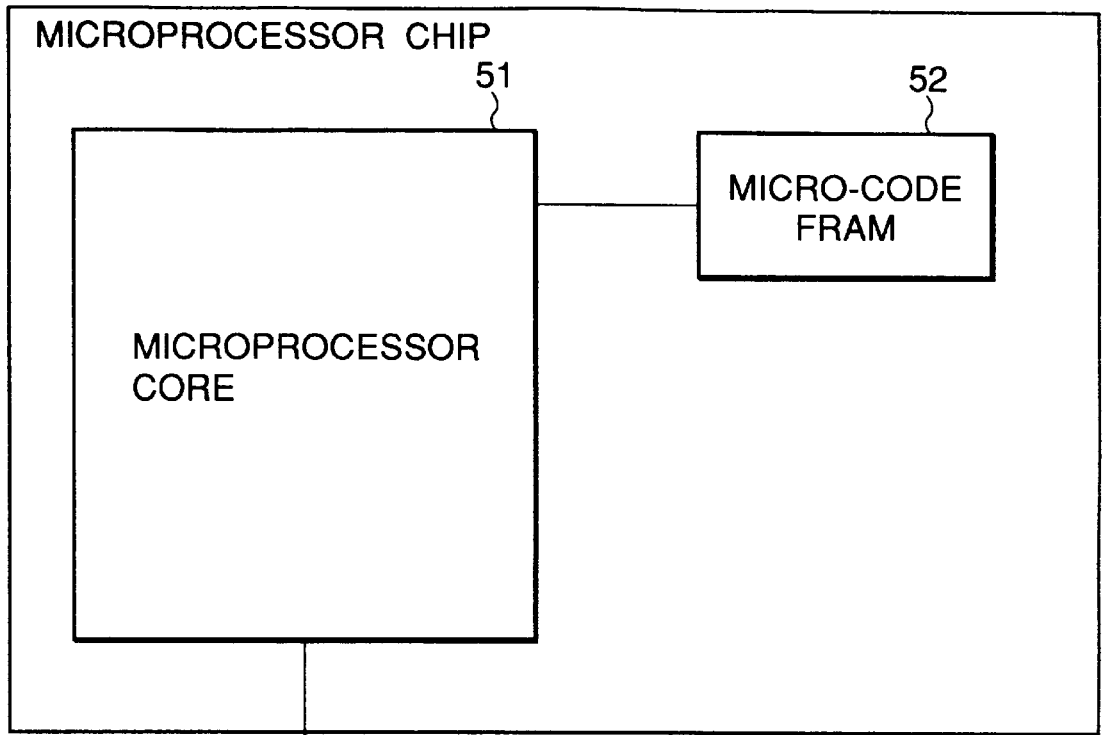
FIG. 18 is a schematic view showing an MPU chip having an FRAM according to the 12th embodiment.

FIG. 18 is a block diagram showing the basic structure of a microprocessor chip according to the 12th embodiment of the present invention.

This system is constituted by forming, on the same chip, a microprocessor core unit (MPU) 51 for performing various arithmetic processing operations and an FRAM 52 for storing data. The FRAM 52 is used as the micro-code memory of the MPU 51.

In this embodiment, the semiconductor memory device (FRAM) of the present invention is mounted in a system LSI such as an MPU. Details of the FRAM used in this embodiment are the same as in the first embodiment, and a detailed description thereof will be omitted.

In the microprocessor chip in which the FRAM of the present invention is mounted, the instruction from the MPU can be easily changed by changing the micro-code stored in the FRAM.

Because of (1) and (2) described in the first embodiment, a large-volume micro-code can be stored in a compact device. When the micro-code is replaced in a normal FRAM, no high-performance MPU can be realized because the FRAM operates at a low speed. However, due to (4) and (5) of the first embodiment, a high-speed MPU with a low power consumption can be realized. Since the MPU has a very large power consumption and operates at a high temperature, the conventional FRAM which requires the refresh operation cannot be mounted. However, according to (6) of the first embodiment, even the high-temperature MPU can have the high-speed nonvolatile micro-code memory. In addition, because of (7) of the first embodiment, the microprocessor chip is resistant to noise from the digital section of the MPU.

(13th Embodiment)

Figure 19:
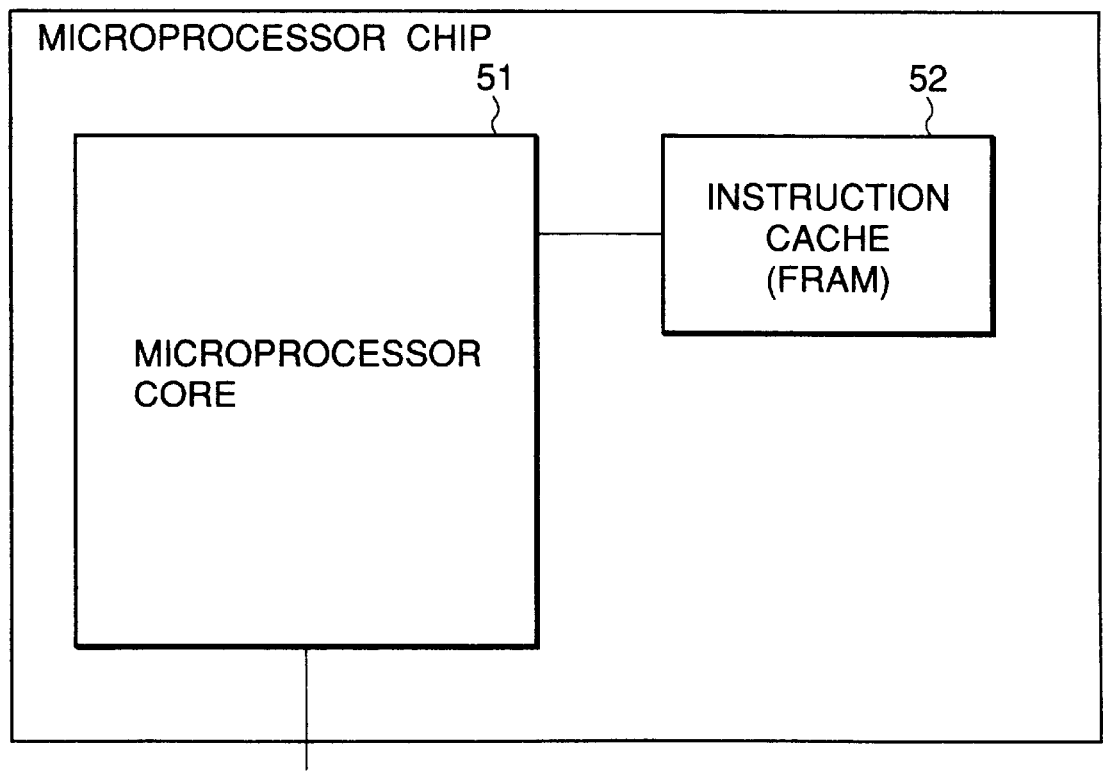
FIG. 19 is a schematic view showing an MPU chip having an FRAM according to the 13th embodiment.

FIG. 19 is a block diagram showing the basic structure of a microprocessor chip according to the 13th embodiment. The same reference numerals as in FIG. 18 denote the same parts in FIG. 19, and a detailed description thereof will be omitted.

This embodiment is different from the 12th embodiment in that an FRAM 52 is used as an instruction cache memory in an MPU 51. When the FRAM 52 is mounted as an instruction cache memory in the MPU 51, a high-speed nonvolatile cache memory can be realized.

Because of (1) and (2) described in the first embodiment, a compact and large-capacity instruction cache memory can be mounted. When the instruction cache memory is replaced with a normal FRAM, no high-performance MPU can be realized because the FRAM operates at a low speed. However, due to (4) and (5) of the first embodiment, a high-speed MPU with a low power consumption can be realized. Since the MPU has a very large power consumption and operates at a high temperature, the conventional FRAM which requires the refresh operation cannot be mounted. However, according to (6) of the first embodiment, even the high-temperature MPU can have the high-speed nonvolatile instruction cache memory. In addition, because of (7) of the first embodiment, the microprocessor chip is resistant to noise from the digital section of the MPU.

(14th Embodiment)

Figure 20:
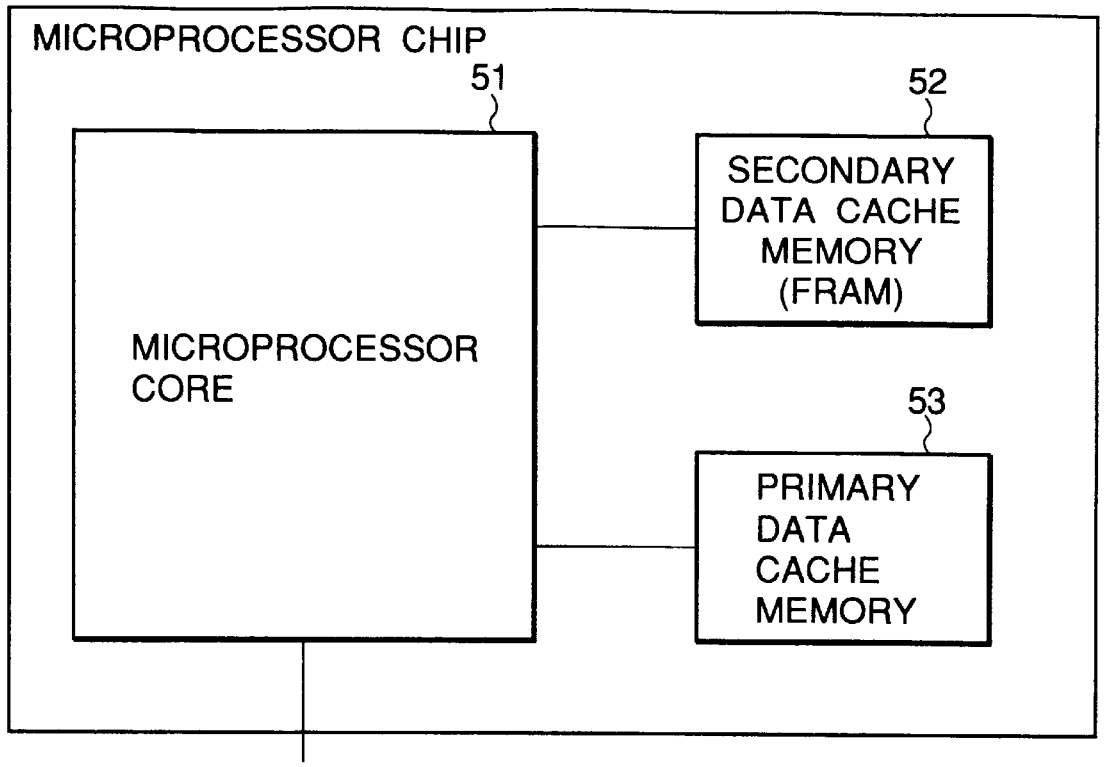
FIG. 20 is a schematic view showing an MPU chip having an FRAM according to the 14th embodiment.

FIG. 20 is a block diagram showing the basic structure of a microprocessor chip according to the 14th embodiment. The same reference numerals as in FIG. 18 denote the same parts in FIG. 20, and a detailed description thereof will be omitted.

This embodiment is different from the 12th embodiment in that an FRAM 52 is used as a secondary data cache memory in an MPU 51. In this embodiment, a high-speed memory 53 such as an SRAM is used as a primary data cache memory. Both the primary and secondary cache memories may be used as the FRAM of the present invention. Alternatively, the MPU and the FRAM of the present invention may be used for an arbitrary purpose.

When the FRAM 52 is mounted as the secondary data cache memory of the MPU 51, a high-speed nonvolatile cache memory can be realized.

Because of (1) and (2) described in the first embodiment, a compact and large-capacity data cache memory can be mounted. When the data cache memory is replaced with a normal FRAM, no high-performance MPU can be realized because the FRAM operates at a low speed. However, due to (4) and (5) of the first embodiment, a high-speed MPU with a low power consumption can be realized. Since the MPU has a very large power consumption and operates at a high temperature, the conventional FRAM which requires the refresh operation cannot be mounted. However, according to (6) of the first embodiment, even the high-temperature MPU can have the high-speed nonvolatile instruction cache memory. In addition, because of (7) of the first embodiment, the microprocessor chip is resistant to noise from the digital section of the MPU.

(15th Embodiment)

Figure 21:
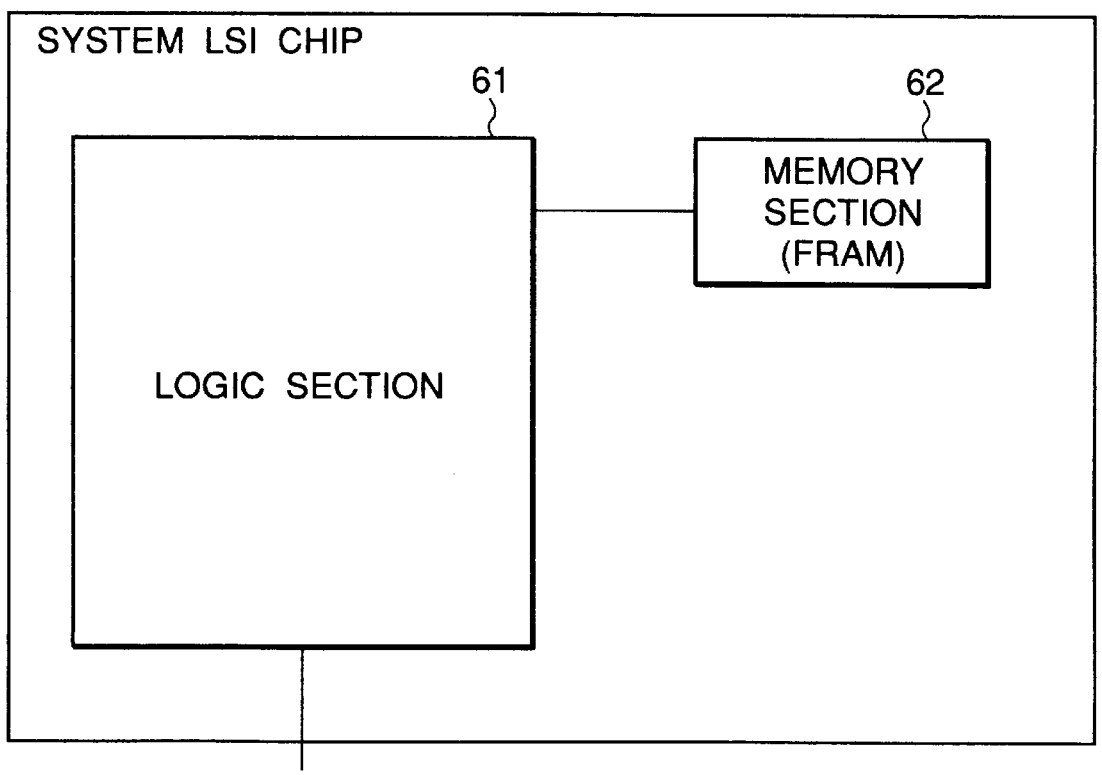
FIG. 21 is a block diagram showing a system LSI chip having an FRAM according to the 15th embodiment.

FIG. 21 is a block diagram showing the basic structure of a system LSI chip according to the 15th embodiment of the present invention.

This system is constituted by mounting, on the same chip, a logic section 61 for performing various calculations and an FRAM 62 for storing data.

In this embodiment, the semiconductor memory device (FRAM) of the present invention is mounted in a system LSI. Details of the FRAM used in this embodiment are the same as in the first embodiment, and a detailed description thereof will be omitted.

In the system LSI chip having the FRAM of the present invention, a small-area large-capacity chip can be realized because of (1) and (2) described in the first embodiment. Since the LSI chip is adaptive to a high-speed operation, a low power consumption, and a high-temperature environment due to (4) to (6) of the first embodiment, the performance of the system LSI can be largely improved. In addition, the system LSI is resistant to digital noise because of (7) of the first embodiment.

(16th Embodiment)

Figure 22:
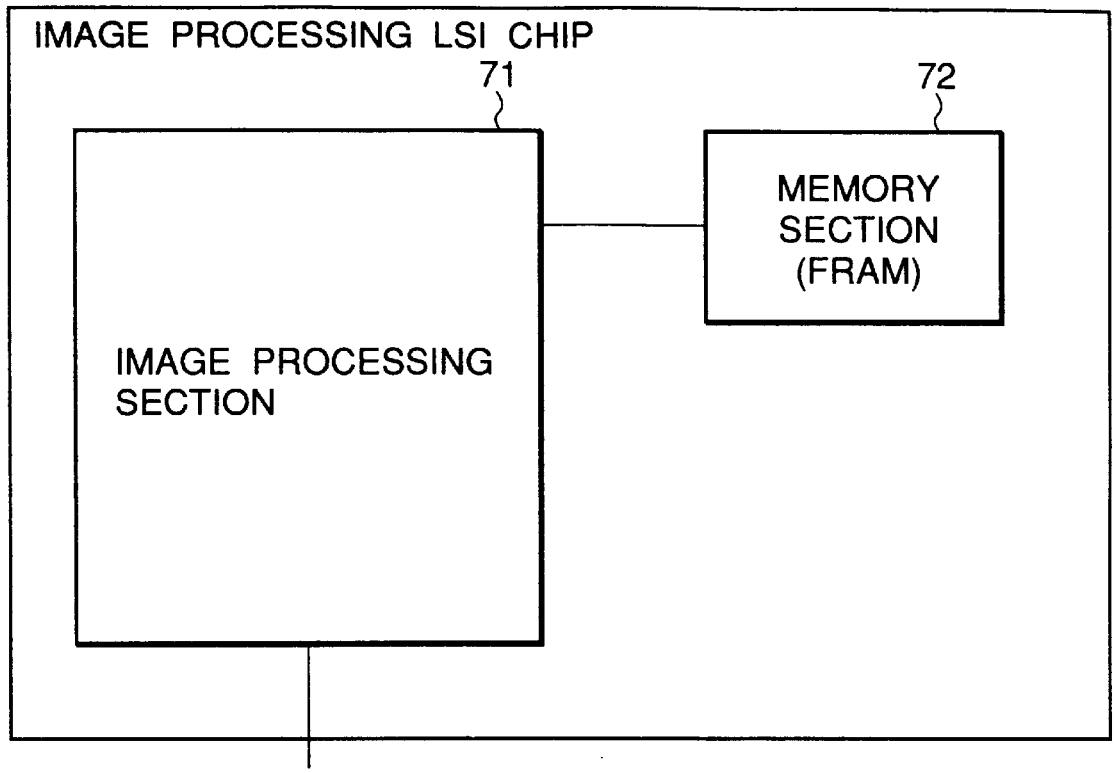
FIG. 22 is a block diagram showing an image processing LSI chip having an FRAM according to the 16th embodiment.

FIG. 22 is a block diagram showing the basic structure of an image processing LSI chip according to the 16th embodiment of the present invention.

This system is constituted by mounting, on the same chip, an image processing unit 71 for performing various image processing operations and an FRAM 72 for storing data.

In this embodiment, the semiconductor memory device (FRAM) of the present invention is mounted in an image processing LSI. Details of the FRAM used in this embodiment are the same as in the first embodiment, and a detailed description thereof will be omitted.

In the image processing LSI chip having the FRAM of the present invention, a small-area large-capacity chip can be realized because of (1) and (2) described in the first embodiment. Since the LSI chip is adaptive to a high-speed operation, a low power consumption, and a high-temperature environment due to (4) to (6) of the first embodiment, image processing data or compressed data can be quickly written in or read out. In addition, the image processing LSI is resistant to digital noise because of (7) of the first embodiment.

(17th Embodiment)

Figure 23:
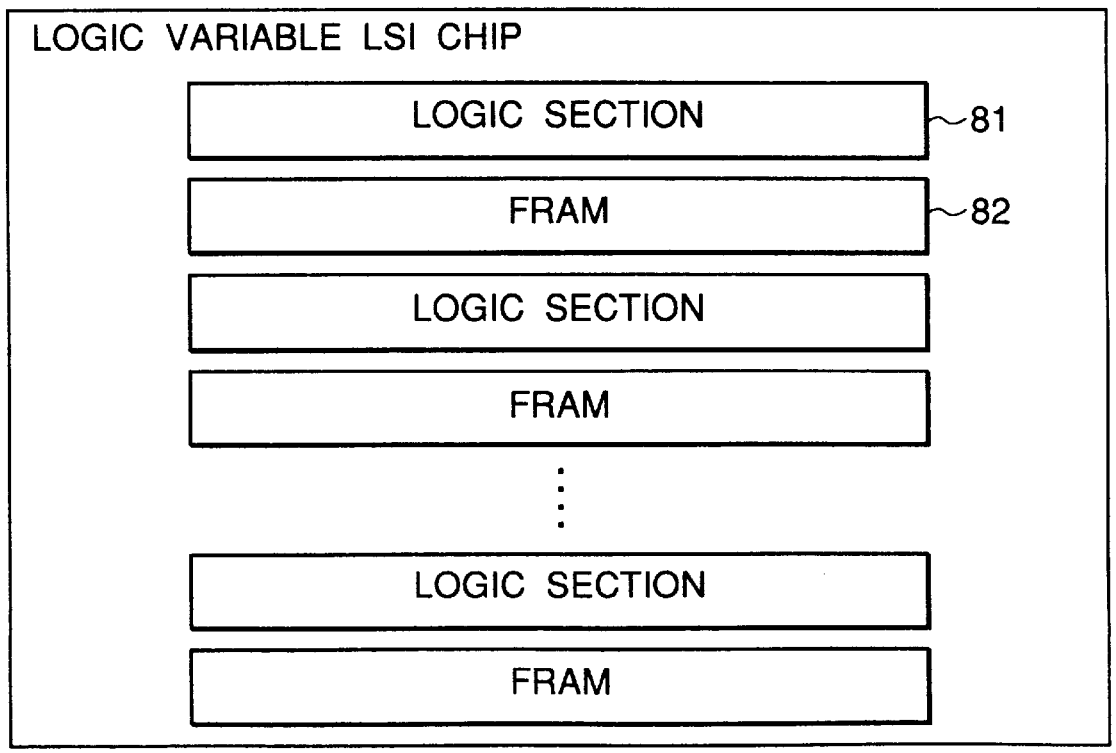
FIG. 23 is a block diagram showing a logic variable LSI chip having an FRAM according to the 17th embodiment.

FIG. 23 is a block diagram showing the basic structure of a logic variable LSI chip according to the 17th embodiment of the present invention.

This system is constituted by mounting, on the same chip, a plurality of logic sections 81 for performing different logic calculations and FRAMs 82 respectively corresponding to the logic sections 81.

In this embodiment, the FRAM of the present invention is mounted as a memory for changing the logic of a logic variable LSI. Details of the FRAM used in this embodiment are the same as in the first embodiment, and a detailed description thereof will be omitted.

In an FPD, an FPGA, or a logic whose logic calculation is reconfigurable, the combinations of logics must be quickly changed using a nonvolatile chip having a small area. The FRAM of the present invention can realize a small-area large-capacity chip on the basis of (1) and (2) described in the first embodiment. The LSI chip is optimum because it is adaptive to a high-speed operation, a low power consumption, and a high-temperature environment due to (4) to (6) of the first embodiment. In addition, the memory is resistant to digital noise because of (7) of the first embodiment. Furthermore, a quick ON/OFF response is obtained due to (8) of the seventh embodiment.

In the logic variable LSI of this embodiment, the FRAMs may be arranged at one position. The FRAMs may be distributed, as shown in FIG. 23, or distributed in units of modules.

(18th Embodiment)

Figure 24:
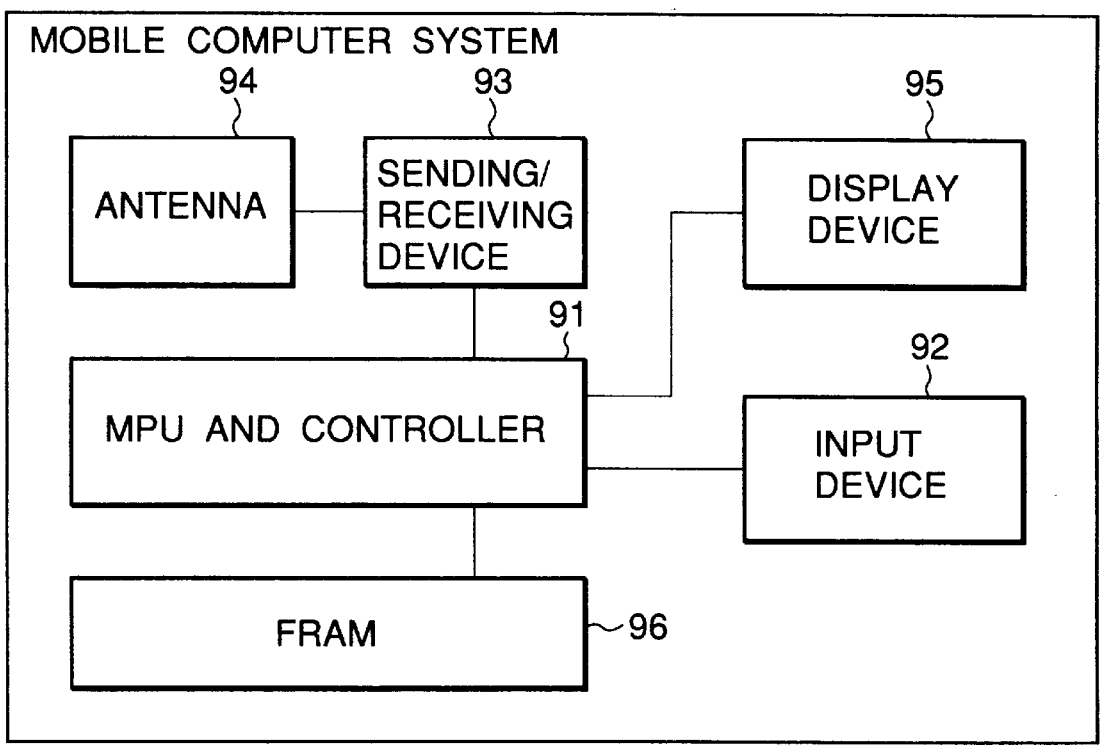
FIG. 24 is a block diagram showing a mobile computer system having an FRAM according to the 18th embodiment.

FIG. 24 is a block diagram showing the basic structure of a mobile computer system according to the 18th embodiment of the present invention.

This system is constituted by a microprocessor (an MPU and a controller: to be abbreviated as an "MPU" hereinafter) 91 for performing various arithmetic processing operations, an input device 92 connected to the MPU 91 to input data, a sending/receiving device 93 connected to the MPU 91 to send/receive data to/from an external device, an antenna 94 connected to the sending/receiving device 93, a display device 95 such as an LCD connected to the MPU 91 to display necessary information, and an FRAM 96 connected to the MPU 91 to store data.

The sending/receiving device 93 has a radio wave sending/receiving function used for a mobile phone or the like. As the display device 95, an LCD or a plasma display may be used. A hand touch device, a key input device, a voice input device, an image input device such as CCD or the like can be applied to the input device 92.

In this embodiment, the semiconductor memory device (FRAM) of the present invention is mounted in a mobile computer system. Details of the FRAM used in this embodiment are the same as in the first embodiment, and a detailed description thereof will be omitted.

In the mobile computer system in which the FRAM of the present invention is mounted, a small-area large-capacity memory unit can be realized because of (1) and (2) described in the first embodiment, and data processing, data storage, and data reading at a high speed are enabled due to (4) to (6) of the first embodiment. In addition, the low power consumption prolongs the service life of the battery, and the system is adaptive to a high-temperature environment. The system is resistant to digital noise or electromagnetic noise because of (7) of the first embodiment. Furthermore, a quick ON/OFF response is obtained due to (8) of the seventh embodiment. Therefore, an excellent mobile computer system can be realized.

The embodiments of various systems using the FRAMs of the present invention have been described above. Various embodiments of FRAMs of the present invention will be described below.

(19th Embodiment)

Figure 25:
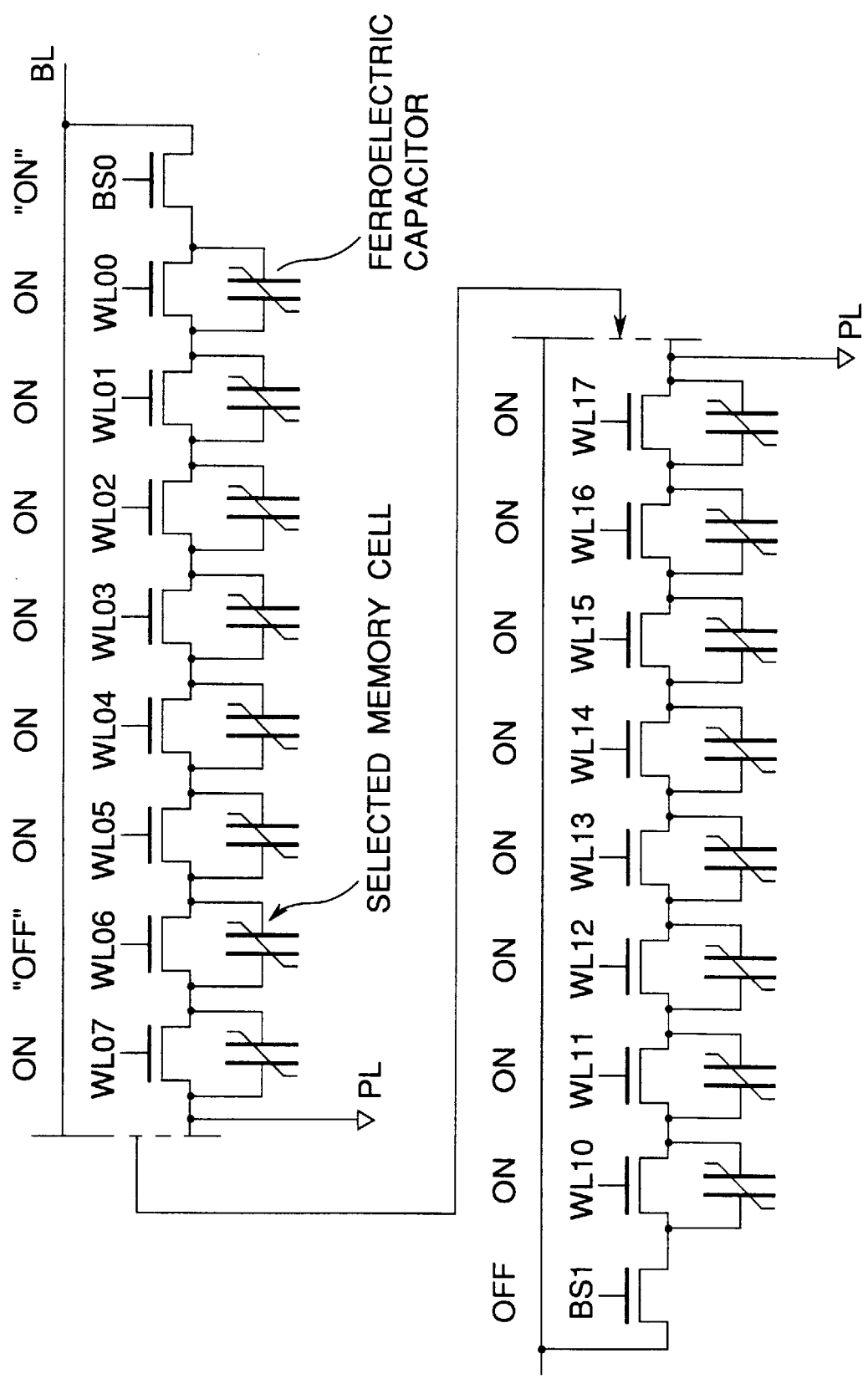
FIG. 25 is an equivalent circuit diagram showing the basic structure of an FRAM according to the 19th embodiment.

FIG. 25 is an equivalent circuit diagram showing the basic structure of an FRAM according to the 19th embodiment of the present invention. This embodiment is different from the first embodiment shown in FIGS. 5A and 5B in that the number of series connected cells in one memory block is eight, i.e., twice that shown in FIGS. 5A and 5B.

In the conventional NAND cell, when the number of series connected cells is increased, the bit line capacity can be decreased. However, when the number of cells is excessively increased, and data is to be read out from a cell far from the bit line, the bit line capacity increases by an amount corresponding to other cell capacities from the bit line to the target read cell. For this reason, the number of series connected cells is limited to about four.

In the present invention, the number of series connected cells can be further increased, and simultaneously, the bit line capacity can be largely decreased. When the number of series connected cells increases, the capacity on the drain side of a select transistor or the diffusion layer capacity can be reduced to 1/n (n is the number of series connected cells) because of the decrease in the number of bit line die conductor portions. Even when n increases, the two terminals of a ferroelectric capacitor of an unselected memory cell in a selected block are short-circuited in reading cell data, and the capacity of the ferroelectric capacitor electrically disappears. Therefore, only a small capacity corresponding to the inverted capacity and diffusion layer capacity of the gate of the select transistor is added in correspondence with the increase in the number of cells. Therefore, the number of series connected cells can be increased to 8 (FIG. 25), 16, or 32.

When the number of series connected cells increases, a problem of read/write time is posed. Assume that the ON resistance of a transistor is 12 k Ω, the resistance of a diffusion layer is 1 k Ω, and the capacity of a ferroelectric capacitor is 30 fF. In this case, the RC time constant per stage is 13k×30f=0.4 ns. The RC time constant is 1.6 ns for four stages, and 3.2 ns for eight stages. Normally, the read delay of a word line (and a block selection line) is 5 to 10 ns, and the data rewrite time is 20 to 30 ns. In consideration of this fact, the above RC time is almost no problem.

When the cells are connected in series, a small voltage is applied across the ferroelectric capacitor due to the ON resistance of the cell transistor of an unselected memory cell. However, the delay of the block selection line is 5 to 10 ns and larger than the RC time constant due to the ON resistance of the cell transistor by at least one order of magnitude. On the basis of this fact, when the number of series-connected stages increases, the voltage instantaneously applied at the time of rising of the block selection line per cell decreases, so no problem is posed.

When eight stages are connected, as in this embodiment, and the bit line post-forming cell structure shown in FIGS. 6A and 6B is employed, the cell size including the select transistor is represented as follows:

$$(18F \times 2F)/8 = 4.5F^2$$

When the bit line pre-forming cell structure shown in FIGS. 7A and 7B is employed, the cell size is represented as follows:

$$(19F \times 2F)/8 = 4.75F^2$$

That is, as the number of stages increases, the cell size approaches to $4F^2$.

(20th Embodiment)

Figure 26:
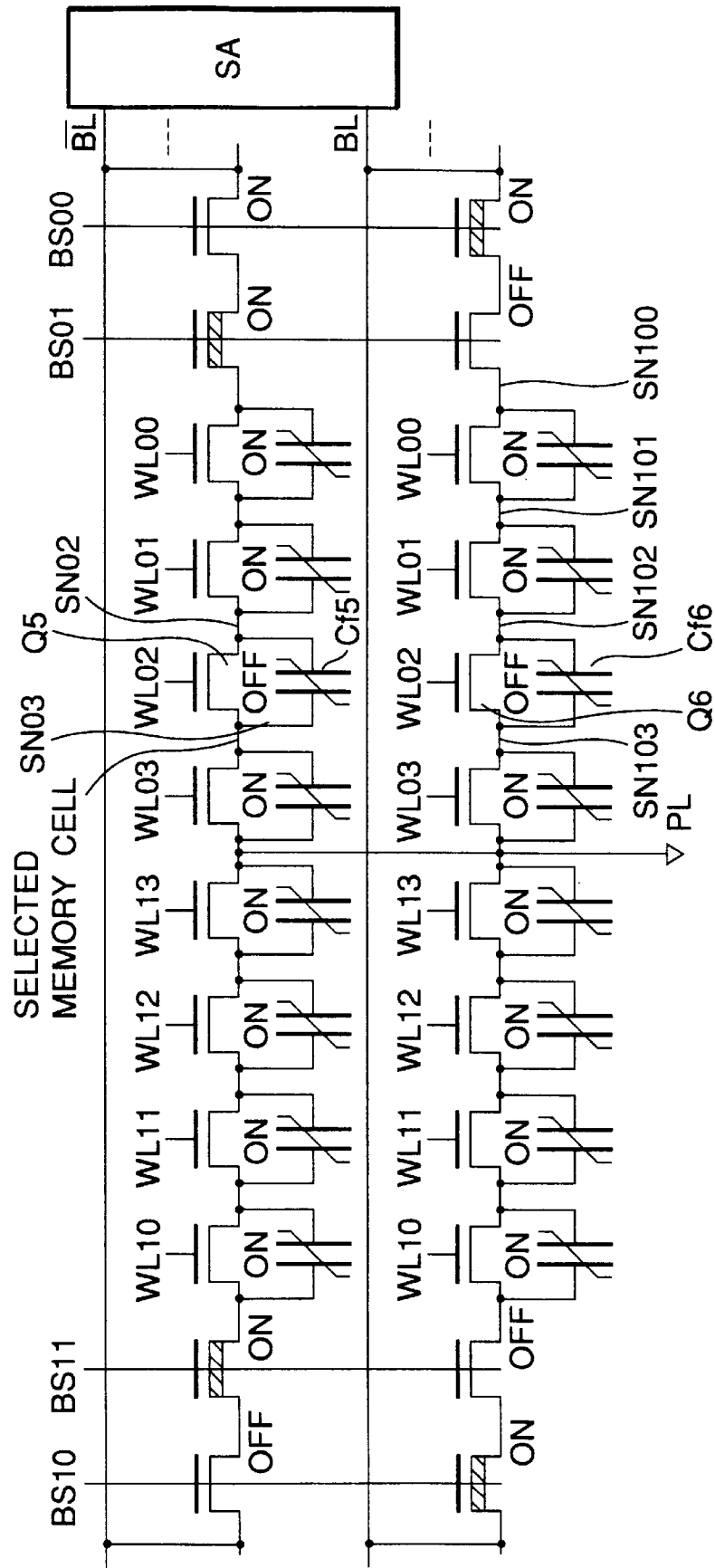
FIG. 26 is an equivalent circuit diagram showing the basic structure of an FRAM according to the 20th embodiment.

FIG. 26 is an equivalent circuit diagram showing the basic structure of an FRAM according to the 20th embodiment of the present invention.

In this embodiment, one more select transistor is added to the structure shown in FIGS. 5A and 5B. A pair of adjacent bit lines BL and $\overline{BL}$ of the same cell array are connected to a sense amplifier SA, thereby forming a folded bit line structure. One of the select transistors is a D-type (Depletion-type) transistor, and the other select transistor is an E-type (Enhancement-type) transistor. With this structure, one of the select transistors is ON regardless of the voltage of the block selection line, so that a short-circuit state is equivalently set. Therefore, the other select transistor is controlled by the remaining block selection lines.

More specifically, for a memory block connected to the bit line $\overline{BL}$ through two select transistors, the select transistor on the bit line $\overline{BL}$ side is an E-type transistor, and the select transistor on the memory block side is a D-type transistor. Similarly, for a memory block connected to the bit line BL through two select transistors, the select transistor on the bit line BL side is a D-type transistor, and the select transistor on the memory block side is an E-type transistor.

Consider a case wherein an arbitrary memory cell (Q5, Cf5) in FIG. 26 is to be selected. A word line WL02 is set at "L", and only a block selection line BS00 is set at "H". Both the select transistors connected to the bit line $\overline{BL}$ side are turned on, and one of the select transistors connected to the bit line BL side is kept OFF. Therefore, cell data is read/written only on the bit line $\overline{BL}$ side. The bit line BL serves as a reference bit line. The folded bit line structure is formed, and the array noise is reduced, as in the DRAM.

With the folded bit line structure, a cell transistor Q6 of a cell (Q6, Cf6) in the memory block on the unselected side is turned off in the active state. A storage node SN103 is short-circuited to a plate electrode PL and set at an equipotential. Storage nodes SN100 to SN102 are also set at an equipotential because of the short-circuit of the cell transistors. When a leakage current such as a p-n junction leakage current is generated in any one of the storage nodes SN100 to SN102, the potential of the storage nodes SN100 to SN102 becomes lower than that of the storage node SN103, so the accumulated polarization is destroyed.

However, this problem is posed only when the ferroelectric memory is in the active state. In a normal memory such as a DRAM, the maximum active time (tRASmax) is limited to 10 μs. This time is shorter than the maximum refresh time (tREFmax: 64 ms for a 64-Mbit DRAM) of the normal DRAM. The specifications can be relaxed, and no problem is posed. More specifically, the original short-circuit state is set at the end of the active time to restore the data. To further relax the specifications, the specifications for tRAS, tCE, and the like may be tightened. This problem is not posed in the circuit shown in FIGS. 5A and 5B, as a matter of course.

The substantial difference between the FRAM of this embodiment and the conventional FRAM will be described. In the conventional FRAM, since one terminal of the ferroelectric capacitor is floating, the stand-by time is infinite, and the refresh operation is necessary. In this embodiment, since one terminal and the other terminal are always short-circuited, the refresh operation is unnecessary. In the folded bit line structure, some cells are floating only for the active time. However, the active time is finite, and no problem is posed.

FIGS. 27A and 27B show a cell structure for realizing the circuit structure shown in FIG. 26. FIG. 27A is a plan view showing a part from the plate electrode PL to a bit line contact at one terminal. FIG. 27B is a sectional view showing a part from a bit line contact at one terminal to that at the other terminal. This is a stack cell structure in which the ferroelectric capacitors are formed after formation of the cell transistors and, more particularly, a bit line post-forming cell structure in which the bit lines are formed after formation of the ferroelectric capacitors. This structure is different from that shown in FIGS. 6A and 6B in that a block selection line is added, and a mask for D-type channel ion implantation (DCI) is added.

FIGS. 28A and 28B show another cell structure for realizing the circuit structure shown in FIG. 26. FIG. 28A is a plan view showing a part from the plate electrode PL to the bit line contact at one terminal. FIG. 28B is a sectional view showing a part from the bit line contact at one terminal to that at the other terminal. This is a stack cell structure in which the ferroelectric capacitors are formed after formation of the cell transistors and, more particularly, a bit line pre-forming cell structure in which the bit lines are formed before formation of the ferroelectric capacitors. This structure is different from that shown in FIG. 7 in that a block selection line is added, and a mask for D-type channel ion implantation (DCI) is added.

When the bit line post-forming cell structure shown in FIGS. 27A and 27B is employed for a folded bit line structure with eight stages, the cell size including the select transistor is represented as follows:

$$(20F \times 2F)/8 = 5F^2$$

For the bit line pre-forming cell structure shown in FIGS. 28A and 28B, the cell size is represented as follows:

$$(21F \times 2F)/8 = 5.25F^2$$

That is, as the number of stages increases, the cell size approaches to the ideal size of $4F^2$.

Figure 29A:
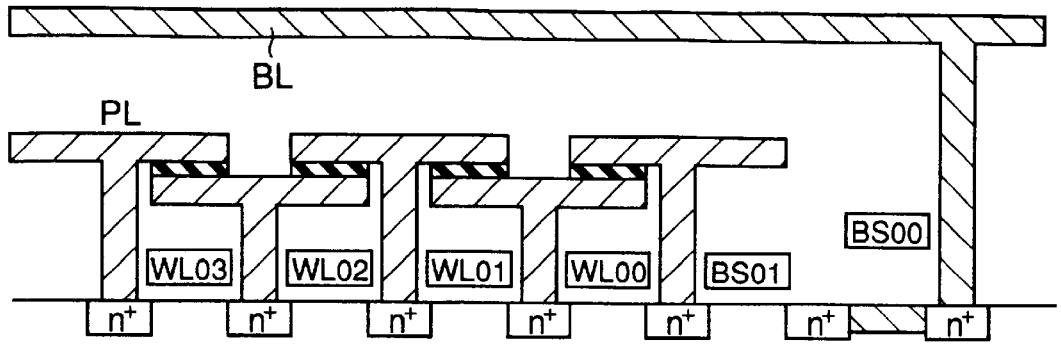
FIGS. 29A to 29D are sectional views, respectively, showing still another memory cell structure for realizing the circuit structure shown in FIG. 26.
Figure 29B:
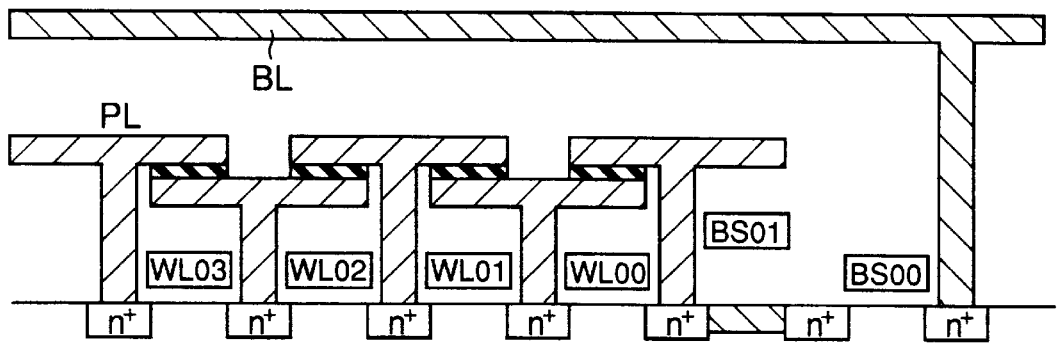

In FIG. 26, instead of using the D-type transistor, a block selection line passing through the transistor portion may be arranged to form a field transistor, as shown in FIGS. 29A and 29B. An $n^+$-type layer is formed under a field oxide film, and regions which originally serve as a source and a drain may be connected to each other. In FIG. 29A, the field transistor is formed on the side of the block selection line BS0. In FIG. 29B, the field transistor is formed on the side of the block selection line BS1 side. Another interconnection formed above the block selection line may be used to connect the regions which originally serve as a source and a drain.

Figure 29C:
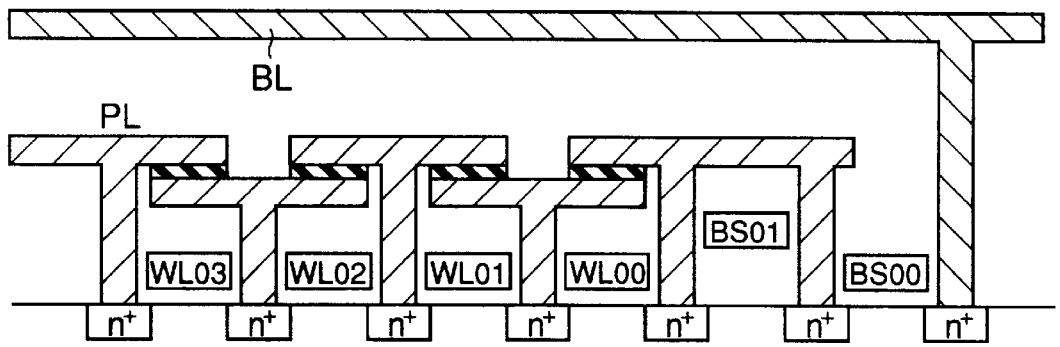
Figure 29D:
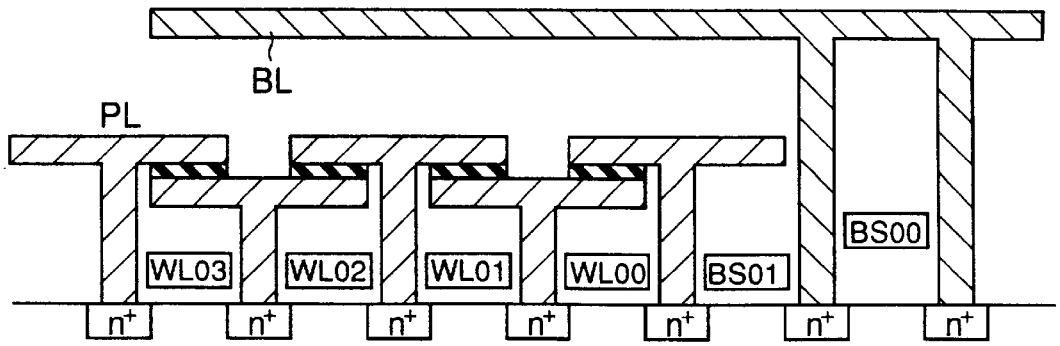

As shown in FIG. 29C, the storage node layers may be properly connected to each other. Alternatively, the number of bit line die conductors may be increased, as shown in FIG. 29D. When a D-type transistor is used, the capacity of the inverted layer of the channel of the D-type transistor appears as a bit line capacity, so that the bit line capacity increases. This problem can be solved by a structure without any D-type transistor, as shown in FIGS. 29A to 29D. This applies to all embodiments using a D-type block select transistor.

(21st Embodiment)

FIGS. 30A to 30C are views showing the schematic structure of an FRAM according to the 21st embodiment of the present invention. In this embodiment, the memory of the present invention is formed by a plurality of cell array blocks and a plurality of sense amplifier blocks.

FIG. 30A shows an open bit line structure to which the embodiment shown in FIGS. 5A and 5B can be applied. Bit lines BL are alternately extracted to sense amplifiers SA at cell array terminals, thereby relaxing the sense amplifier rule.

FIG. 30B shows a folded bit line structure to which the embodiment shown in FIG. 26 can be applied. When a signal φ ti is to be read out, the potential of the unselected one of the left and right cell arrays is lowered. With this structure, the sense amplifier SA can be shared, and the number of sense amplifiers can be halved.

Figure 31:
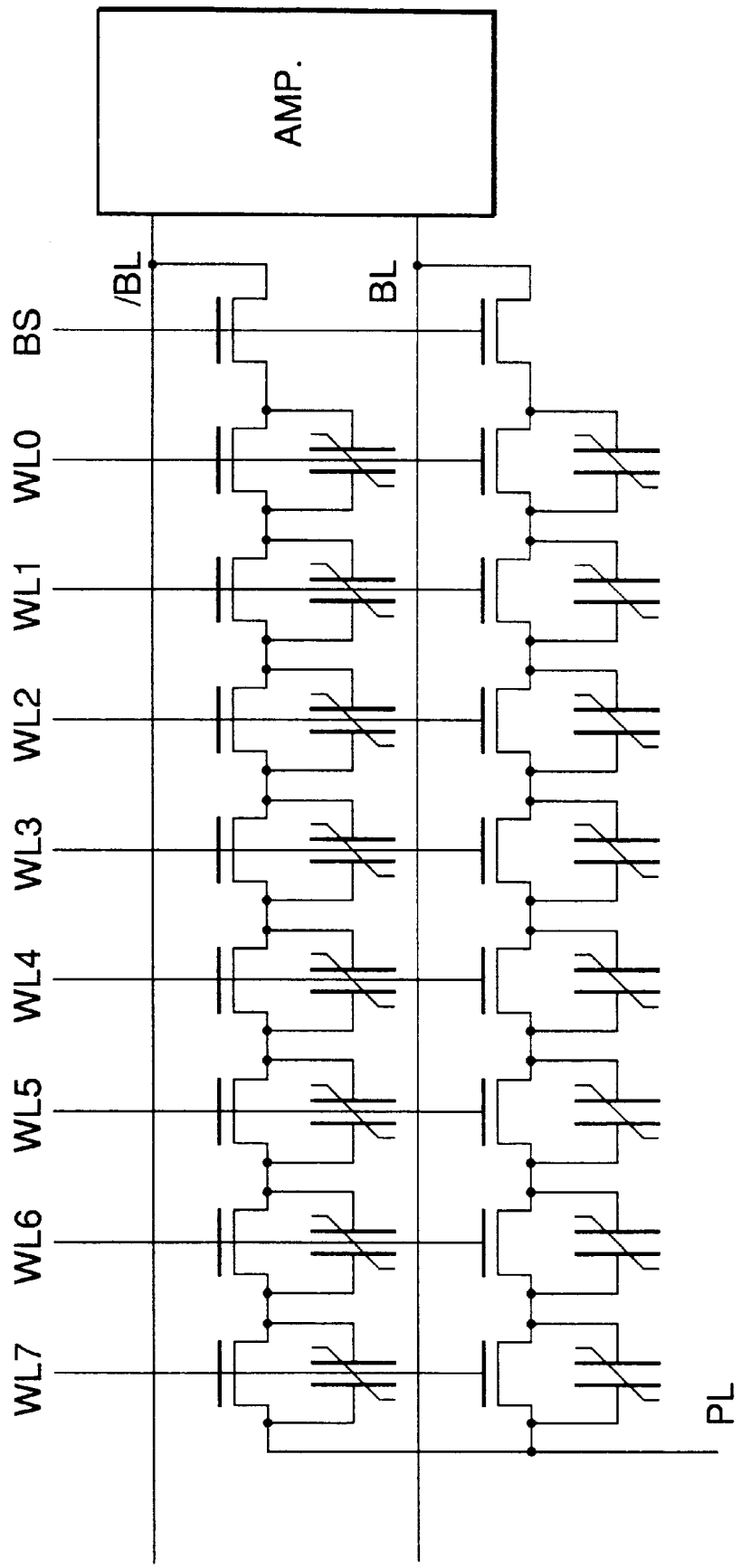
FIG. 31 is a circuit diagram showing an example wherein a folded bit line structure is realized in the circuit shown in FIGS. 5A and 5B.

In the circuit shown in FIGS. 5A and 5B as well, when 1-bit data is stored in two cells, data "1" ("0") is written on the bit line BL side, and data "0" ("1") is written on a bit line $\overline{BL}$ side, the folded bit line structure can be easily realized, as shown in FIG. 30B, detailed in FIG. 31. In this case, the conventional cell size of $8F^2$ can be halved to $4F^2$. Therefore, the read reliability can be improved, and dummy cells can be omitted without changing the chip size, unlike the conventional 1-transistor/1-ferroelectric capacitor structure.

FIG. 30C shows a structure in which the bit lines BL and the sense amplifier SA are time-divisionally connected, to which both embodiments shown in FIGS. 5A and 5A and FIG. 26 can be applied.

(22nd Embodiment)

Figure 32A:
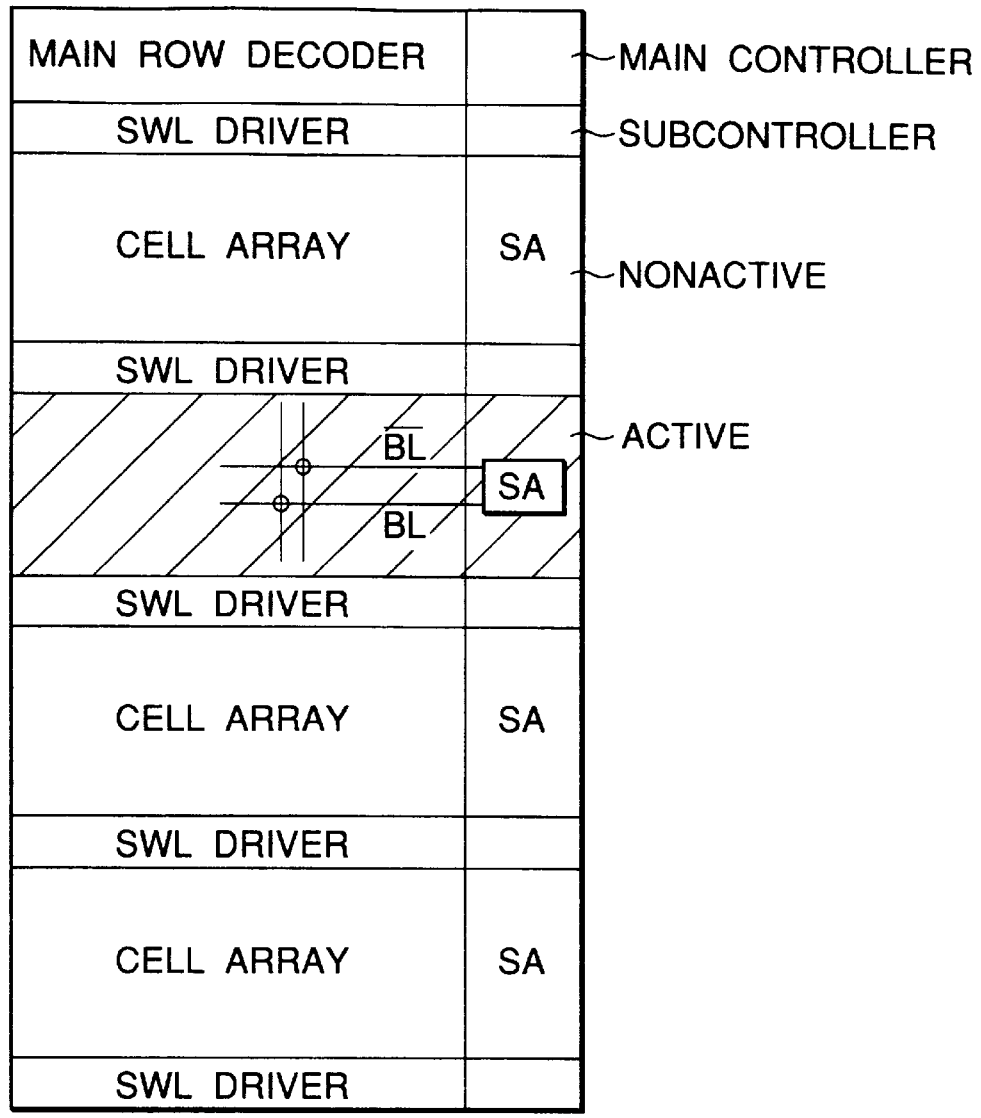
FIGS. 32A and 32B are block diagrams showing the schematic structure of an FRAM according to the 22nd embodiment.
Figure 32B:
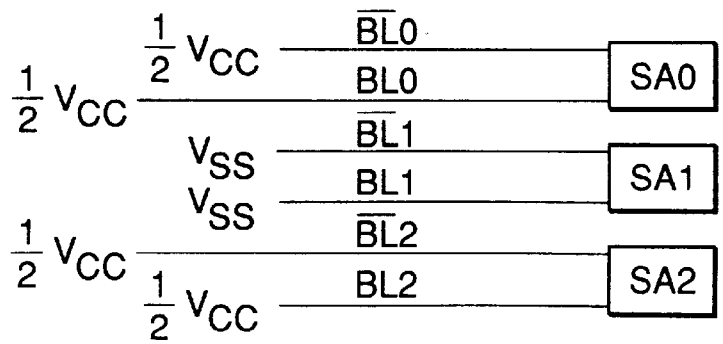

FIGS. 32A and 32B are block diagrams showing the schematic structure of an FRAM according to the 22nd embodiment of the present invention. To this structure as well, both embodiments shown in FIGS. 5A and 5B and FIG. 26 can be applied.

In FIG. 32A, each of a cell array block and a sense amplifier block is divided into a plurality of subblocks along the word line. By activating some subblocks or only one subblock of all subblocks, the active current can be largely decreased. This structure is normally used for the scheme of changing the potential of a plate electrode PL from 0V to Vcc because the load capacity of PL driving is large. In the scheme of fixing the plate electrode at (½)Vcc, the refresh operation is necessary. For this reason, the number of subblocks cannot be optionally increased to reduce the number of columns to be activated. In this embodiment, however, the refresh operation can be omitted. Therefore, even in the scheme of fixing the plate electrode at (½)Vcc, the number of subblocks can be sufficiently increased to reduce the number of columns to be activated, thereby reducing the current consumption.

In the scheme of fixing the plate electrode at (½)Vcc, only the bit lines of columns ($\overline{BL1}$, BL1) where data is to be read or written are precharged to Vss to operate the sense amplifier, as shown in FIG. 32B. The remaining columns are precharged to (½)Vcc not to operate the sense amplifiers. In this case, only one column can be operated. This also utilizes the fact that, for an unselected column, even when the word line and the block selection line are operated while the bit line and the plate electrode PL are fixed at (½)Vcc, the data is not destroyed.

In the scheme of fixing the plate electrode at (½)Vcc, only the bit lines of columns ($\overline{BL}$, BL) where data is to be read or written are precharged to Vcc to operate the sense amplifier. The remaining columns are precharged to (½)Vcc not to operate the sense amplifiers. In this case, only one column can be operated. In the scheme of changing the plate electrode potential from 0V to Vcc as well, the bit line can be precharged to Vcc to read/write data.

[More Detailed Description of Operation]

Figure 33:
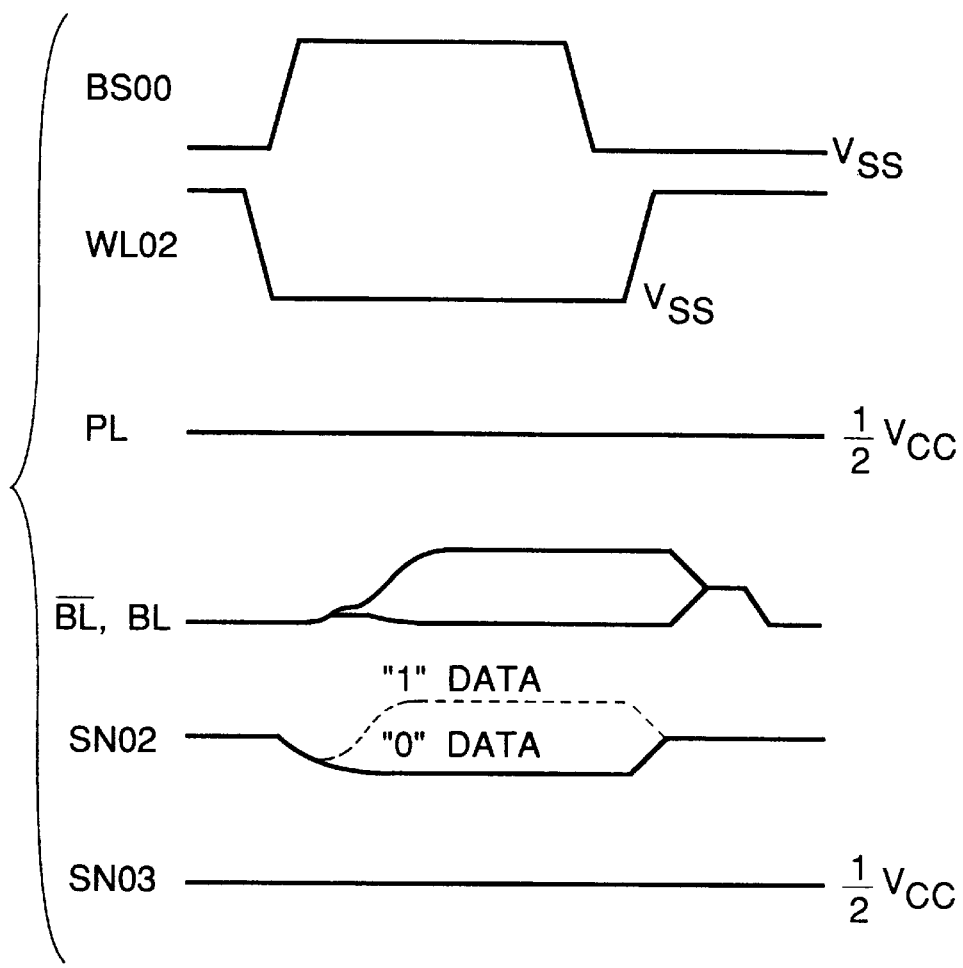
FIG. 33 is a chart showing signal waveforms so as to explain an operation example of each embodiment.
Figure 34:
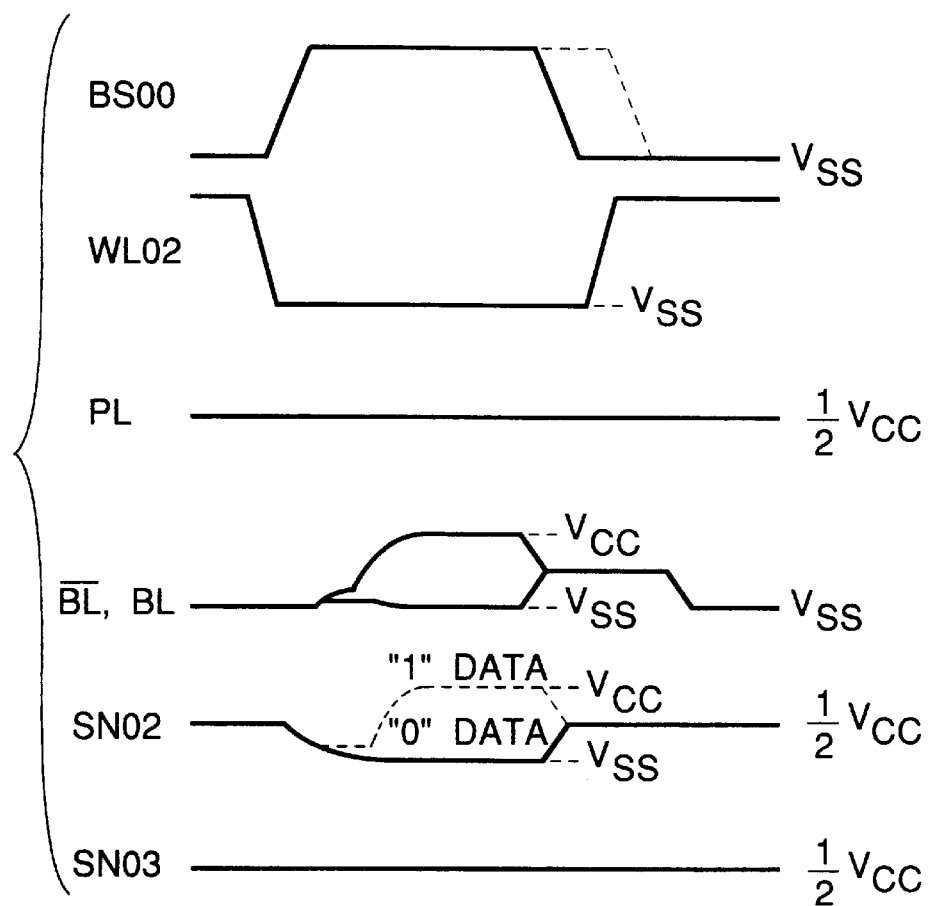
FIG. 34 is a chart showing signal waveforms so as to explain an operation example of each embodiment.
Figure 35:
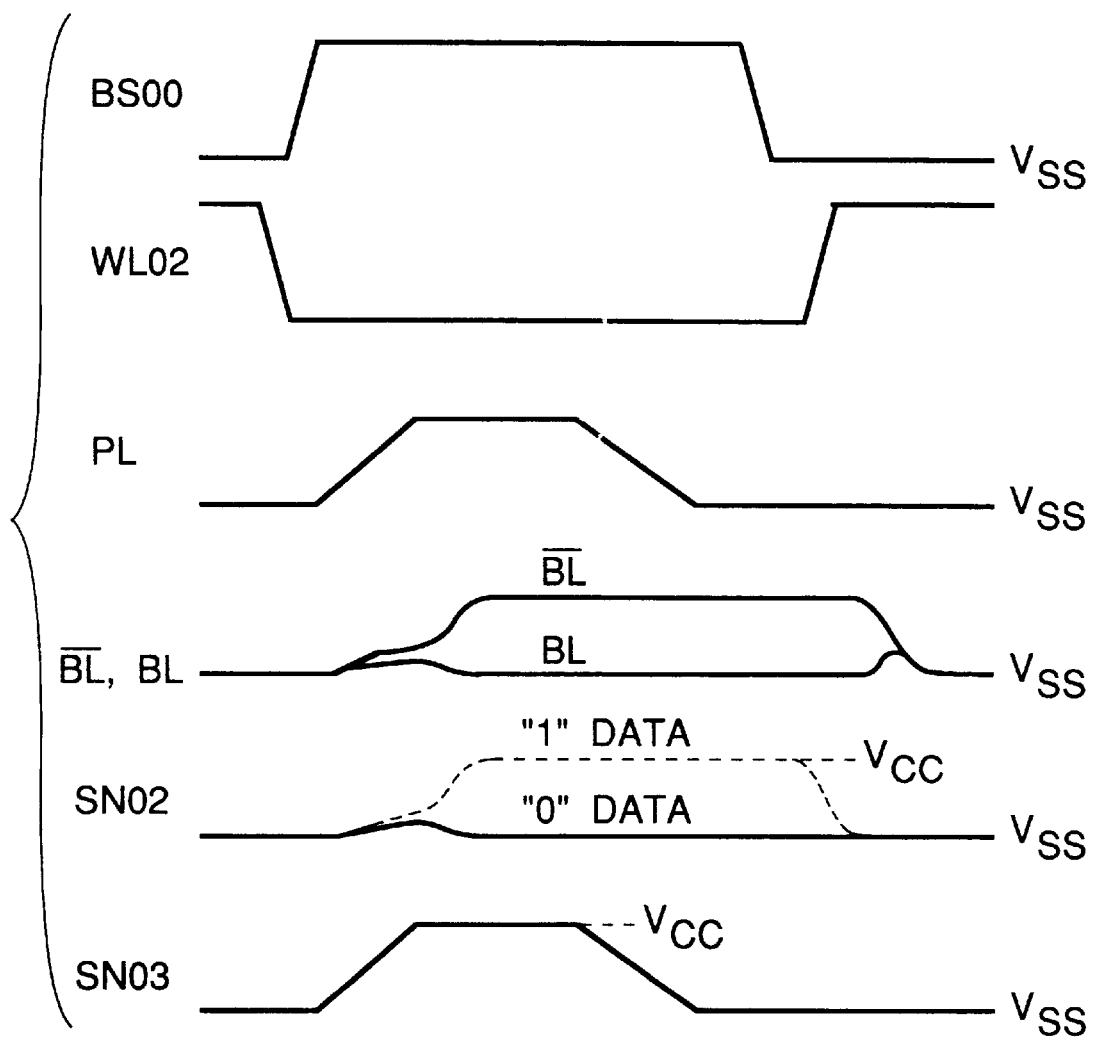
FIG. 35 is a chart showing signal waveform so as to explain an operation example of each embodiment.

The operations of the embodiments shown in FIGS. 5A and 5B, FIG. 26, FIGS. 30A to 30C, FIG. 31, and FIGS. 32A and 32B will be described below with reference to FIGS. 33, 34, and 35. The signal names are based on the case wherein the cell constituted by the cell transistor Q5 and the ferroelectric capacitor Cf5 is selected in FIG. 26. FIGS. 33 and 34 show the scheme of fixing the plate electrode at (½)Vcc. The operation shown in FIG. 33 is slightly different from that shown in FIG. 34 at the latter half part. FIG. 35 shows the scheme of changing the plate electrode potential from 0V to Vcc.

In FIG. 33, the bit lines $\overline{BL}$ and BL are precharged to Vss. The word line WL02 is set at "L" to turn off the cell transistor Q5. The block selection line BS00 is set at "H" to connect the cell and the bit line. A potential difference of $(\overline{1/2})$Vcc is generated between the bit line BL and the plate electrode PL, and cell charges are read out. The potentials of the bit lines $\overline{BL}$ and BL are amplified to Vss and Vcc by the sense amplifier, respectively. The data is rewritten in the cell. At this time, while keeping the bit lines $\overline{BL}$ and BL at Vss and Vcc, respectively, the block selection line BS00 is closed (set at "L"), and the potential of the word line WL02 is raised (set at "H") to turn on the cell transistor Q5. Upon turning on the cell transistor Q5, the potential difference between the two terminals of the ferroelectric capacitor Cf5 automatically becomes 0V, and writing is ended.

After the block selection line BS00 is closed, simultaneously the bit lines $\overline{BL}$ and BL are short-circuited and set at (½)Vcc. Then, the bit lines $\overline{BL}$ and BL are set at 0V to prepare the next active operation. As a modification of this operation, instead of short-circuiting the bit lines $\overline{BL}$ and BL, the bit lines may be directly set at 0V. Alternatively, the bit lines may be short-circuited and simultaneously set at 0V.

The example shown in FIG. 34 is partially different from that shown in FIG. 33. More specifically, after the bit lines $\overline{BL}$ and BL are short-circuited, the block selection line BS00 is closed, and the word line WL02 is set at "H" to turn on the cell transistor Q5. In FIG. 33, the word line WL02 is set at "H" to short-circuit the two terminals of the ferroelectric capacitor Cf5. In FIG. 34, however, when the bit lines $\overline{BL}$ and BL are short-circuited, both the plate electrode PL and the bit lines $\overline{BL}$ and BL are set at (½)Vcc to cancel the potential difference between the two terminals of the ferroelectric capacitor Cf5. In this case, the block selection line BS00 may be set at "L" first, or the word line WL02 may be set at "H" first. Thereafter, the potentials of the bit lines $\overline{BL}$ and BL are lowered to Vss.

FIG. 35 shows a modification of the scheme of changing the plate electrode potential. After the bit lines $\overline{BL}$ and BL are precharged to 0V, the word line WL02 is set at "L", and the block selection line BS00 is set at "H". At this time, since BL=PL=0V, no data is read out. Next, the plate electrode potential is raised from 0V to Vcc, data "1" is polarization-inverted from the point B to the point C in FIG. 2B, so that a potential difference is generated in reading the data "1" and "0".

When the sense amplifier operates to set the bit line at 0V, the data "0" returns to the point C, and the data "1" moves to the point D. When the plate electrode potential is lowered to 0V, the data "0" moves to the point D, and the data "1" returns to the point A. Thereafter, when block selection line BS00 is set at "L", and the word line WL02 is set at "H", the data "0" stays at the point D, and the data "1" moves to the point B, so the state before reading is restored. Thereafter, the bit lines $\overline{BL}$ and BL are short-circuited and then returned to Vss.

FIGS. 36 and 37 summarize the major effects of the present invention. In FIG. 36, the conventional cell with a size of $8F^2$, the stacked-type transistor with a cell size of $4F^2$, the NAND cell, and the present invention are compared. According to the present invention, the cell size is small, like other cells with a size of $4F^2$, and the bit line capacity can be decreased, so that a lot of cells can be connected to a bit line. Since this allows to reduce the number of sense amplifiers, the chip size is minimized. In addition, the structure can be easily realized by a planar transistor, and random access is enabled. Conventionally, these advantages cannot be simultaneously obtained. Furthermore, a folded bit line structure can be realized, and noise can be reduced. It is needless to say that a nonvolatile cell can be realized.

As for noise, when two bit line layers are formed, a folded bit line structure can be realized in the conventional stacked-type transistor with a cell size of $4F^2$, as has been proposed by the present inventors. However, this increases the cost.

When a folded bit line structure is to be realized in the NAND cell, a block selection line may be added, as has already been proposed by the present inventors. In this case, however, the folded bit line structure does not allow perfect random access, unlike the present invention. The reason for this is as follows. Even when a block selection line is added to prevent cell data on the reference side from being read out to the bit line BL, the data on the source side of the selection gate transistor of the block selection line has already been read out because of the NAND cell connection. As a result, unless this data is read out in the next access, the data is destroyed.

In FIG. 37, the conventional FRAM is compared with the present invention. As described above, in the present invention, a high-speed operation can be realized, and simultaneously, the refresh operation can be omitted for the scheme of fixing the plate electrode at (½)Vcc. The conventional FRAM cannot realize these effects simultaneously. More specifically, in the scheme of changing the plate electrode potential within the range of 0V and Vcc, the refresh operation can be omitted. However, the scheme of fixing the plate electrode at (½)Vcc absolutely requires the refresh operation.

(23rd Embodiment)

FIGS. 38A and 38B are circuit diagrams for explaining an FRAM according to the 23rd embodiment of the present invention and, more particularly, showing a sense amplifier circuit using a dummy cell structure. Note that the D-type select transistor shown in FIG. 26 is regarded as short-circuited because it is always ON, and omitted in these circuit diagrams.

Figure 39:
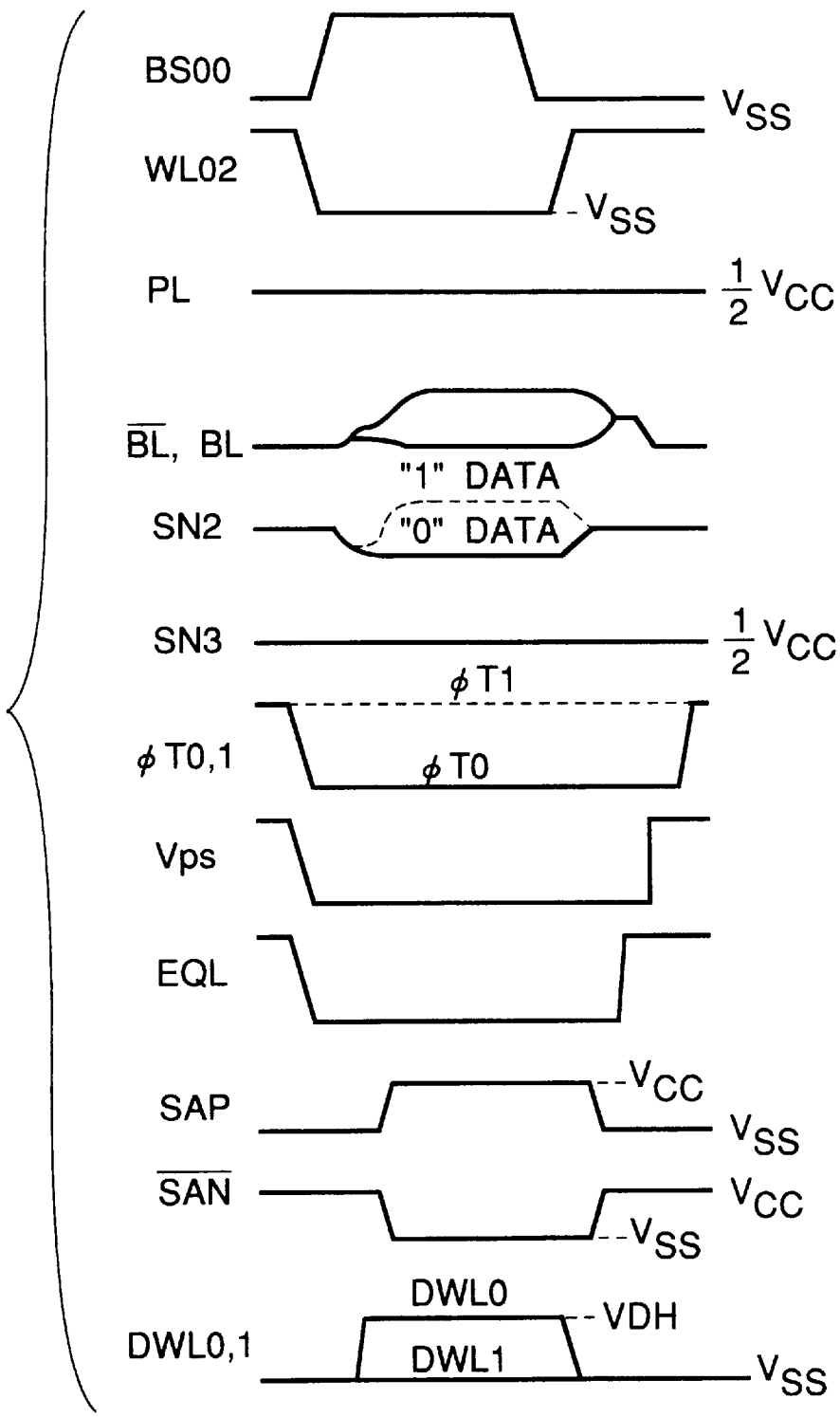
FIG. 39 is a chart showing signal waveforms so as to explain the operation of the 23rd embodiment.

FIG. 38A shows a coupling dummy cell structure. FIG. 39 shows the operation of this cell structure. In FIG. 39, the operation of the scheme of fixing the plate electrode at (½)Vcc shown in FIG. 33 is explained in more detail.

In the stand-by state, a signal VPS is kept at "H", and a bit line is set at Vss. In the active state, the signal VPS is set at "L", a signal EQL is set at "L", and the bit line is set at 0V in the floating state. Only a signal φ t1 is set at "L" to select the cell array on the left side of the sense amplifier. Thereafter, a word line WL02 is set at "L", and a block selection line BS00 is set at "H" to read out cell data to the bit line. On the reference bit line side, a dummy word line DWL0 may be set at "H" to read out data on the side of a bit line BL by a coupling capacitor C2, so that the potential on the side of the bit line BL is raised by an equal potential at which charges corresponding to a saturation polarization Ps are read out. This can be realized by adjusting the amplitude amount (VDH) of the dummy word line DWL0 and the capacity of the coupling capacitor C2.

Thereafter, an NMOS sense amplifier driving line $\overline{SAN}$ is set at "L", and a PMOS sense amplifier driving line SAP is set at "H" to operate the sense amplifier. The bit lines are set at Vss and Vcc, respectively, and cell data rewriting is ended. Thereafter, the block selection line BS00 is set at "L", and the word line WL02 is set at "H". Next, the signal EQL is set at "H" to short-circuit the bit lines $\overline{BL}$ and BL. When the signal VPS is set at "H", the bit lines $\overline{BL}$ and BL are set at 0V. this embodiment can also be applied to the scheme of changing the PL voltage 0V to Vcc.

FIG. 38B shows a case wherein 1-bit data is stored in two cells having the structure shown in FIGS. 5A and 5B. In this case, no dummy cells are required.

(24th Embodiment)

Figure 40A:
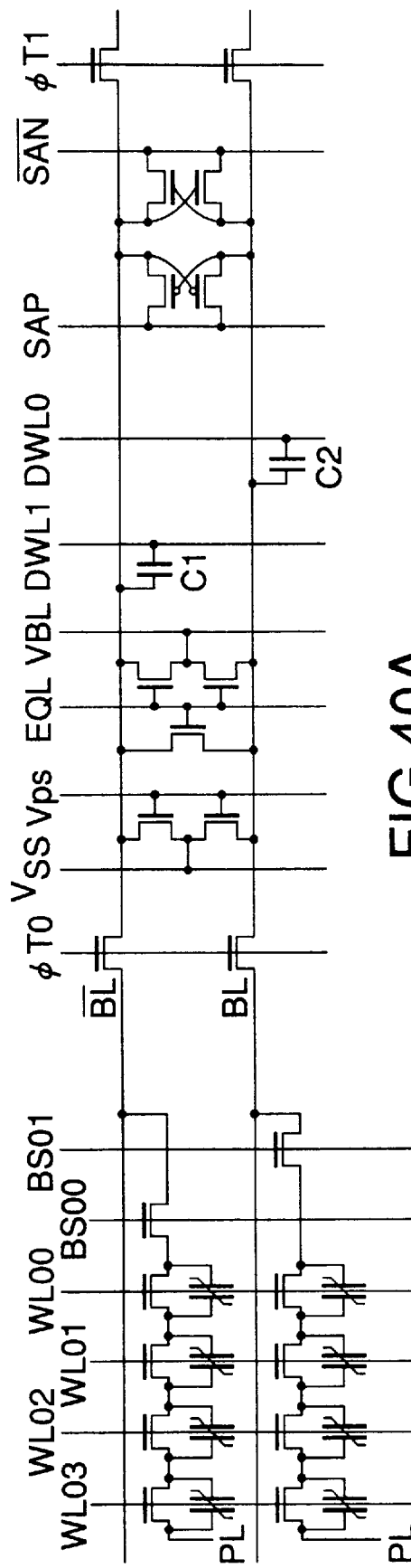
FIGS. 40A and 40B are circuit diagrams showing the structure of a sense amplifier portion so as to explain an FRAM according to the 24th embodiment.
Figure 40B:
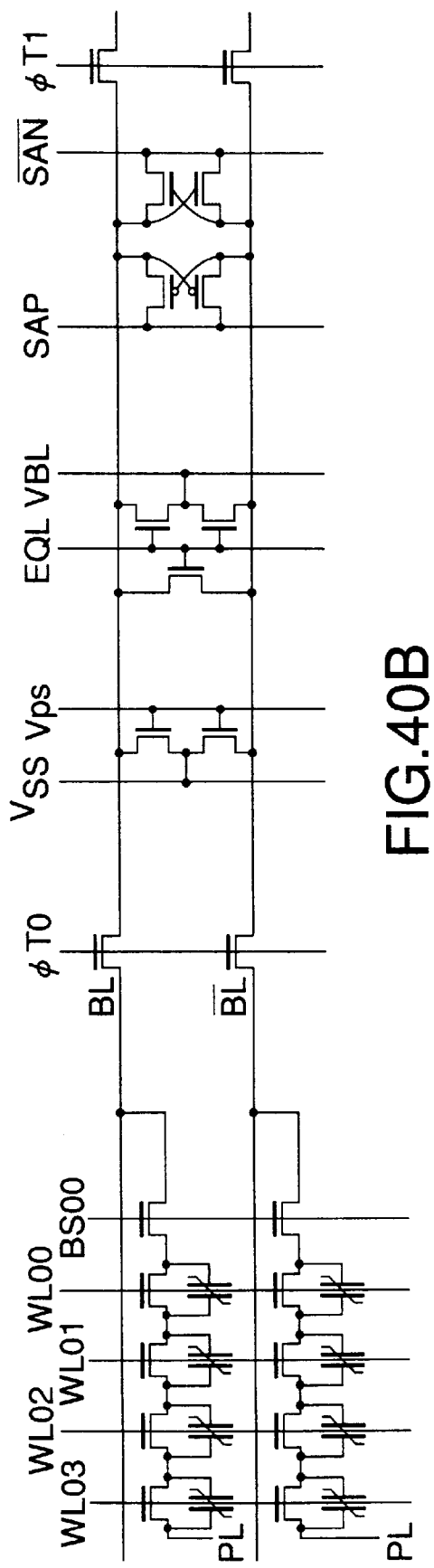

FIGS. 40A and 40B are circuit diagrams for explaining an FRAM according to the 24th embodiment of the present invention and, more particularly, showing a sense amplifier circuit using a dummy cell structure. Note that the D-type select transistor shown in FIG. 26 is regarded as short-circuited because it is always ON, and omitted in these circuit diagrams.

FIG. 40A is partially different from FIG. 38A. More specifically, when bit lines $\overline{BL}$ and BL are to be equalized to (½)Vcc, a VBL potential (=(½)Vcc) is set in setting a signal EQL at "H", thereby more properly fixing the potential. With this arrangement, when the bit lines $\overline{BL}$ and BL are equalized to set the two terminals of a ferroelectric capacitor Cf5 at an equipotential, and the plate electrode potential shifts from the potential of the bit lines $\overline{BL}$ and BL because of, e.g., a leakage current, as in the operation shown in FIG. 34, the accumulated charge loss can be prevented.

Figure 41:
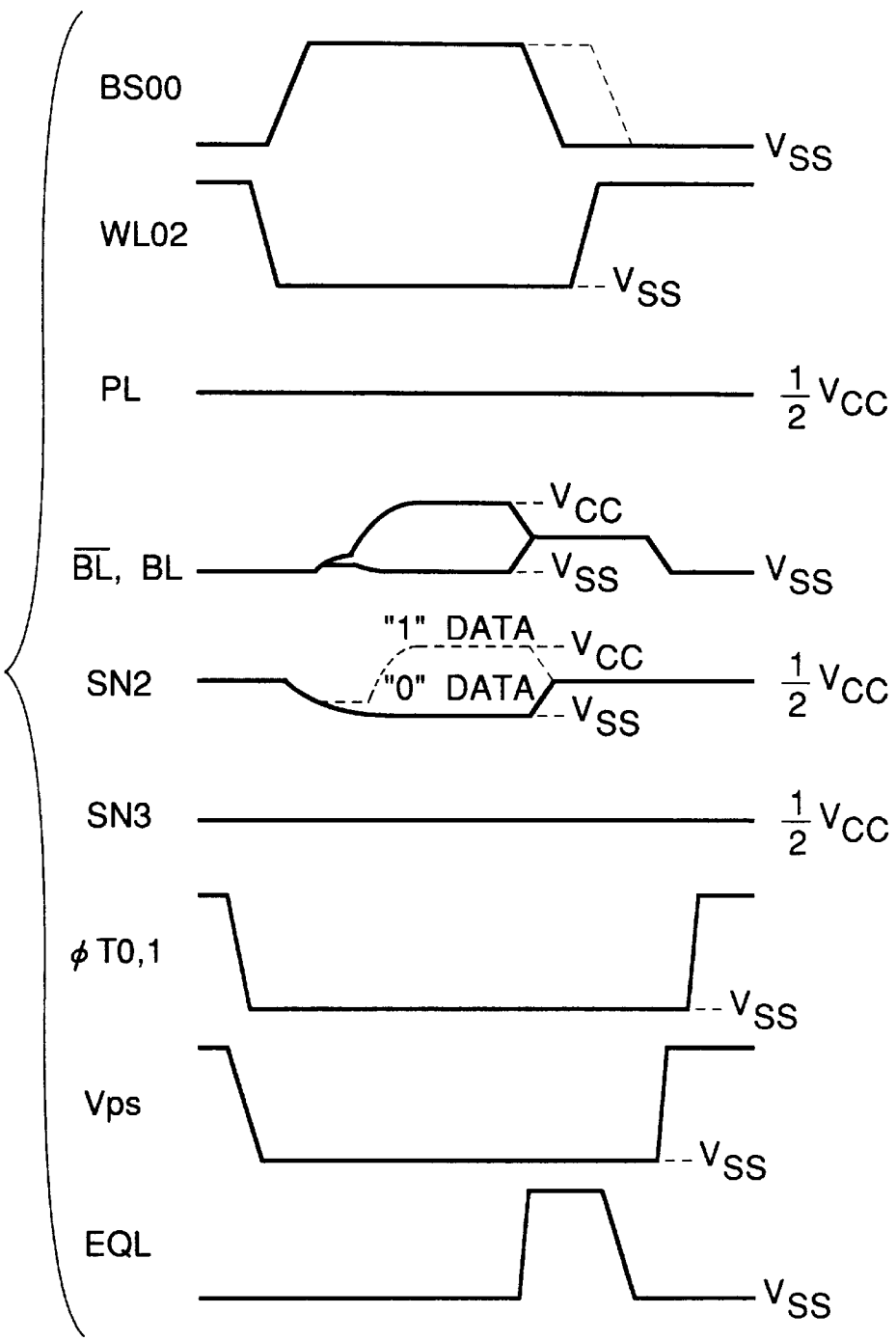
FIG. 41 is a chart showing signal waveforms so as to explain the operation of the 24th embodiment.

FIG. 41 shows the detailed operation in this case. The signal EQL is set at "H" to short-circuit the bit lines $\overline{BL}$ and BL. A block selection line BS00 is set at "L", and a word line WL02 is set at "H". Before the signal VPS is set at "H", the signal EQL is set at "L". The reason why the signal EQL is set at "L" is that the short-circuit between VBL and Vss is prevented.

FIG. 40B shows an example in which a VBL circuit is added to the structure shown in FIG. 38B.

(25th Embodiment)

Figure 42A:
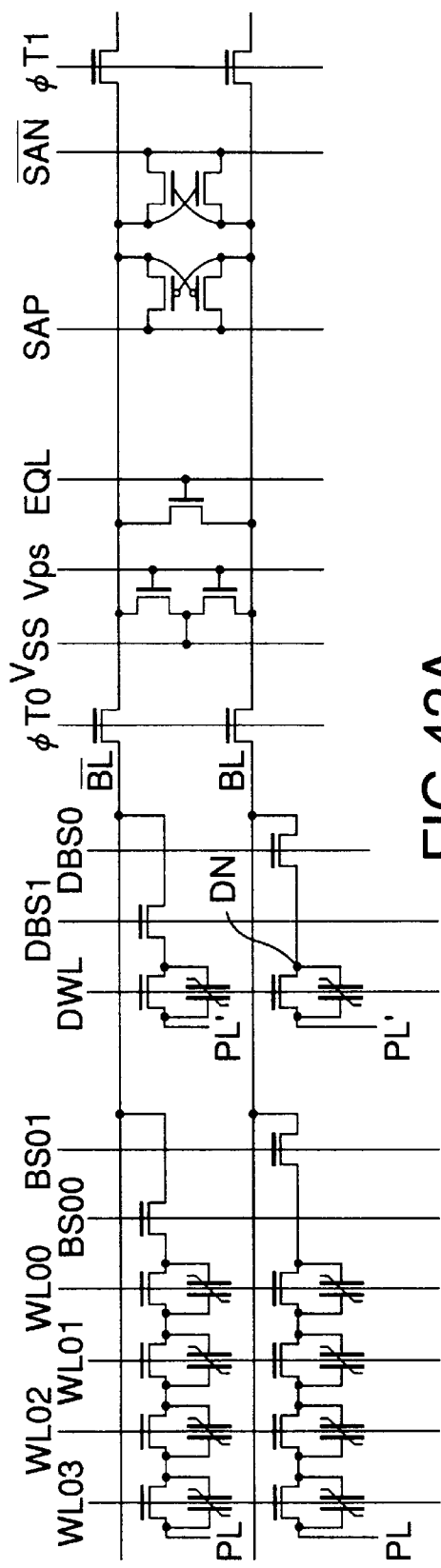
FIGS. 42A and 42B are circuit diagrams showing the structure of a sense amplifier portion so as to explain an FRAM according to the 25th embodiment.
Figure 42B:
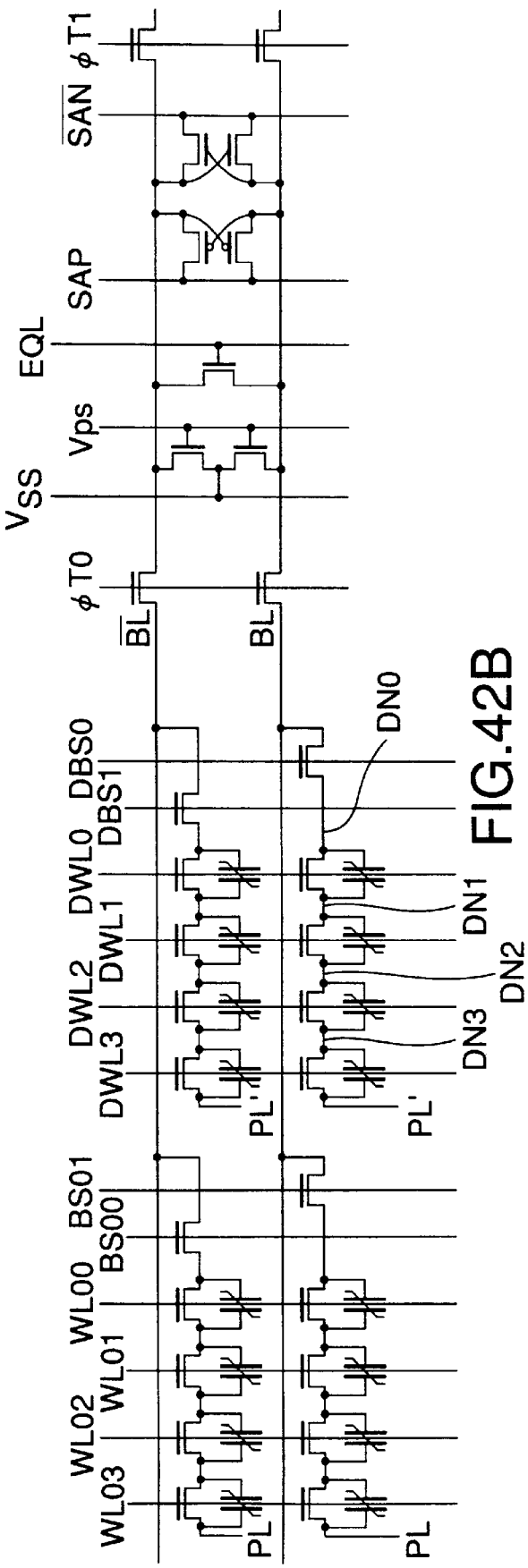

FIGS. 42A and 42B are circuit diagrams for explaining an FRAM according to the 25th embodiment of the present invention and, more particularly, showing a sense amplifier circuit using a dummy cell structure. Note that the D-type select transistor shown in FIG. 26 is regarded as short-circuited because it is always ON, and omitted in these circuit diagrams.

Figure 43:
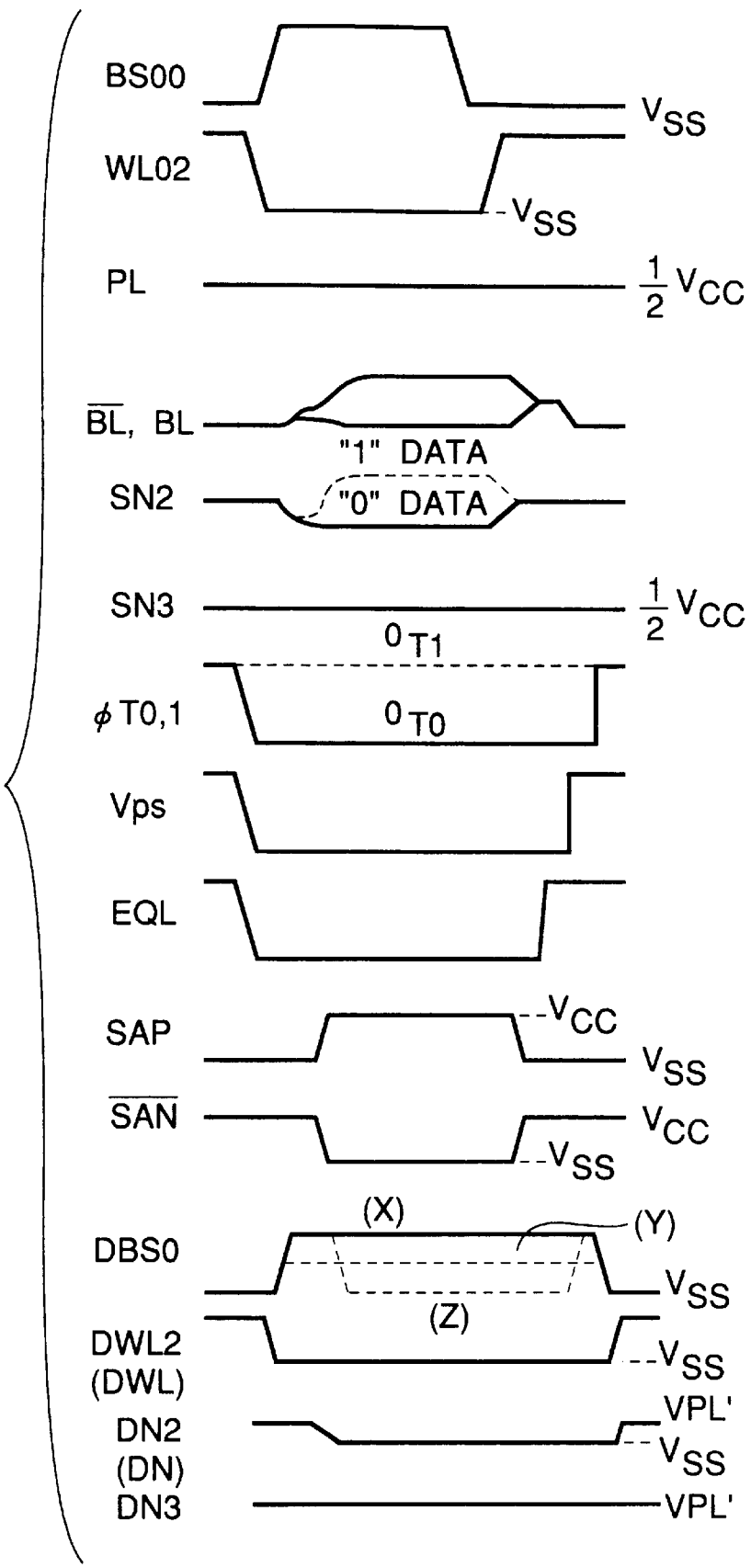
FIG. 43 is a chart showing signal waveforms so as to explain the operation of the 25th embodiment.

FIG. 42A is different from FIG. 38A only in the dummy cell structure. In FIG. 42A, the dummy cell is constituted by a ferroelectric capacitor. FIG. 43 shows the operation of this embodiment. FIG. 43 is different from FIG. 39 only in the operation of the dummy cell.

The dummy cell structure shown in FIG. 42A is equivalent to a structure in which the number of series connected cells in the memory cell having the folded bit line structure shown in FIG. 26 is 1. The dummy cell can perform various operations. For (X) of a block selection line DBSO for dummy cell in FIG. 43, data is located at the point D in FIG. 2B in the stand-by state. In FIG. 43, a word line WL02 is set at "L", and a block selection line BS00 is set at "H" to read out cell data to a bit line $\overline{BL}$. At the same time, a dummy word line DWL is set at "L", and the block selection line DBS0 for dummy cell is set at "H" to read out dummy cell data to a bit line BL. Thereafter, the sense amplifier operation and rewriting are performed. The block selection line BS00 is closed, and the word line WL02 is set at "H" to restore the original state, and then, the bit lines $\overline{BL}$ and BL are short-circuited to lower the potential of the bit line $\overline{BL}$ to BLVss. At this time, a cell node DN for dummy cell is set at 0V almost at the point C in FIG. 2B. Thereafter, the selection bit line DBSO for dummy cell is set at "L", and the dummy work line DWL is set at "H" to return the data to the original point D. the PL of the normal memory cell may be used by fixing the PL' of the dummy cell in a 0V to Vcc driving because of needless of polarization inversion.

In this embodiment, charges corresponding to Ps'-Pr' are read out, like data "0". The capacity of the ferroelectric capacitor may be increased to (Ps of cell)=(Ps'-Pr') of dummy cell. Alternatively, the potential of a dummy cell PL' may be adjusted to be relatively higher than (½)Vcc. In this embodiment, when the data "0" has been written in the cell, data on the dummy cell side is "1". Since the data "1" temporarily moves to the point A, then to the point C, and returns to the point D, polarization inversion occurs.

The dummy cell operates every time a cell in the cell array is selected. Therefore, the number of times of polarization inversion increases to result in a conspicuous fatigue. To avoid this problem, the "H"-side voltage of the block selection line DBS0 for dummy cell in FIG. 43 is lowered, as represented by (Y). In this case, even when the bit line BL on the dummy cell side is set at Vcc in reading out the cell data "0", the cell node DN for dummy cell is set at a potential corresponding to (DBS0 voltage-Vt). When the signal PL' is designed to satisfy a condition DBS0 voltage-Vt≦PL', no polarization inversion occurs, and the fatigue can be minimized. Even when the DBS0 potential is changed as represented by (X), PL'=Vcc. Alternatively, the DBS0 potential is raised to almost that level, no polarization inversion occurs, and the fatigue is minimized. Alternatively, the DBS0 potential is temporarily lowered, as represented by (Z), after the dummy cell data is read out. When the bit lines $\overline{BL}$ and BL are set at 0V, the block selection line DBS0 for dummy cell is set at "H" or "L". At this time, the data moves from the point D to the point C without polarization inversion. Thereafter, when the dummy word line DWL is set at "H", the data returns to the point D.

When a dummy cell is formed in the conventionally cell structure in which one cell transistor and one ferroelectric capacitor are connected in series, the cell node for dummy cell is floating. For this reason, the potential may change due to a leakage current or the like, resulting in a change in read potential of the dummy cell. To avoid this problem, the conventional dummy cell circuit has a complex circuit structure different from a normal cell, in which, for example, the data is temporarily moved to the point D and returned to the point C. In this embodiment, the same cell structure or circuit structure as that of the normal cell can be used.

FIG. 42B is a circuit diagram showing a circuit structure for solving the problem of FIG. 42A. In FIG. 42A, the bit line capacity slightly changes depending on whether the selected memory cell in the memory block is close to or far from the bit line. This change decreases the margin for the sense amplifier operation although the change amount is small.

The structure shown in FIG. 42B solves this problem. More specifically, when a dummy cell block having the same structure as that of a normal cell portion is formed, as in FIG. 42B, and a dummy cell in a dummy cell block at a position corresponding to the selected memory cell in the memory block is selected, the unbalance in capacity between the bit line pair can be solved. The operation is the same as that of the structure shown in FIG. 42A except that the dummy word line to be selected is different. Various modifications of the operation are also the same as those described above.

The select transistor of the dummy cell block shown in FIG. 42A or 42B may be actually omitted, as shown in FIGS. 29A to 29D, although the D-type transistor which is always ON is not illustrated, as is apparent from the description of FIG. 39. As shown in FIG. 44A, the D-type transistor may be actually used.

Figure 45:
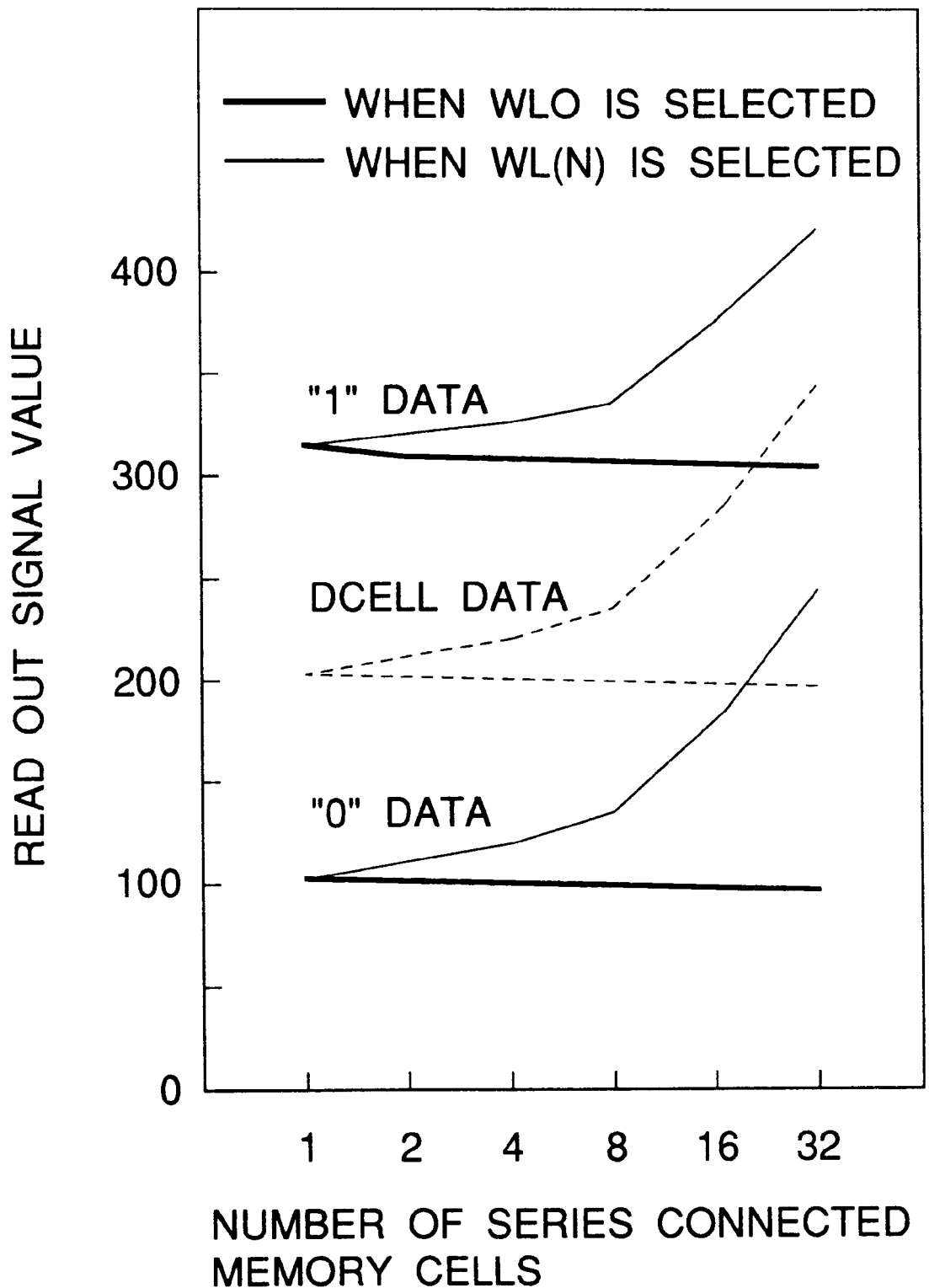
FIG. 45 is a graph showing the relationship between the number of series connected cells and a readout signal value in the 25th embodiment.

Another reason why the dummy cells are also connected in series is shown in FIG. 45. FIG. 45 shows bit line potentials with respect to the number (N) of series connected cells after the actual cell data "1" and "0" are read out to the bit line. A case wherein a word line WL0 closest to the bit line contact is selected and a case wherein the farthest word line WL(N) is selected are shown as parameters.

For the farthest cell, the signal difference between the data "1" and the data "0" becomes slightly smaller than that for the closest cell by the an amount corresponding to the parasitic capacity such as the gate channel capacity in the series-connected cell. The most serious problem is that, when the farthest cell is selected, the readout values of both the data "1" and data "0" are shifted to the Vdd side. This is because the potential of the node in the series-connected cell, which has been (½)Vdd in the stand-by state, lowers to Vss after reading, and the readout value shifts to the Vdd side due to coupling of the parasitic capacity in the series-connected cell. This problem becomes more conspicuous as the number of series connected cells increases.

When the dummy cells are also connected in series, as shown in FIG. 42B or 44A, and a series-connected dummy cell at a position corresponding to the normal cell is selected, the dummy cell (Dcell in FIG. 45) side is similarly influenced, so that the problem of shift disappears when viewed from the sense amplifier. When the dummy cell is constituted using a paraelectric capacitor, a plurality of types of coupling capacitors may be prepared in the sense amplifier, as shown in FIG. 38A, or the amplitude voltage of the dummy word line DWL0 or DWL1 in FIG. 38A may be changed in correspondence with the position of the selected memory cell in the series connection. The problem of the shift to the Vdd side is not occurred in the 0V to Vdd PL driving scheme. The reason is why these nodes are pre-charged to 0V.

(26th Embodiment)

FIG. 46A is a circuit diagram showing a cell array equivalent circuit including dummy cells according to the 26th embodiment of the present invention. FIG. 46B is a chart showing signal waveforms of the operation of the 26th embodiment.

Referring to FIG. 46A, the dummy cells of a bit line pair ($\overline{BL}$ and BL) are shared. When a word line WL2 and a block selection line BS0 are selected to read out cell data to the bit line $\overline{BL}$ side, a block selection line DBS0 for dummy cell and a dummy word line DWL2 are selected to read out the ferroelectric capacitor information of the dummy cell con-nected to the dummy word line DWL2 is read out to the bit line BL side. When the word line WL2 and a block selection line BS1 are selected to read out cell data to the bit line BL side, a block selection line DBS1 for dummy cell and the dummy word line DWL2 are selected to read out the ferroelectric capacitor information of the dummy cell connected to the dummy word line DWL2 to the bit line $\overline{BL}$ side.

In reading shown in FIG. 46B, data "0" is always read out from the dummy cell, as shown in FIG. 42B. Accordingly, the ferroelectric capacity of the dummy cell must be 1.5 to 3 times that of a normal cell (the optimum value is about twice) such that an intermediate value Ps between data "1" (=Pr+Ps) and the data "0" (=Ps−Pr) almost equals (Ps'−Pr') of the dummy cell. In the structure shown in FIG. 42B, the word line interval must be increased (extended along the bit line) to increase the ferroelectric capacitor area of the dummy cell. However, when the circuit shown in FIG. 46A is used, the interval between the cells along the word line becomes large because the dummy cell is shared, so that the ferroelectric capacitor area can be increased without increasing the word line interval.

Figure 47A:
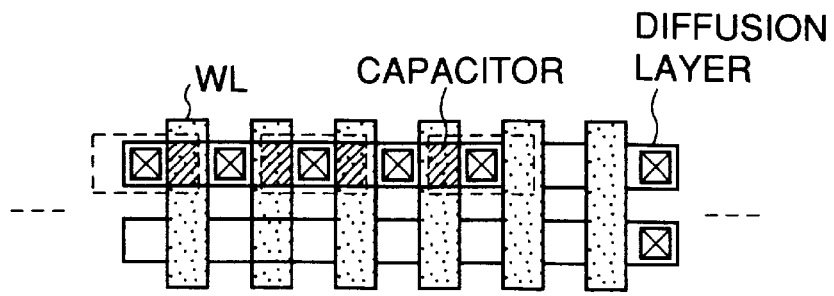
FIGS. 47A to 47D are views showing layout examples for realizing the equivalent circuit shown in FIGS. 46A and 46B.
Figure 47B:
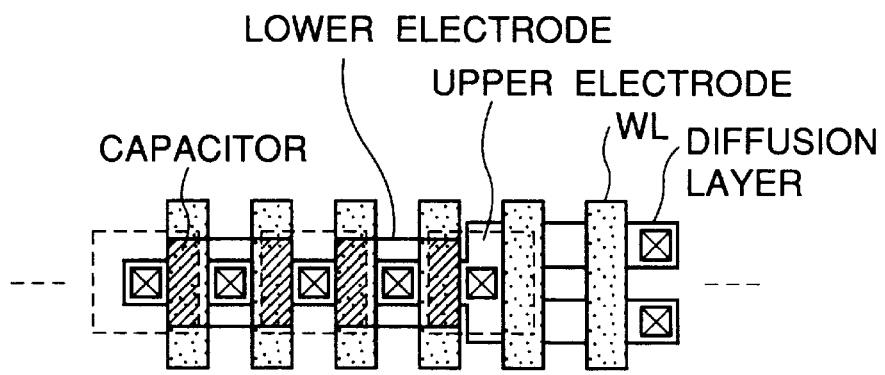
Figure 47C:
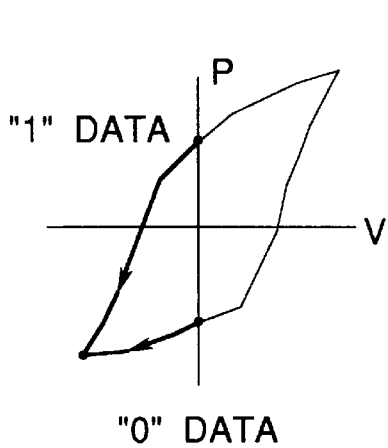
Figure 47D:
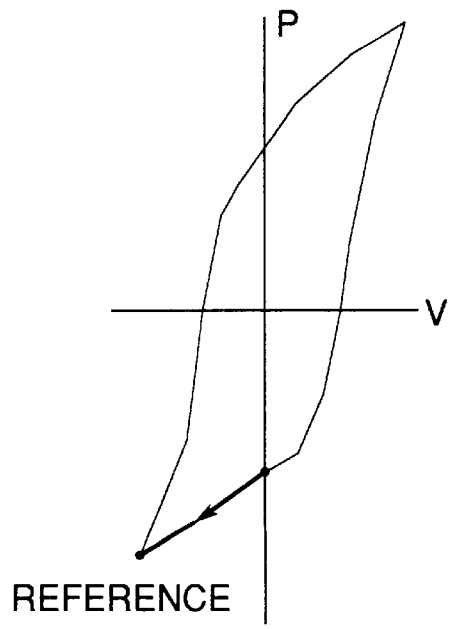

FIGS. 47A to 47D are views showing examples of layouts for realizing the equivalent circuit shown in FIG. 46A. FIG. 47A shows a normal cell layout. FIG. 47B shows a dummy cell layout. For the dummy cells, when the element isolation region between the cells has a minimum size F, the ferroelectric capacitor area can be increased to $3F^2$ while keeping the word line interval at F, although the ferroelectric capacitor of the normal cell is $F^2$, as is apparent from FIGS. 47A and 47B. For this reason, the ferroelectric capacitor area of the dummy cell can be set at an arbitrary value of $F^2$ to $3F^2$. As shown in FIGS. 47C and 47D, the read charge amount on the reference side can be set at the intermediate value between the data "1" and data "0" of the normal cell. The readout potential of the dummy cell can be adjusted by both of the capacitor area and an area of the PL of the dummy cell.

When the cell transistor size of the dummy cell is set to be the same as that of the normal cell while increasing the ferroelectric capacitor area, as shown in FIG. 37B, the inverted capacity of the cell transistor channel of the dummy cell can be equalized to that of the cell transistor of the normal cell. The shift amount of the dummy cell portion can be almost equalized to that of the normal cell portion. Therefore, the shift amount is canceled and does not appear in the difference between the read bit line and the reference bit line.

(27th Embodiment)

Figure 48:
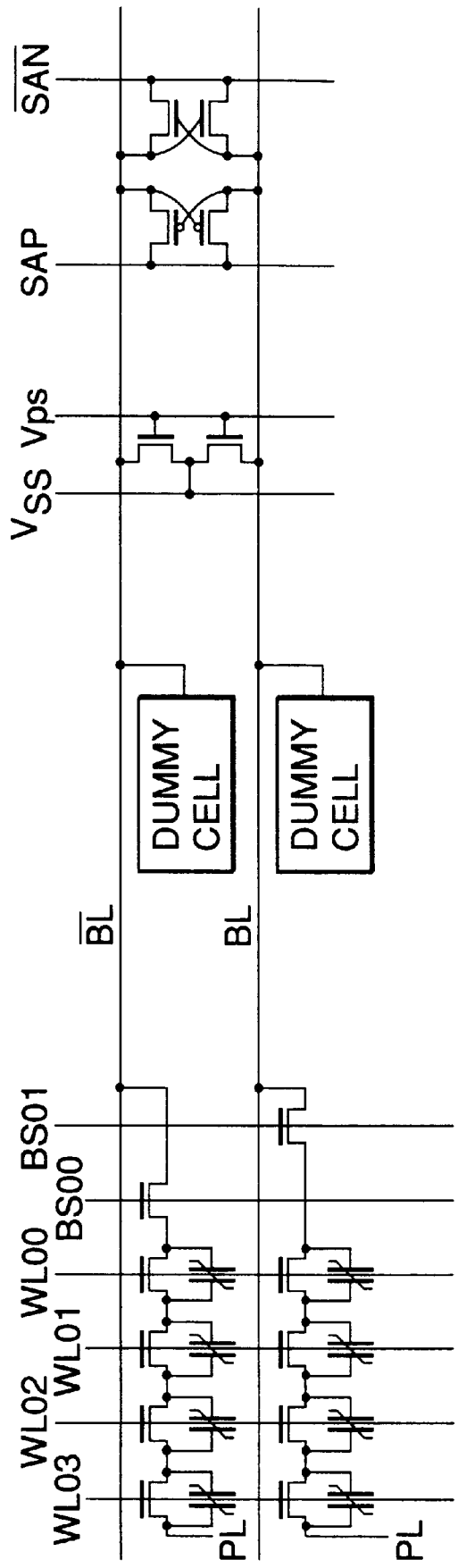
FIG. 48 is a circuit diagram showing the structure of a sense amplifier portion so as to explain an FRAM according to the 27th embodiment.

FIG. 48 is a circuit diagram for explaining an FRAM according to the 27th embodiment of the present invention and, more particularly, showing a sense amplifier circuit using a dummy cell structure. Note that the D-type select transistor shown in FIG. 26 is regarded as short-circuited because it is always ON, and omitted in this circuit diagram.

In this embodiment, the EQL circuit is removed from the circuit shown in FIG. 38A, 42A, or 42B. This means that a signal VPS is directly set at "H" and lowered to Vss without equalizing bit lines $\overline{BL}$ and BL in, e.g., FIG. 33. With this structure, the sense amplifier area can be reduced.

(28th Embodiment)

Figure 49:
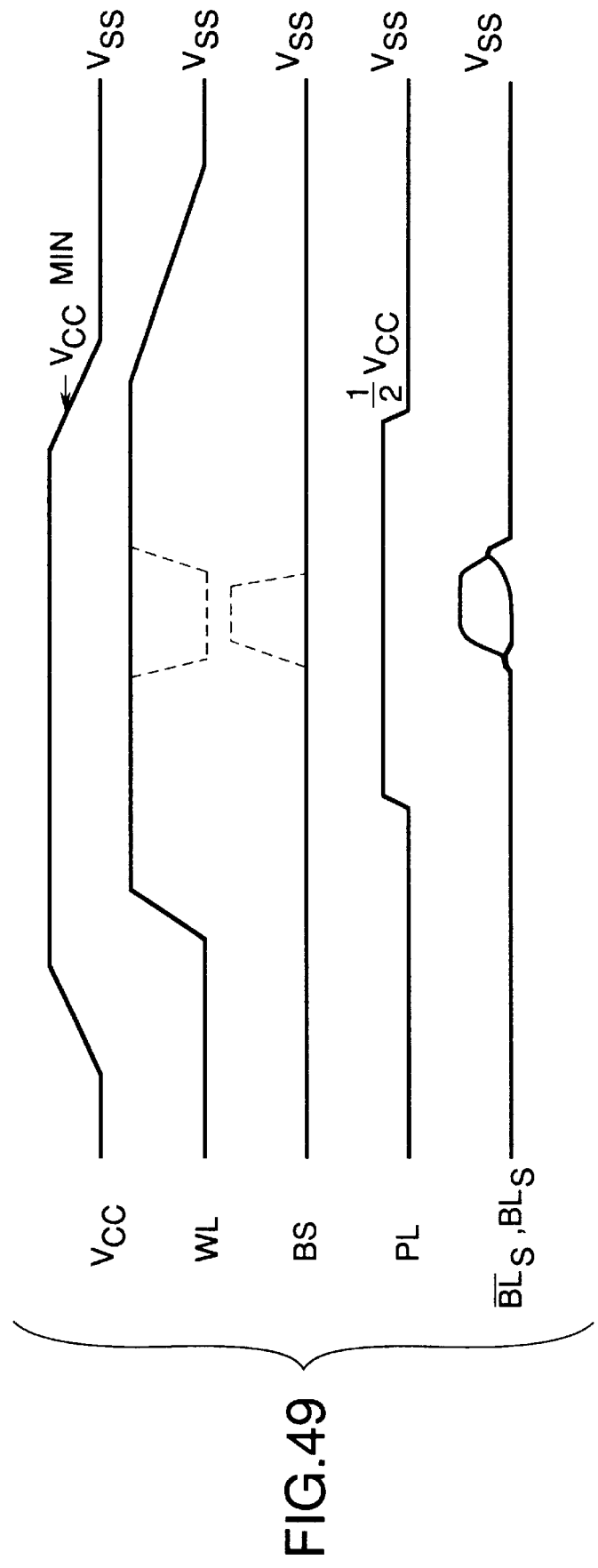
FIG. 49 is a chart showing signal waveforms so as to explain the 28th embodiment.

FIG. 49 is a chart showing signal waveforms so as to explain the 28th embodiment of the present invention. This embodiment presents desired procedures of turning on/off the power supply.

In this embodiment, a power supply Vcc is turned on first. When the power supply Vcc has completely risen, all word lines WL are set at "H" by a power-ON reset circuit. Thereafter, the plate potential is raised from 0V to (½)Vcc. If the order of raising the word line potential and the plate electrode potential is reversed, cell data tends to be destroyed. At this time, a bit line BL and a block selection line BS are kept at 0V. Thereafter, a normal memory operation is performed.

In falling of the power supply, when Vcc becomes lower than Vssmin (the lower limit value of Vcc), the plate electrode PL is set at 0V by a power-OFF reset circuit or a power-OFF signal. If the bit line BL is at 0V, or if the block selection line BS is at 0V, the data is not destroyed even when the word line potential lowers thereafter.

(29th Embodiment)

Figure 50:
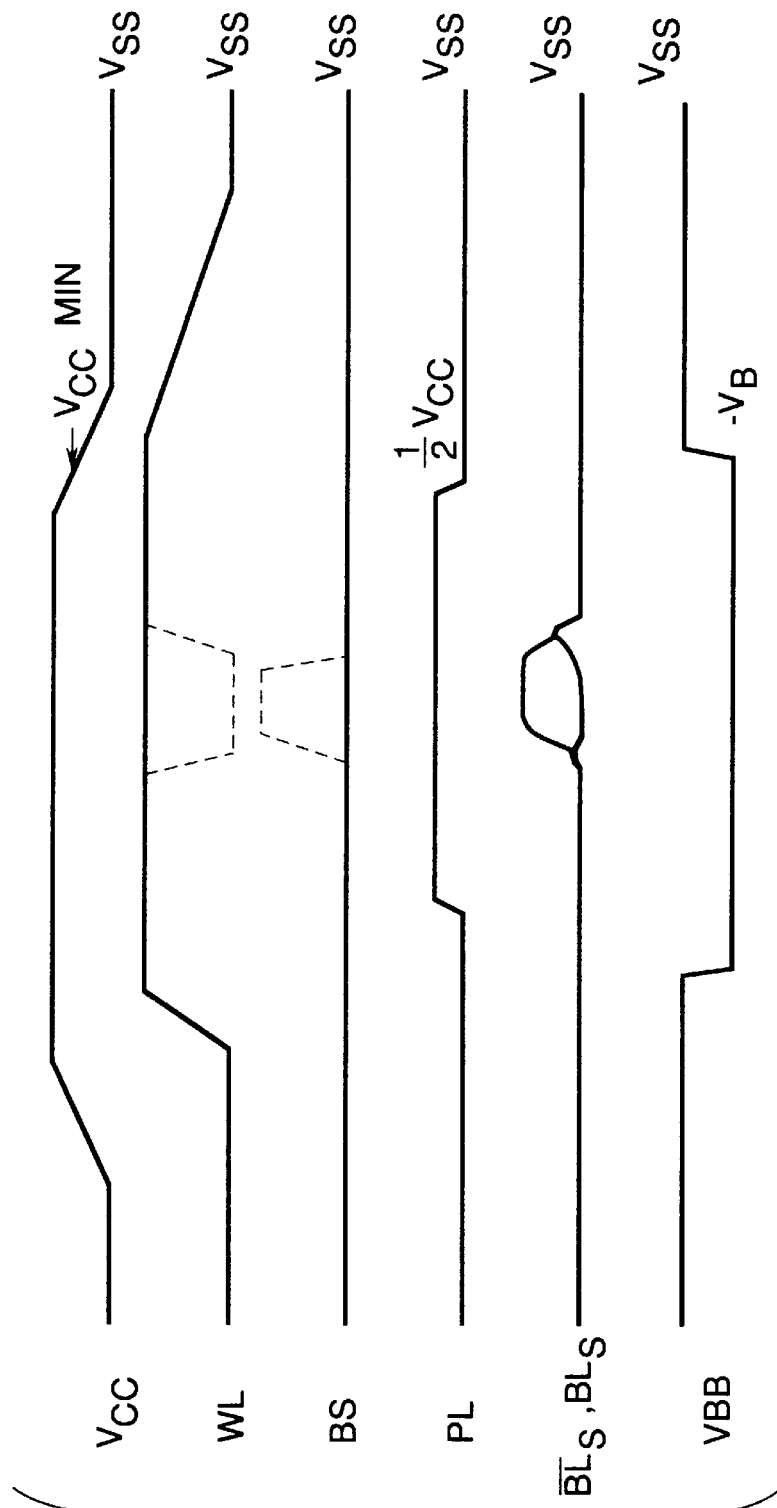
FIG. 50 is a chart showing signal waveforms so as to explain the 29th embodiment.

FIG. 50 is a chart showing signal waveforms so as to explain the 29th embodiment of the present invention. This embodiment presents desired procedures of turning on/off the power supply. More specifically, in addition to FIG. 49, procedures of applying a negative substrate bias voltage VBB to a cell array are presented.

In the conventional FRAM using the scheme of fixing the plate electrode at (½)Vdd, cell data is destroyed, and the plate electrode is set at 0V in the stand-by state. In the plate driving scheme in which the plate electrode potential is changed from 0V to Vdd as well, when a negative substrate bias voltage is applied to the cell array, data "1" is destroyed because the storage node potential lowers to 0V or less in the stand-by state. Therefore, in the conventional FRAM, the substrate bias voltage of the cell array is set at 0V. In this embodiment, however, the substrate bias voltage VBB of the cell array is set to be negative (=−VB) not only in the active state but also in the stand-by state. Since the ferroelectric capacitor is short-circuited by the cell transistor, the data is not destroyed.

Accordingly, the following effects can be expected. (1) Since the region between the diffusion layer and the cell well can be reverse-biased, the bit line capacity can be reduced by decreasing the p-n junction capacity, so that the read signal amount increases. (2) The threshold voltage of the ferroelectric capacitor can match the bias voltage −VB so that the substrate bias effect can be reduced. (3) The element isolation breakdown voltage can increase. The VBB application timing is shown in FIG. 50. When a word line WL is set at "H" at the time of turning on the power supply to short-circuit the ferroelectric capacitor, and then the voltage VBB is lowered, the cell information is not destroyed. At the time of turning off the power supply, when the voltage VBB is returned to 0V before the word line WL is set at "L", no problem is posed.

(30th Embodiment)

Figure 51:
FIG. 51 is an equivalent circuit diagram showing the basic structure of an FRAM according to the 30th embodiment.

FIG. 51 is a circuit diagram showing the basic structure of an FRAM according to the 30th embodiment of the present invention and, more particularly, an equivalent circuit corresponding to eight memory cells.

The structure of this embodiment is basically the same as that shown in FIGS. 5A and 5B except that the cell transistor shown in FIG. 4 is changed to a D-type transistor, and the threshold voltage has a negative value. The operation is shown in FIG. 53. In the power-OFF state or the stand-by state, the word line voltage is set at 0V to turn on the cell transistor. Only the word line of a selected memory cell is set at a negative potential to turn off the cell transistor.

The advantages of this embodiment are as follows.

(1) Since the word line is at 0V in the stand-by state, the word line leakage poses no problem.

(2) Since no high word line voltage is applied in the stand-by state, the reliability of the device increases.

(3) The largest advantage is that the device is resistant to noise. While the power supply is OFF, cell data is properly held because the cell transistor is always ON. The device is also resistant to a sudden power failure.

When the threshold voltage is set to have a small negative value to set the word line/bit line amplitude within the range of −Vpp' to Vcc, the step-up potential can be prevented from lowering due to the word line leakage in the stand-by state. This is because Vcc is the power supply voltage, and the current can be sufficiently supplied.

(31st Embodiment)

Figure 52:
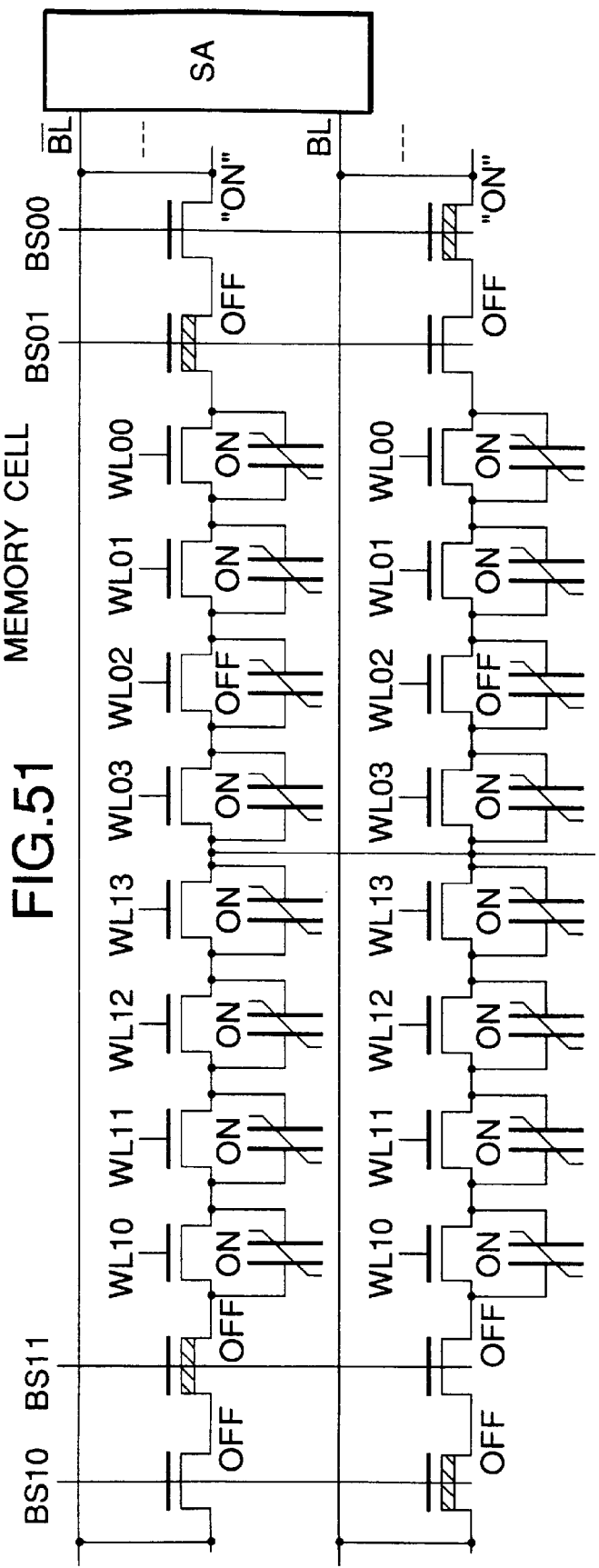
FIG. 52 is an equivalent circuit diagram showing the basic structure of an FRAM according to the 31st embodiment.

FIG. 52 is a circuit diagram showing the basic structure of an FRAM according to the 31st embodiment of the present invention.

In this embodiment, the cell transistor shown in FIG. 26 is changed to a D-type transistor, and the threshold voltage has a negative value. The operation is shown in FIG. 53. In the power-OFF state or stand-by state, the word line voltage is set at 0V to turn on the cell transistor. Only the word line of a selected memory cell is set at a negative potential to turn off the cell transistor.

As in the 30th embodiment, this embodiment is advantageous in that the word line leakage is not a problem, the reliability of the device increases, and the device is resistant to noise.

In FIGS. 51 and 52, the cell transistor is ON both in the power-OFF state and in the unselected state with the power turned ON. For this reason, even when a radiation such as an a ray is irradiated on the cell, a software error caused by the potential difference between the ferroelectric capacitors due to collected charges generated by the irradiation is less likely to take place because the ferroelectric capacitors are short-circuited by the cell transistor in the ON state, unlike the conventional cell, so that the reliability can be largely improved. In the conventional cell, the storage node is floating. Therefore, when the cell transistor is ON in the unselected state, the device is influenced by noise such as a parasitic capacity coupling caused by the operation of the selected memory cell. However, such an influence can be prevented by the present invention. FIG. 53 shows an example of this operation.

(32nd Embodiment)

FIGS. 54A to 54I are sectional views showing various memory structures so as to explain the 32nd embodiment of the present invention.

Figure 54A:
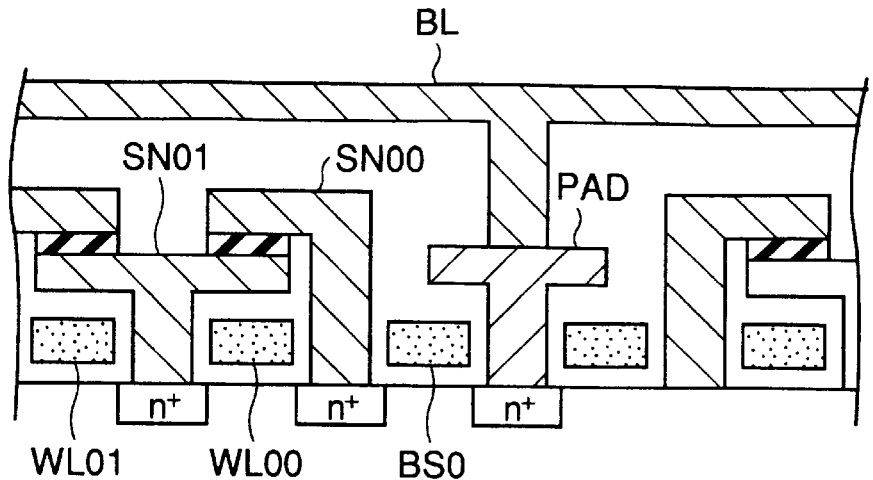
FIGS. 54A to 54I are sectional views showing the structures of various memory cells so as to explain the 32nd embodiment.

In FIG. 54A, no deep bit line contact is formed at the bit line die conductor portion where a bit line BL and a select transistor are connected, unlike FIGS. 6A and 6B. Instead, the select transistor is connected to the bit line BL through a pad layer PAD. The pad layer PAD may be commonly used as the lower or upper electrode interconnection of a cell node, as a matter of course. In this case, since no deep bit line contact need be formed, the device can be easily manufactured.

Figure 54B:
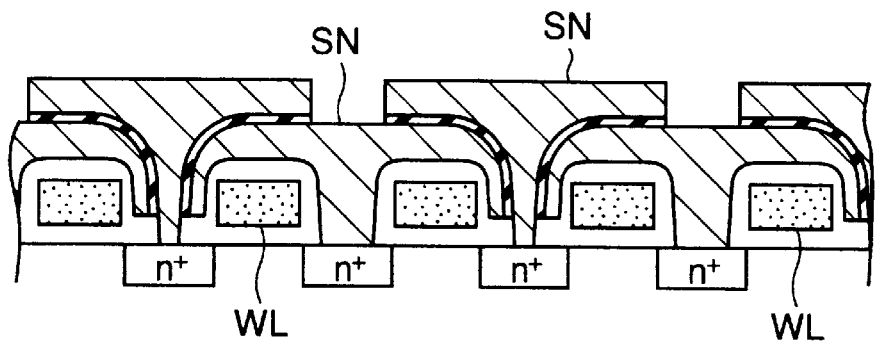

In FIG. 54B, a ferroelectric capacitor is also formed at a gate side wall portion. In this case, the capacitor area can be increased.

Figure 54C:
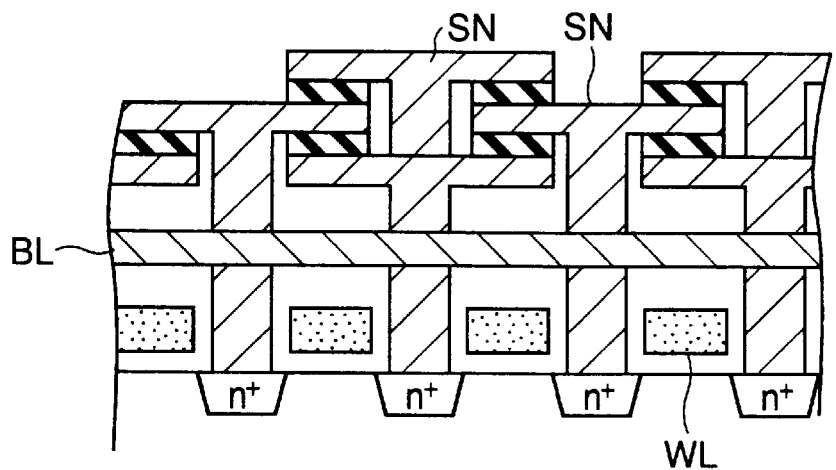
Figure 54D:
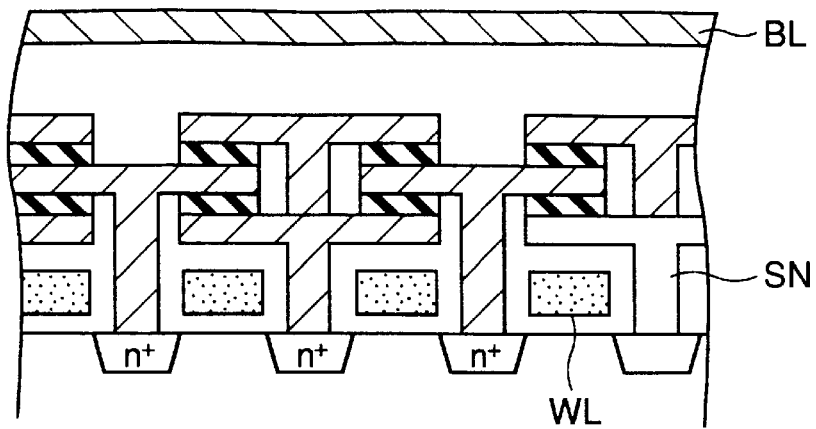

In FIGS. 54C and 54D, the ferroelectric capacitors are stacked using a fin structure. In this case as well, the capacitor area can be increased. The fin structure is also used for the conventional DRAM in which a plate electrode is sandwiched between fins. In this embodiment, however, the plate electrode is not sandwiched between fins.

Figure 54E:
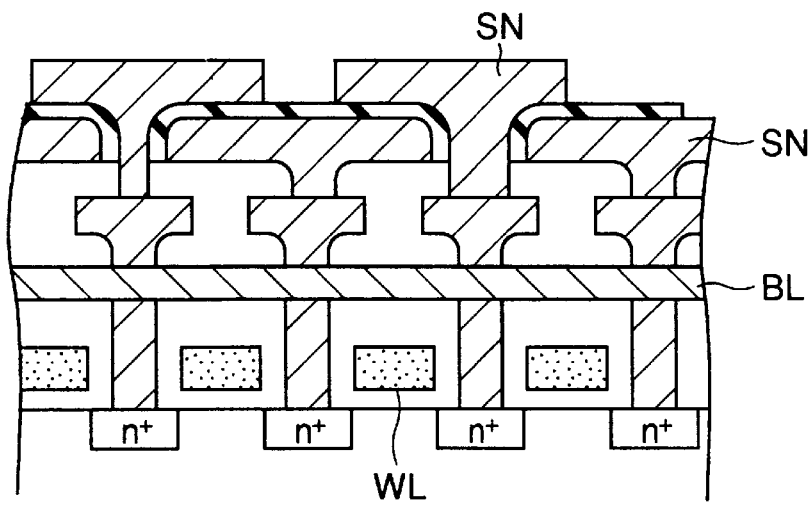
Figure 54F:
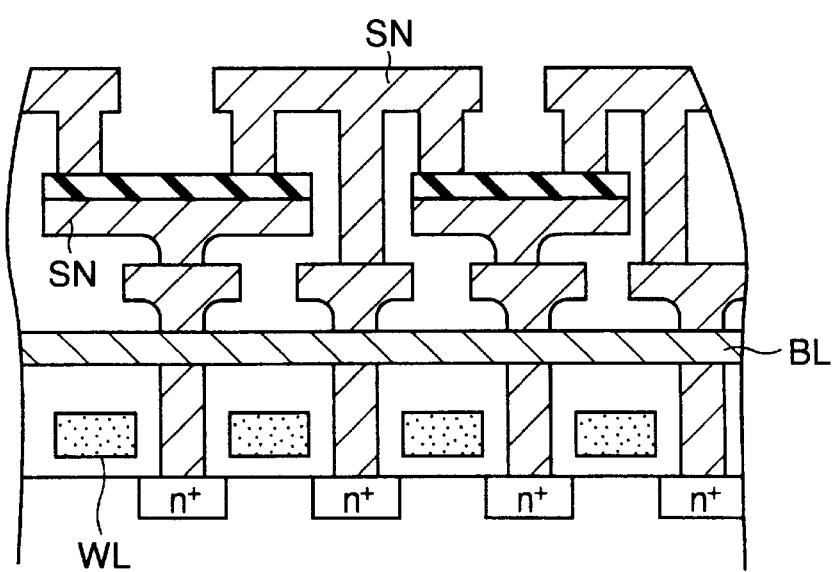

In FIG. 54E, after a cell node is formed above the bit line BL, the ferroelectric capacitor is formed. In FIG. 54F, an insulating film is formed after formation of a ferroelectric film, and an upper electrode is formed after formation of a contact hole, as in FIG. 54E. As shown in FIG. 54E, the ferroelectric capacitor may be formed to be perpendicular to the substrate.

Figure 54G:
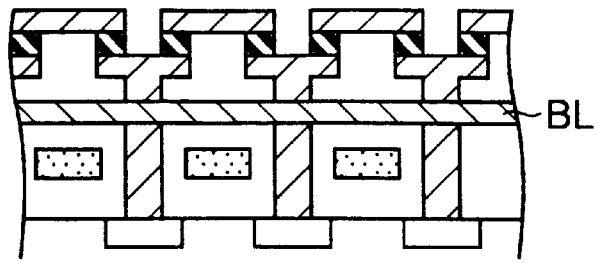

FIG. 54G is slightly different from the above examples in that, in any cell node, the ferroelectric film is formed after formation of a lower electrode, and thereafter, adjacent cell nodes are connected through the upper electrode. This structure is equivalent to a structure in which two ferroelectric capacitors are connected in series. Although the cell capacity is halved, the device can be easily manufactured because the upper electrode need only be connected to the ferroelectric film.

Figure 54H:
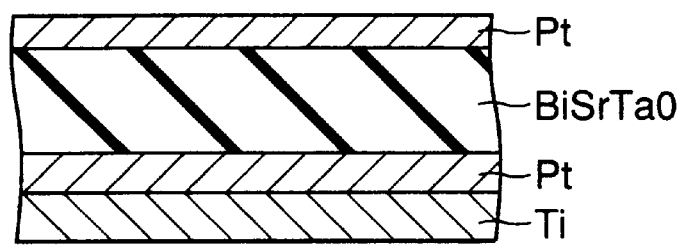
Figure 54I:
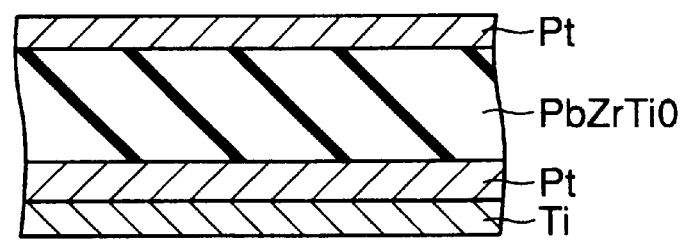

FIGS. 54H and 54I are enlarged sectional views of a capacitor portion. A ferroelectric film and upper and lower electrodes contacting the ferroelectric film are shown. In FIG. 54H, a Pt film serving as a lower electrode is formed on a Ti layer, a composite film of a ferroelectric film (SrBiTaO) is formed on the resultant structure, and a Pt film is formed as an upper electrode. In FIG. 54I, a Pt film serving as a lower electrode is formed on a Ti layer, a composite film of a ferroelectric film (PbZrTiO) is formed on the resultant structure, and a Pt film is formed as an upper electrode.

An Si layer or another metal layer may be formed on the upper electrode. An Si layer or a metal layer may be connected to the lower surface of the lower electrode. The two stages of plugs of a cell node in, e.g., FIG. 54E are formed of polysilicon layers. A ferroelectric film is formed on the polysilicon layer through a barrier metal layer of TiPi, and a Pt layer is formed on the ferroelectric film. An Al layer may be formed on the Pt layer. Ir, $IrO_2$, or the like may be used as the electrode of the cell.

As a modification of FIG. 54E, an Si plug may be formed on a diffusion layer, a Ti layer/TiN layer/Pt layer may be formed on the resultant structure, and a ferroelectric film may be formed on the Ti layer/TiN layer/Pt layer. A BaSrTiO-based material may be used to form the ferroelectric film. A BaSrTiO-based material containing Sr in an amount larger than that of Bs can be used for a ferroelectric capacitor. SrRuO may be used as the electrode of this ferroelectric capacitor such that the lattice constant of the ferroelectric capacitor does not match that of the electrode. With this distortion, the polarization amount may be increased. Ru, RuO, or the like may be used as the electrode material. After formation of the upper electrode, a $TiO_2$ film/$SiO_2$ film may formed. In this case, the polarization amount can be prevented from decreasing due to various subsequent heat treatments based on reduction of H in which oxygen is removed from the ferroelectric capacitor. The ferroelectric capacitor can be formed using any one of a sol-gel process, sputtering, CVD and MOCVD.

(33rd Embodiment)

Figure 55:
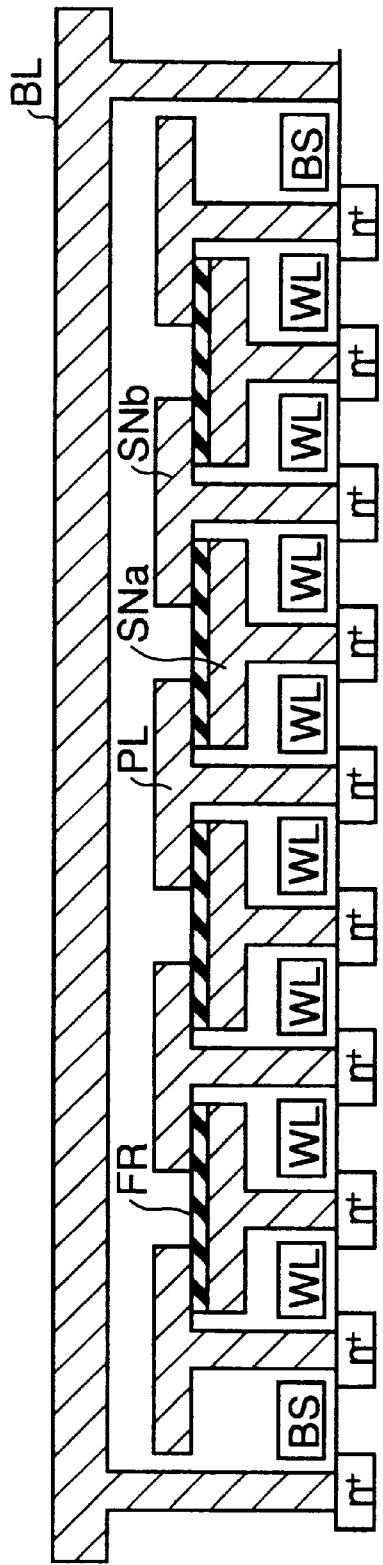
FIG. 55 is a sectional view showing the device structure of an FRAM according to the 33rd embodiment.

FIG. 55 is a sectional view showing the memory cell structure of an FRAM according to the 33rd embodiment of the present invention.

After a lower electrode SNa and a ferroelectric film FR of a capacitor are formed, the ferroelectric film FR is not entirely but partially processed to form an upper electrode SNb of the capacitor. That is, the ferroelectric film FR is partially connected. The ferroelectric film has an anisotropy in the direction of film formation. In this example, polarization mainly occurs in a direction perpendicular to the Si surface and not in the horizontal direction. For this reason, no problem is posed even in the above structure. All the above-described examples of a cell can also have the same structure. Even when an isotropic material is used, no problem is posed as far as the ferroelectric films are sufficiently separated from each other.

(34th Embodiment)

Figure 56A:
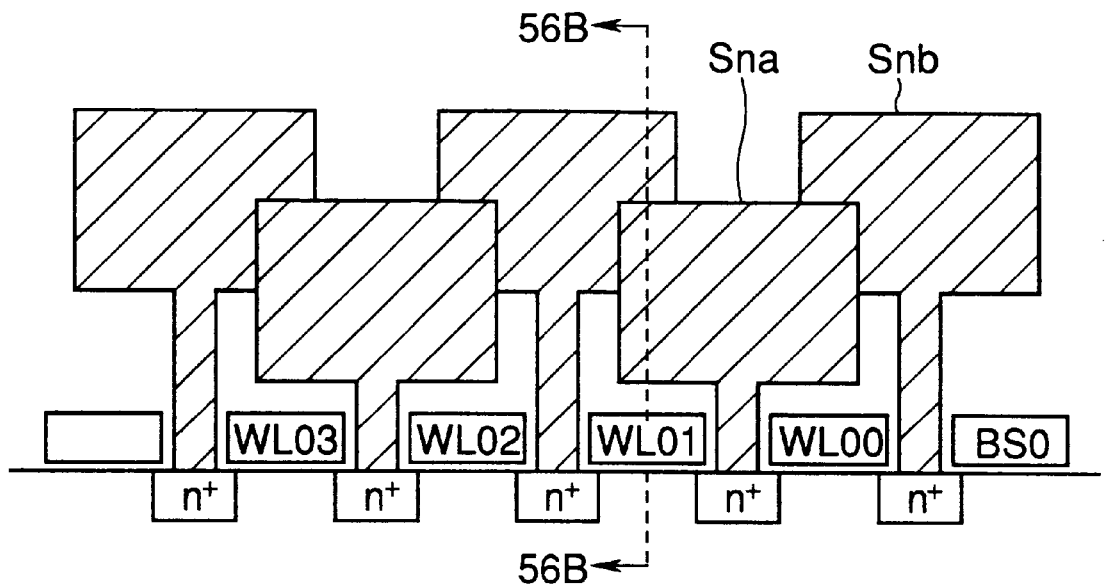
FIGS. 56A and 56B are sectional views showing the device structure of an FRAM according to the 34th embodiment.
Figure 56B:
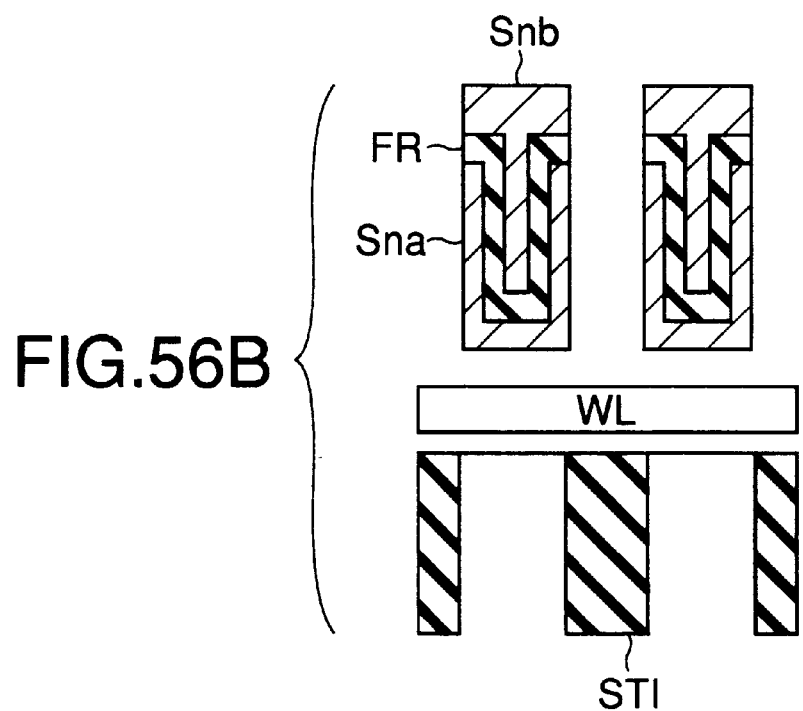

FIGS. 56A and 56B are sectional views showing the memory cell structure of an FRAM according to the 35th embodiment of the present invention. FIG. 56A is a sectional view taken along a bit line, and FIG. 56B shows a section along a word line, i.e., taken along a line 56B—56B in FIG. 56A.

A lower electrode SNa of a capacitor is formed as a groove (or a hole). An ferroelectric film FR is formed in the groove, and an upper electrode SNb is formed. With this structure, the area of the ferroelectric film FR can be increased, and the polarization amount of the memory cell can be increased.

(35th Embodiment)

Figure 57:
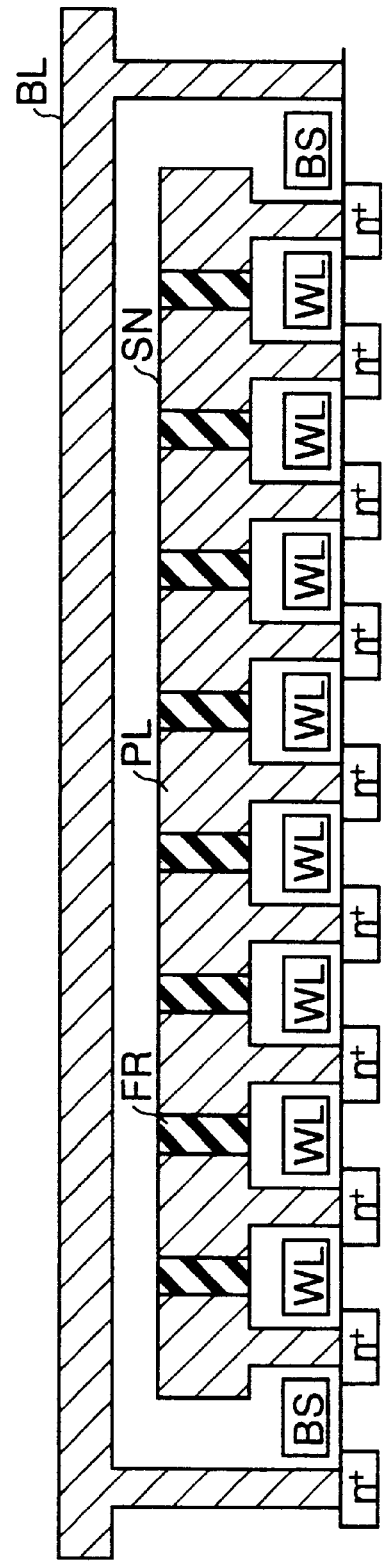
FIG. 57 is a sectional view showing the device structure of an FRAM according to the 35th embodiment.

FIG. 57 is a sectional view showing the memory cell structure of an FRAM according to the 35th embodiment of the present invention. Unlike the above-described cell structure, all storage nodes (SN) are simultaneously formed, and thereafter, ferroelectric films FR are deposited between the adjacent storage nodes SN, thereby realizing the equivalent circuit of the present invention.

The characteristic features of this embodiment are as follows. (1) Since the upper and lower electrodes can be simultaneously formed, the process cost can be reduced. A plate electrode PL need not be independently formed, unlike the conventional cell having a 1-transistor/1-capacitor structure, resulting in cost merit. (2) When the upper electrode is to be formed, the node is extracted from the diffusion layer of the cell transistor. For this reason, the ferroelectric films must be separated to extract the node. This problem is also solved by this embodiment. (3) When the storage node SN is made thicker, the cell polarization amount can be freely increased. (4) When the thickness of the ferroelectric film is decreased, the paraelectric component of the ferroelectric film increases. However, the remnant polarization amount as an important factor of the nonvolatile device does not depend on the thickness. When the thickness is decreased, only the coercive voltage lowers. As a result, when only the coercive voltage can be sufficiently lowered, the thickness need not be decreased. In fact, an increase in thickness increases only the paraelectric component, resulting in a decrease in read margin.

As is apparent from this result, when the cell size is reduced, e.g., when a 256-Mbit FRAM having a small size of 0.25 $\mu$m is to be manufactured, the ferroelectric film may have a thickness of about 250 nm. If the distance between the storage nodes SN is 0.25 $\mu$m, the distance between the storage nodes SN before formation of the ferroelectric film matches the required ferroelectric film thickness even in this cell structure, so the distance between the storage nodes SN, i.e., the distance smaller than the design rule need not be forcibly maintained.

Figure 58:
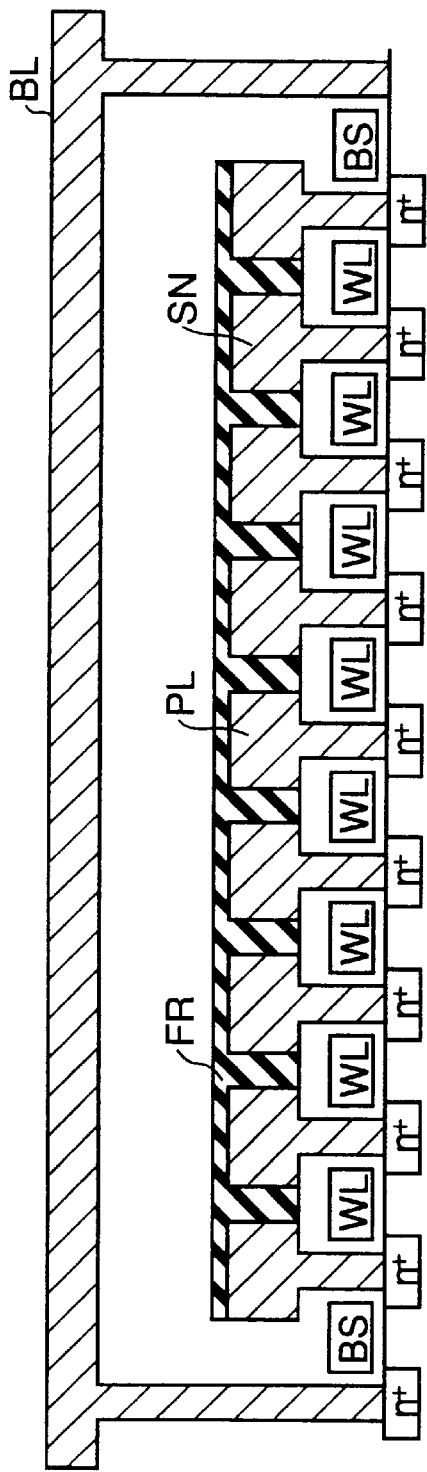
FIG. 58 is a sectional view showing a modification of the FRAM according to the 35th embodiment.

FIG. 58 is a sectional view showing a modification of this embodiment. In FIG. 58, in formation of the cell shown in FIG. 57, the ferroelectric film FR is left not only between the nodes SN but also on the storage nodes SN. Even when the ferroelectric film FR is formed on the storage node SN (even when the ferroelectric film FR is inevitably formed on the storage node SN because of the process of burying the ferroelectric film between the storage nodes SN), the ferroelectric film FR on the storage node SN has no counter electrodes as far as an insulating film of $SiO_2$ or the like is formed on the ferroelectric film FR. Therefore, the ferroelectric film FR can be neglected in term of operation.

(36th Embodiment)

Figure 59:
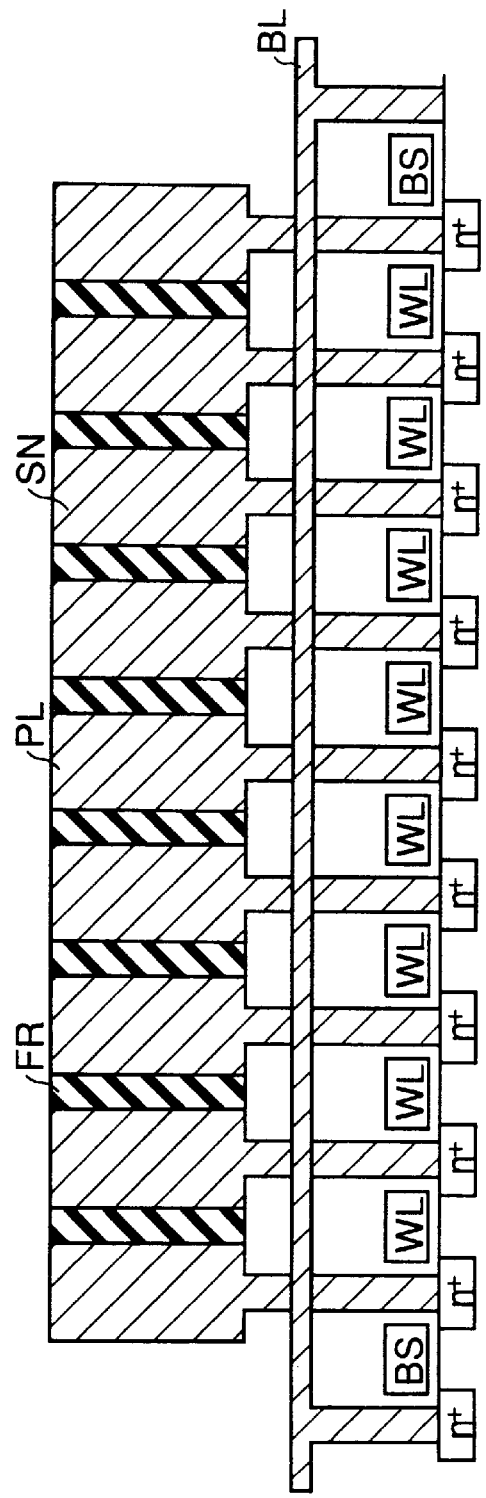
FIG. 59 is a sectional view showing the device structure of an FRAM according to the 36th embodiment.

FIG. 59 is a sectional view showing the memory cell structure of an FRAM according to the 36th embodiment of the present invention. In this embodiment, a ferroelectric film FR and an electrode SN are formed after formation of a bit line BL in the cell shown in FIG. 58. In this case, the influence of the cell step formed by the storage node thickness in formation of the bit line BL is eliminated. For this reason, the storage node thickness can be increased to increase the remnant polarization amount of the cell.

Note that CVD or MOCVD is suitably used to form the three-dimensional ferroelectric capacitor in FIGS. 56A and 56B or bury the ferroelectric capacitor film between the electrodes in FIGS. 57, 58, and 59.

(37th Embodiment)

Figure 60:
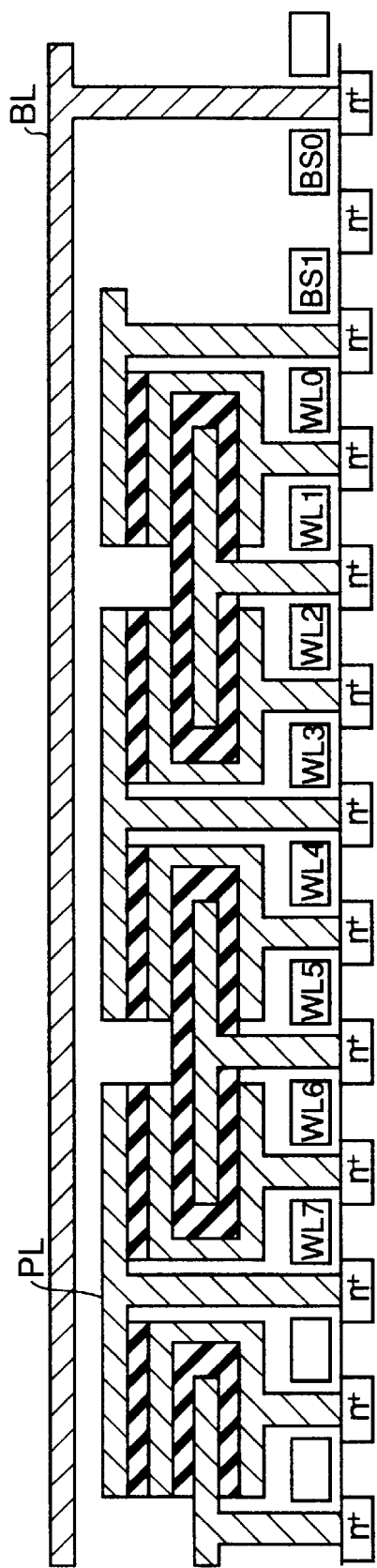
FIG. 60 is a sectional view showing the device structure of an FRAM according to the 37th embodiment.

FIG. 60 is a sectional view showing the memory cell structure of an FRAM according to the 37th embodiment of the present invention.

In the cell structure shown in FIGS. 6A and 6B, when, in a cell having a size of $4F^2$, the ferroelectric capacitor is formed as a planar capacitor, the ferroelectric capacitor area becomes $1F^2$, thus decreasing the polarization amount per cell, although the ferroelectric capacitor area of the conventional cell having a size of $8F^2$ is $2F^2$ to $3F^2$.

This problem can be solved by using, e.g., four capacitor electrode layers, as shown in FIG. 60. Four conductive layers serving as capacitor electrodes are formed above a word line WL, and the electrodes are connected to the sources and drains of cell transistors. The first electrode layer and the third electrode layer are electrically connected.

The first and third electrode layers are connected to a certain node (source/drain of a cell transistor) of the series connected cells. The second electrode layer is connected to one of the adjacent nodes, and the fourth electrode layer is connected to the other of the adjacent nodes. A ferroelectric capacitor film is formed between the first and third electrode layers and the second electrode layer. Another ferroelectric capacitor film is formed between the third and fourth electrode layers.

The ferroelectric film between the third and fourth electrode layers can be formed to have a size of $3F^2$. The ferroelectric film between the first and third electrode layers and the second electrode layer can be formed to have a size of $3F^2$ or more. Therefore, a capacitor area of $3F^2$ can be obtained even in the cell having the size of $4F^2$, so that the same polarization amount as in the prior art can be ensured. In this cell, not only the planar ferroelectric film but also a three-dimensional ferroelectric film can be formed, as shown in FIGS. 56A and 56B, to obtain a larger cell area.

Figure 61:
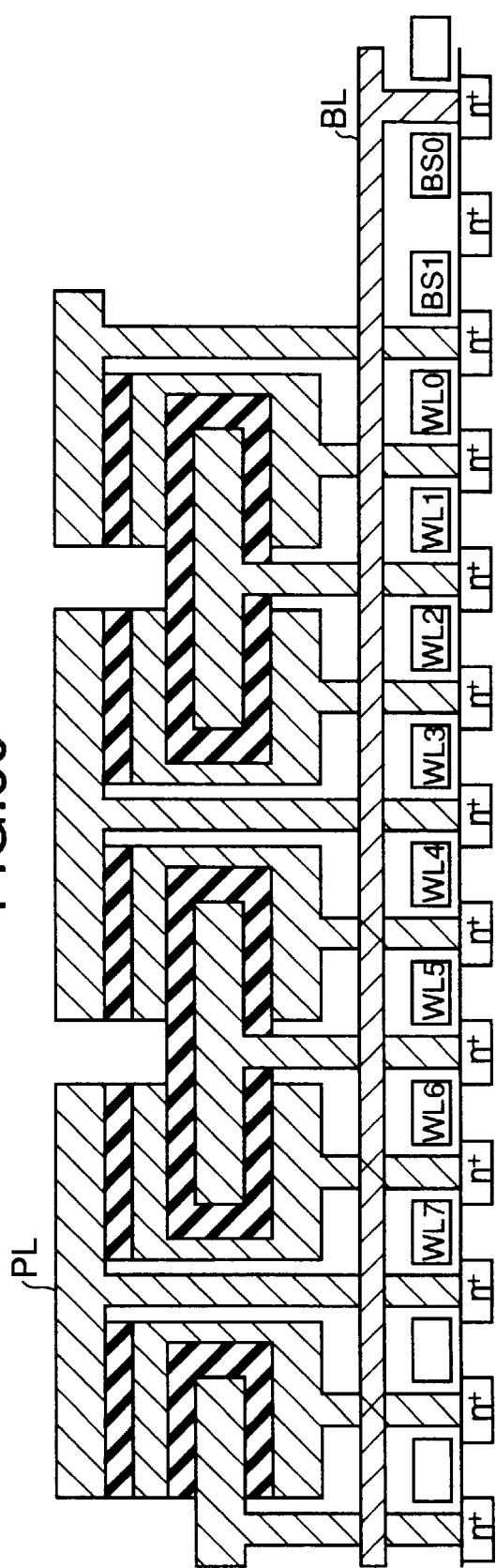
FIG. 61 is a sectional view showing a modification of the 37th embodiment.

FIG. 61 shows a modification of this embodiment in which the ferroelectric capacitors are formed after formation of bit lines, unlike FIG. 60.

(38th Embodiment)

Figure 62A:
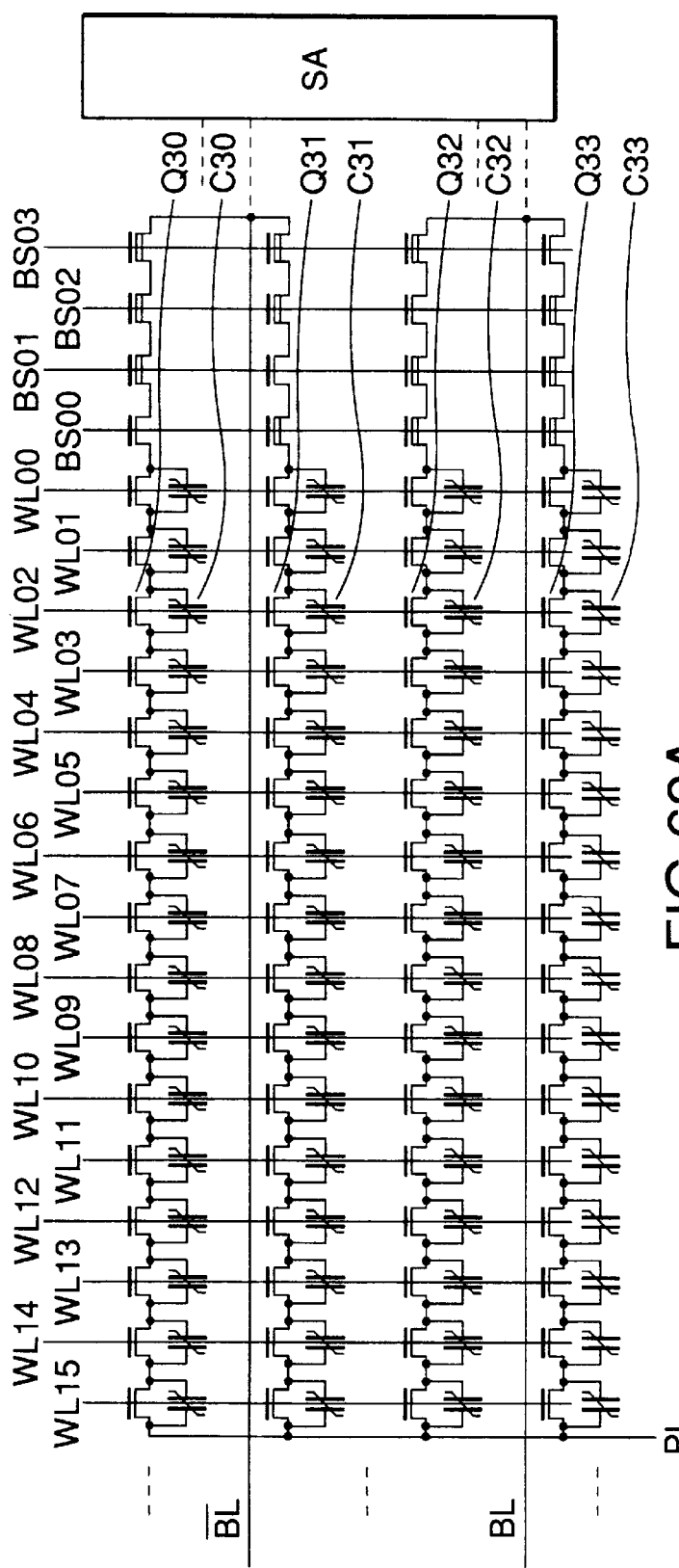
FIGS. 62A and 62B are a circuit diagram and a timing chart, respectively, showing an equivalent circuit of an FRAM according to the 38th embodiment.
Figure 62B:
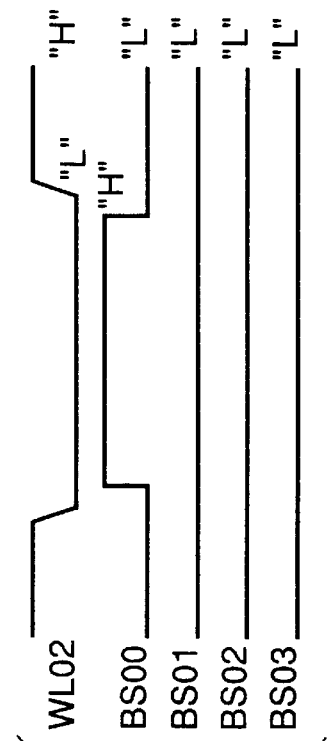

FIGS. 62A and 62B are an equivalent circuit diagram and a timing chart, respectively, showing the memory cell structure of an FRAM according to the 38th embodiment of the present invention.

As shown in FIG. 62A, a ferroelectric capacitor and a cell transistor (WL00 to WL15) are connected in parallel to constitute one cell. A plurality of cells are connected in series. Four select transistors controlled by four block selection lines (BS00 to BS03) are connected in series with each other and also connected to the cells, thereby constituting cell blocks. One terminal of a cell block is connected to a plate (PL) electrode. The other terminal is connected to a bit line BL. One terminal of the first cell block including a cell (Q30, C30) and one terminal of the second cell block including a cell (Q31, C31) are connected to a common bit line $\overline{BL}$. One terminal of the third cell block including a cell (Q32, C32) and one terminal of the fourth cell block including a cell (Q33, C33) are connected to the common bit line BL.

As the selection block transistors, one transistor having a positive threshold value and three transistors each having a negative threshold value are used for each cell block, as shown in FIG. 62A. In selecting a memory cell, only one of the first to fourth cell blocks can be selected by the four block selection lines (BS00 to BS03).

As is apparent from the timing chart of FIG. 62B, when only the block selection line BS00 is set at "H", only the first cell block can be selected. This is because, only in the first cell block, all the four series-connected select transistors are turned on. As a result, when the word line WL02 is selected, only the cell (Q30, C30) is selected. The cell data is read out not to bit line BL side but to the bit line $\overline{BL}$ side, so that a folded bit line structure can be realized. As in FIG. 26, the number of sense amplifiers can be half that of an open bit line structure because of advantages including low noise, relaxation of the sense amplifier pitch, and sharing of a sense amplifier by cell arrays on both sides of the sense amplifier (shared sense amplifier).

In this embodiment, the bit line pitch can be increased to twice that shown in FIG. 26, so that a bit line pitch relaxation type folded bit line structure can be realized. With this structure, the bit lines can be easily manufactured. Since the bit lines are separated in terms of characteristics, coupling noise between the bit lines can be reduced. In addition, the sense amplifier pitch can also be increased to twice that shown in FIG. 26. The sense amplifier circuits can be easily formed, and the number of sense amplifiers can be ½ that shown in FIG. 26, so that the chip size can be reduced.

When a sense amplifier is shared by a plurality of bit lines, as shown in FIG. 30C, the bit line pitch cannot be increased, although the number of sense amplifiers decreases. Additionally, another bit line must be selected later. In the combination of the structure shown in FIG. 30C and that shown in FIG. 32B, a sense amplifier can be shared, and cell data need not be read out to another bit line which is not selected. However, the bit line pitch cannot be increased. In addition, before reading, only the selected bit line potential must be lowered (or raised) to Vss, as shown in FIG. 32B, resulting in a decrease in access speed. To the contrary, the scheme shown in FIGS. 62A and 62B can prevent such penalty in access speed.

(39th Embodiment)

FIGS. 63A and 63B are an equivalent circuit diagram and a timing chart, respectively, showing the memory cell structure of an FRAM according to the 39th embodiment of the present invention.

This embodiment has almost the same structure and effects as those in FIGS. 62A and 62B except that, as selection block transistors, two transistors each having a positive threshold value and two transistors each having a negative threshold value are used for each cell block.

In selecting a memory cell, two of four selection block lines (BS00 to BS03) are set at "H" so that only one of the first to fourth cell blocks can be selected. More specifically, the selection block line BS02 or BS03 is selected to select the two upper or lower cell blocks, and then, one of the two cell blocks is selected by the block selection line BS00 or BS01.

(40th Embodiment)

FIGS. 64A and 64B are an equivalent circuit diagram and a timing chart, respectively, showing the memory cell structure of an FRAM according to the 40th embodiment of the present invention.

This embodiment has almost the same structure and effects as those in FIGS. 63A and 63B. As an additional effect, the number of selection block transistors is reduced.

The operation is the same as that shown in FIGS. 63A and 63B. In selecting a memory cell, two of four selection block lines (BS00 to BS03) are set at "H" so that only one of the first to fourth cell blocks can be selected.

More specifically, the selection block line BS02 or BS03 is selected to select the two upper or lower cell blocks, and then, one of the two cell blocks is selected by the block selection line BS00 or BS01. With this structure, the gate capacities of the block selection lines BS02 and BS03 can be reduced, the bit line capacity can be reduced, and the rule for the selection block transistor can be relaxed.

(41st Embodiment)

Figures 65A, 65B:
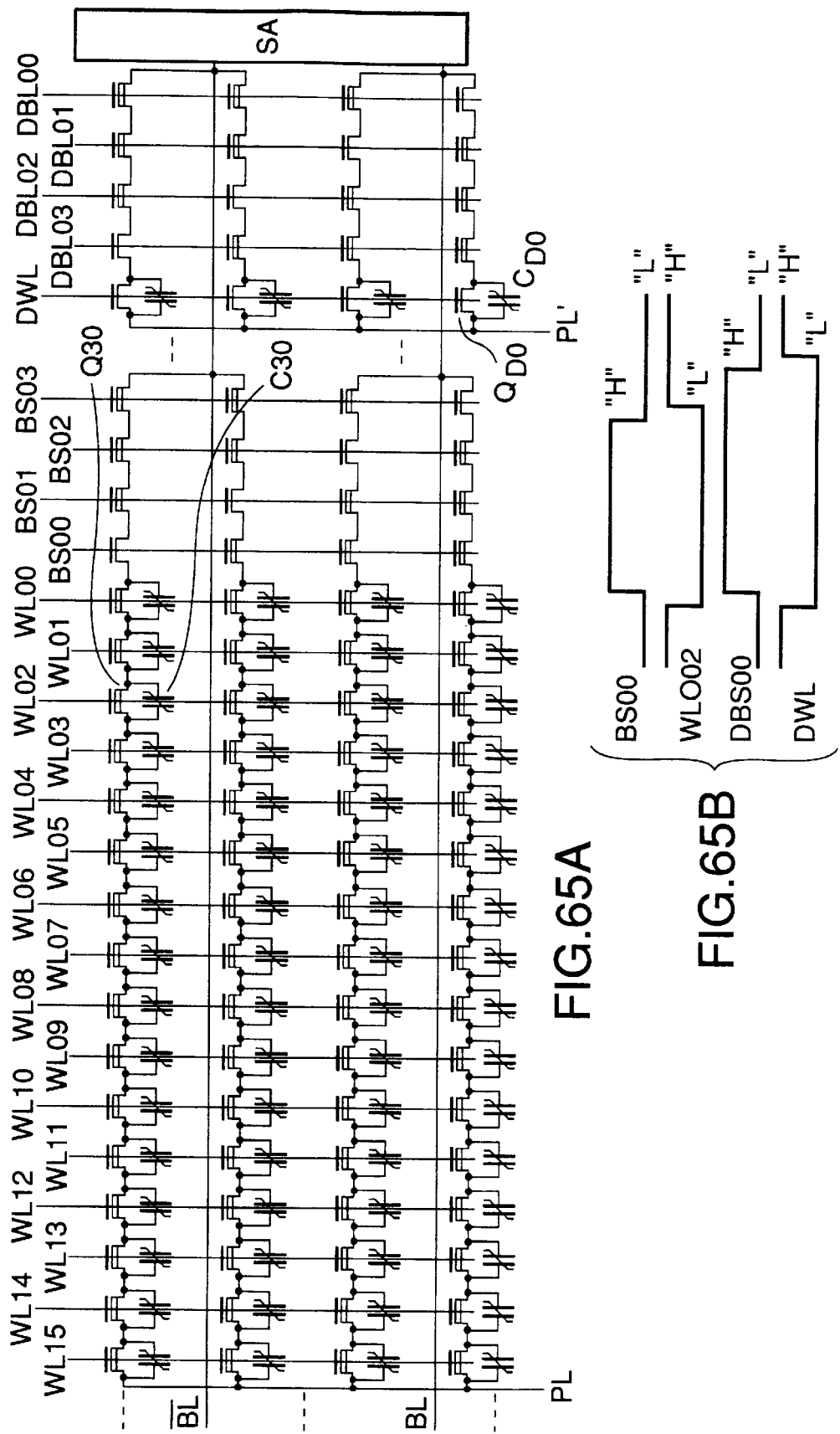
FIGS. 65A and 65B are a circuit diagram and a timing chart, respectively, showing an equivalent circuit of an FRAM according to the 41st embodiment.

FIGS. 65A and 65B are an equivalent circuit diagram and a timing chart, respectively, showing the memory cell structure of an FRAM according to the 41st embodiment of the present invention.

The dummy cell can also realize the same structure as that of the memory cell except that the number of series connected dummy cells is 1. For the operation, in selecting a memory cell (Q30, C30), the cell data is read out to a bit line $\overline{BL}$, as shown in FIG. 65B. Simultaneously, a block selection line DBS00 for dummy cell is set at "H", and a dummy word line DWL is set at "L". With this operation, the dummy cell data is also read out to a reference bit line (BL). The detailed operation is the same as that shown in FIG. 43, and a fatigue according to polarization inversion of the dummy cell can be suppressed.

(42nd Embodiment)

Figures 66A, 66B:
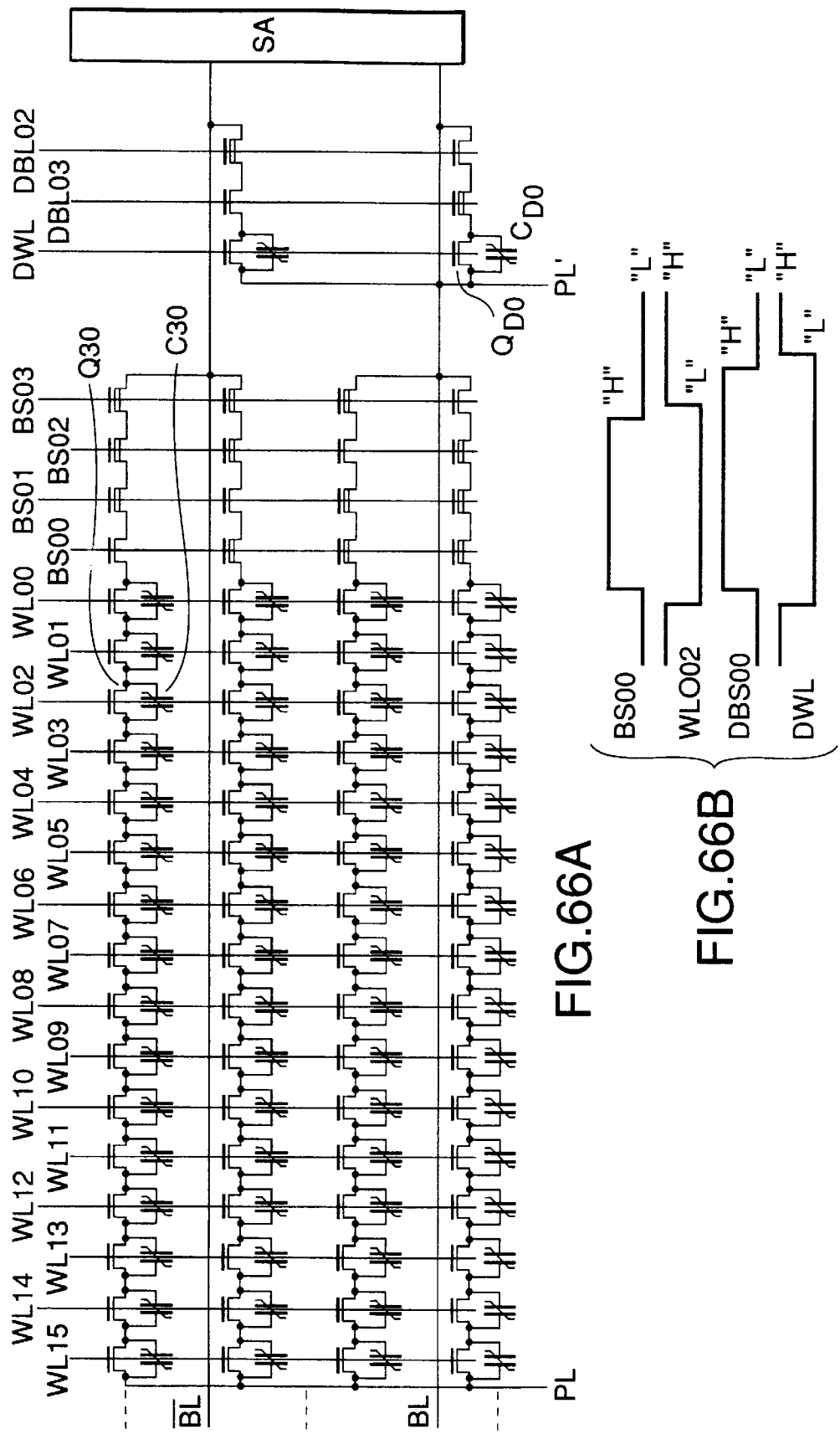
FIGS. 66A and 66B are a circuit diagram and a timing chart, respectively, showing an equivalent circuit of an FRAM according to the 42nd embodiment.

FIGS. 66A and 66B are an equivalent circuit diagram and a timing chart, respectively, showing the memory cell structure of an FRAM according to the 42nd embodiment of the present invention.

In FIG. 66A, another example of the dummy cell structure shown in the embodiment shown in FIG. 62A is added. The number of dummy cells is reduced, as compared to the structure shown in FIG. 65A, and the rule can be relaxed. For the operation, in selecting a memory cell (Q30, C30), the cell data is read out to a bit line $\overline{BL}$, as shown in FIG. 66B. Simultaneously, a block selection line DBS02 for dummy cell is set at "H", and a d ummy word line DWL is set at "L". With this operation, the dummy cell data is also read out to a reference bit line (BL). The detailed operation is the same as that shown in FIG. 43, and a fatigue according to polarization inversion of the dummy cell can be suppressed.

Figure 67:
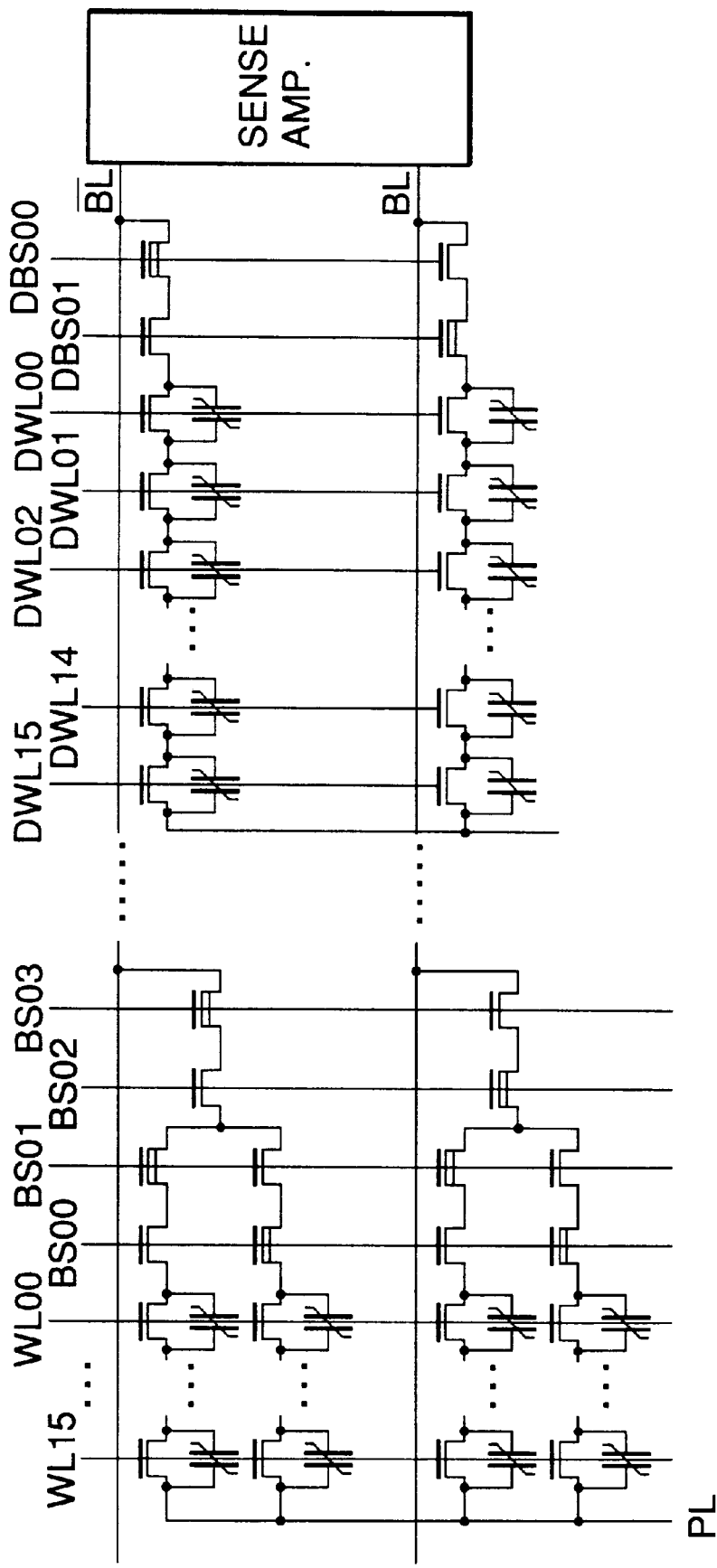
FIG. 67 is a circuit diagram showing a structure in which a plurality of dummy cells according to the embodiment shown in FIGS. 66A and 66B are connected in series.
Figure 68:
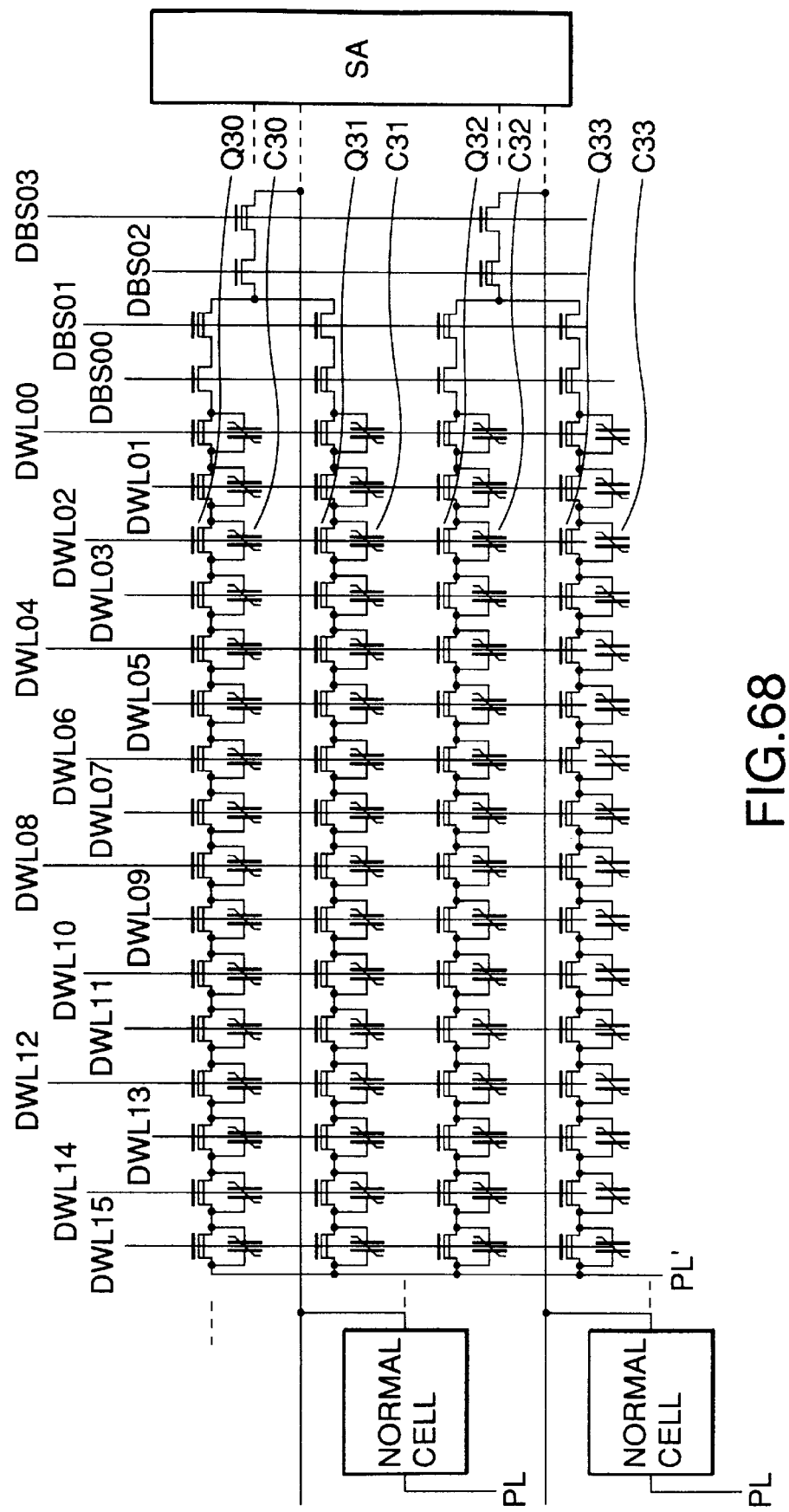
FIG. 68 is a circuit diagram showing a structure in which a plurality of dummy cells connectable to the embodiment shown in FIGS. 64A and 64B are connected in series.

FIG. 67 shows a structure in which a plurality of dummy cells of the embodiment shown in FIG. 66A are connected in series. With this structure, the same effects as those in FIGS. 42B and 44A can be obtained. FIG. 68 shows a structure in which a plurality of dummy cells connectable to the embodiment shown in FIG. 64A are connected in series. With this structure, the same effects as those in FIGS. 42B and 44A can be obtained.

(43rd Embodiment)

FIGS. 69A and 69B are an equivalent circuit diagram and a timing chart, respectively, showing the memory cell structure of an FRAM according to the 43rd embodiment of the present invention.

In FIG. 69A, a depletion-type transistor is employed as the memory cell transistor of the embodiment shown in FIG. 62A. For the operation, in the power-OFF state or in the stand-by state, the word line voltage is set at 0V to turn on the cell transistor, and only the potential of the word line of a selected memory cell is lowered to a negative potential to turn off the cell transistor, as shown in FIG. 69B.

In this embodiment, the following effects can be obtained in addition to the effects of the embodiment shown in FIGS. 62A and 62B, as in FIGS. 51 and 50. (1) The word line leakage in the stand-by state poses no problem. (2) No high voltage is applied in the stand-by state. The device is resistant to noise and sudden power OFF. (3) In both the power-OFF state and the stand-by state, the device is resistant to a software error due to a radiation.

(44th Embodiment)

FIGS. 70A and 70B are an equivalent circuit diagram a timing chart, respectively, showing the memory cell structure of an FRAM according to the 44th embodiment of the present invention.

In FIG. 70A, a depletion-type transistor is employed as the memory cell transistor of the embodiment shown in FIG. 63A. In this embodiment, the following effects can be obtained in addition to the effects of the embodiment shown in FIGS. 63A and 63B, as in FIGS. 51 and 50. (1) The word line leakage in the stand-by state poses no problem. (2) No high voltage is applied in the stand-by state. (3) The device is resistant to noise and sudden power OFF. (4) In both the power-OFF state and the stand-by state, the device is resistant to a software error caused by a radiation.

(45th Embodiment)

Figures 71A, 71B:
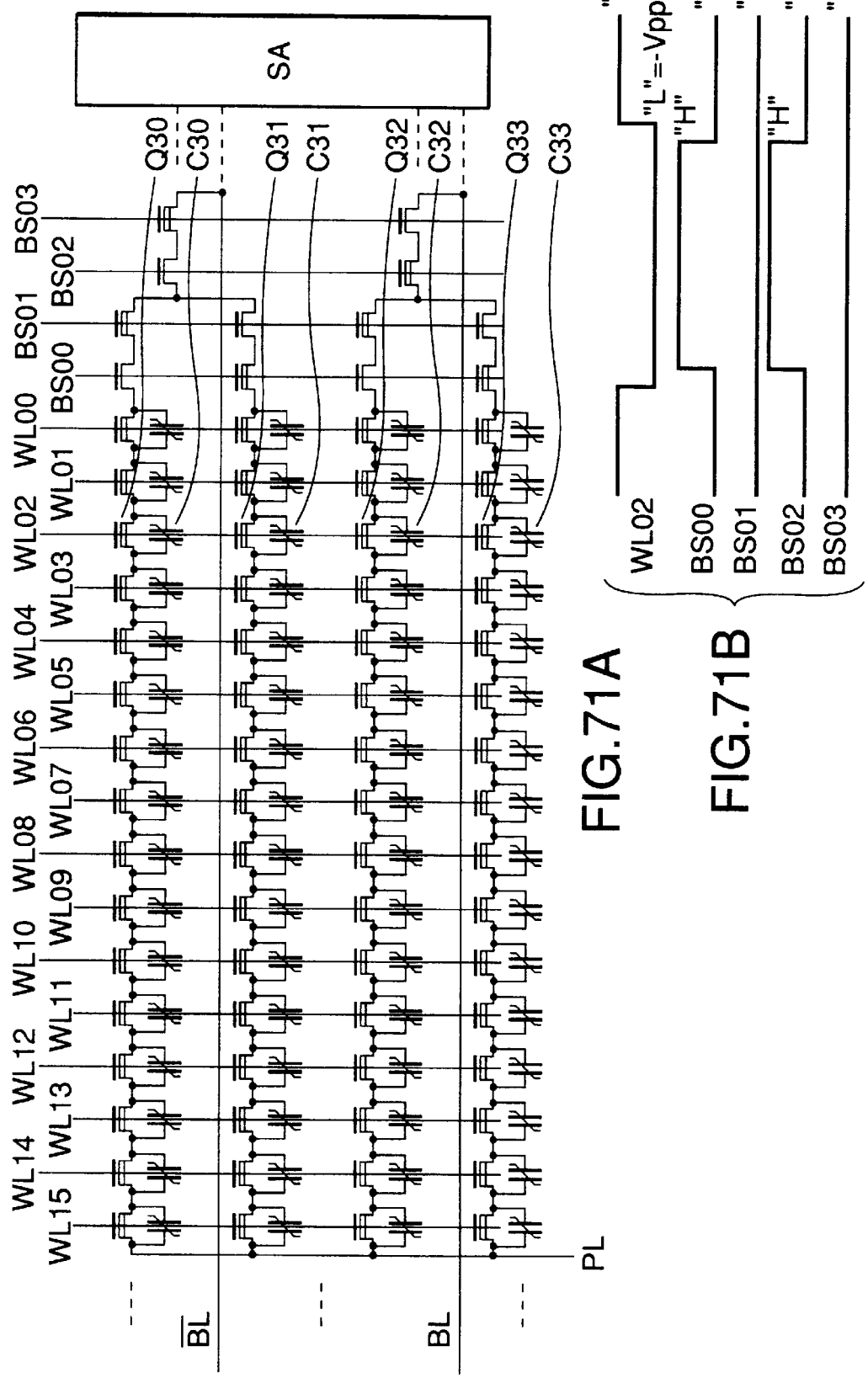
FIGS. 71A and 71B are a circuit diagram and a timing chart, respectively, showing an equivalent circuit of an FRAM according to the 45th embodiment.

FIGS. 71A and 71B are an equivalent circuit diagram a timing chart, respectively, showing the memory cell structure of an FRAM according to the 45th embodiment of the present invention.

In FIG. 71A, a depletion-type transistor is employed as the memory cell transistor of the embodiment shown in FIG. 64A. In this embodiment, the following effects can be obtained in addition to the effects of the embodiment shown in FIGS. 64A and 64B, as in FIGS. 51 and 50. (1) The word line leakage in the stand-by state poses no problem. (2) No high voltage is applied in the stand-by state. (3) The device is resistant to noise and sudden power OFF. (4) In both the power-OFF state and the stand-by state, the device is resistant to a software error caused by a radiation.

(46th Embodiment)

Figures 72A, 72B:
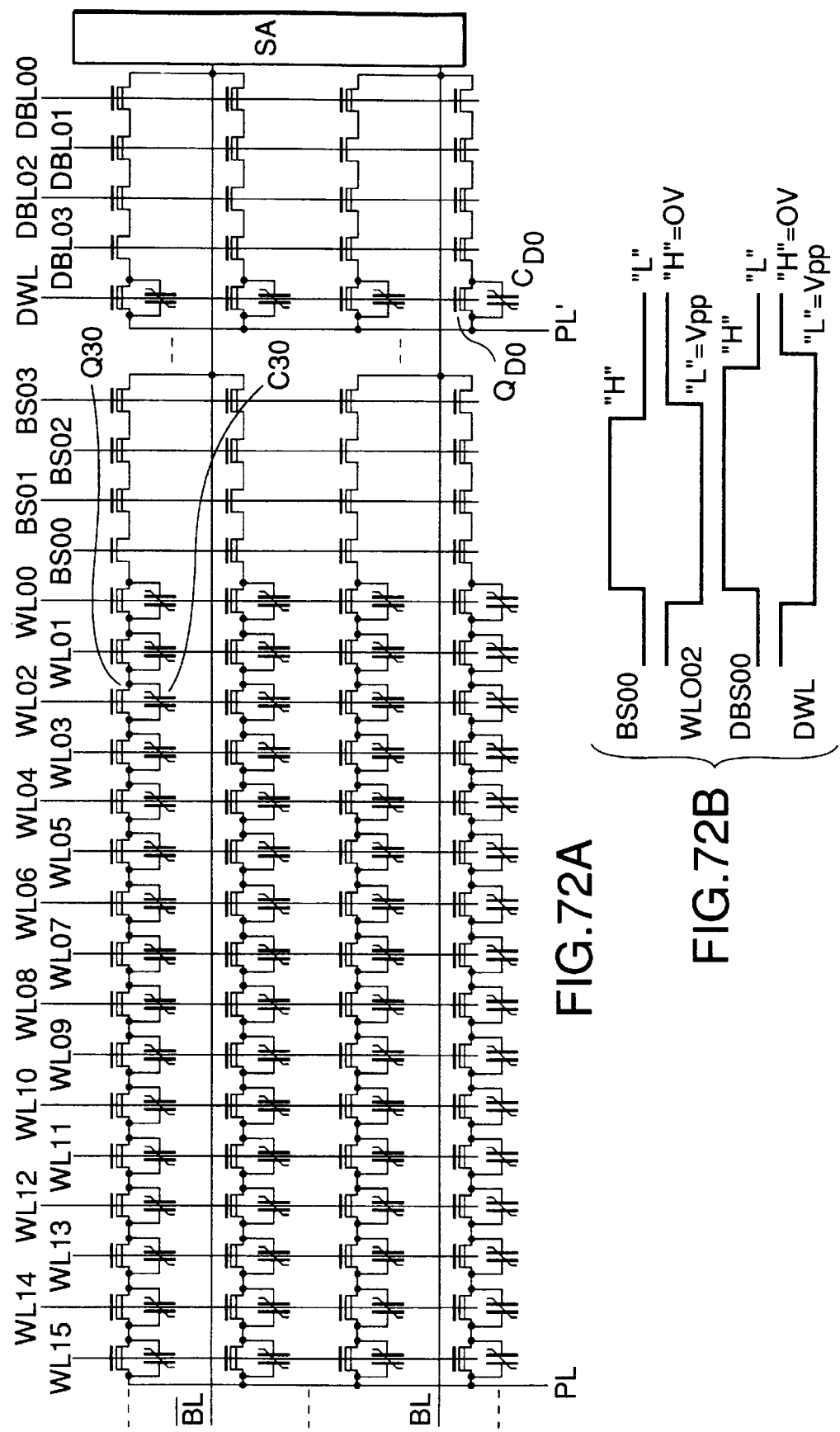
FIGS. 72A and 72B are a circuit diagram and a timing chart, respectively, showing an equivalent circuit of an FRAM according to the 46th embodiment.

FIGS. 72A and 72B are an equivalent circuit diagram a timing chart, respectively, showing the memory cell structure of an FRAM according to the 46th embodiment of the present invention.

In FIG. 72A, a depletion-type transistor is employed as the memory cell transistor of the embodiment shown in FIG. 65A. The dummy cell transistor also uses a depletion-type transistor.

In this embodiment, the following effects can be obtained in addition to the effects of the embodiment shown in FIGS. 65A and 65B, as in FIGS. 51 and 50. (1) The word line leakage in the stand-by state poses no problem. (2) No high voltage is applied in the stand-by state. (3) The device is resistant to noise and sudden power OFF. (4) In both the power-OFF state and the stand-by state, the device is resistant to a software error caused by a radiation.

(47th Embodiment)

FIGS. 73A and 73B are an equivalent circuit diagram a timing chart, respectively, showing the memory cell structure of an FRAM according to the 47th embodiment of the present invention.

In FIG. 73A, a depletion-type transistor is employed as the memory cell transistor of the embodiment shown in FIG. 66A. The dummy cell transistor also uses a depletion-type transistor.

In this embodiment, the following effects can be obtained in addition to the effects of the embodiment shown in FIGS. 66A and 66B, as in FIGS. 51 and 50. (1) The word line leakage in the stand-by state poses no problem. (2) No high voltage is applied in the stand-by state. (3) The device is resistant to noise and sudden power OFF. (4) In both the power-OFF state and the stand-by state, the device is resistant to a software error caused by a radiation.

(48th Embodiment)

Figure 74A:
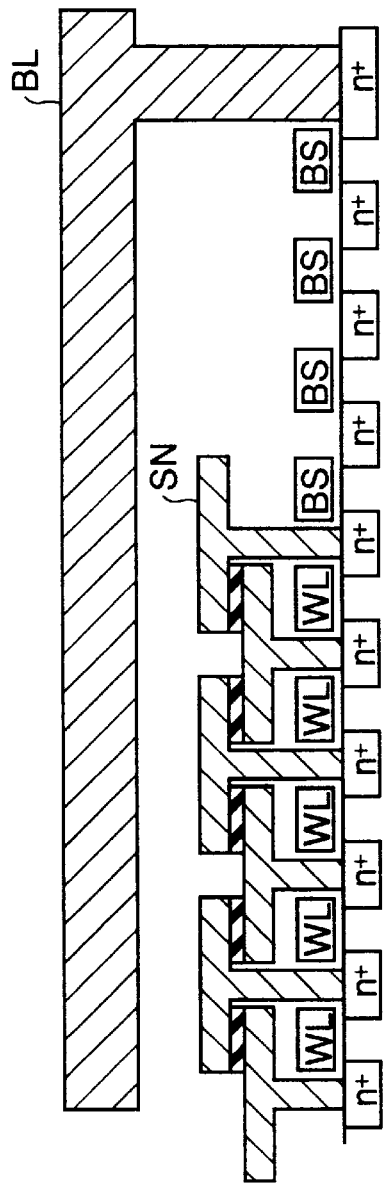
FIGS. 74A and 74B are sectional and plan views, respectively, showing the device structure of an FRAM according to the 48th embodiment.
Figure 74B:
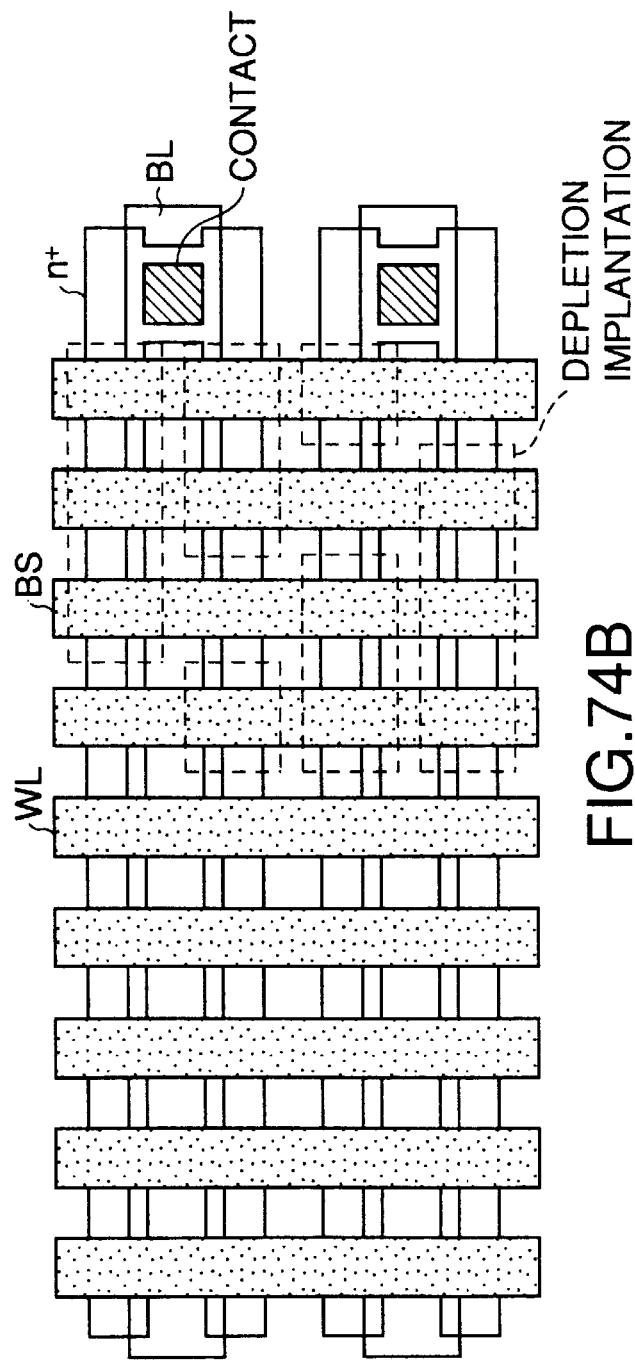

FIGS. 74A and 74B are sectional and plan views, respectively, showing the memory cell structure of an FRAm according to the 48th embodiment of the present invention. This structure equivalently corresponds to that shown in FIG. 62A.

Four block selection lines are constituted by gate interconnection. Three of four select transistors connected in series are formed as depletion-type transistors by performing ion implantation using an ion implantation mask for D-type transistor formation. In this case, the bit line pitch is largely relaxed to twice the cell pitch.

(49th Embodiment)

Figure 75A:
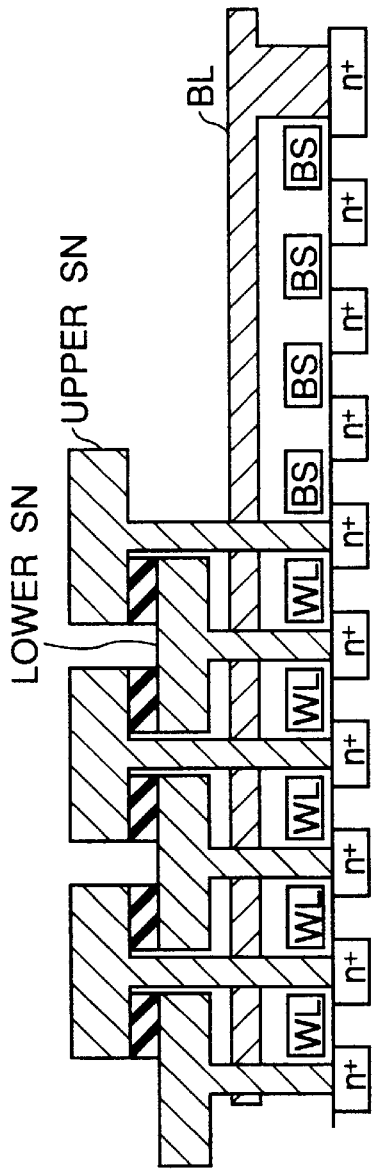
FIGS. 75A and 75B are sectional and plan views, respectively, showing the device structure of an FRAM according to the 49th embodiment.
Figure 75B:
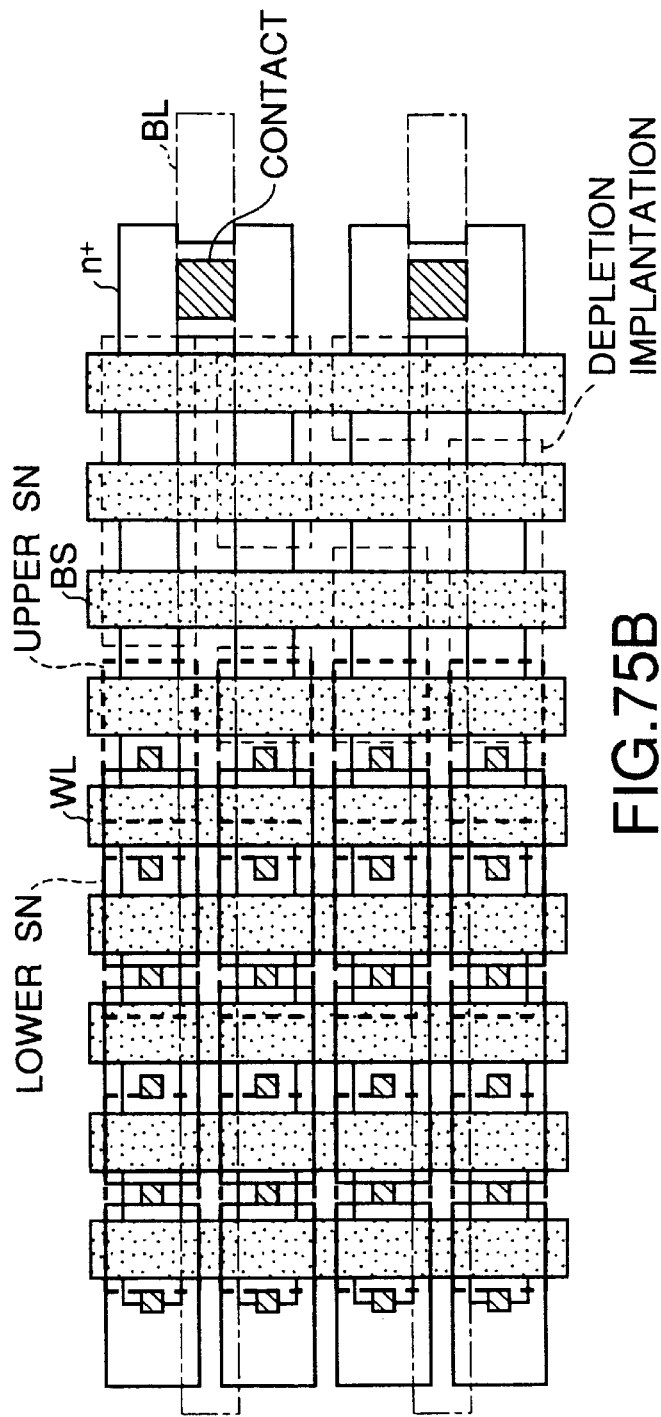

FIGS. 75A and 75B are sectional and plan views, respectively, showing the memory cell structure of an FRAM according to the 49th embodiment of the present invention. This structure equivalently corresponds to that shown in FIG. 62A. In FIGS. 74A and 74B, bit lines are formed after formation of ferroelectric capacitors. However, in FIGS. 75A and 75B, ferroelectric capacitors are formed after formation of bit lines.

In a cell structure in which bit lines are formed after formation of ferroelectric capacitors, an storage node SN must be extended from the region between bit line interconnections. This requires to shift the bit line contacts by a ½ pitch, so that an excess area is necessary at the bit line portion. In FIGS. 75A and 75B, a bit line is shared by two cell blocks. For this reason, the bit line can be extended between cells of two cell blocks, as shown in FIGS. 75A and 75B. The bit line and the cell node are automatically shifted by a ½ pitch, so that the storage node can be extended to the above portion from the region between the bit line interconnections without any overhead area.

As an additional advantage, the design rule for the bit line contact portion is doubled. As shown in FIGS. 75A and 75B, the bit line contact size and the alignment margin can be increased.

(50th Embodiment)

Figure 76A:
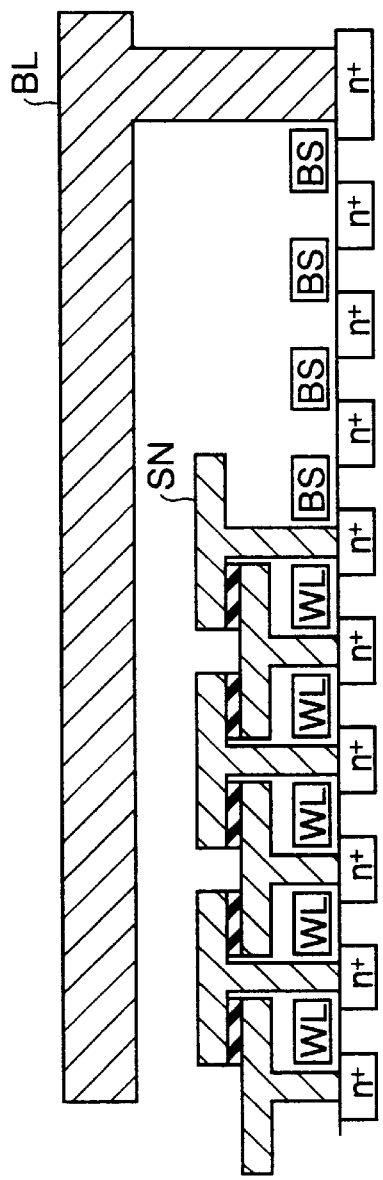
FIGS. 76A and 76B are sectional and plan views, respectively, showing the device structure of an FRAM according to the 50th embodiment.
Figure 76B:
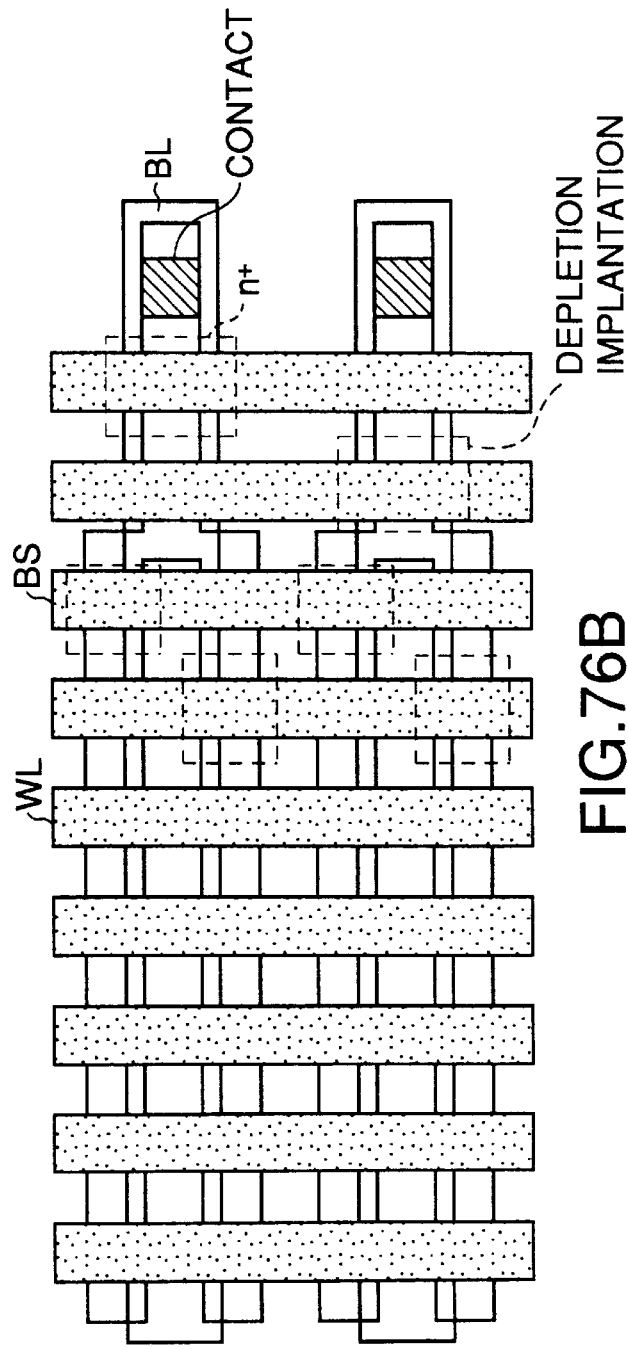

FIGS. 76A and 76B are sectional and plan views, respectively, showing the memory cell structure of an FRAm according to the 50th embodiment of the present invention. This structure equivalently corresponds to that shown in FIG. 71A.

Four block selection lines are constituted by gate interconnection, and the rule of two select transistors close to the bit line is relaxed to twice. In this embodiment, the two select transistors close to the bit line have the same size. The rule of interval is relaxed to three times to reduce the gate capacity of the select transistor. In this embodiment as well, the bit line pitch and the bit line contact pitch are largely relaxed to twice the cell pitch.

(51st Embodiment)

Figure 77A:
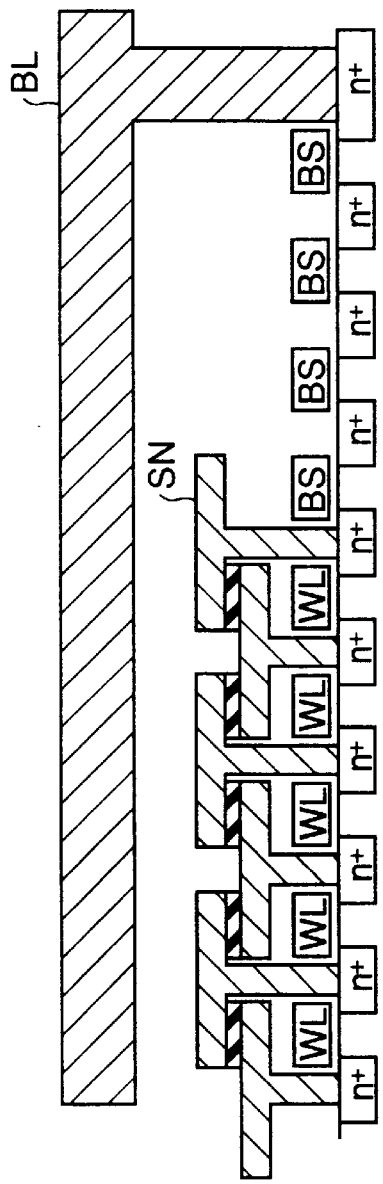
FIGS. 77A and 77B are sectional and plan views, respectively, showing the device structure of an FRAM according to the 51st embodiment.
Figure 77B:
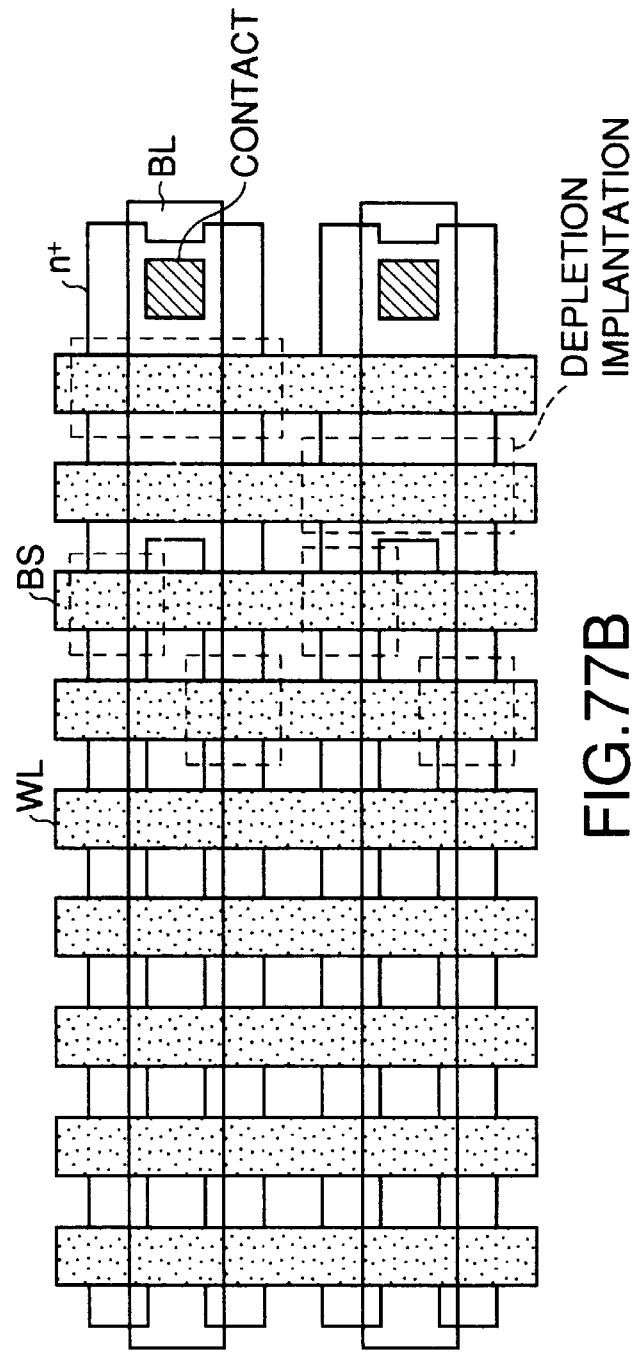

FIGS. 77A and 77B are sectional and plan views, respectively, showing the memory cell structure of an FRAm according to the 51st embodiment of the present invention. This structure equivalently corresponds to that shown in FIG. 71A.

Four block selection lines are constituted by gate interconnections, and the rule of two select transistors close to the bit line is relaxed to twice. In this embodiment, the size of the two select transistors close to the bit line is relaxed to three times, so that the rule of interval is the same as that of the prior art. In this embodiment as well, the bit line pitch and the bit line contact pitch are largely relaxed to twice the cell pitch.

FIGS. 78A to 80B show simulation/evaluation results quantitatively representing the effects of the present invention.

Figure 78B:
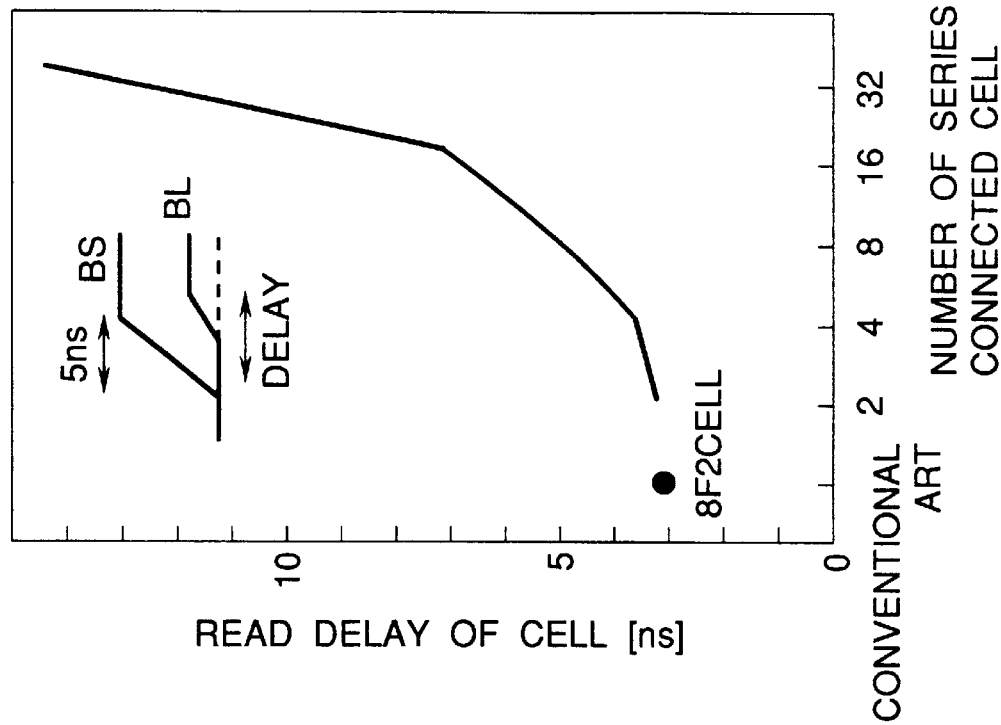
FIGS. 78A and 78B are graphs showing the dependencies of the bit line capacity and read delay of the FRAM on the number of series connected cells in the present invention.
Figure 78A:
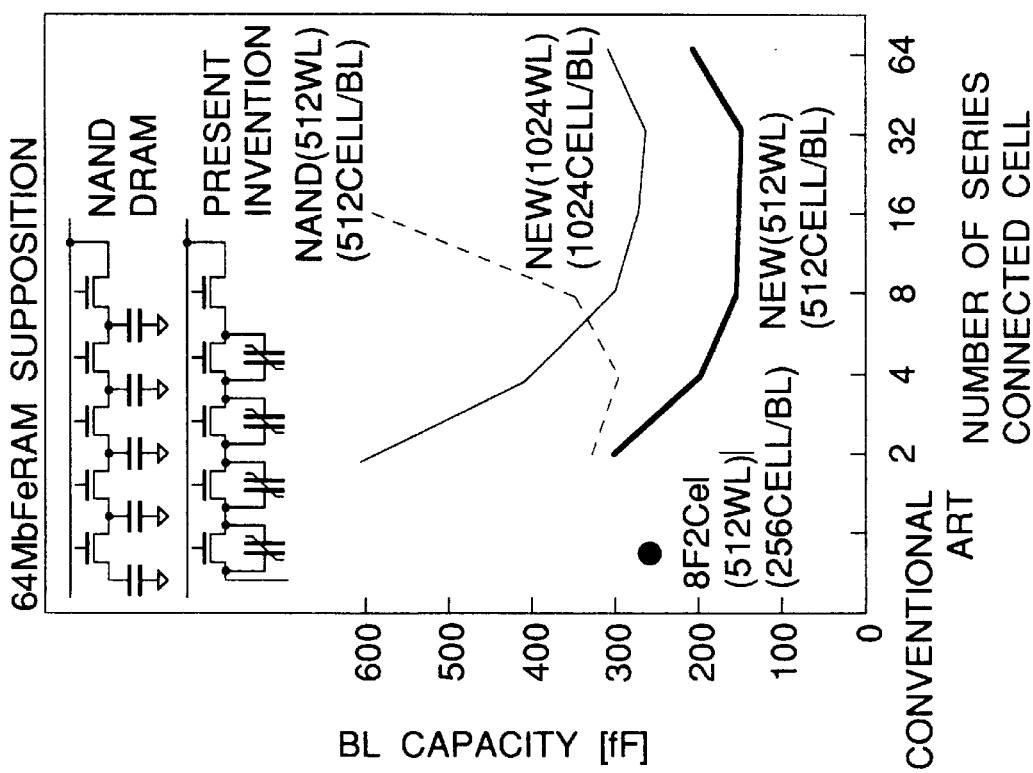

FIG. 78A shows the bit line capacity with respect to the number of series connected cells of the present invention assuming a 64-Mbit FRAM with a 0.45 $\mu$m rule. When the number of word lines connected one bit line is 512, the bit line capacity of the conventional FRAM having a size of $8F^2$ is about 265 fF. In the present invention, as the number of series connected cells increases, the bit line capacity is largely reduced. When the number of series connected cells is about 8, 16, or 32, the bit line capacity can be reduced to about ¼ that of the conventional cell. This is because as the number of series connected cells increases, the number of bit line contacts decreases to reduce the bit line capacity.

In the NAND DRAM shown in FIG. 78A, when the number of series connected cells is increased, and data of the farthest cell from the bit line contact is to be read out, cells on the way seem as a bit line capacity. When the number of series connected cells is larger than 4, the bit line capacity conversely appears. According to the present invention, since cell capacitors of the cells on the way are short-circuited, no voltage is applied between the capacitors, and no capacity appears. Unless the number of series connected cells is 64 or more, no disadvantage occurs. Conversely speaking, even when the number of cells connected to one bit line is increased to four times, i.e., 1,024, the same bit line capacity as in the prior art can be maintained. Consequently, the number of sense amplifiers can be reduced to ¼ that of the prior art, and the chip area can be reduced.

FIG. 78B shows the relationship between the number of series connected cells and the cell data read delay in the present invention. Even when the number of series connected cells is 8 or 16, the cell read delay is as small as 1.5 to 4 ns, as compared to the conventional cell with a size of $8F^2$. When the plate electrode driving scheme is employed for the conventional system to omit the refresh operation, a larger delay is generated. In the scheme of the present invention, the refresh operation is not required even in the scheme of fixing the plate electrode at (½)Vcc. As a result, about 16 cells can be sufficiently connected in series without decreasing the operation speed. When the plate electrode driving scheme is employed, it is faster than the conventional ones because it is easy to snap the Al or Cu wiring the plate.

Figure 79B:
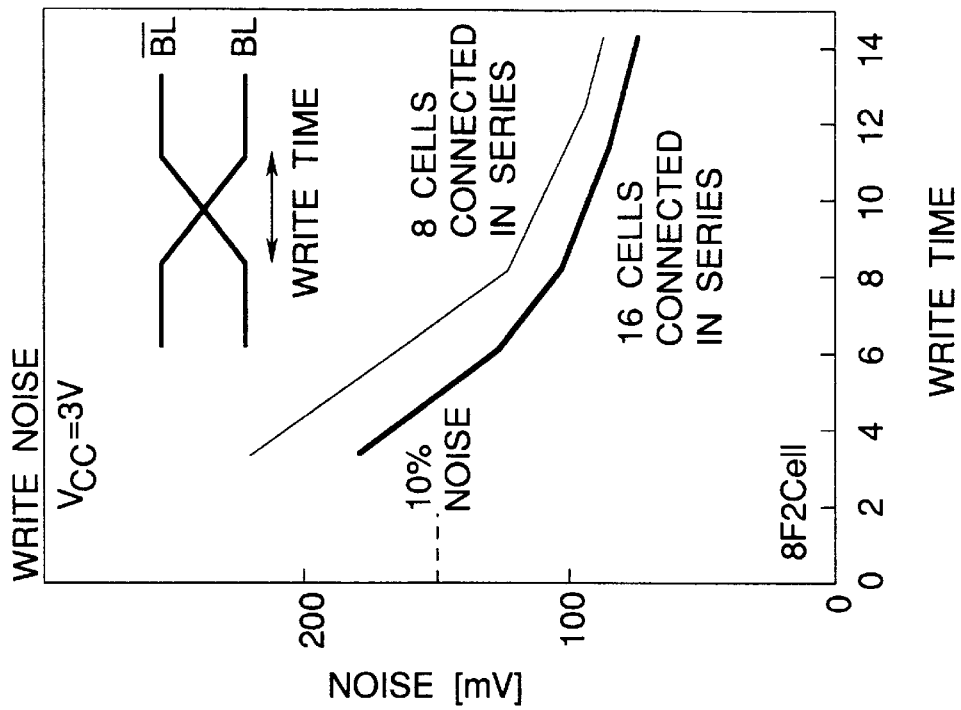
FIGS. 79A and 79B are graphs showing the dependencies of noise in reading/writing in the FRAM on the number of series connected cells and the write speed in the present invention.
Figure 79A:
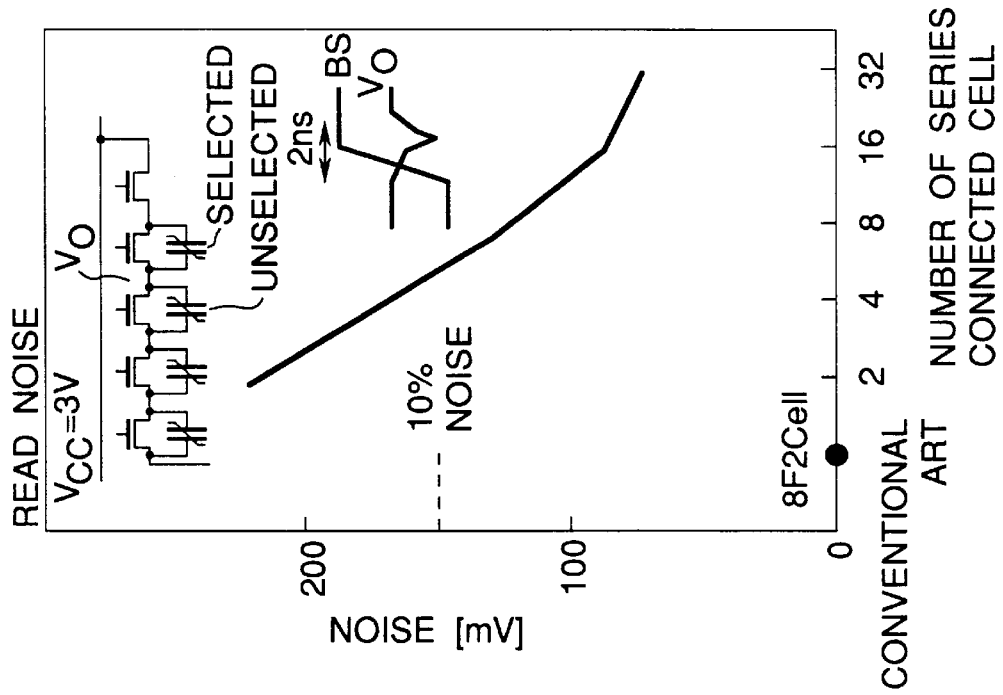

FIGS. 79A and 79B show problems unique to the present invention. In the cell read/write operation of this scheme, unselected memory cells other than a selected memory cell in a selected cell block are theoretically short-circuited because the word line is kept at "H", and no voltage is supposed to be applied between two electrodes of the ferroelectric capacitor of each unselected cell. However, the transistor of the unselected cell has an ON resistance. For this reason, in reading cell data (FIG. 79A) or in writing cell data opposite to cell data read access, a voltage difference may be instantaneously generated, although the time is very short, to destroy the unselected cell data.

However, this problem can also be minimized as the number of series connected cells increases. Even when the number of series connected cells increases, the entire applied voltage does not change. The maximum applied voltage per cell lowers as the ratio (applied voltage/the number of series connected cells) lowers. Therefore, a sufficient margin can be obtained by increasing the number of series connected cells. (Noise can be made lower than 10% of the write voltage of the selected cell). This also applies to writing. As shown in FIG. 79B, as the write time becomes longer, the problem of write noise is also relaxed. Since the unit of the write time is normally several ten ns, the noise can be made lower than 10% with a sufficient margin, as shown in FIG. 79B.

Figure 80A:
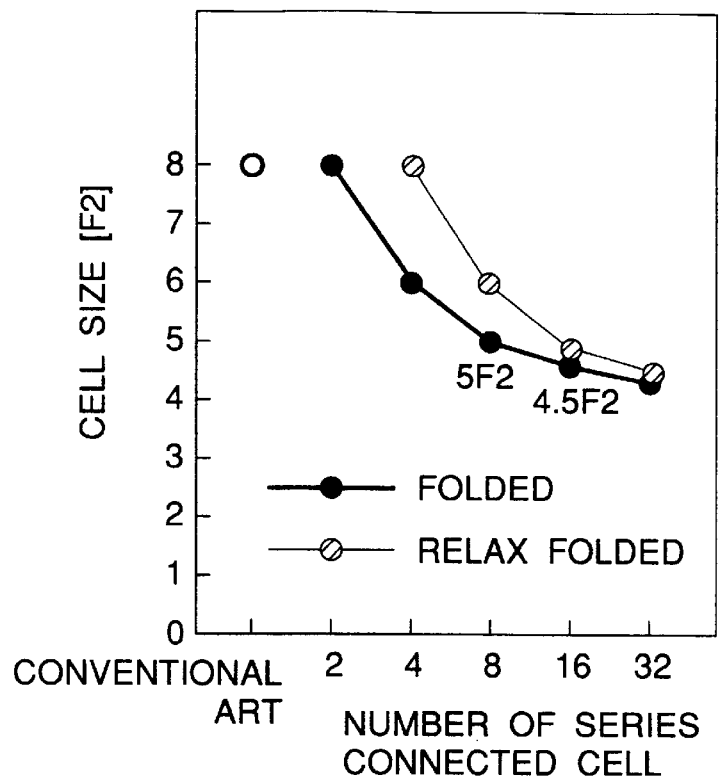
FIGS. 80A and 80B are graphs showing the dependencies of the cell size and chip size of the FRAM on the number of series connected cells in the present invention.
Figure 80B:
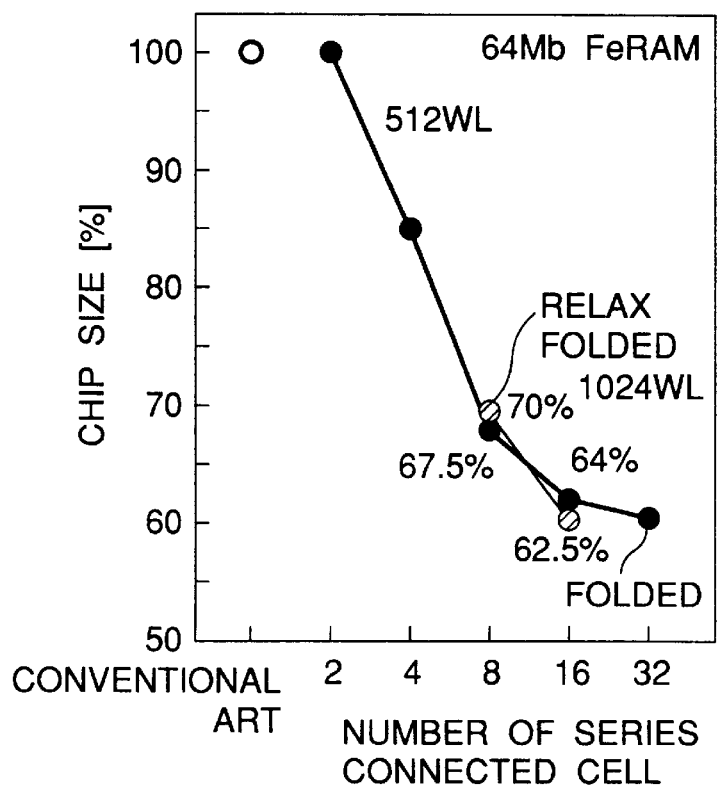

FIGS. 80A and 80B show the dependencies of the cell size and chip size on the number of series connected cells in the present invention. As shown in FIG. 80A, as the number of series connected cells increases, the ratio of select transistors to the cell area lowers and approaches the minimum theoretical value of $4F^2$. From the viewpoint of the read speed, the number of series connected cells can be increased to about 8 to 16. (If a lower read speed is allowed, the cell size can be further reduced). Therefore, a cell size of about $4.5F^2$ to $5F^2$ can be easily realized. As the number of series connected cells increases, the chip size can be reduced.

In the bit line rule relaxation type folded bit line structure, the number of select transistors increases to make the cell block size larger than that of the folded bit line structure. However, the number of sense amplifiers can be halved. Therefore, when the number of series connected cells is 16 or more, the disadvantage of the increase in the number of select transistors is eliminated, and the chip size can be reduced conversely.

(52nd Embodiment)

Figure 81:
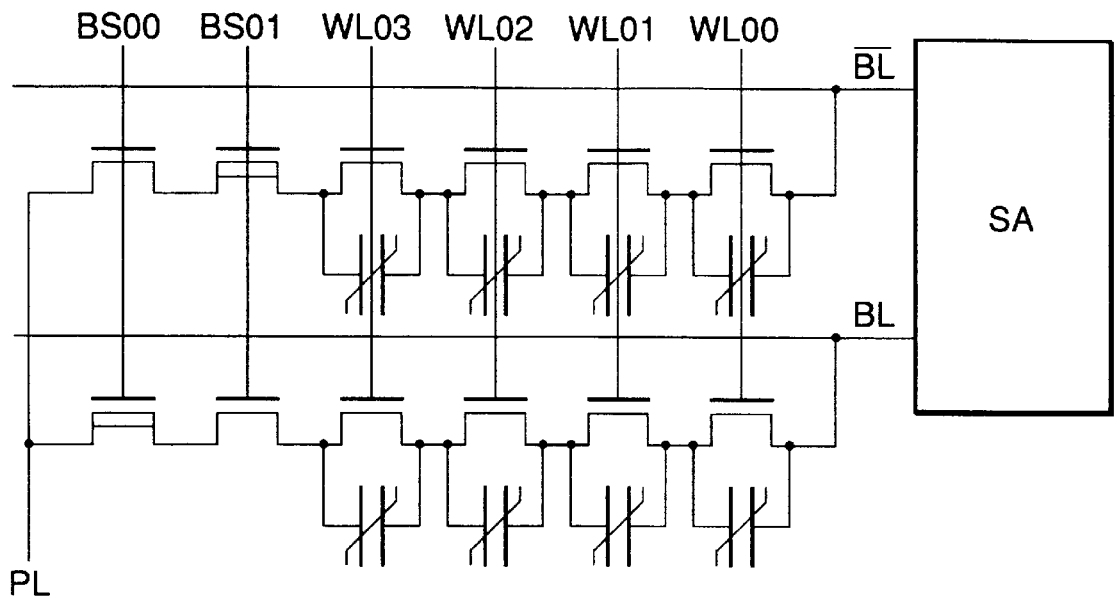
FIG. 81 is an equivalent circuit diagram of an FRAM according to the 52nd embodiment.

FIG. 81 is an equivalent circuit diagram showing the memory cell structure of an FRAM according to the 52nd embodiment of the present invention.

In the above-described embodiments, a ferroelectric capacitor and a cell transistor are connected in parallel. A plurality of such structures are connected in series, and a select transistor is inserted to a connection portion to a bit line.

In the above-described embodiments, the select transistor may be connected to a plate electrode PL side, as shown in FIG. 81. Alternatively, the select transistor may be inserted to the midway of the series connected cells each having the ferroelectric capacitor and the cell transistor connected in parallel. When the select transistor is connected to the plate electrode PL side, the ferroelectric capacitor is short-circuited, and the capacity does not appear. However, the channel capacity generated when the remaining transistors are turned on appears as an increase in bit line capacity.

(53rd Embodiment)

Figure 82:
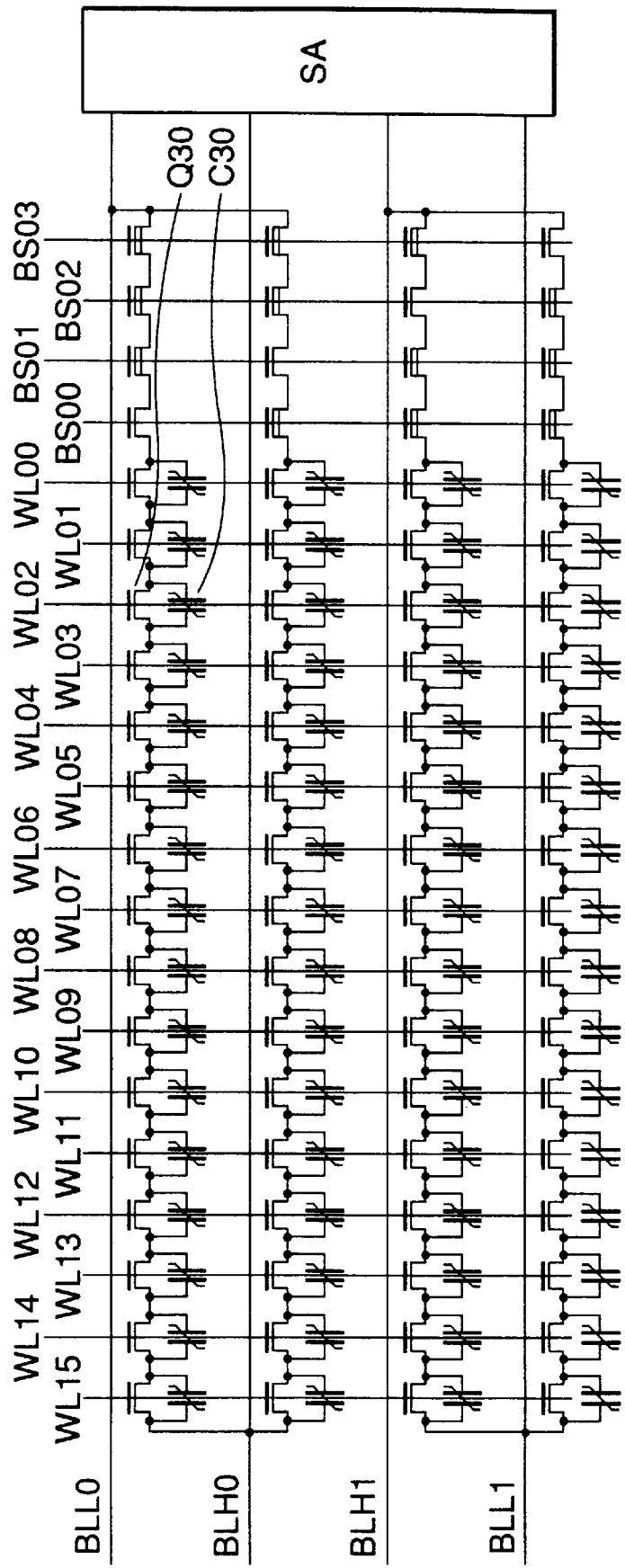
FIG. 82 is an equivalent circuit diagram of an FRAM according to the 53rd embodiment.

FIG. 82 is an equivalent circuit diagram showing the memory cell structure of an FRAM according to the 53rd embodiment of the present invention.

In the above-described embodiments, a ferroelectric capacitor and a cell transistor are connected in parallel. Such structures are connected in series, one terminal is connected to a bit line through a select transistor, and the other terminal is connected to a plate electrode PL. In FIG. 82, one terminal is connected to a bit line (BLL0), and the other terminal is connected to a bit line (BLH0).

With this structure, a potential difference is generated between the bit lines BLL0 and BLH0 to float the bit lines BLL0 and BLH0. The block selection line is set at "H", and the word line is set at "L" to read out cell data. For data "0", charges corresponding to –(Pr+Ps) are read out to the bit line BLH0 side, and charges corresponding to +(Pr+Ps) are read out to the bit line BLL0 side. As compared to the above-described embodiments, a readout charge amount can be obtained about twice. This allows to improve the read margin and reduce the cell capacitor area.

Although the select transistor is connected only to one side, the node potential of an unselected cell is Vcc or more or Vss or less, so the reliability does not degrade. When this system is employed to the conventional cell, the floating cell node is set at Vcc or more or Vss or less through capacitor coupling. However, in this embodiment, the cell transistor of the unselected cell is turned on to short-circuit the ferroelectric capacitor, and no problem is posed.

Bit lines BLH1 and BLL1 serve as reference bit lines, so that a folded bit line structure is constituted. When data is to be read out to the bit lines BLH1 and BLL1, the bit lines BLH0 and BLL0 serve as reference bit lines. The sense amplifier determines data "1" or "0" on the basis of the potential difference (BLH0–BLL0) or (BLH1–BLL1).

(54th Embodiment)

Figure 83:
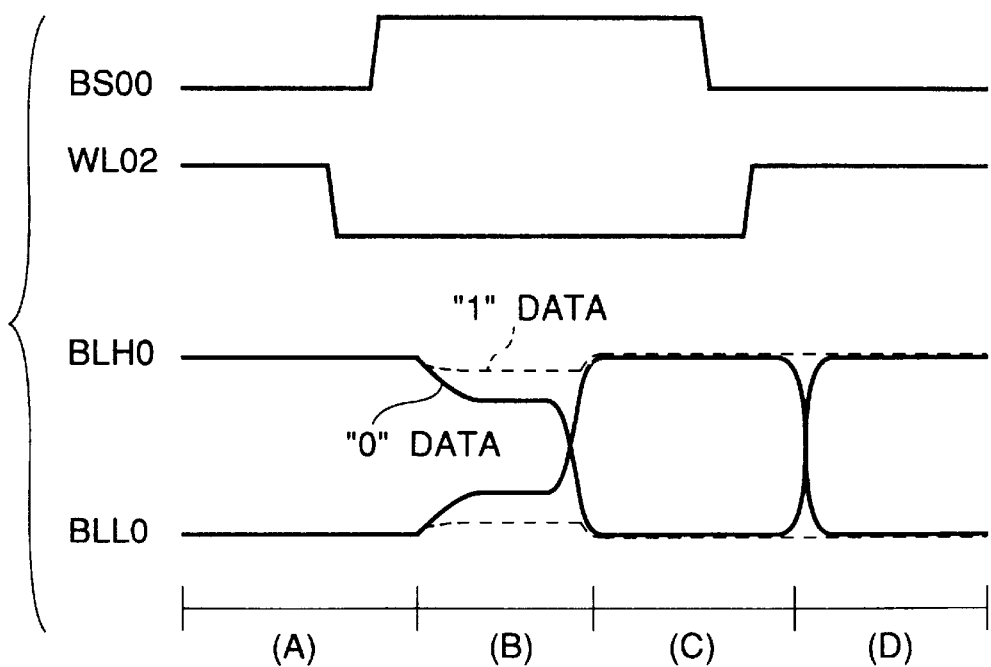
FIG. 83 is a timing chart showing the operation of an FRAM according to the 54th embodiment.

FIG. 83 is a timing chart for explaining the 54th embodiment of the present invention. FIG. 83 shows an example of the operation of the embodiment shown in FIG. 82.

In the precharge operation, a bit line BLH0 is set at Vcc, and a bit line BLL0 is set at Vss. In the active state, the bit lines BLH0 and BLL0 are set in a floating state. A block selection line BS00 is set at "H", and a word line WL02 is set at "L" to read out cell data (Q30, C30) (time (A)).

For data "0", charges corresponding to –(Pr+Ps) are read out to the bit line BLH0 side, and charges corresponding to +(Pr+Ps) are read out to the bit line BLL0 side. As compared to the above-described embodiments, a readout charge amount can be obtained about twice. If the potential difference between the bit lines BLH0 and BLL0 is larger than a reference, the potential difference is amplified by the sense amplifier as data "1". If the potentia difference is smaller than the reference, the potential difference is amplified as data "0" (time (B)). In time (C), write (restore) is performed. In time (D), the bit lines BLH0 and BLL0 are precharged to Vcc and Vss, respectively. The solid line in FIG. 83 represents an example of the data "0" read/rewrite operation, and the dotted line represents an example of the data "1" read/rewrite operation.

(55th Embodiment)

Figure 84:
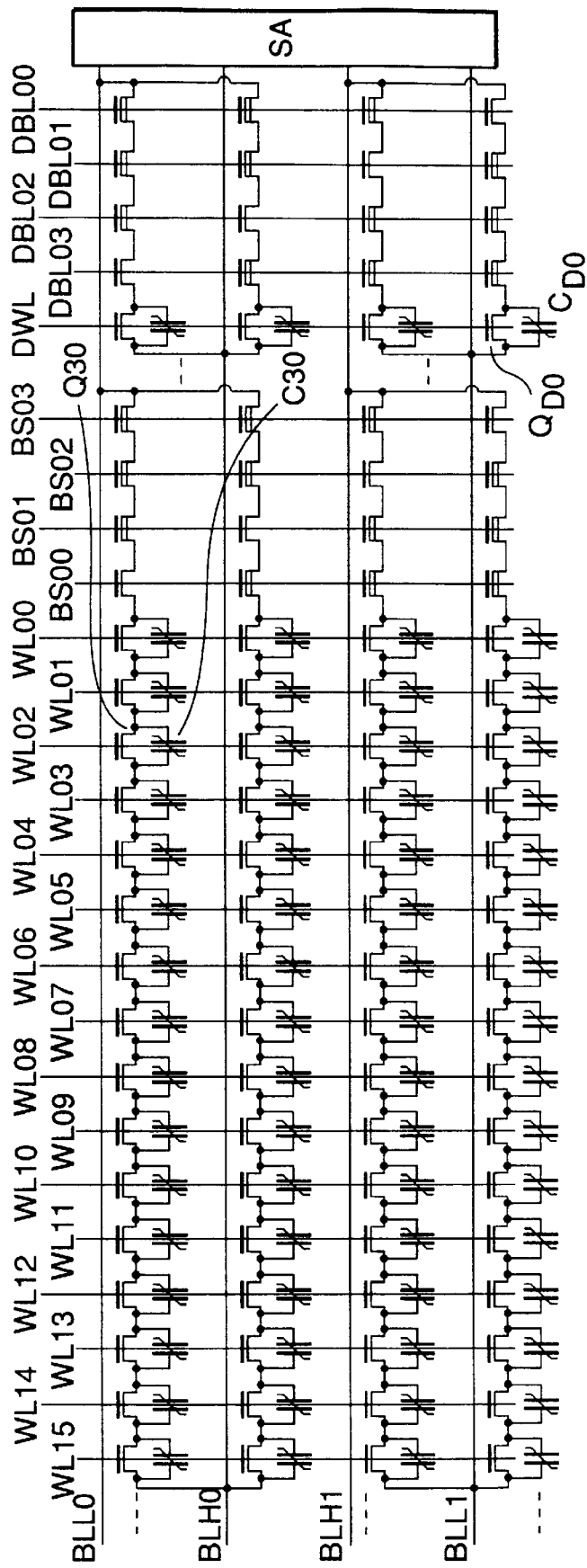
FIG. 84 is an equivalent circuit diagram of an FRAM according to the 55th embodiment.

FIG. 84 is an equivalent circuit diagram showing the memory cell structure of an FRAM according to the 55th embodiment of the present invention. In this embodiment, one of the embodiments of a dummy cell is added to the embodiment shown in FIG. 82.

In this embodiment, dummy cells have the same structure as the cell structure, i.e., one terminal of the dummy cell is connected to a bit line (BLL0) through a select transistor, and the other terminal is connected to an opposite bit line (BLH0).

With this structure, data "1" is necessarily read out from the dummy cell. Charges corresponding to –(Ps'–Pr') are read out to the bit line BLH0 side, and charges corresponding to +(Ps'–Pr') are read out to the bit line BLL0 side. As compared to the above-described embodiments, a readout charge amount can be obtained about twice. When the dummy cell size is increased such that Ps of the cell=Ps'–Pr', intermediate data between data "1" and data "0" of the cell is read out.

(56th Embodiment)

Figure 85:
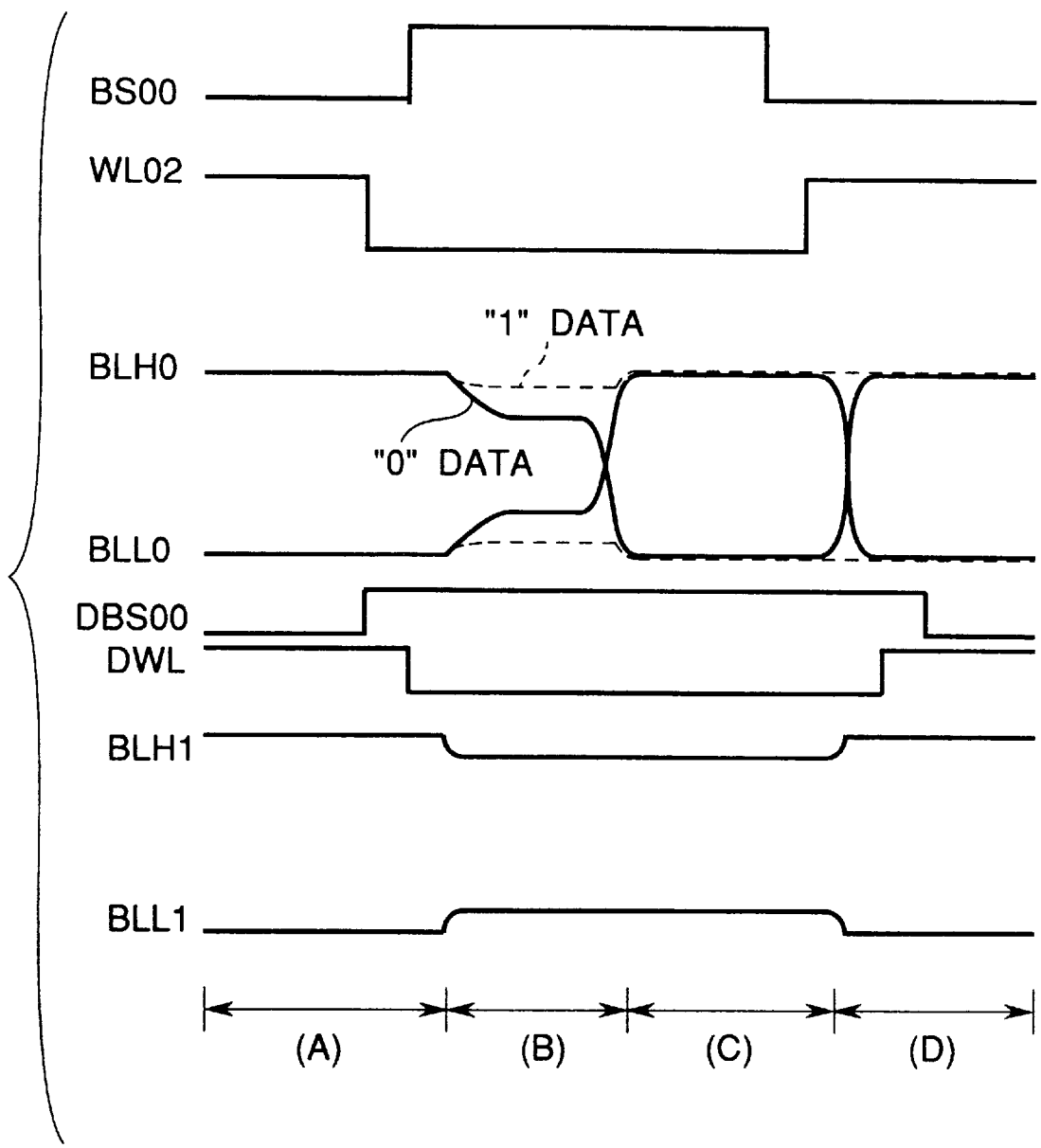
FIG. 85 is a timing chart showing the operation of an FRAM according to the 56th embodiment.

FIG. 85 is a timing chart for explaining the 56th embodiment of the present invention. FIG. 85 shows an example of the operation of the embodiment shown in FIG. 84.

In the precharge operation, a bit line BLH0 is set at Vcc, and a bit line BLL0 is set at Vss. In the active state, the bit lines BLH0 and BLL0 are set in a floating state. A block selection line BS00 is set at "H", and a word line WL02 is set at "L" to read out cell data (Q30, C30). Simultaneously, a selection block line DBS00 for dummy cell is set at "H", and a dummy word line DWL is set at "L" to rad out dummy cell data "1" to a bit line BLH1 side and a bit line BLL1 side.

The dummy cell size is larger than the normal cell size, so that the signal has an intermediate value between data "1" and data "0" of the normal cell (time (A)).

For data "0", charges corresponding to −(Pr+Ps) are read out to the bit line BLH0 side, and charges corresponding to +(Pr+Ps) are read out to the bit line BLL0 side. As compared to the above-described embodiments, a readout charge amount can be obtained about twice. If the potential difference between the bit lines BLH0 and BLL0 is larger than the potential difference between the reference bit lines BLH1 and BLL1, the potential difference is amplified by the sense amplifier as data "1". If the potential difference is smaller, the potential difference is amplified as data "0" (time (B)). In time (C), write (restore) is performed.

In time (D), the bit lines BLH0 and BLL0 are precharged to Vcc and Vss, respectively, and the bit lines BLH1 and BLL1 to Vcc and Vss, respectively. The original data "1" is written in the dummy cell. The solid line in FIG. 85 represents an example of the data "0" read/rewrite operation, and the dotted line represents an example of the data "1" read/rewrite operation.

(57th Embodiment)

Figure 86:
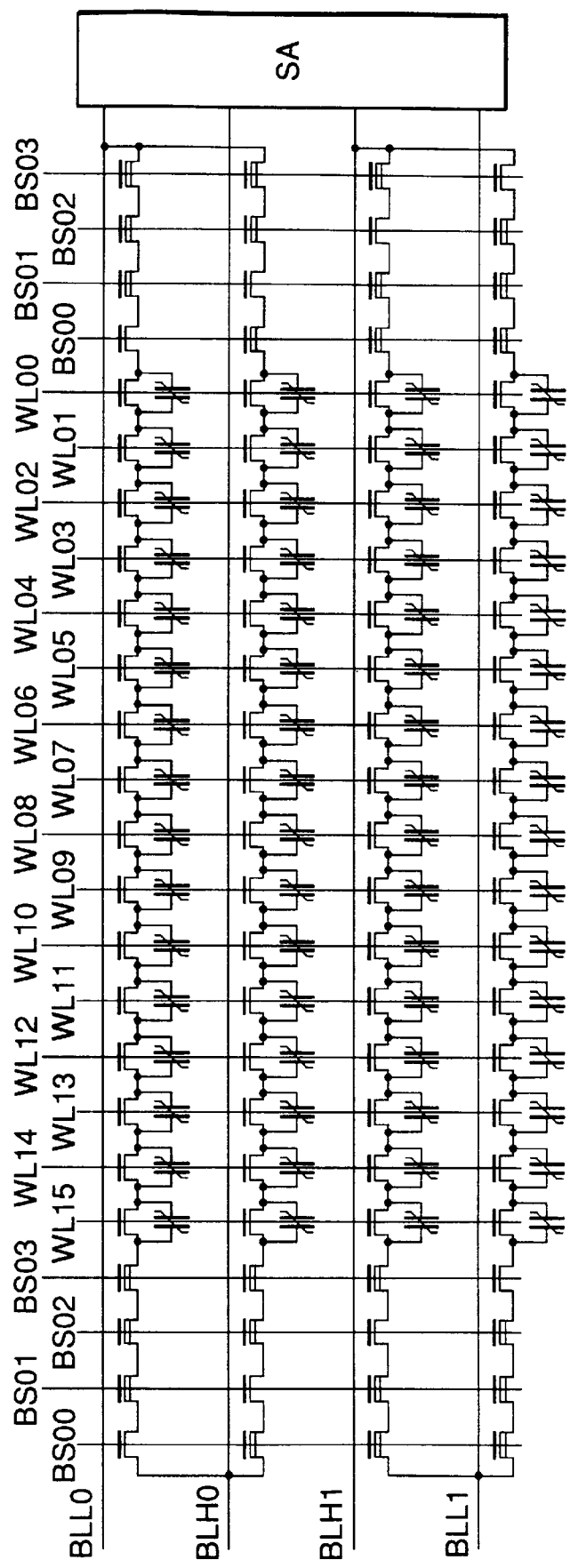
FIG. 86 is an equivalent circuit diagram of an FRAM according to the 57th embodiment.

FIG. 86 is an equivalent circuit diagram showing the memory cell structure of an FRAM according to the 57th embodiment of the present invention.

Unlike the embodiment shown in FIG. 82, select transistors are inserted to both terminals of the series connected cells and connected to bit lines BLH0 and BLL0. In this case, although the cell block size becomes large, the parasitic capacity excluding the capacity of the ferroelectric capacitors in the series connected cells can be made invisible on both sides of the bit lines BLH0 and BLL0.

(58th Embodiment)

Figure 87:
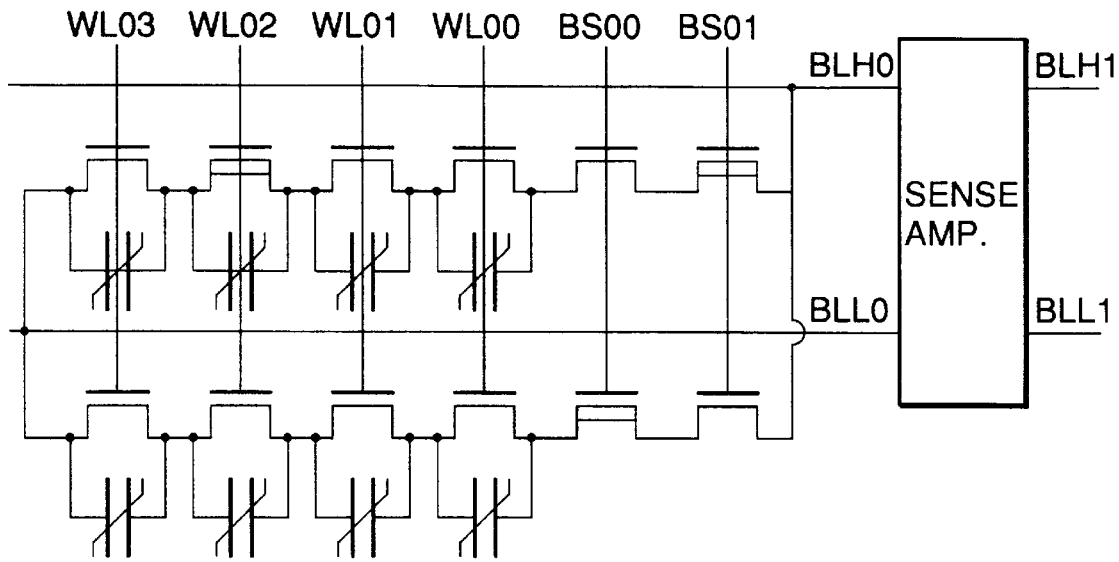
FIG. 87 is an equivalent circuit diagram of an FRAM according to the 58th embodiment.

FIG. 87 is an equivalent circuit diagram showing the memory cell structure of an FRAM according to the 58th embodiment of the present invention.

FIGS. 82 to 86 show a folded bit line structure in which the reference bit lines are arranged on the same cell array mat. FIG. 87 shows an open bit line structure in which the reference bit lines are arranged on a cell array mat on an opposite side of the sense amplifier. In this case, the number of select transistors can be halved.

(59th Embodiment)

Figure 88:
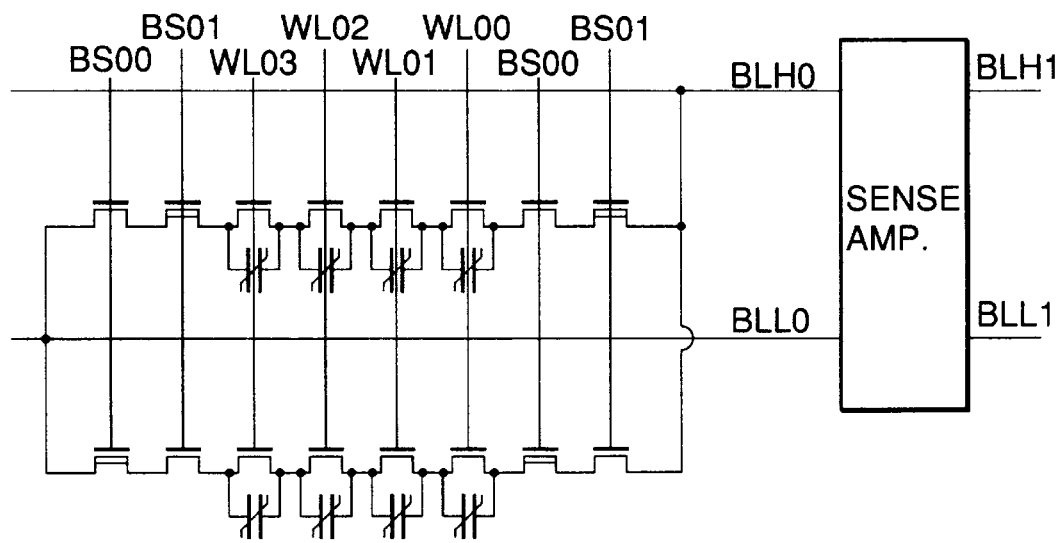
FIG. 88 is an equivalent circuit diagram of an FRAM according to the 59th embodiment.

FIG. 88 is an equivalent circuit diagram showing the memory cell structure of an FRAM according to the 59th embodiment of the present invention.

As in FIG. 87, FIG. 88 shows an open bit line structure in which the reference bit lines are arranged on a cell array mat on an opposite side of the sense amplifier. The select transistors are arranged on both sides of the series connected cells. With this structure, the parasitic capacity in the series connected cells in an unselected block can be made invisible as a bit line capacity.

(60th Embodiment)

FIGS. 89A and 89B are sectional and plan views, respectively, showing the memory cell structure of an FRAM according to the 60th embodiment of the present invention. This cell structure is equivalent to the circuit shown in FIG. 88.

When the bit line contact between a cell block and a bit line is shifted by a distance corresponding to the cell pitch on both sides of the cell block, as shown in FIGS. 89A and 89B, the cell block can be easily connected to bit lines BLH0 and BLL0. If the select transistor on the left side is omitted, and four select transistors are connected in series on the right side, the structure is equivalent to the circuit shown in FIG. 82.

(61st Embodiment)

Figure 90:
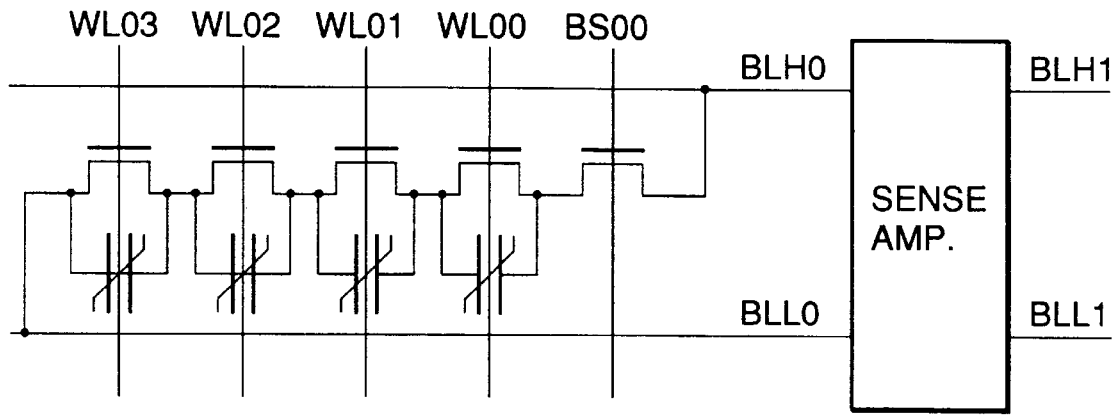
FIG. 90 is an equivalent circuit diagram of an FRAM according to the 61st embodiment.

FIG. 90 is an equivalent circuit diagram showing the memory cell structure of an FRAM according to the 61st embodiment of the present invention.

Structures each having a ferroelectric capacitor and a cell transistor connected in parallel are connected in series. One terminal of the series connected cells is connected to a bit line (BLL0) through only one select transistor, and the other terminal is connected to an opposite bit line (BLH0). With this open bit line structure having a cell size of $8F^2$, a readout charge amount can be obtained about twice.

(62nd Embodiment)

Figure 91:
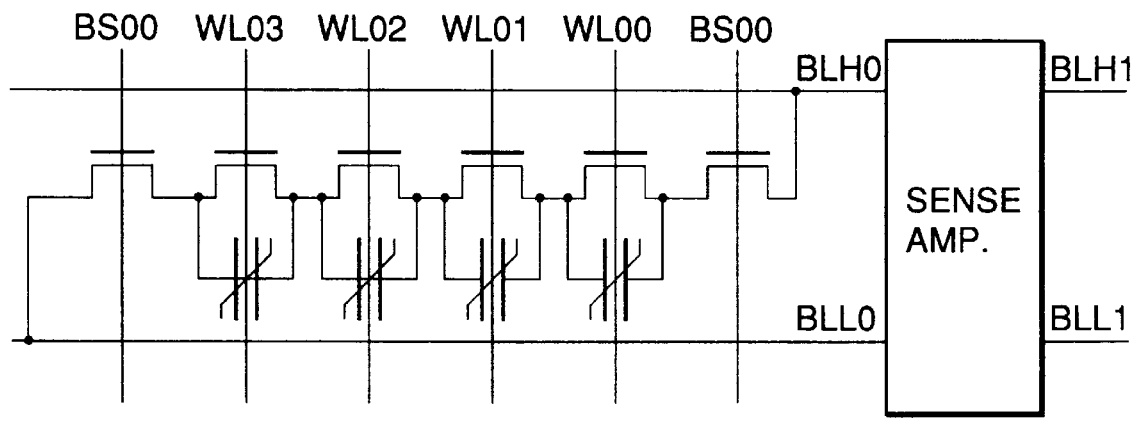
FIG. 91 is an equivalent circuit diagram of an FRAM according to the 62nd embodiment.

FIG. 91 is an equivalent circuit diagram showing the memory cell structure of an FRAM according to the 62nd embodiment of the present invention.

Structures each having a ferroelectric capacitor and a cell transistor connected in parallel are connected in series. One terminal of the series connected cells is connected to a bit line (BLL0) through only one select transistor, and the other terminal is connected to an opposite bit line (BLH0) through only one select transistor. With this open bit line structure having a cell size of $8F^2$, a readout charge amount can be obtained about twice. In addition, the bit line capacity can be prevented from increasing due to the parasitic capacity in the series connected cells.

(63rd Embodiment)

Figure 92:
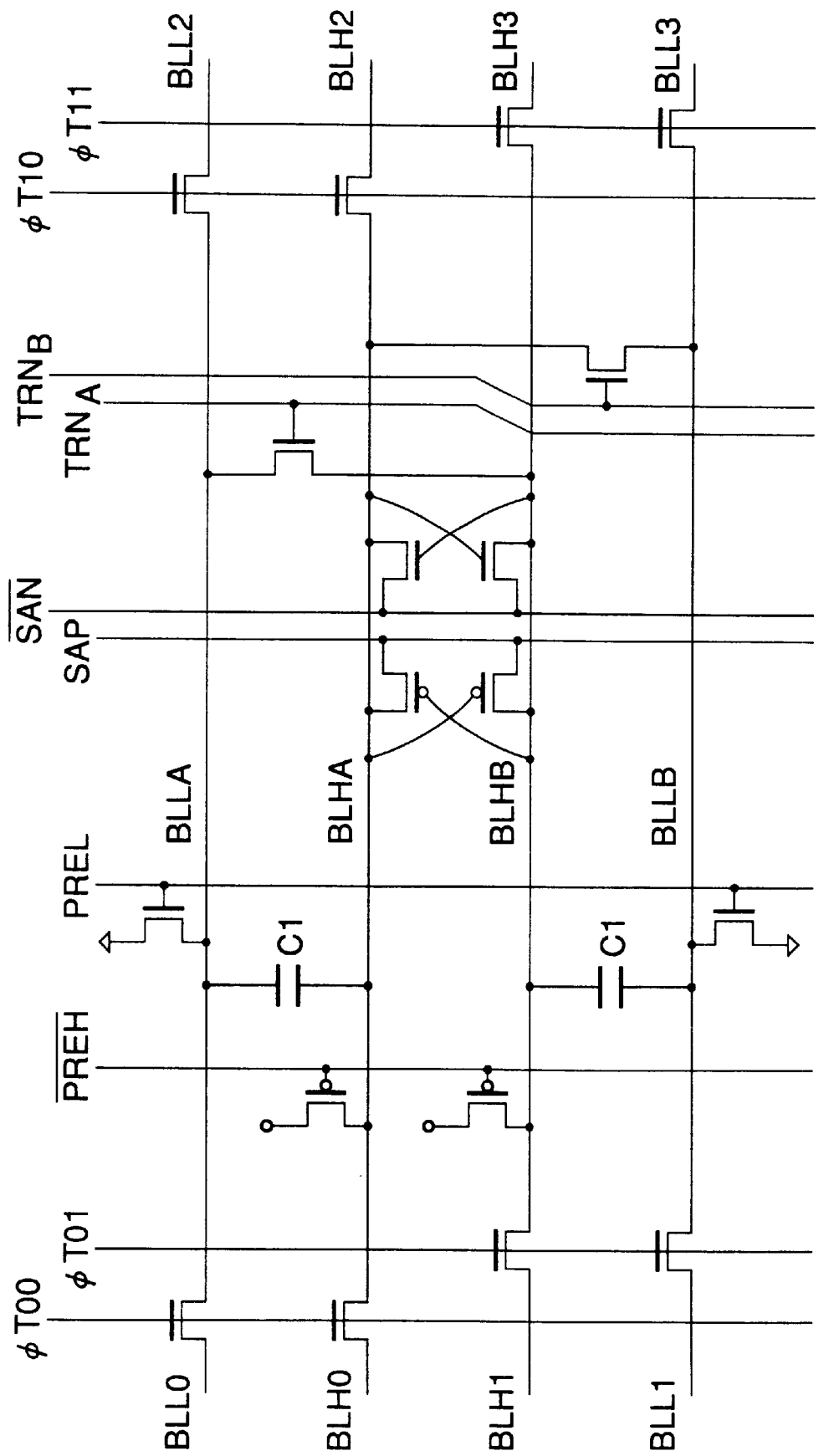
FIG. 92 is a circuit diagram of the sense amplifier of an FRAM according to the 63rd embodiment.
Figure 93:
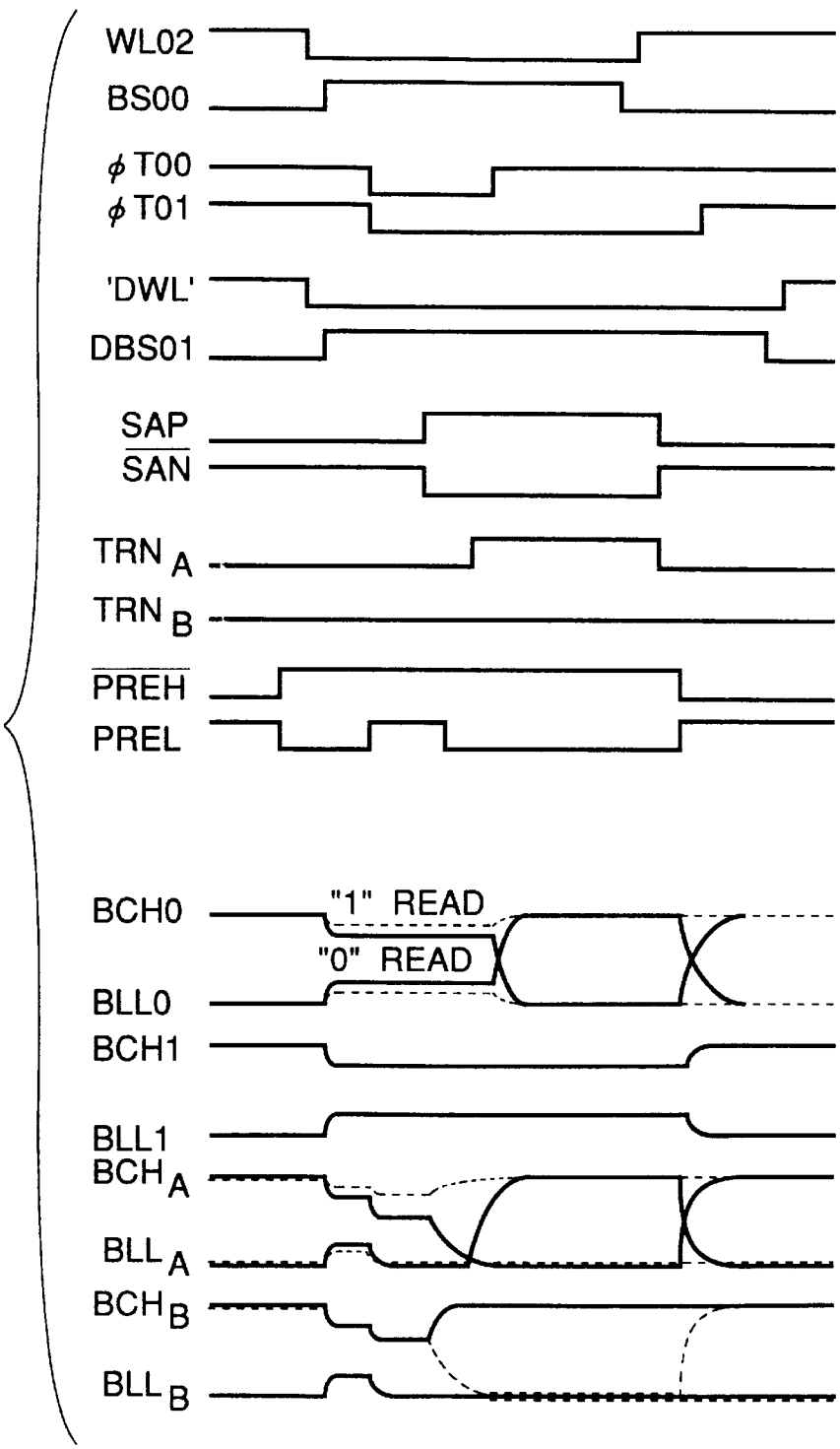
FIG. 93 is a timing chart showing the operation of the FRAM according to the 63rd embodiment.

FIG. 92 is an equivalent circuit diagram showing the sense amplifier structure of an FRAM according to the 63rd embodiment of the present invention. This sense amplifier can be applied to the embodiments shown in FIGS. 84 and 85 in which a signal amount is obtained twice with a folded bit line structure. FIG. 93 shows an example of the operation.

The operation will be described with reference to FIG. 93. $\overline{\text{PREH}}$ is set at "H", and PREL is set at "L" to set the bit lines in a floating state. A word line WL01 is set at "L", and a block selection line BS00 is set at "H" to read out cell data to bit lines BLH0 and BLL0 and transmitted through bit lines BLHA and BLLA in the sense amplifier. Simultaneously, a dummy word line DWL is set at "L", and a selection block line DBS00 for dummy cell is set at "H" to read out dummy cell to bit lines BLH1 and BLL1 and transmitted through bit lines BLHB and BLLB in the sense amplifier. Thereafter, signals ft00 and ft01 are raised to confine the data in the sense amplifier.

PREL is raised to lower the potentials of the bit lines BLLA and BLLB to Vss. As shown in FIG. 92, the potentials of the bit lines BLHA and BLHB lower by a value twice that of the cell readout signal due to the effect of capacitors Cl connected between the bit lines BLLA and BLHA and between the bit lines BLLB and BLHB. Thereafter, an NMOS sense amplifier driving line $\overline{\text{SAN}}$ and a PMOS sense amplifier driving line SAP are set at "L"/"H" to activate the sense amplifier, thereby amplifying the difference between the bit line BLHA on the cell read side and the bit line BLHB on the dummy cell side, i.e., the readout signal.

Next, PREL is set at "H" to set the bit lines BLLA and BLLB in the floating state. The TRNA is set at "H" to transmit the amplified data of the bit line BLHB to the bit line BLLA. The signal φ t00 is set at "H" to transmit the data amplified by the sense amplifier to the bit lines BLL0 and BLH0 and rewrite the data in the cell. The block selection line BS00 is set at "L", and the word line WL02 at "H" to close the cell. The NMOS and PMOS sense amplifier driving lines $\overline{\text{SA}}$ and SAP are set in an inactive state. The TRNA is set at "L", $\overline{\text{PREH}}$ is set at "L", and PREL is set at "H" such that BLH0=BLHA=BLH1=BLHB=Vcc, and BLL0=BLLA=BLL1=BLLB=Vss. At this time, data "1" is written in the dummy cell. Finally, the selection block line DBS01 for dummy cell is set at "L", and the dummy word line DWL is set at "H" to close the dummy cell.

(64th Embodiment)

Figure 94:
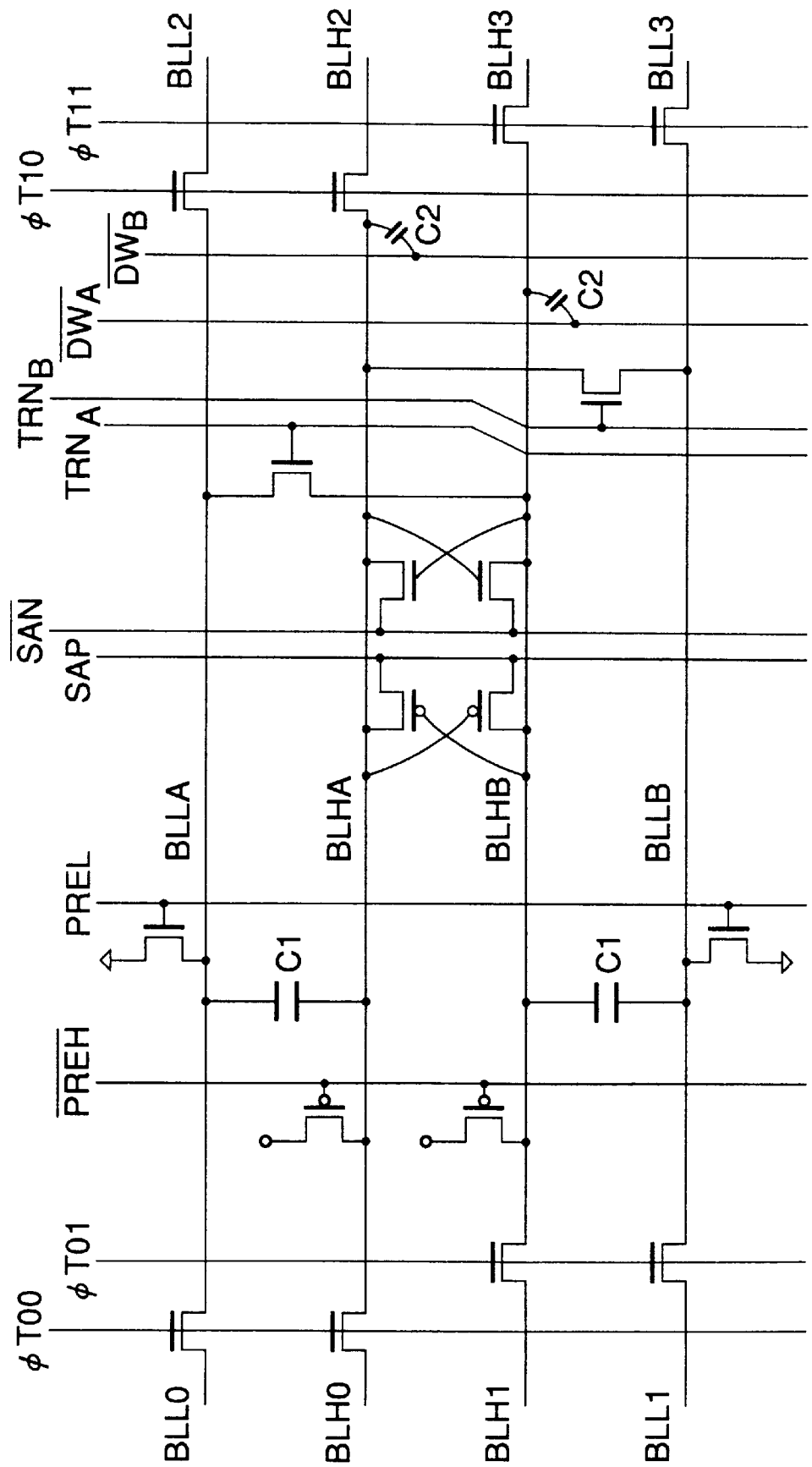
FIG. 94 is a circuit diagram of the sense amplifier of an FRAM according to the 64th embodiment.
Figure 95:
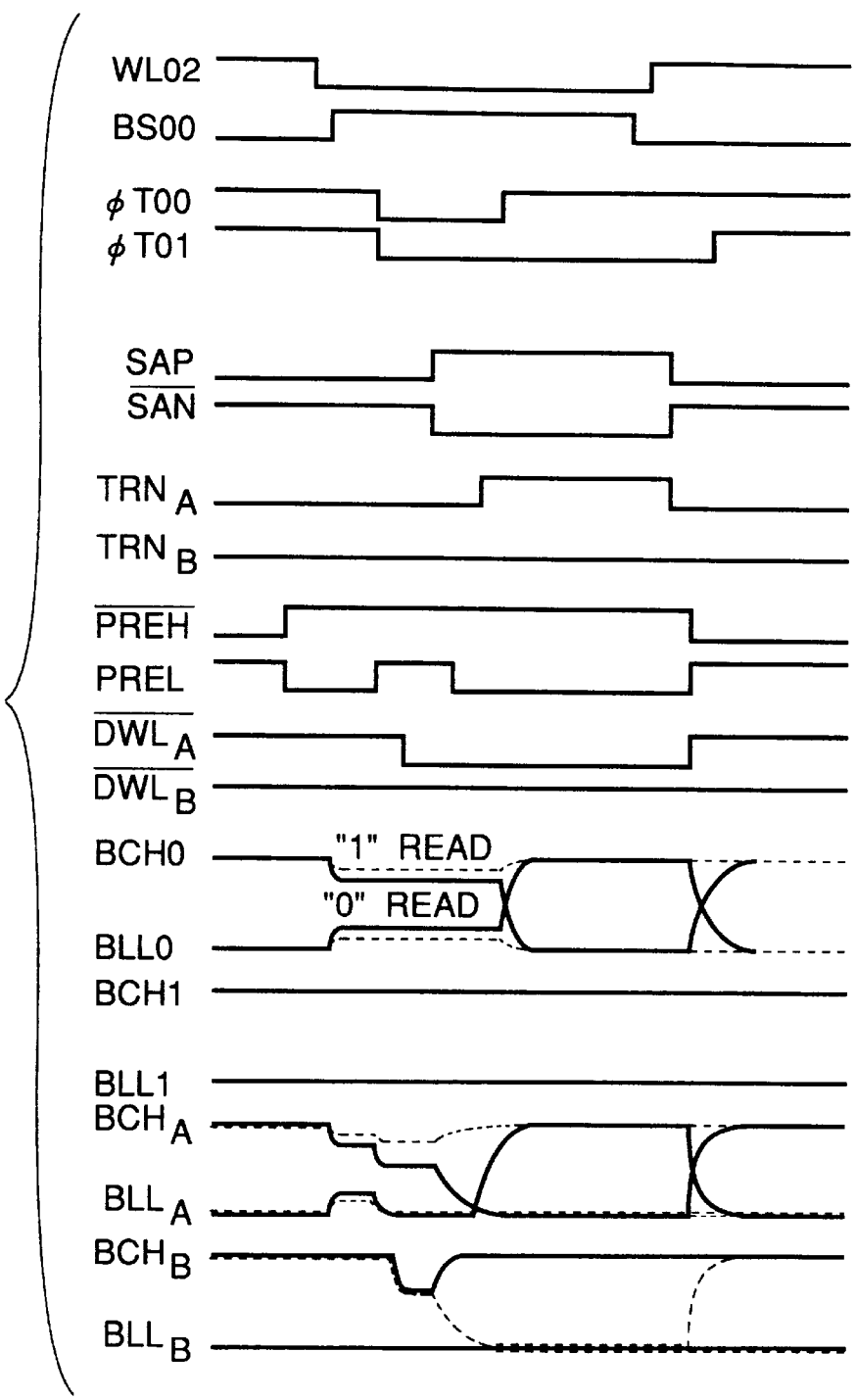
FIG. 95 is a timing chart showing the operation of the FRAM according to the 64th embodiment.

FIG. 94 is an equivalent circuit diagram showing the sense amplifier structure of an FRAM according to the 64th embodiment of the present invention. This sense amplifier can be applied to the embodiments shown in FIGS. 82, 83, and 86 in which a signal amount is obtained twice with a folded bit line structure. FIG. 95 shows an example of the operation.

FIG. 94 is different from FIG. 92 in that the dummy cell is replaced with a coupling capacitor in the sense amplifier. For the operation, $\overline{\text{PREH}}$ is set at "H", and PREL is set at "L" to set the bit lines in a floating state. A word line WL01 is set at "L", and a block selection line BS00 is set at "H" to read out cell data to bit lines BLH0 and BLL0 and transmitted through bit lines BLHA and BLLA in the sense amplifier. Thereafter, signals $\phi$ t00 and $\phi$ t01 are set at "L" to confine the data in the sense amplifier.

The PREL is raised to lower the potentials of the bit lines BLLA and BLLB to Vss. As shown in FIG. 94, the potential of the bit line BLHA lowers by a value twice that of the cell readout signal due to the effect of a capacitor Cl connected between the bit lines BLLA and BLHA. Thereafter, $\overline{\text{DWLA}}$ is set at "L" to lower the potential on BLHB side to an intermediate value between data "1" and data "0". An NMOS sense amplifier driving line $\overline{\text{SAN}}$ and a PMOS sense amplifier driving line SAP are set at "L"/"H" to activate the sense amplifier, thereby amplifying the difference between the bit line BLHA on the cell read side and the bit line BLHB on the dummy cell side, i.e., the readout signal.

Next, the PREL is set at "L" to set the bit lines BLLA and BLLB in the floating state. The TRNA is set at "H" to transmit the amplified data of the bit line BLHB to the bit line BLLA. The signal $\phi$ t00 is set at "H" to transmit the data amplified by the sense amplifier to the bit lines BLL0 and BLH0 and rewrite the data in the cell. The block selection line BS00 is set at "L", and the word line WL02 at "H" to close the cell. The NMOS and PMOS sense amplifier driving lines $\overline{\text{SAN}}$ and SAP are set in an inactive state. The TRNA is set at "L", the $\overline{\text{PREH}}$ is set at "L", and the PREL is set at "H" such that BLH0=BLHA=BLH1=BLHB=Vcc, and BLL0=BLLA=BLL1=BLLB=Vss. At this time, the control signal for the capacitor for dummy cell is set at "H" for the precharge operation.

(65th Embodiment)

Figure 96:
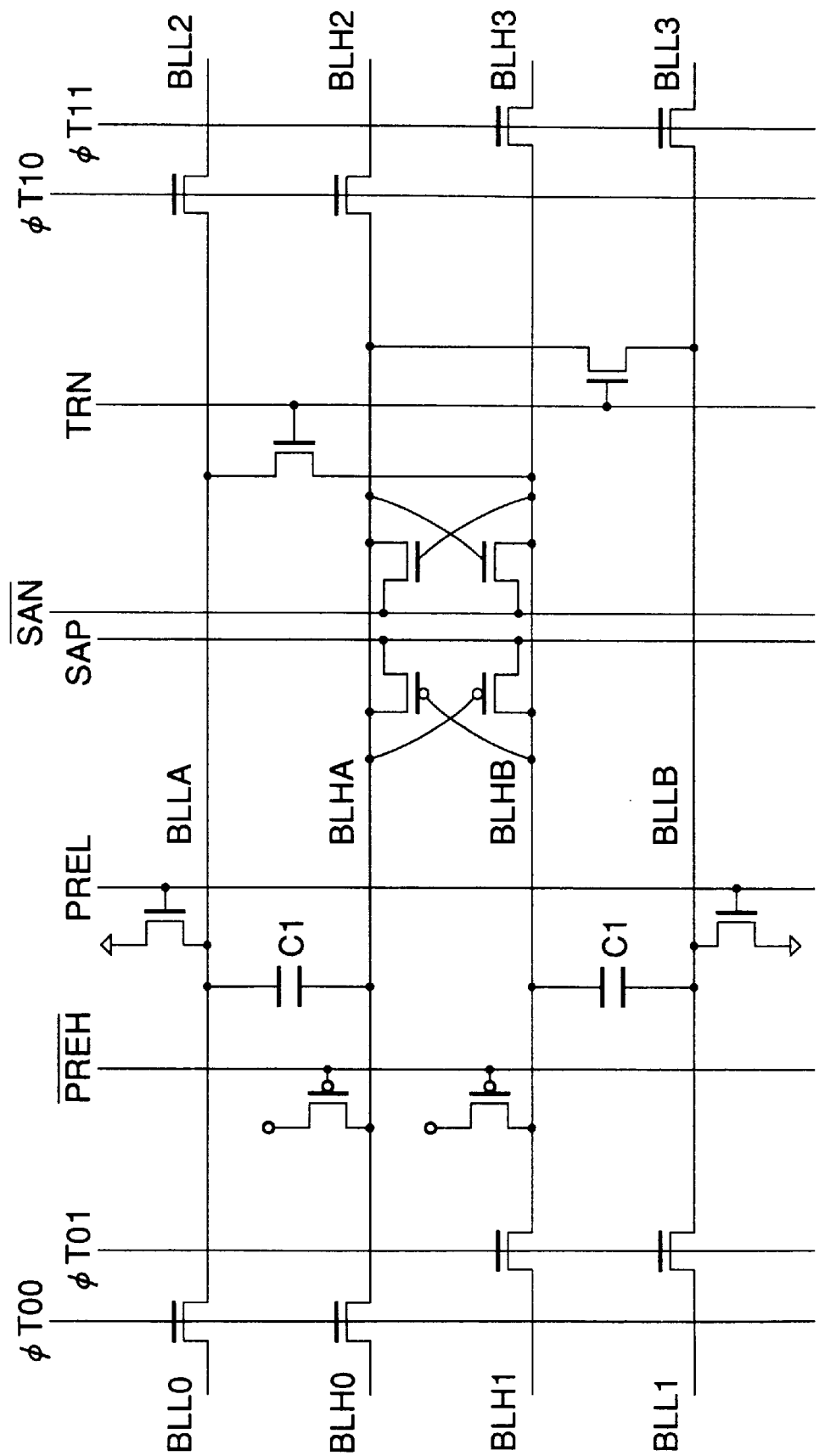
FIG. 96 is a circuit diagram of the sense amplifier of an FRAM according to the 65th embodiment.
Figure 97:
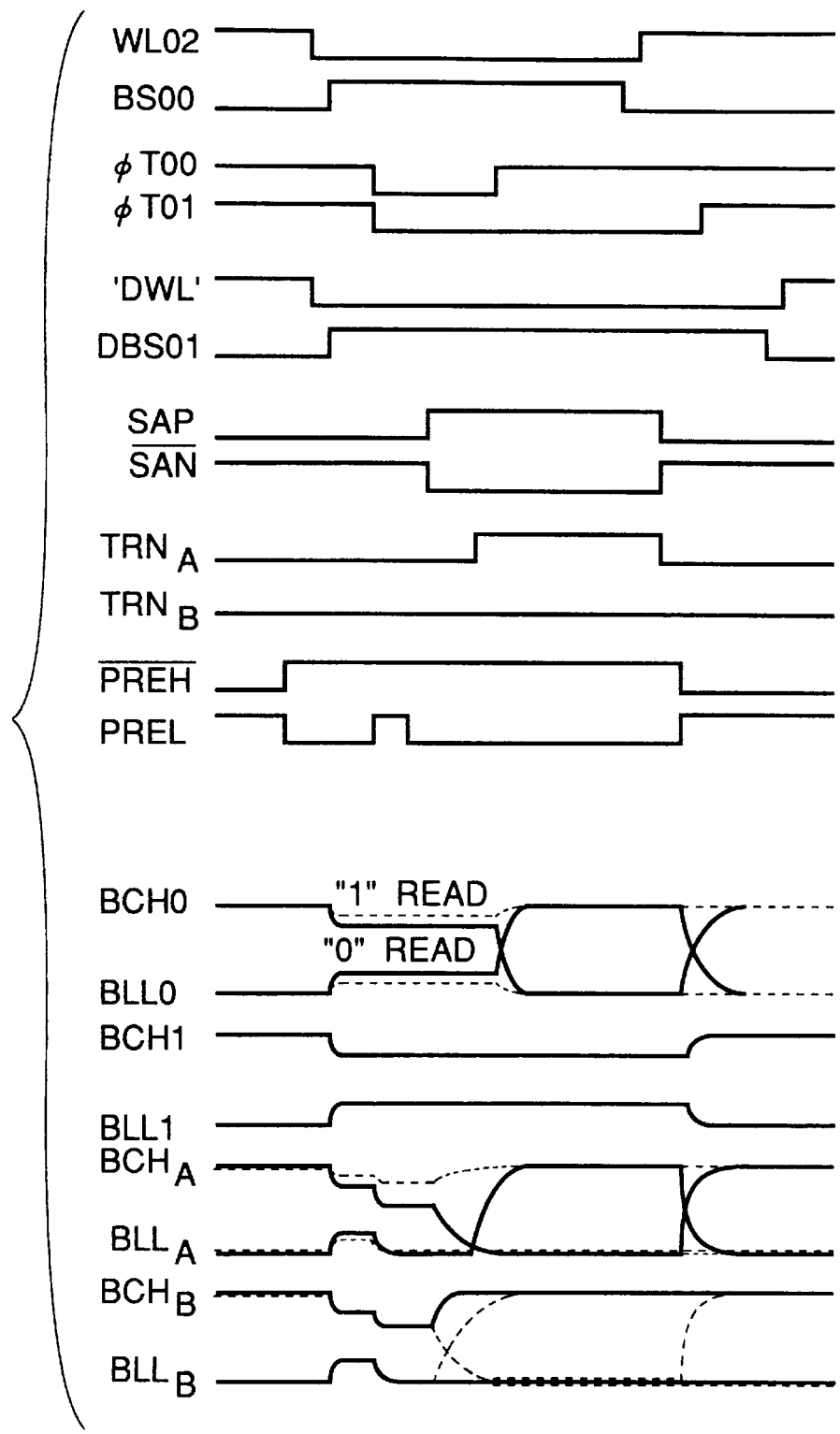
FIG. 97 is a timing chart showing the operation of the FRAM according to the 65th embodiment.

FIG. 96 is an equivalent circuit diagram showing the sense amplifier structure of an FRAM according to the 65th embodiment of the present invention. This sense amplifier can be applied to the embodiments shown in FIGS. 84 and 85 in which a signal amount is obtained twice with a folded bit line structure. FIG. 97 shows an example of the operation.

This structure is different from that shown in FIGS. 92 and 93 in that a TRA is commonly used as the TRNA and TRNB. In this case, the sense amplifier area can be reduced. The disadvantage is that when the TRN is set at "H" after sense amplification, the BLLB side is also restored, and the power consumption slightly increases.

(66th Embodiment)

Figure 98:
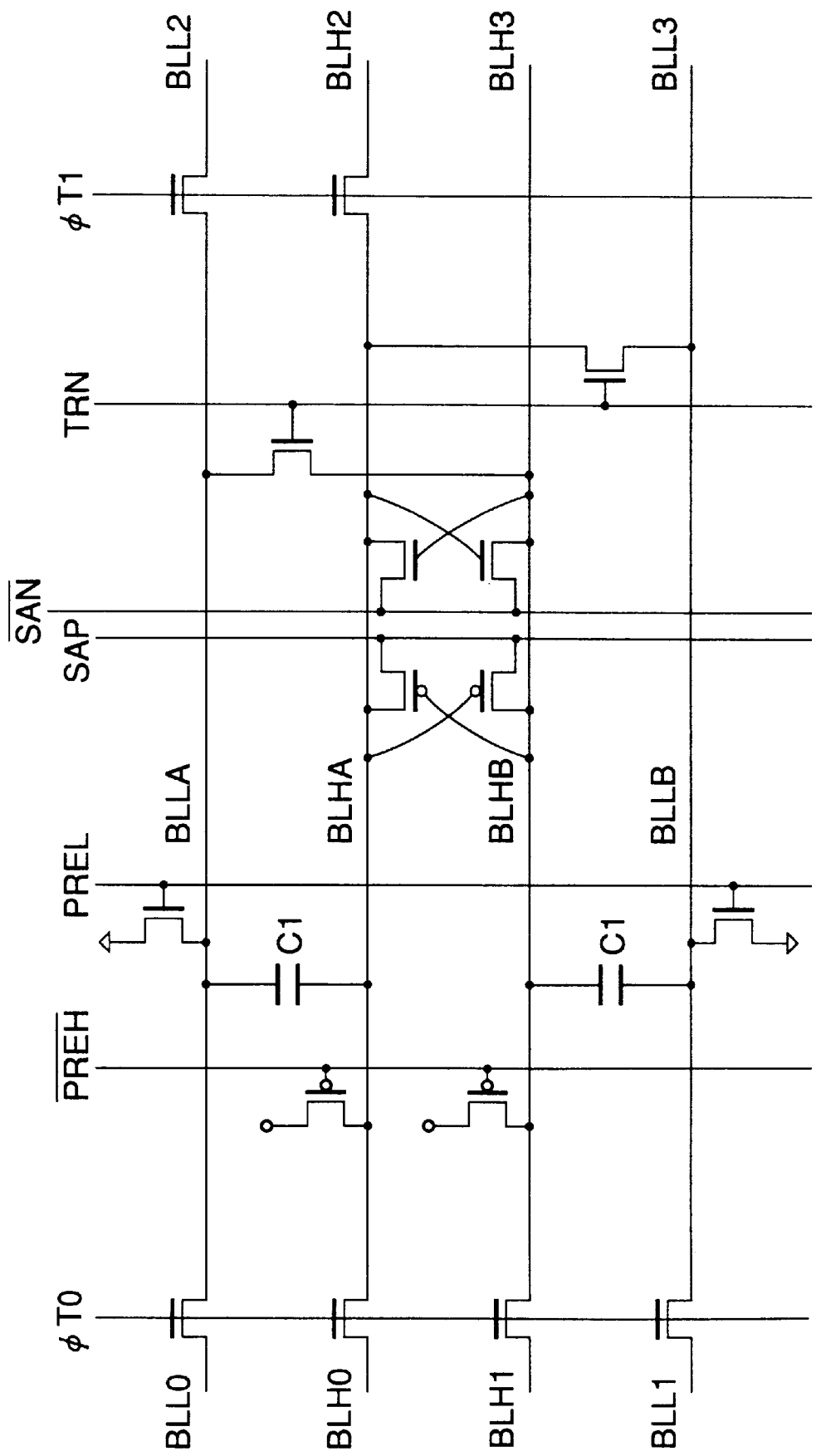
FIG. 98 is a circuit diagram of the sense amplifier of an FRAM according to the 66th embodiment.
Figure 99:
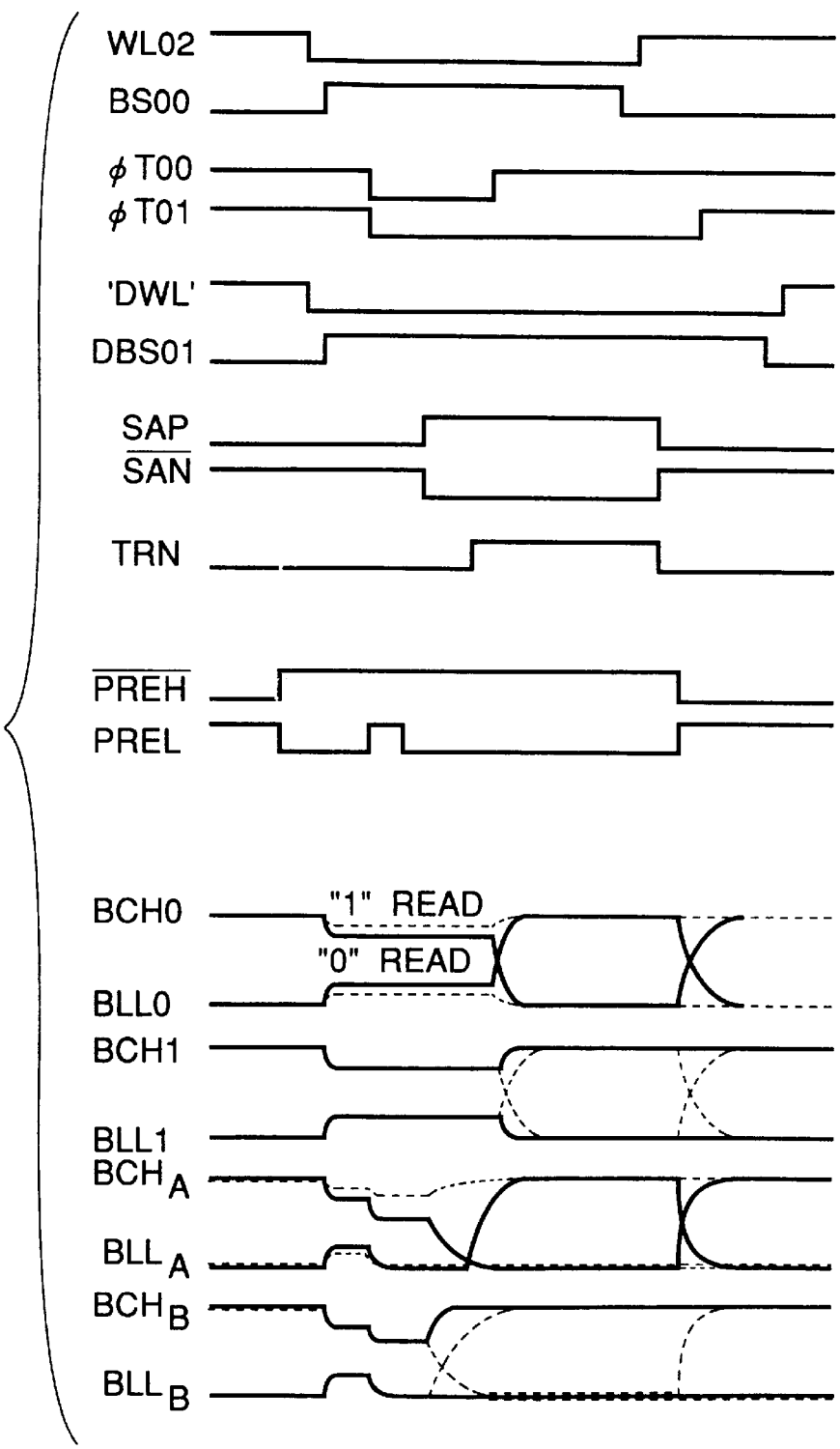
FIG. 99 is a timing chart showing the operation of the FRAM according to the 66th embodiment.

FIG. 98 is an equivalent circuit diagram showing the sense amplifier structure of an FRAM according to the 66th embodiment of the present invention. This sense amplifier can be applied to the embodiments shown in FIGS. 84 and 85 in which a signal amount is obtained twice with a folded bit line structure. FIG. 99 shows an example of the operation.

This structure is different from that shown in FIGS. 96 and 97 in that a signal $\phi$ t0 is commonly used as the signals $\phi$ t00 and $\phi$ t01. In this case, the sense amplifier area can be further reduced. The disadvantage is that when the TRN is set at "H" after sense amplification, not only the BLH0 and BLL0 side but alto the BLH1 and BLL1 side the BLLB side is temporarily restored, and the power consumption increases.

(67th Embodiment)

Figure 100:
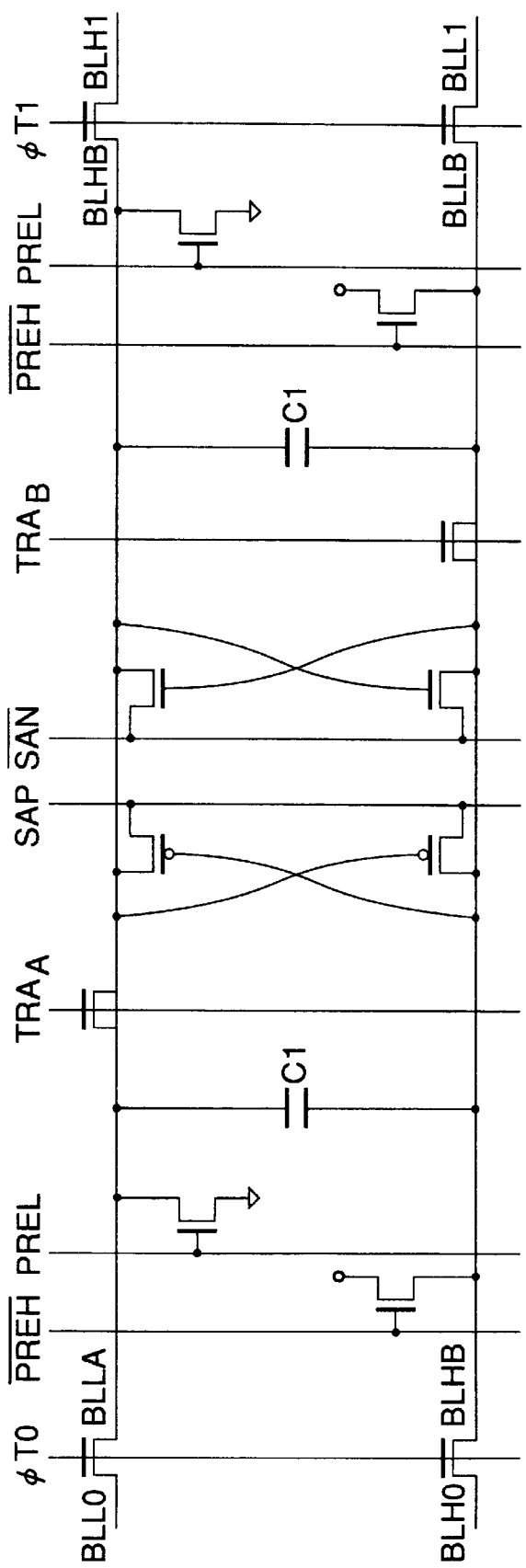
FIG. 100 is a circuit diagram of the sense amplifier of an FRAM according to the 67th embodiment.

FIG. 100 is an equivalent circuit diagram showing the sense amplifier structure of an FRAM according to the 67th embodiment of the present invention. This sense amplifier can be applied to the embodiments shown in FIGS. 87 to 92 in which a signal amount is obtained twice with an open bit line structure.

The structure shown in FIG. 100 is equivalent to that in FIG. 92 except that bit lines BLH1 and BLL1 are arranged on the right side of the sense amplifier, the shared sense amplifier is omitted, and the circuit position is changed.

(68th Embodiment)

Figure 101:
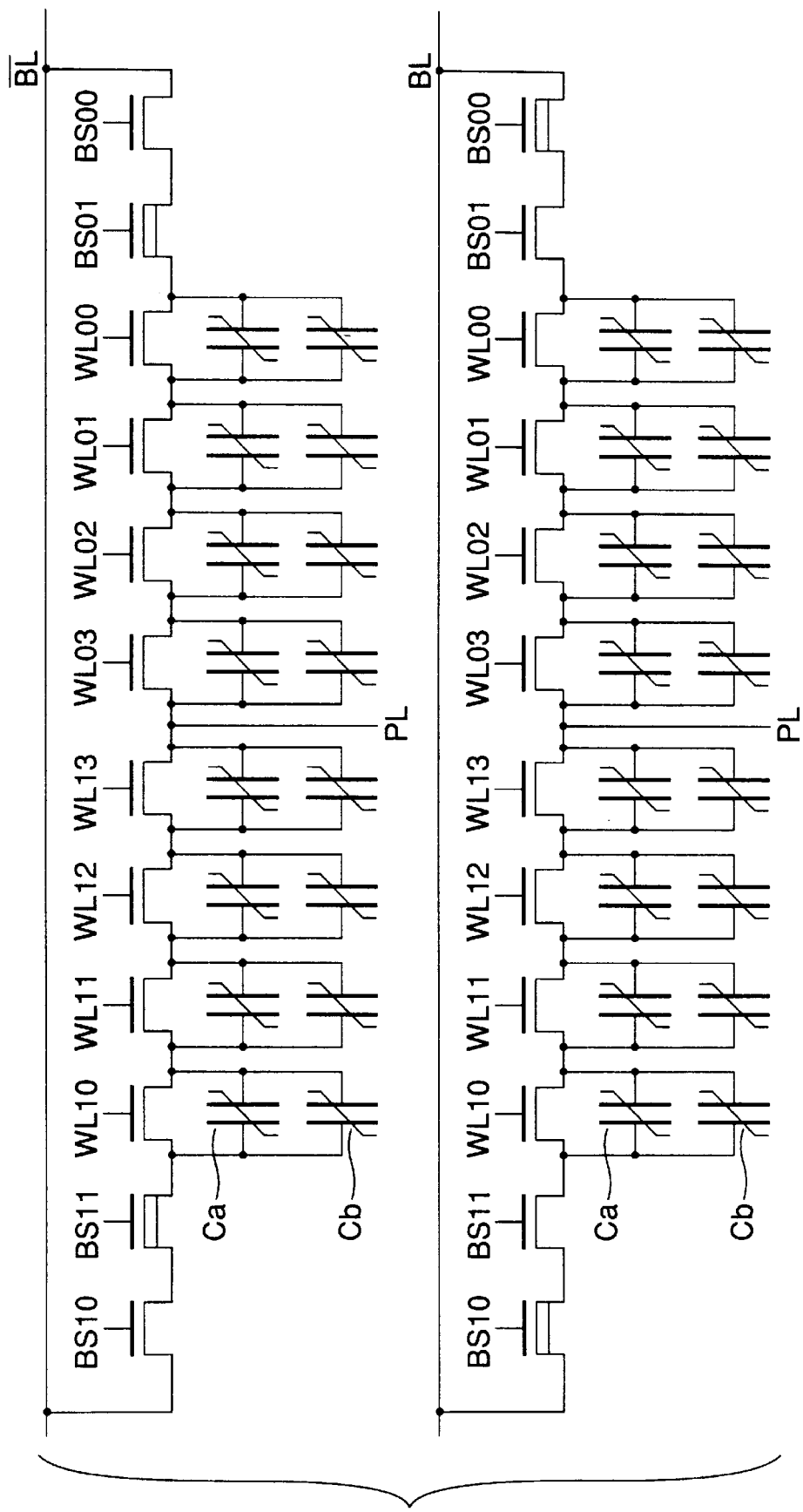
FIG. 101 is an equivalent circuit diagram of an FRAM according to the 68th embodiment.

FIG. 101 is an equivalent circuit diagram showing the memory cell structure of an FRAM according to the 68th embodiment of the present invention.

Ferroelectric capacitors (Ca, Cb) having different coercive voltages are connected in parallel to a memory cell transistor to constitute one cell. One terminal of series connected cells is connected to a bit line ($\overline{\text{BL}}$, BL) through a select transistor, and the other terminal is connected to a plate electrode (PL), thereby constituting a cell block. With this structure, 2-bit data can be stored in a cell, and a folded bit line structure can be realized.

(69th Embodiment)

Figure 102:
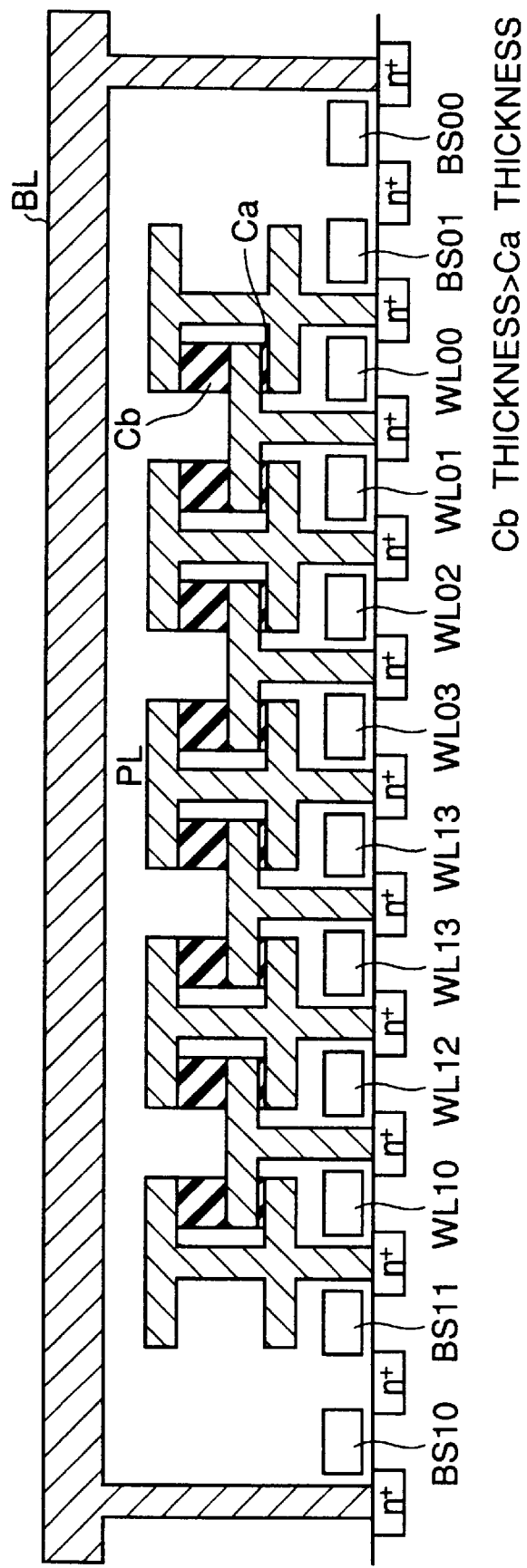
FIG. 102 is a sectional view showing the device structure of an FRAM according to the 69th embodiment.

FIG. 102 is a sectional view showing the memory cell structure of an FRAM according to the 69th embodiment of the present invention. This structure realizes the equivalent circuit of the memory cell shown in FIG. 101.

Ferroelectric capacitors having different thicknesses (thickness of Cb>thickness of Ca) are connected on a memory cell transistor to form one cell. The reason why the film thickness is changed is as follows. The coercive field is almost constant independently of the film thickness because of the characteristic features of the ferroelectric capacitor. When the ferroelectric capacitor is made thin, the coercive voltage lowers. In addition, the remnant polarization amount does not depend on the film thickness. Therefore, both in reading 1-bit data in the thick ferroelectric capacitor Cb and in reading 1-bit data in the thin ferroelectric capacitor Ca, the read margin is almost constant, and a stable operation is enabled.

The cell size is substantially $2F^2$ because the cell transistor and the 2-bit ferroelectric capacitors can be arranged at the intersection of a word line and the bit line BL with a size of $4F^2$. When four or more transistors are stacked in the vertical direction to form a three-dimensional cell array, a cell with a size of $2F^2$ can be realized in the conventional structure. However, from the viewpoint of the device structure, characteristics, process, reliability, and yield, it is very difficult to stacked-type transistors as in a TFT.

In this embodiment, however, such a structure can be easily realized because the transistors are formed in the minimum size of $4F^2$. When multiple passive elements (ferroelectric capacitors, capacitors, resistors, p-n junctions, and the like) which can be relatively easily stacked from the viewpoint of reliability on the area with the size of $4F^2$, a cell having a size of $2F^2$ or less per bit can be realized. Even in the conventional cell having a size of $8F^2$, ferroelectric capacitors can be parallelly connected and stacked to obtain the effect of reducing the cell size. Basically, however, as an optimum method, the cell size is made as small as possible (reduced to $4F^2$) first, and ferroelectric capacitors and the like other than Tr are stacked to increase the bit number. With this method, the random access properties can be maintained even when the cell size is reduced.

To change the coercive voltage of the ferroelectric capacitor, not only the film thickness but also the material may be changed. For example, materials such as SrBiTaO and PbZrTiO which originally have different coercive voltages may be connected in parallel.

(70th Embodiment)

Figure 103A:
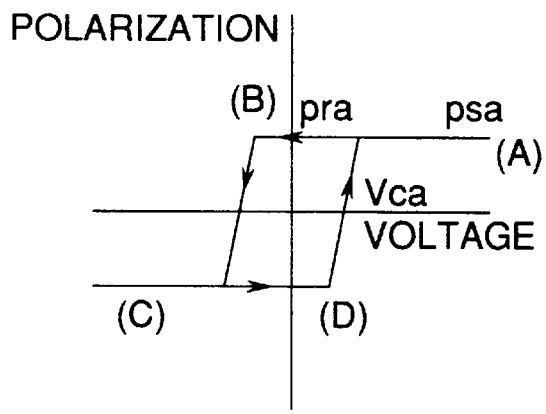
FIGS. 103A to 103C are graphs showing hysteresis loops representing the operating points of an FRAM according to the 70th embodiment.
Figure 103B:
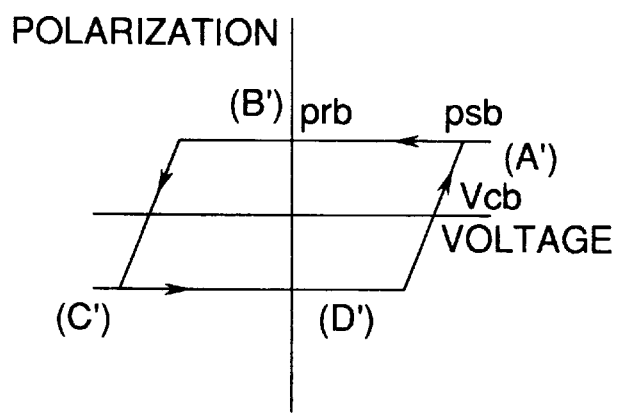
Figure 103C:
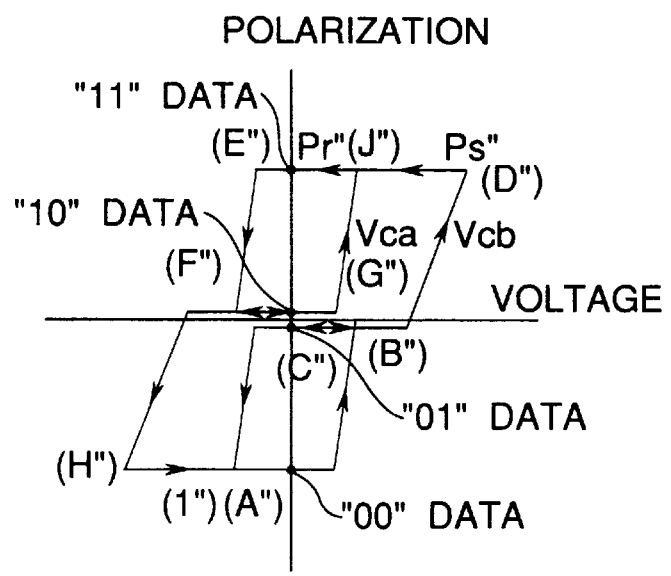

FIGS. 103A to 103C are graphs for explaining the 70th embodiment of the present invention. FIGS. 103A to 103C show an example of the operation of the memory cell shown in FIGS. 101 and 102.

FIG. 103A shows a schematic view (excluding the paraelectric component) of the hysteresis loop of a thin ferroelectric capacitor (Ca) which is connected in parallel. The coercive voltage is represented as Vca; the remnant polarization amount, Pra; and the saturation polarization amount, Psa. FIG. 103B shows a schematic view (excluding the paraelectric component) of the hysteresis loop of a thick ferroelectric capacitor (Cb) which is connected in parallel. The coercive voltage is represented as Vcb; the remnant polarization amount, Prb; and the saturation polarization amount, Psb.

FIG. 103C shows a schematic view (excluding the paraelectric component) of an equivalent hysteresis loop obtained when the two ferroelectric capacitors are connected in parallel.

For the basic operation, a low voltage is applied across the ferroelectric capacitors to read out data of the ferroelectric capacitor Ca. Next, a high voltage is applied to read out/rewrite data from/in the ferroelectric transistor Cb. Finally, a low voltage is applied to rewrite the data in the ferroelectric transistor Ca. More specifically, assume that the voltage applied across the ferroelectric capacitors (i.e., between a bit line BL and a plate electrode PL) is V1. First, the small voltage V1 larger than −Vcb and smaller than −Vca is applied such that no polarization inversion occurs in the ferroelectric transistor Cb, and polarization inversion occurs in the ferroelectric transistor Ca, thereby reading out the polarization inversion information of the ferroelectric transistor Ca and temporarily storing the information outside the cell array. Next, the voltage V1 is temporarily reset to 0V.

Second, the voltage V1 smaller than −Vcb is applied such that polarization inversion occurs in the ferroelectric transistor Cb to read out the polarization inversion information of the ferroelectric transistor Cb. After the information is amplified, the voltage V1 smaller than −Vcb (data "0") or larger than Vcb (data "1") is applied such that polarization inversion occurs in the ferroelectric transistor Cb to rewrite the cell data in the ferroelectric capacitor Cb, and the voltage V1 is temporarily reset to 0V.

Third, the temporarily stored data is rewritten in the ferroelectric transistor Ca. More specifically, the voltage V1 larger than −Vcb and smaller than −Vca (data "0") or larger than Vca and smaller than Vcb (data "1") is applied such that no polarization inversion occurs in the ferroelectric transistor Cb, and the data of the ferroelectric transistor Cb is not destroyed, and polarization inversion occurs in the ferroelectric transistor Ca. With this operation, the cell data is rewritten in the ferroelectric transistor Ca. Finally, the voltage V1 is reset to 0V to set the precharge time.

The voltage V1 is reset to 0V a number of times during the operation. However, the voltage V1 may be reset to a predetermined voltage. To read/write data from/in the ferroelectric transistors Ca and Cb with a margin, Vcb/Vca must be 3 to 5. When Vcb/Vca is low, the difference between the voltages Vcb and Vca becomes zero to cause an erroneous operation. When Vcb/Vca is too high, the value of the voltage Vca becomes too small because the voltage Vcb cannot be higher than Vcc. For this reason, the data of the ferroelectric transistor Ca is destroyed due to noise.

Exactly speaking, the coercive voltage has a distribution in the ferroelectric capacitor and causes polarization inversion with a gradient with respect to the applied voltage. When the coercive voltage at which the ferroelectric transistor Ca is almost completely inverted is Vcamax, and the minimum coercive voltage at which the ferroelectric transistor Cb starts to be inverted is Vcbmin, the voltage at the time of read/write data from/in the ferroelectric transistor Ca should be Vcamax<|V1|<Vcbmin. Accordingly, the thickness of the ferroelectric capacitor must be set such that |V1|−Vcamax>α, and Vcbmin−|V1|>α (α>0) to ensure a sufficient margin. For example, the voltage Vca is 0.5V, the voltage Vcb is 2V, the voltage V1 for reading data of the ferroelectric transistor Cb is −3V, and the voltage V1 for reading out data of the ferroelectric transistor Ca is −1V.

Figures 104A, 104B:
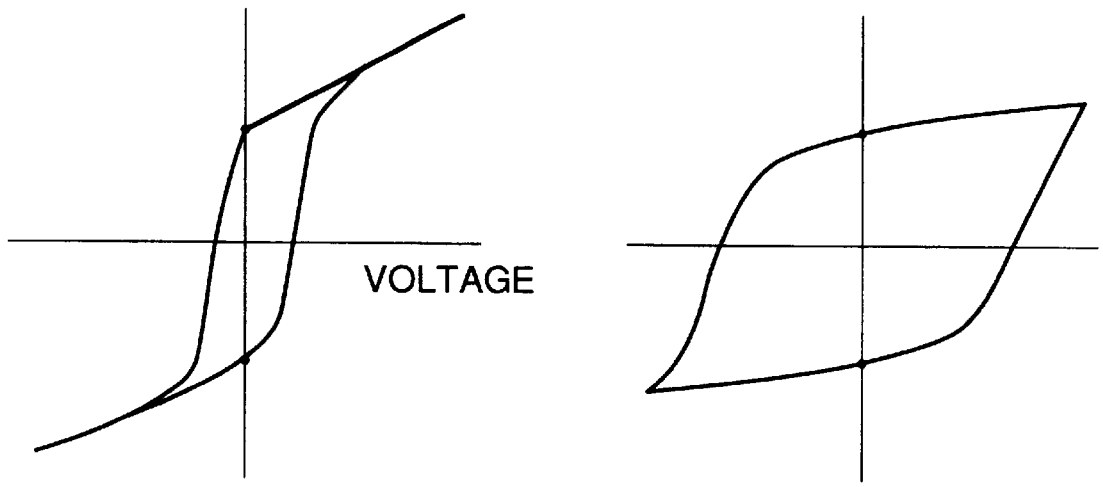
FIGS. 104A to 104C are graphs showing hysteresis loops representing the operating points of the FRAM according to the 70th embodiment.
Figure 104C:
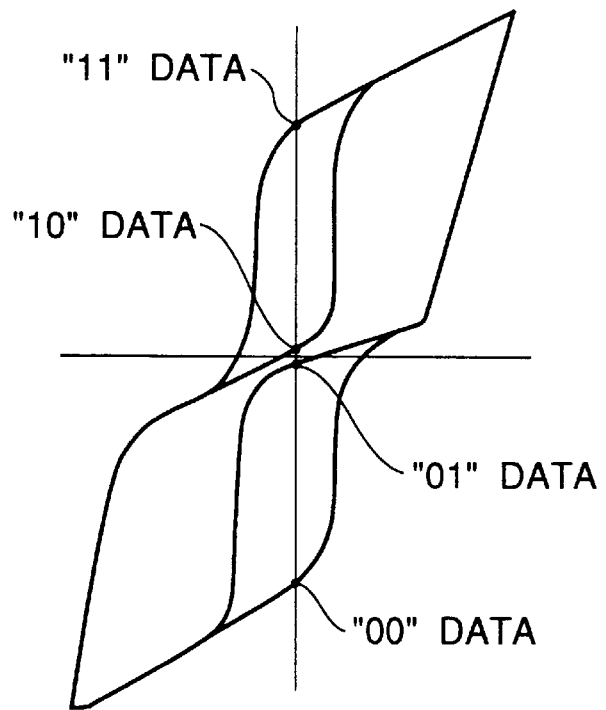

When the voltage V1 for reading out data of the ferroelectric transistor Ca is −1V, |V1|−Vca=0.5V, and Vcb−|V1|= 1V. This is because, in the actual hysteresis loop, the ferroelectric transistor Cb has a larger distribution width of the coercive voltage, as shown in FIGS. 104A to 104C. Actually, the coercive field distribution of the ferroelectric transistor Ca equals that of the ferroelectric transistor Cb. However, when the electric fields are converted into voltages, the distribution of the ferroelectric transistor Cb becomes wider. When the applied voltage Vcc for reading data of the ferroelectric transistor Cb is 3V, and the applied voltage for reading data of the ferroelectric transistor Ca, i.e., ½Vcc is 1.5V, the voltage Vca may be 0.5 to 0.75V, and the voltage Vcb may be 2 to 2.25V.

As shown in FIGS. 103A to 104C, in this embodiment, data "11" (the first "1" represents data of the ferroelectric transistor Cb, and the second "1" represents data of the ferroelectric transistor Ca) is at a position −Pr' (=2Pra= 2Prb). Data "00" is at a position −Pr' (=−2Pra=−2Prb). Data "01" and data "10" are at 0V. Although the data "01" and "10" are at the same position, these data exhibit different operation loci upon application of a voltage. Therefore, there are four states in total. The operation margin with respect to the reference will be considered. Since, in the two-layered ferroelectric capacitors as shown in FIG. 102, the polarization amount of each layer is the same as that of the above-described cell having a size of $4F^2$, the margin becomes ½Pr'=(Pra=Prb). That is, the margin equals that of the cell with a size of $4F^2$.

When the ferroelectric capacitor area is doubled to constitute a quaternary memory, information is stored at one of points obtained by dividing the section between −2Pr and 2Pr (at positions 2Pr, ⅔Pr, −⅔Pr, and −2Pr). The operation margin with respect to the reference will be considered. The margin becomes ⅔Pr, i.e., degrades as compared to this embodiment. In addition, since the sense amplifier must read a small voltage value, the circuit becomes bulky, and the margin becomes zero. In the present invention, n-bit data is held in a structure having n capacitors and one transistor and a size of $4F^2$. The capacity is proportional to the number n of stacked ferroelectric capacitors. However, in the multi-valued memory, the capacity is proportional to $Log_2$(m value), resulting in a disadvantage.

The locus of the hysteresis loop will be examined in more detail.

Upon application of the voltage V1=-½Vcc, 2-bit cell data "11" (point E") moves to a point F" to read out data of the ferroelectric transistor Ca. The voltage V1 is temporarily reset. After the data "11" comes to a point G", the voltage V1=-Vcc is applied. The data "11" moves to a point H" to read out data of the ferroelectric transistor Cb. After rewrite, the data "11" returns to a point D". After the voltage V1 is reset, the data "11" returns to the point E". In rewriting the data in the ferroelectric transistor Ca, the data "11" moves to a point J". The data "11" returns to the point E" upon the precharge operation.

Upon application of the voltage V1=-½Vcc, 2-bit cell data "10", (point G") moves to the point F" to read out data of the ferroelectric transistor Ca. The voltage V1 is temporarily reset. After the data "10" comes to the point G", the voltage V1=-Vcc is applied. The data "10" moves to the point H" to read out data of the ferroelectric transistor Cb. After rewrite, the data "10" returns to the point D". After the voltage V1 is reset, the data "10" returns to the point E". In rewriting the data in the ferroelectric transistor Ca, the data "10" moves to a point F". The data "10" returns to the point G" upon the precharge operation.

Upon application of the voltage V1=-½Vcc, 2-bit cell data "01" (point C") moves to a point I" to read out data of the ferroelectric transistor Ca. The voltage V1 is temporarily reset. After the data "01" comes to a point A", the voltage V1=-Vcc is applied. The data "01" moves to the point H" to read out data of the ferroelectric transistor Cb. After rewrite, the data "01" returns to the point H". After the voltage V1 is reset, the data "01" returns to the point A". In rewriting the data in the ferroelectric transistor Ca, the data "01" moves to a point B". The data "01" returns to the point C" upon the precharge operation.

Upon application of the voltage V1=-½Vcc, 2-bit cell data "00" (point A") moves to the point I" to read out data of the ferroelectric transistor Ca. The voltage V1 is temporarily reset. After the data "00" comes to the point A", the voltage V1=-Vcc is applied. The data "00" moves to the point H" to read out data of the ferroelectric transistor Cb. After rewrite, the data "00" returns to the point H". After the voltage V1 is reset, the data "00" returns to the point A". In rewriting the data in the ferroelectric transistor Ca, the data "00" moves to the point I". The data "00" returns to the point A" upon the precharge operation.

As described above, although the points G" and C" are at the same position, the data "01" and "10" exhibit different operation loci, unlike the multivalued memory, so that these data can be recognized as different data.

(71st Embodiment)

Figure 105:
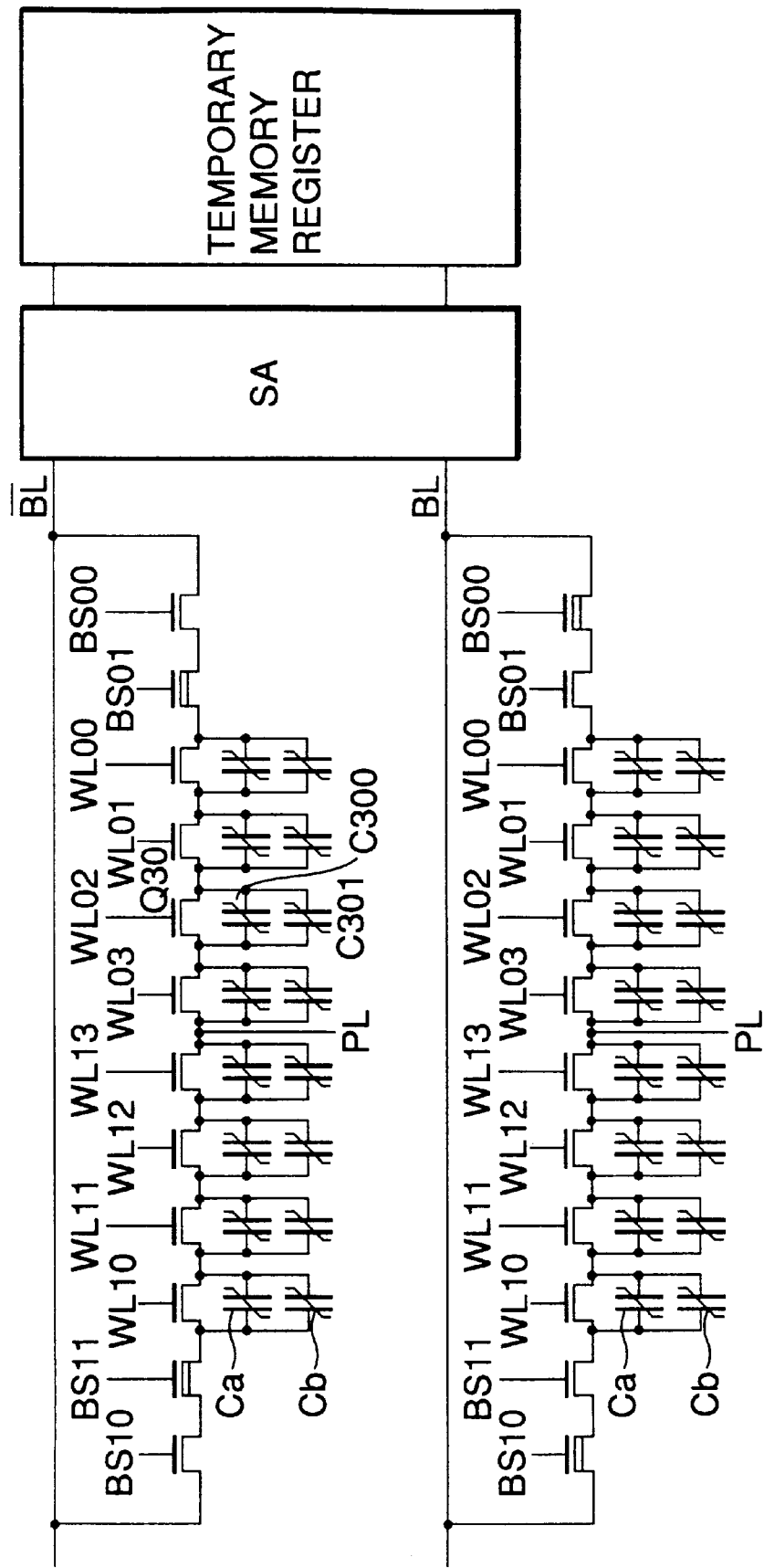
FIG. 105 is an equivalent circuit diagram of an FRAM according to the 71st embodiment.

FIG. 105 is a circuit diagram for explaining the 71st embodiment of the present invention. In FIG. 105, a sense amplifier and a temporary memory register having a folded bit line structure are arranged in the embodiment shown in FIG. 101.

When a block selection line BS00 and a word line WL02 are selected to sequentially read/write data from/in ferroelectric capacitors C300 and C301, a bit line BL is used as a reference bit line. When the data of the ferroelectric capacitor C300 is read out, the readout data is stored in the temporary memory register shown in FIG. 105. Next, after the data of the ferroelectric capacitor C301 is read/written, the data stored in the temporary memory register is rewritten in the ferroelectric capacitor C300.

(72nd Embodiment)

Figure 106:
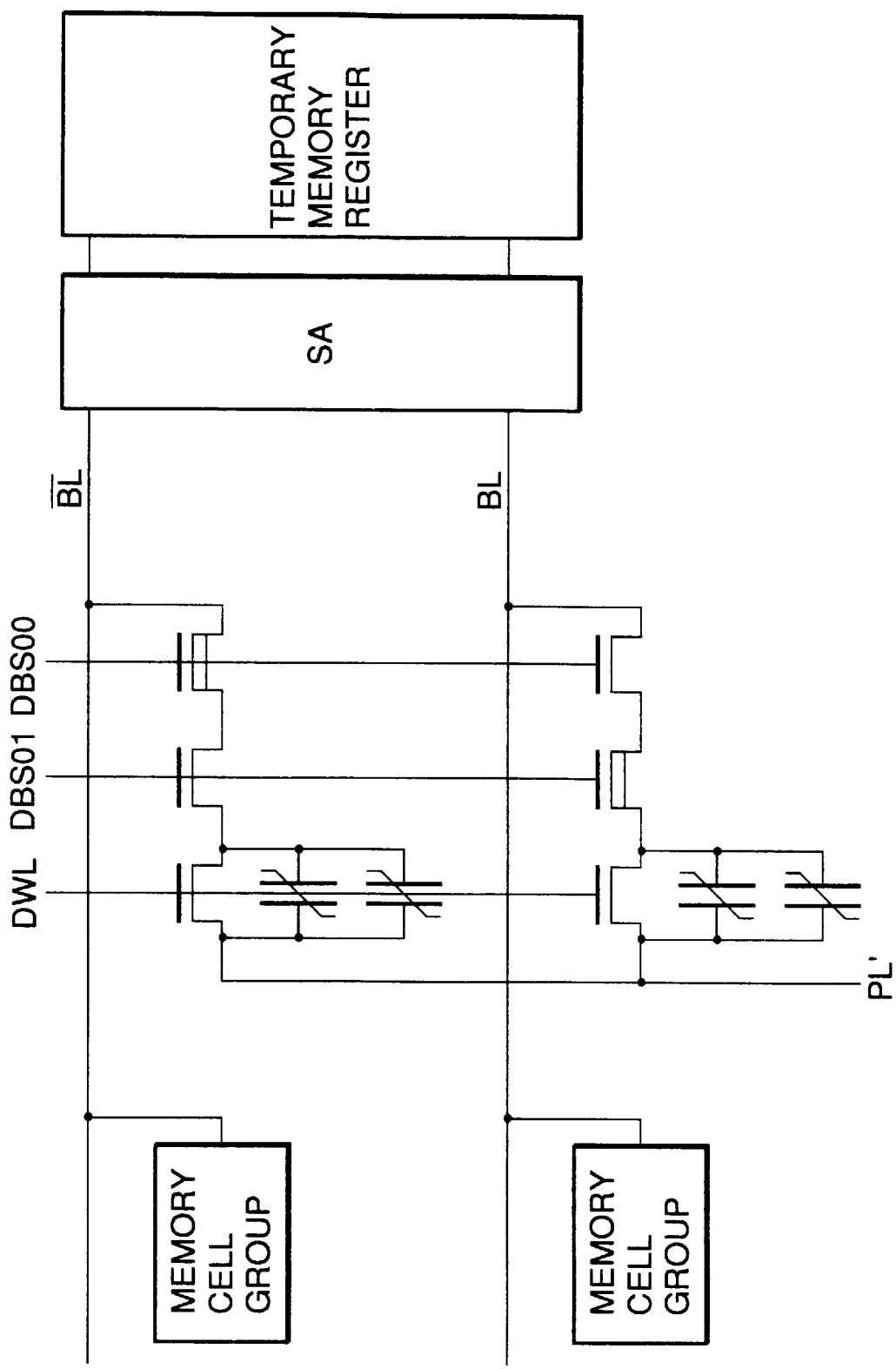
FIG. 106 is an equivalent circuit diagram of an FRAM according to the 72nd embodiment.

FIG. 106 is a circuit diagram for explaining the 72nd embodiment of the present invention. In FIG. 106, a dummy cell for the ferroelectric capacitor is added to the embodiment shown in FIG. 105.

This structure can be realized with the same structure as that of a normal cell structure. When a dummy word line DWL is kept at "L", and a selection block line DBS01 for dummy cell is kept at "H" for a short time after the precharge operation, data "0" is written. In the next cycle, the data "0" is read out. When the dummy cell area is made relatively large, the bit line potential can be set at an intermediate potential between data "1" and "0" of the normal cell.

Figure 107:
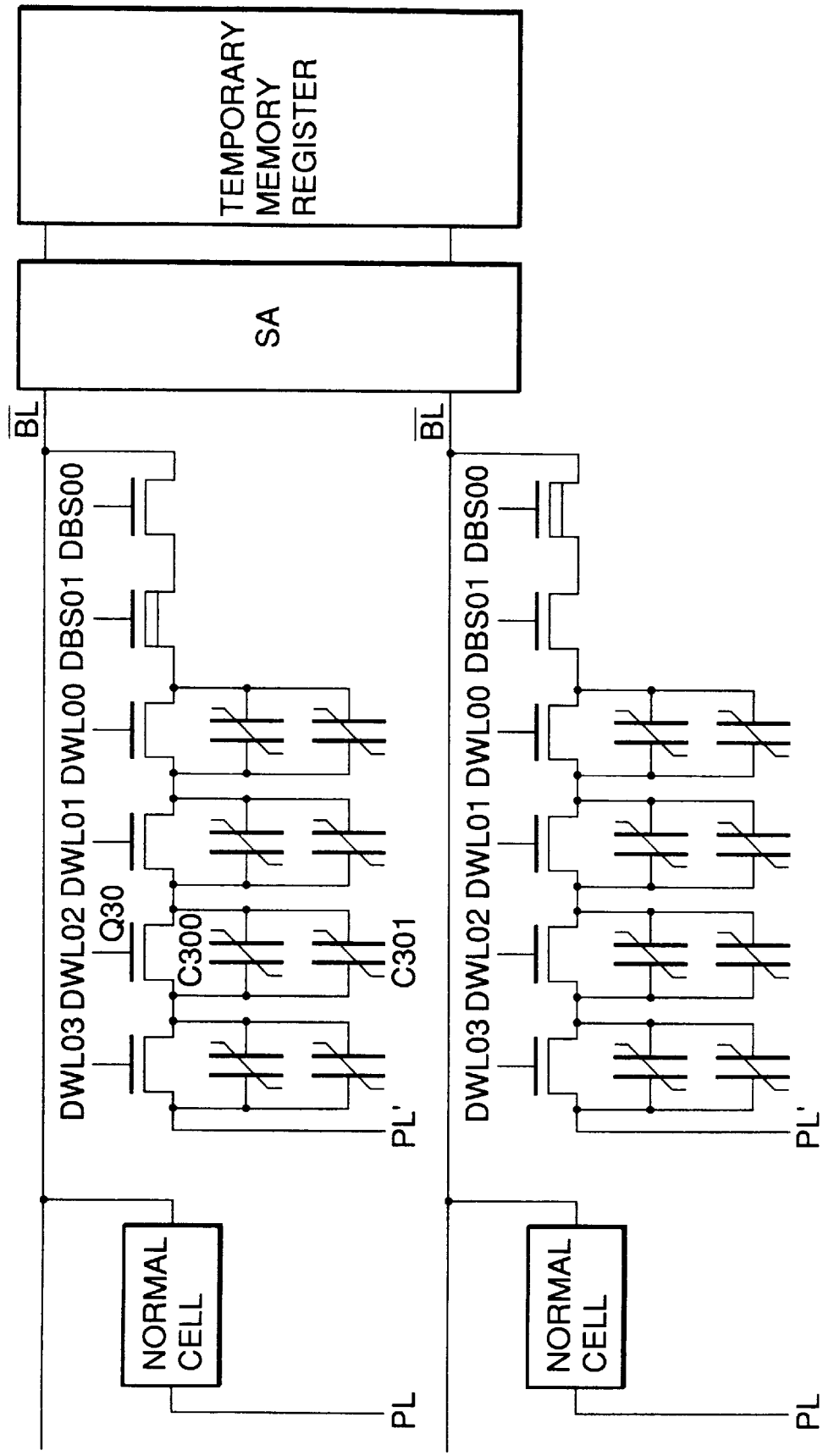
FIG. 107 is a circuit diagram showing a structure in which a plurality of dummy cells according to the embodiment shown in FIG. 106 are connected in series.

In FIG. 107, a plurality of dummy cells shown in the embodiment shown in FIG, 106 are connected in series. With this structure, the same effect as in FIG. 42B or 44A can be obtained.

(73rd Embodiment)

Figure 108:
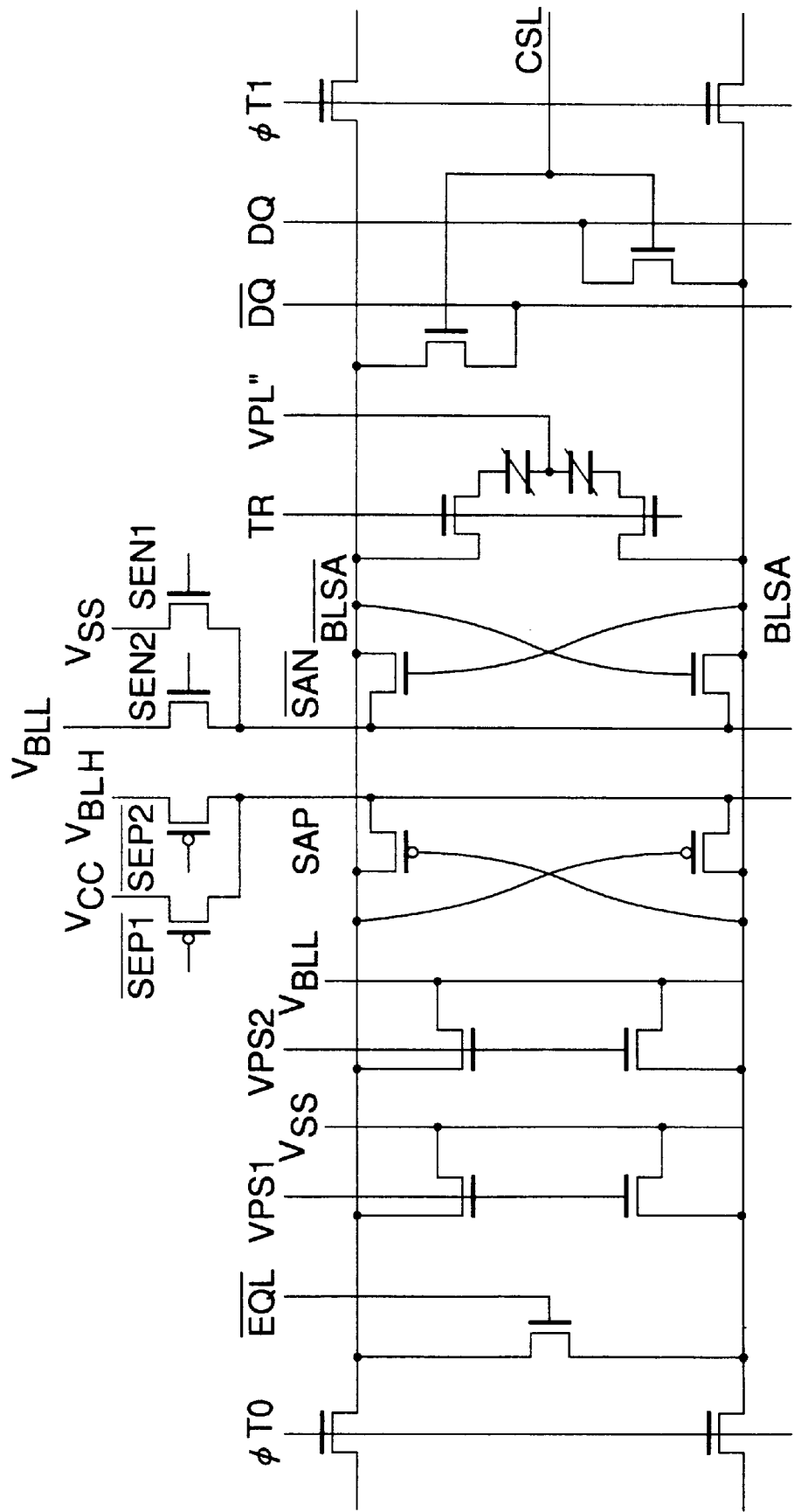
FIG. 108 is a circuit diagram of the sense amplifier of an FRAM according to the 73rd embodiment.

FIG. 108 is a circuit diagram showing a sense amplifier applicable to the structures shown in FIGS. 101 to 106 so as to explain the 73rd embodiment of the present invention. In this case, the plate (PL) voltage is fixed.

This sense amplifier is different from a normal sense amplifier for a ferroelectric capacitor in the following points. (1) A circuit for setting the potentials of a bit line pair ($\overline{BLSA}$ and BLSA) in the sense amplifier not only at Vss but also at VBLL is arranged. (2) A circuit for setting the potentials of NMOS and PMOS sense amplifier driving lines not only at Vcc and Vss but alto at VBLL and VBLH, respectively, is arranged. (3) The sense amplifier incorporates a register for temporarily storing data read out from a cell.

(74th Embodiment)

Figure 109:
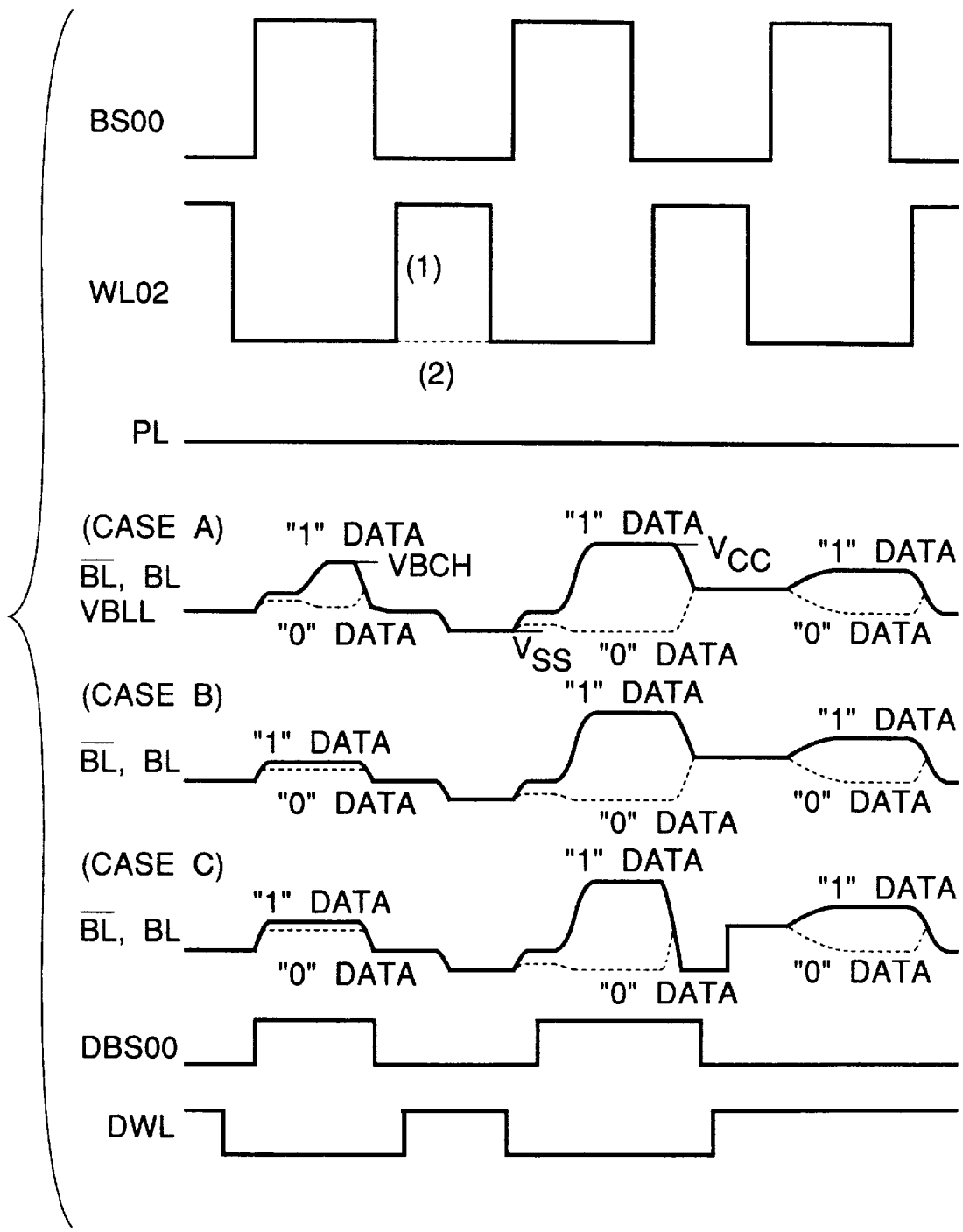
FIG. 109 is a timing chart showing the operation of an FRAM according to the 74th embodiment.

FIG. 109 is a timing chart showing three operations applicable to the cell structures shown in FIGS. 101 to 106 and the sense amplifier shown in FIG. 108 so as to explain the 74th embodiment of the present invention. In this case, the plate (PL) voltage is fixed.

In case A, the plate electrode is fixed at (½)Vcc, and the bit line is precharged to VBLL. When a word line WL02 is set at "L", and a block selection line BS00 is set at "H", a potential corresponding to (½)Vcc-VBLL is applied to the cell to read out the data of a ferroelectric capacitor C300. The sense amplifier is activated to amplify the bit line potentials to VBLL and VBLH, respectively. TR is set at "H" to store this data in the temporary memory register.

Bit lines $\overline{BL}$ and BL are set at VBLL to eliminate the difference in polarization amount between data "1" and data "0" of the ferroelectric capacitor C300. The block selection line BS00 is set at "L", and the word line WL02 is set at "H" to make the potential between the ferroelectric capacitors 0V. The bit lines $\overline{BL}$ and BL are precharged to Vss. The word line WL02 is set at "L", and the block selection line BS00 is set at "H" again to read out data of a ferroelectric capacitor C301. The readout signal is amplified by the sense amplifier. Thereafter, a block selection line BS02 is set at "L", and the word line WL021 is set at "H" to make the potential between the ferroelectric capacitor 0V. The bit lines $\overline{BL}$ and BL are equalized. Thereafter, the word line WL02 is set at "L", the block selection line BS02 is set at "H" to connect the bit line and the cell and rewrite the data in the temporary memory register in the cell. The block selection line BS00 is set at "L", and the word line WL02 is set at "H" to precharge the bit lines $\overline{BL}$ and BL to VBLL, and the operation of one cycle is ended.

In case B, after the data of the ferroelectric capacitor C300 is read out, a signal φ t0 is set at "L" and amplified by the sense amplifier. For this reason, no excess rewrite in the bit lines $\overline{BL}$ and BL occurs. When the potentials of the bit lines $\overline{BL}$ and BL are lowered to VBLL, the signal φ t0 is set at "H".

In case C, the dummy cell shown in FIG. 106 is used in case B. The data of the ferroelectric capacitor C301 is rewritten in the cell. After the block selection line BS00 is set at "L", and the word line WL02 is set at "H", the potentials of the bit lines $\overline{BL}$ and BL are temporarily lowered to Vss. At this time, while keeping a selection block line DBS00 for dummy cell at "H", and a dummy word line DWL at "L", data "00" is written in the dummy cell. Thereafter, the selection block line DBS00 for dummy cell is set at "L", and the dummy word line DWL is set at "H", so that the dummy cell can prepare for the operation of the next cycle.

(75th Embodiment)

Figure 110:
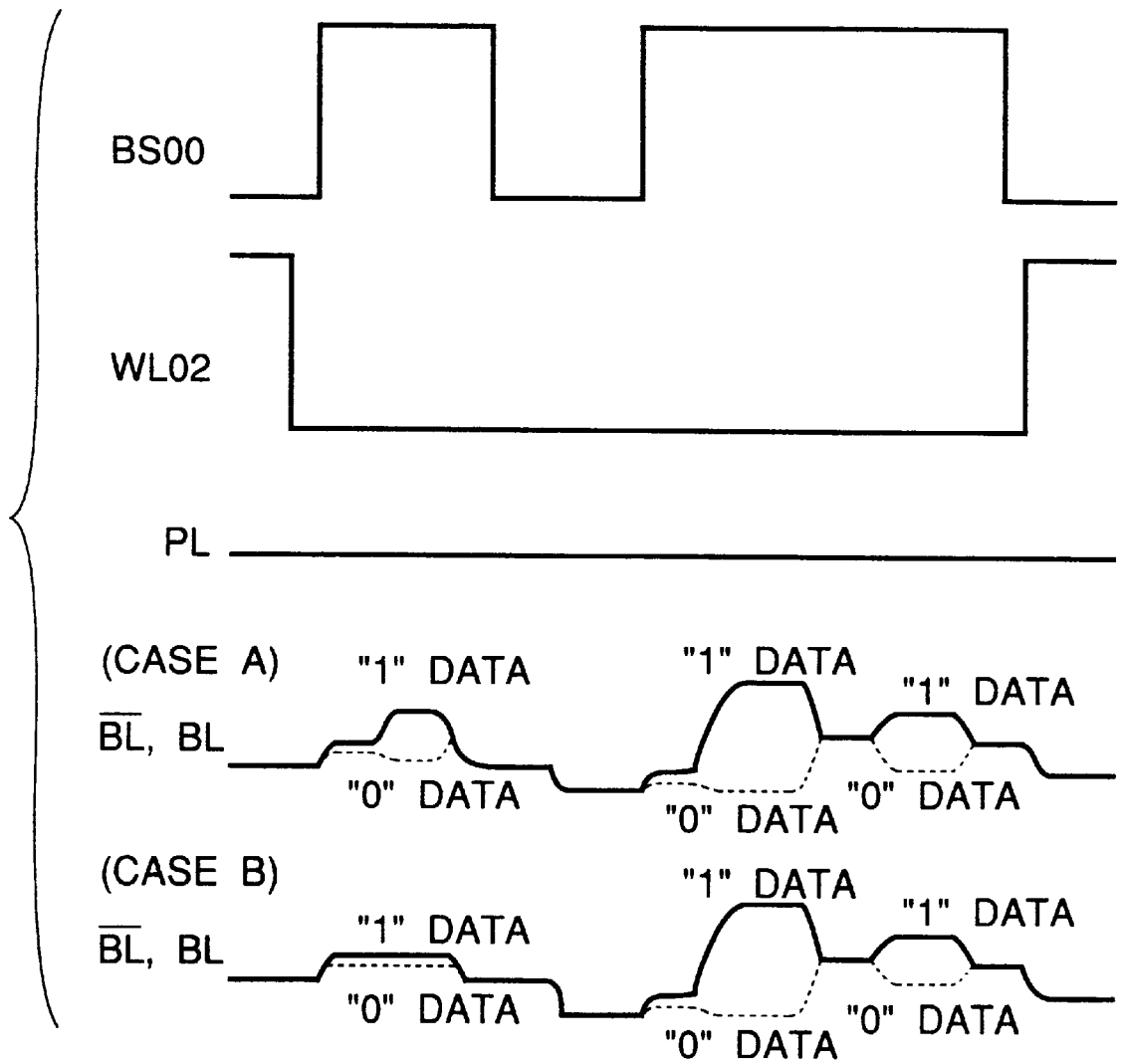
FIG. 110 is a timing chart showing the operation of an FRAM according to the 75th embodiment.

FIG. 110 is a timing chart showing two other operations applicable to the cell structures shown in FIGS. 101 to 106 and the sense amplifier shown in FIG. 107 so as to explain the 75th embodiment of the present invention.

In this case, the plate (PL) voltage is fixed. The number of unnecessary operations of a word line WL02 and that of a block selection line BS00 can be reduced to realize a high-speed operation.

In case A, the plate voltage is set at (½)Vcc. The bit lines are precharged to VBLL. The word line WL02 is set at "L" level and the block selection line BS00 is set at "H" to apply a potential corresponding to (½)Vcc–VBLL so that data of a ferroelectric capacitor C300 is read out. Thereafter, the sense amplifier is activated to amplify the bit line potentials to VBLL and VBLH, respectively. TR is set at "H" to store the data in the temporary memory register.

The potentials of the bit lines $\overline{BL}$ and BL are lowered to VBLL to eliminate the difference in polarization amount between data "1" and data "0" of the ferroelectric capacitor C300. The block selection line BS00 is set at "L" to disconnect the cell and the bit line. The bit lines $\overline{BL}$ and BL are precharged to Vss. The block selection line BS00 is set at "H" again to read out data of a ferroelectric capacitor C301. The readout signal is amplified by the sense amplifier, and the data of the ferroelectric capacitor C301 is rewritten. The bit lines $\overline{BL}$ and BL are equalized. The TR is set at "H" again to rewrite the data of the ferroelectric capacitor C301, which is stored in the temporary memory register, in the cell. The block selection line BS00 is set at "L", and the word line WL02 is set at "H" to precharge the bit lines $\overline{BL}$ and BL to VBLL, and the operation of one cycle is ended.

In case B, after the data of the ferroelectric capacitor C300 is read out, a signal φ t0 is set at "L" and amplified by the sense amplifier. For this reason, no excess rewrite in the bit lines $\overline{BL}$ and BL occurs. When the potentials of the bit lines $\overline{BL}$ and BL are lowered to VBLL, the signal φ t0 is set at "H". Above described operation can be realized by operating in a range of $0V \leq PL \leq -Vcc/3$ and $0V \leq BL \leq Vcc/3$ in a case of reading out the C300, and by operating in a range of $0V \leq PL \leq Vcc$ and $0V \leq BL \leq Vcc$ in a case of reading out the C301, using the plate driving scheme.

(76th Embodiment)

Figure 111:
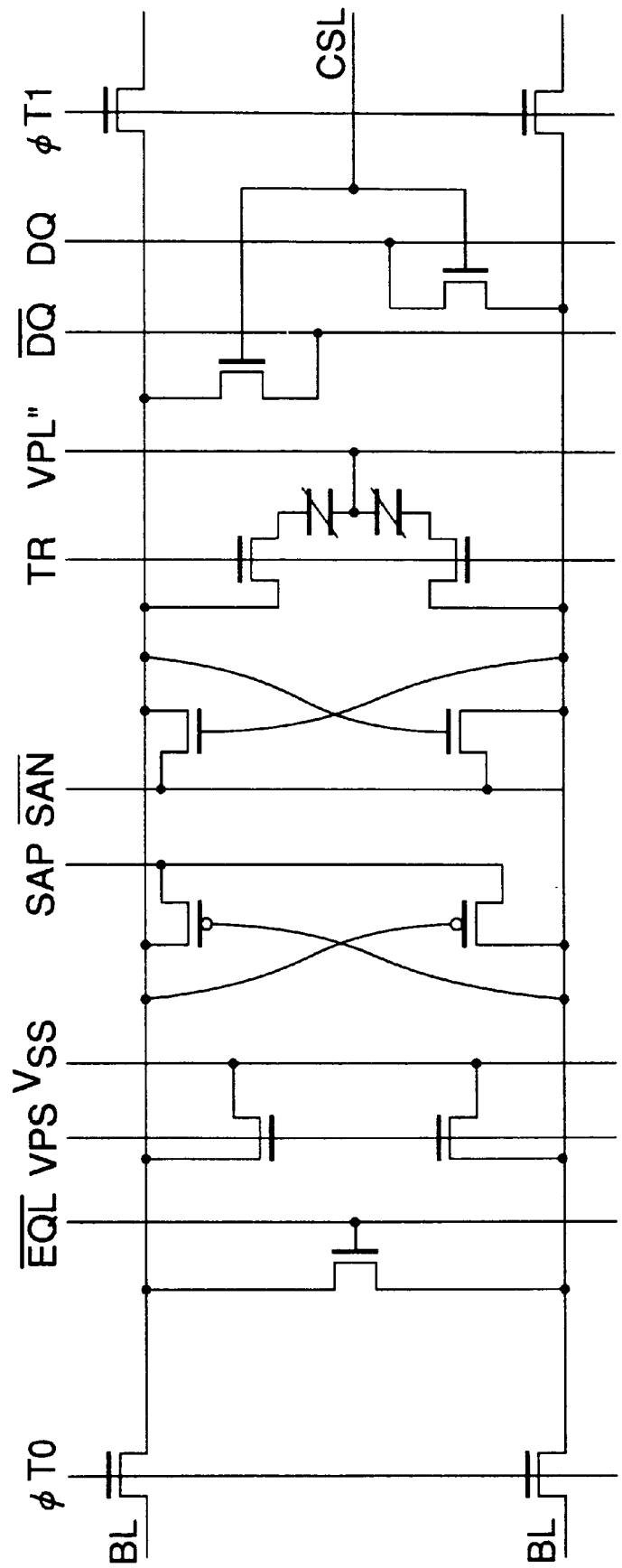
FIG. 111 is a circuit diagram of the sense amplifier of an FRAM according to the 76th embodiment.

FIG. 111 is a circuit diagram showing a sense amplifier applicable to the structures shown in FIGS. 101 to 106 so as to explain the 76th embodiment of the present invention. In this case, the plate (PL) voltage is partially driven.

The sense amplifier is different from the normal sense amplifier for a ferroelectric memory in that the sense amplifier incorporates a register for temporarily storing data read out from the cell. No precharge and sense circuits of VBLL and VBLH, which may be complex and unstably operate, can be omitted.

(77th Embodiment)

Figure 112:
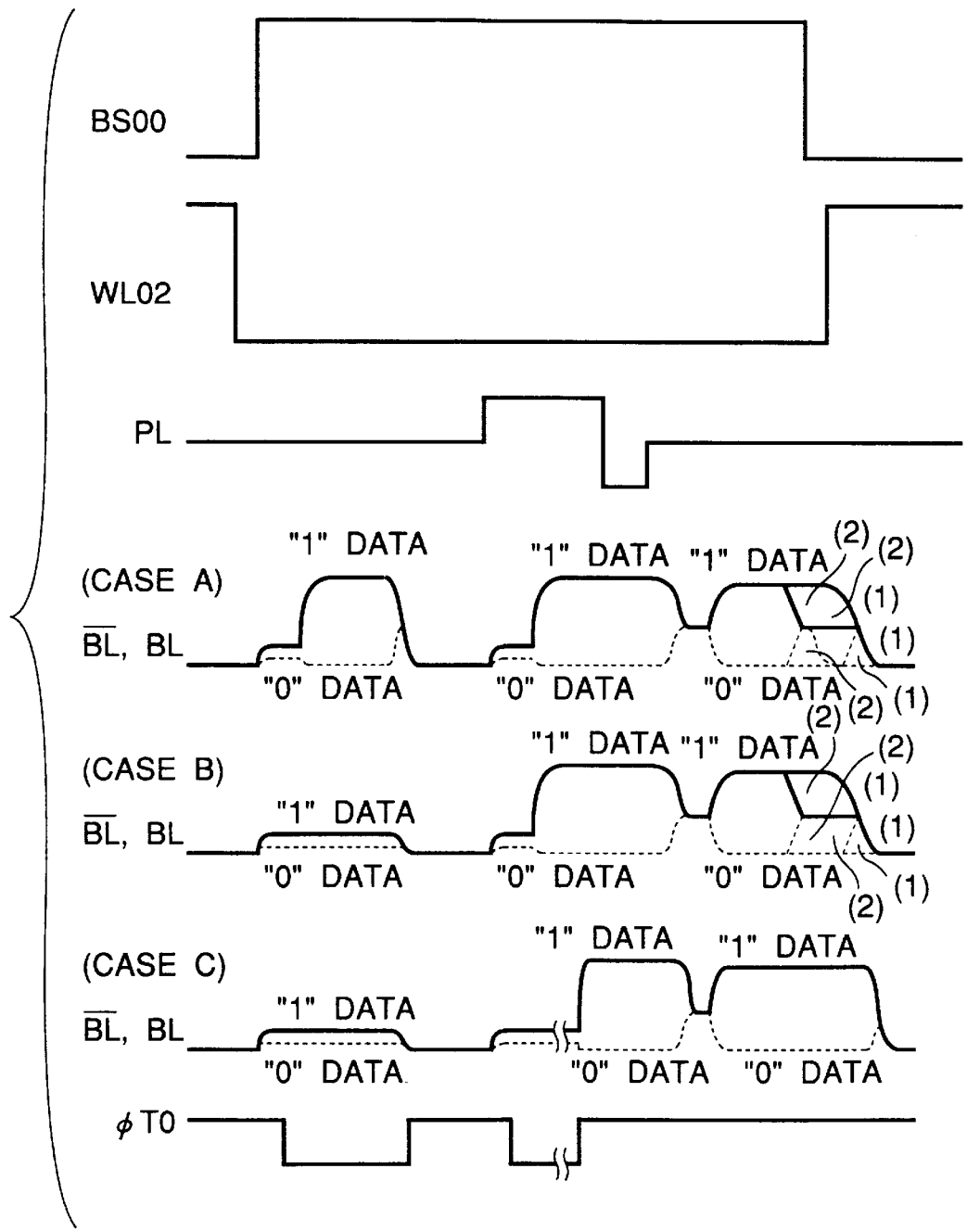
FIG. 112 is a timing chart showing the operation of an FRAM according to the 77th embodiment.

FIG. 112 is a timing chart showing three operations applicable to the cell structures shown in FIGS. 101 to 106 and the sense amplifier shown in FIG. 111 so as to explain the 77th embodiment of the present invention. In this case, the plate (PL) voltage is partially driven.

Briefly speaking, when data of a cell C300 having a small coercive voltage value is to be read out, the scheme of fixing the plate electrode at (½)Vcc is used. The |maximum voltage| applied to the cell is (½)Vcc. When data of a cell C301 having a large coercive voltage value is to be read out, the PL driving scheme is used. The |maximum voltage| applied to the cell is Vcc. With these operations, the maximum amplitude of a bit line pair $\overline{BL}$ and BL can be maintained at Vcc, so no excess circuit is necessary.

In case A, the plate electrode is set at (½)Vcc. The bit lines are precharged to Vss. A word line WL02 is set at "L", and a block selection line BS00 is set at "H" to apply a potential of –(½)Vcc to the cell. The data of the ferroelectric capacitor C300 is read out. The sense amplifier SA is activated to amplify the potentials of the bit lines to Vcc and Vss, respectively. TR is set at "H" to store the data in the temporary memory register. The potentials of the bit lines $\overline{BL}$ and BL are lowered to Vss to eliminate the difference in polarization amount between data "1" and data "0" of the ferroelectric capacitor C300. After the bit lines $\overline{BL}$ and BL are set in a floating state, the plate electrode voltage is raised to Vcc. The data of the ferroelectric capacitor C301 is read out to the bit line. The readout signal is amplified by the sense amplifier. The bit lines are set at Vss and Vcc, respectively. When the data of the ferroelectric capacitor C301 is data "0", rewrite is performed. The plate electrode voltage is lowered to Vss. When the data of the ferroelectric capacitor C301 is data "1", rewrite is performed.

The plate electrode voltage is returned to (½)Vcc to equalize the bit line pair to (½)Vcc. Accordingly, no polarization inversion of the data of the ferroelectric capacitor C301 occurs. Next, the plate electrode is kept at (½)Vcc. The TR is set at "H" to rewrite the data of the ferroelectric capacitor C300, which is stored in the temporary memory register, in the cell. The block selection line BS00 is set at "L", and the word line WL02 is set at "H" to precharge the bit lines $\overline{BL}$ and BL to Vss. As represented by (2), after the bit lines $\overline{BL}$ and BL are set at (½)Vcc, the block selection line BS00 may be set at "L", and the word line WL02 is set at "H". The operation of one cycle is ended.

When the ferroelectric capacitor is used as the temporary memory register, the data can be temporarily stored by charges due to the paraelectric component even when VPL" is kept fixed.

In case B, after the data of the ferroelectric capacitor C301 is read out, a signal φ t0 is set at "L" and amplified by the sense amplifier. For this reason, no excess rewrite in the bit lines $\overline{BL}$ and BL occurs. When the potentials of the bit lines $\overline{BL}$ and BL is lowered to VBLL, the signal φ t0 is set at "H".

In case C, after the data of the ferroelectric capacitor C301 is read out, the signal φ t0 is set at "L" in (case B). In this case, two temporary memory registers are prepared for the ferroelectric capacitors C300 and C301, respectively. This is suitable for a case wherein, after the data of the ferroelectric capacitors C300 and C301 are stored in the temporary memory registers, the data of the ferroelectric capacitors C300 and C301 are read out externally through the temporary memory registers, and the data are externally written in the temporary memory registers. This method is suitable for High-Bnad FRAM which transmits a large quantity of data to an external device.

(78th Embodiment)

Figure 113:
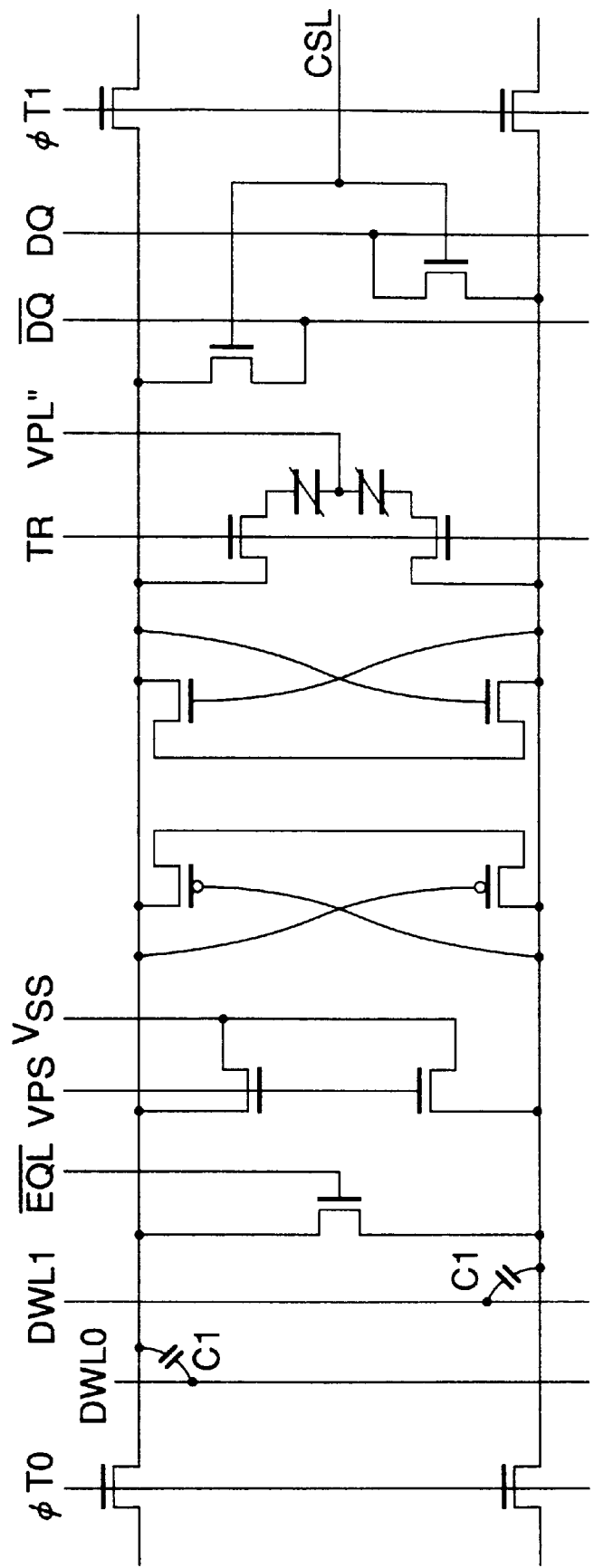
FIG. 113 is a circuit diagram of the sense amplifier of an FRAM according to the 78th embodiment.

FIG. 113 is a circuit diagram showing a sense amplifier applicable to the structures shown in FIGS. 101 to 106 so as to explain the 78th embodiment of the present invention.

In this case, the plate (PL) voltage is partially driven. As shown in FIG. 113, a coupling type dummy cell is arranged in the sense amplifier, in addition to the structure shown in FIG. 111.

(79th Embodiment)

Figure 114:
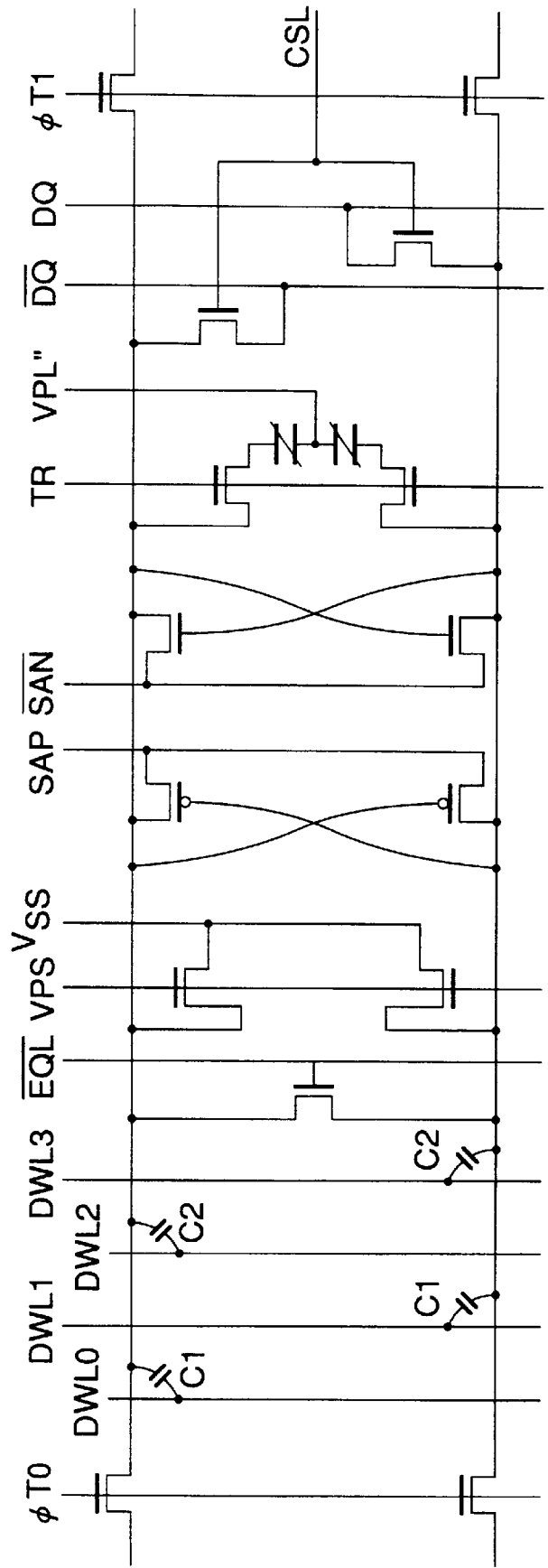
FIG. 114 is a circuit diagram of the sense amplifier of an FRAM according to the 79th embodiment.

FIG. 114 is a circuit diagram showing a sense amplifier applicable to the structures shown in FIGS. 101 to 106 so as to explain the 79th embodiment of the present invention. In this case, the plate (PL) voltage is partially driven.

Two coupling type dummy cells are arranged in the sense amplifier, in addition to the structure shown in FIG. 113. Basically, even when the ferroelectric capacitors have different thicknesses, the remnant polarization amount does not change, although the paraelectric component changes. Therefore, the coupling type dummy cell is convenient to a case wherein the coupling capacity is finely changed and optimized. The number of capacitors may be increased in correspondence with the effect shown in FIG. 45.

(80th Embodiment)

Figure 115:
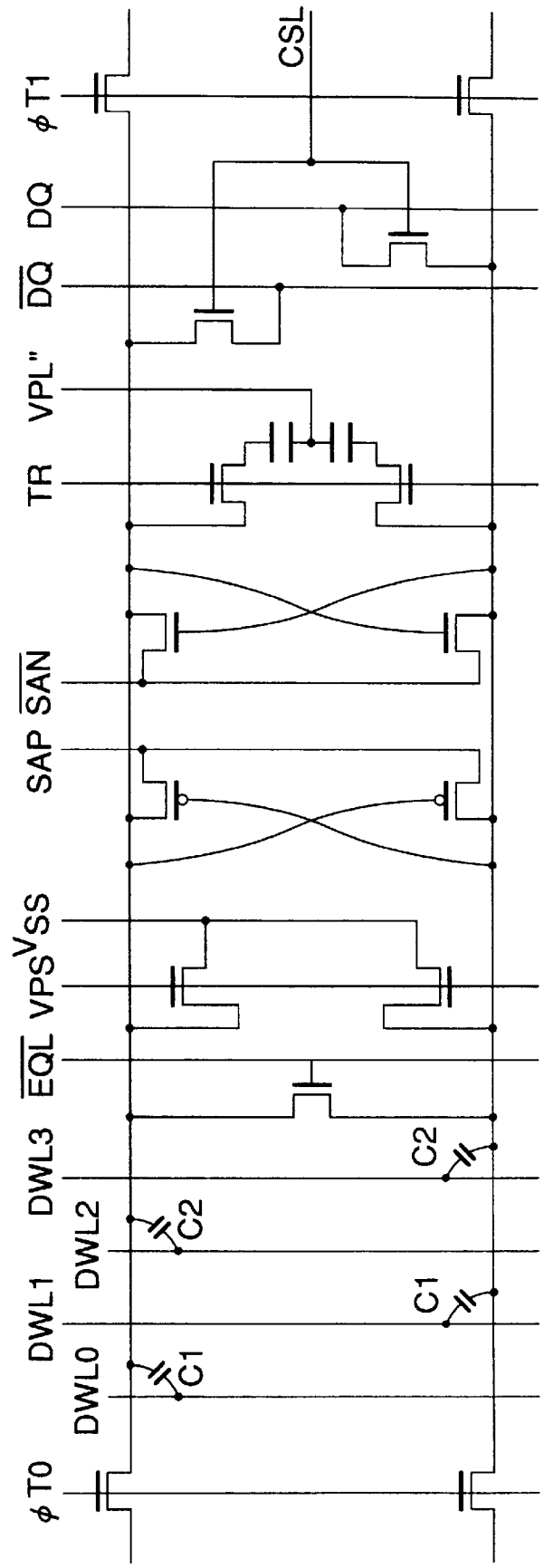
FIG. 115 is a circuit diagram of the sense amplifier of an FRAM according to the 80th embodiment.

FIG. 115 is a circuit diagram showing a sense amplifier applicable to the structures shown in FIGS. 101 to 106 so as to explain the 80th embodiment of the present invention. In this case, the plate (PL) voltage is partially driven.

This sense amplifier is different from that shown in FIG. 114 in that the sense amplifier uses a paraelectric capacitor as a temporary memory register, in place of the ferroelectric capacitor. Another storage device such as a flip-flop may be used.

(81st Embodiment)

Figure 116:
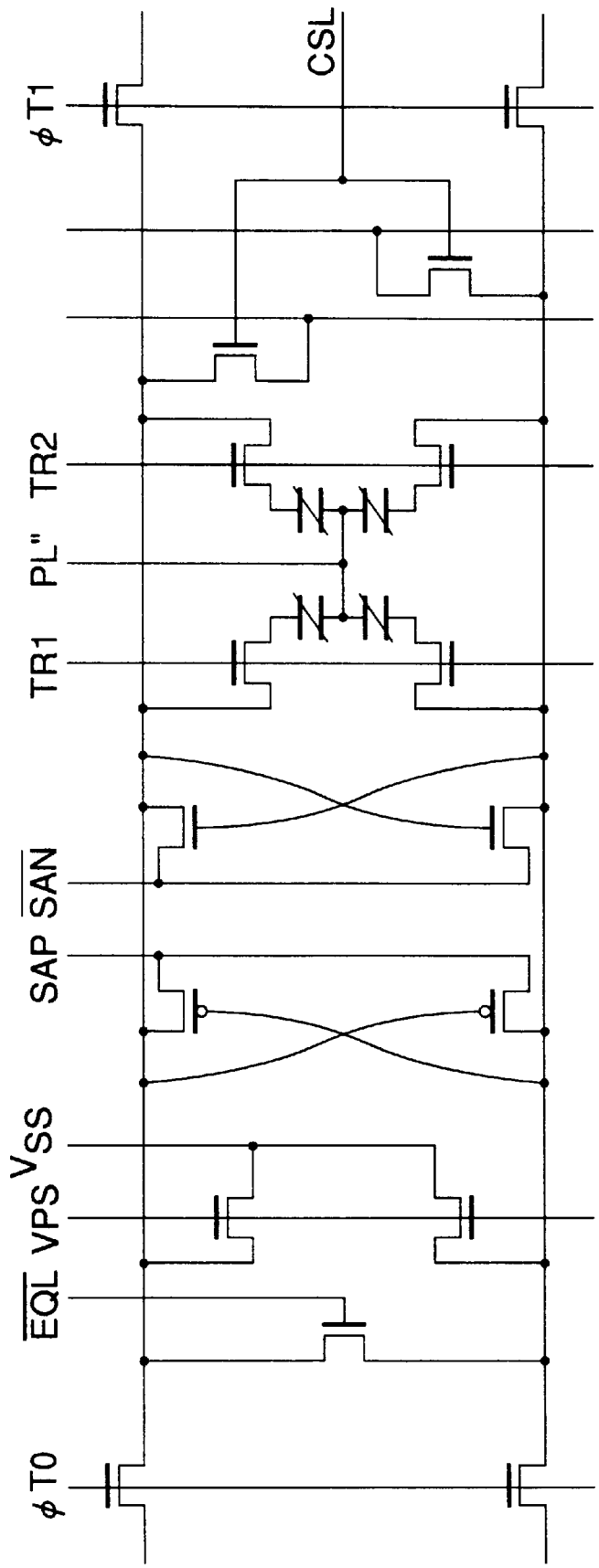
FIG. 116 is a circuit diagram of the sense amplifier of an FRAM according to the 81st embodiment.

FIG. 116 is a circuit diagram showing a sense amplifier applicable to the structures shown in FIGS. 101 to 106 so as to explain the 81st embodiment of the present invention. In this case, the plate (PL) voltage is partially driven.

The sense amplifier is different from that shown in FIG. 113 in that the temporary memory register has 2-bit data. One bit data is for a cell with a low coercive voltage, and the other bit data is for a cell with a high coercive voltage. This sense amplifier can be used for, e.g., case C in FIG. 113.

The scheme of partially driving the plate electrode voltage shown in FIG. 112 and the technique of changing the bit line amplitude shown in FIG. 108 can be combined to operate multi-bit cells shown in FIGS. 101 to 106, as a matter of course.

The (½)Vdd plate and the small bit line amplitude are combined to read out the first bit data, and the Vdd amplitude plate and the large bit line amplitude are combined to read out the next bit data. In this case, the ratio of the bit line amplitudes can be ½ the value in FIG. 109 or 110, and control can be easily performed. The Vdd amplitude plate scheme can also be applied to the scheme of changing the bit line amplitude shown in FIG. 108.

When the operation shown in FIG. 112 is applied to the cell structures shown in FIGS. 101 to 106, the sense amplifier easily operates. However, the plate electrode voltage must be changed to Vss, Vcc, and (½)Vcc. The plate electrode can be set at Vss or Vcc by connecting the plate electrode to a Vss or Vcc line. To set the plate electrode at (½)Vcc, a (½)Vcc power supply voltage generated by the (½)Vcc generation circuit in the chip must be used. When the plate electrode voltage is to be returned from Vss to (½)Vcc, the (½)Vcc power supply voltage undesirably lowers.

Figure 117:
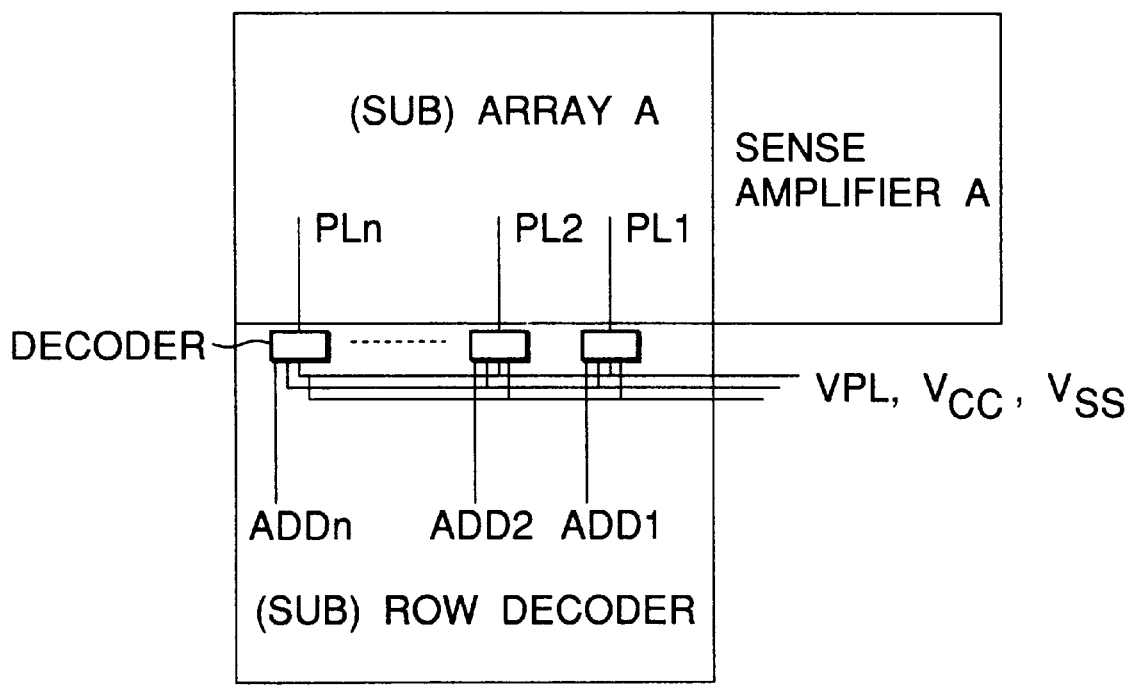
FIG. 117 is a circuit diagram showing a plate electrode driving scheme applicable to the cells shown in FIGS. 101 to 106.

As shown in FIG. 117, when only the plate electrode arranged every two cell blocks in a selected block is driven, the plate load capacity is largely decreased, and the variations in (½)Vcc power supply can be suppressed. In FIG. 117, the plate is divided into n plates, i.e., plates PL1 to PLn, and only the plate in a block selected by a decoder is driven.

Figure 118A:
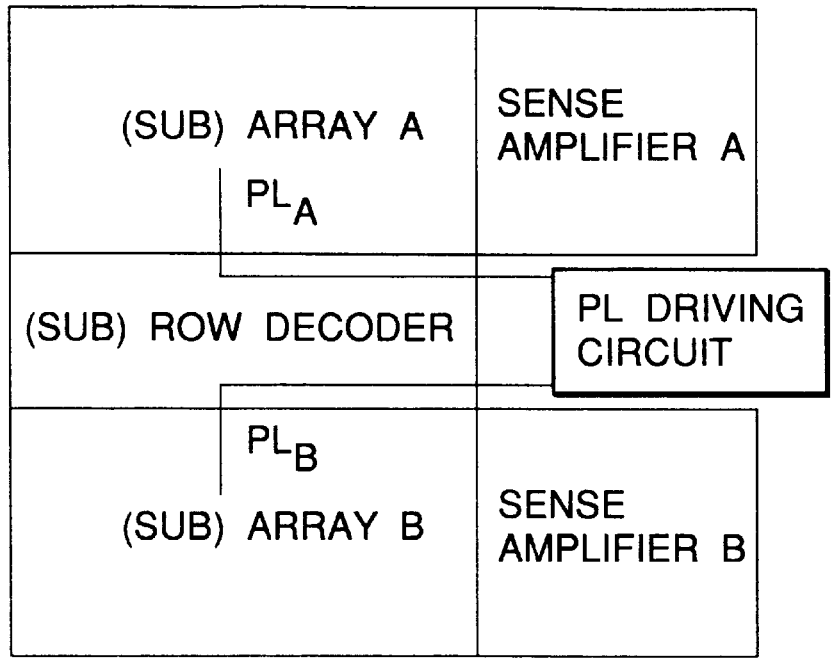
FIGS. 118A and 118B are circuit diagrams showing another plate electrode driving scheme applicable to the cells shown in FIGS. 101 to 106.
Figure 118B:
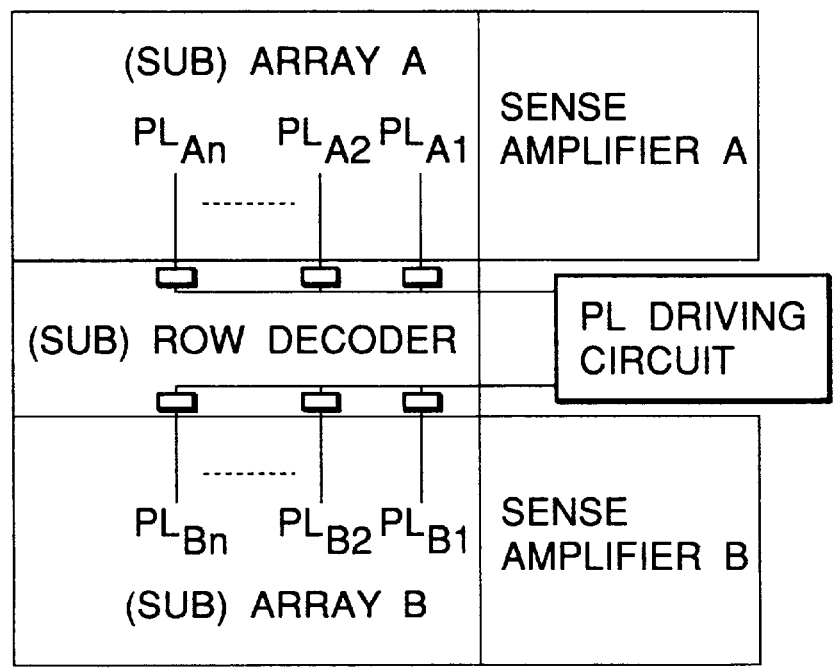
Figure 119A:
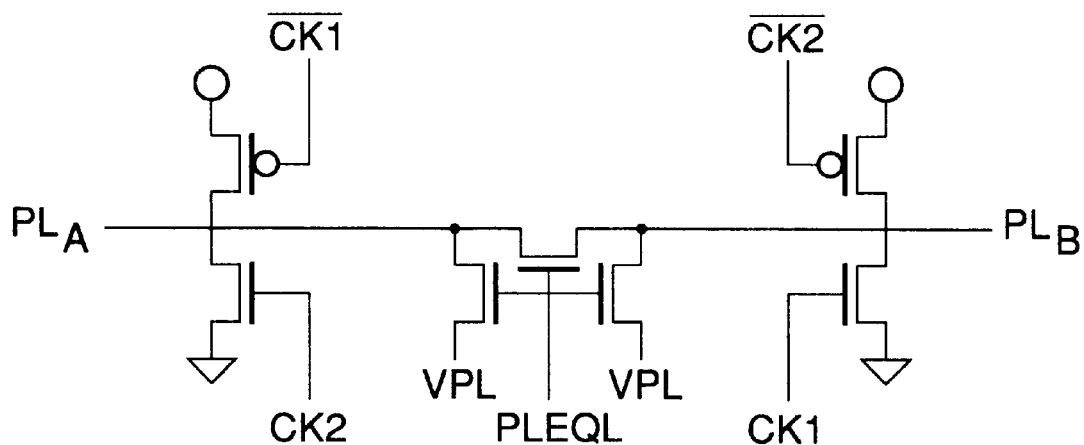
FIGS. 119A and 119B are a detailed circuit diagram and a timing chart, respectively, of the plate electrode driving scheme shown in FIGS. 118A and 118B.
Figure 119B:
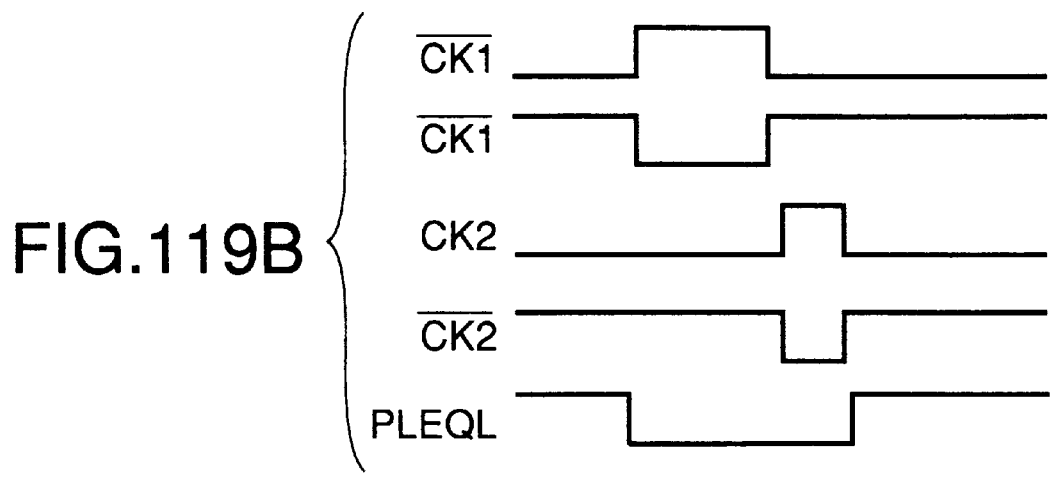

In FIGS. 118A and 118B, two plate signals are used. The PL driving circuit sets a plate signal PLB at Vss when a plate signal PLA is at Vcc, or the PLB at Vcc when the PLA is at Vss. With this operation, the PLA and PLB are short-circuited to automatically generate (½)Vcc. When a cell array A (or a sub-cell array) is activated, a cell array B can be realized by driving the dummy plate. FIGS. 119A and 119B are a detailed circuit diagram and a timing chart of this PL driving circuit, respectively. When a signal PLEQL is set at "H", the PLA and PLB are short-circuited, and (½)Vcc is automatically generated. In addition, the charge consumption can be halved.

In FIG. 118B, the plate signal is decoded by an address to further reduce the power consumption, in addition to the structure shown in FIG. 118A. In this case as well, (½)Vcc can be automatically generated. FIGS. 120A and 120B are a detailed circuit diagram and a timing chart of this PL driving circuit shown in FIG. 118B, respectively.

Figure 121A:
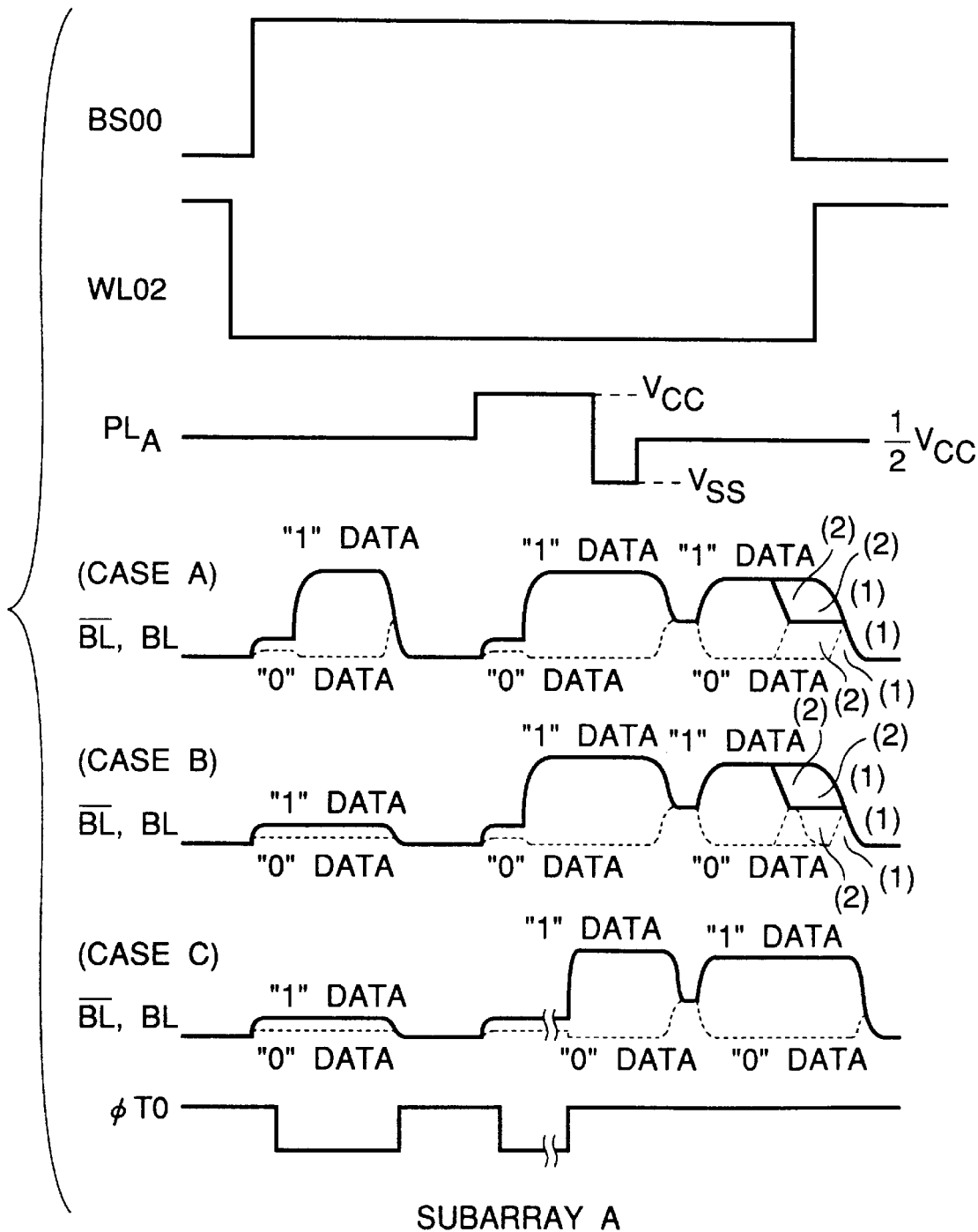
Figure 121B:
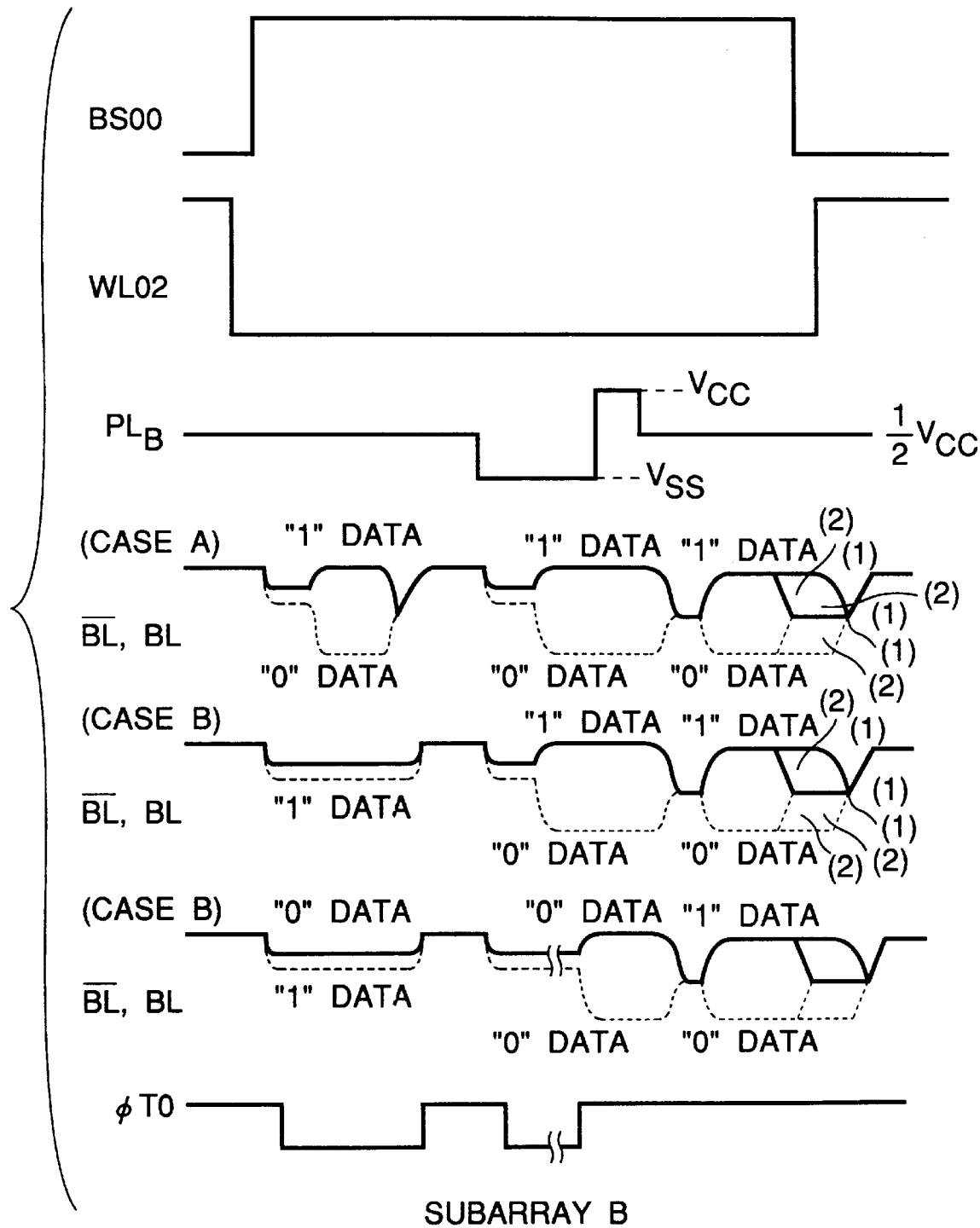
Figure 123A:
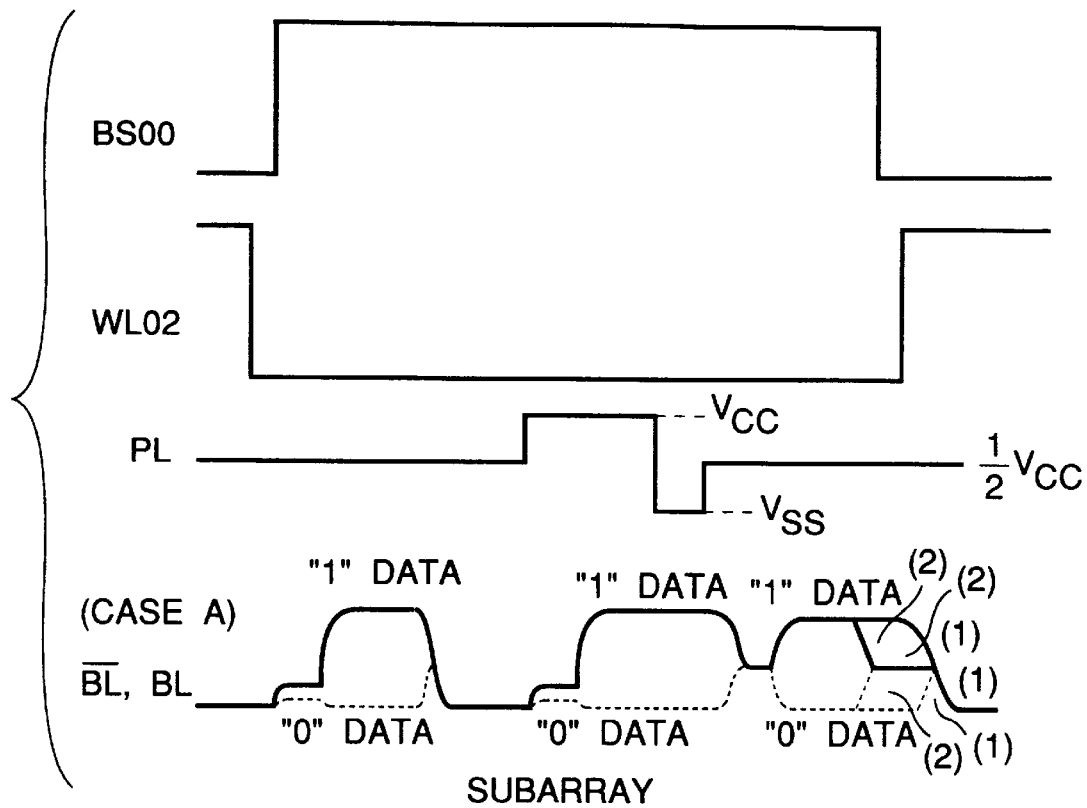
Figure 123B:
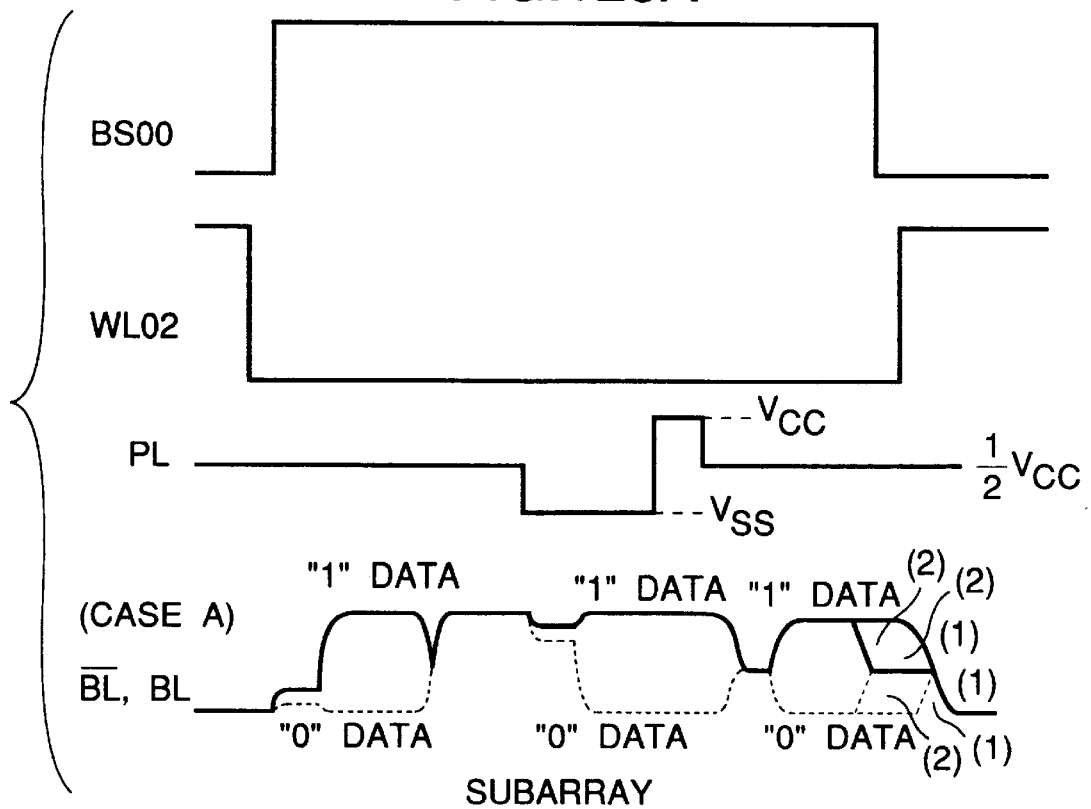

Referring to FIGS. 118A and 118B, not only the (sub) array A but also the (sub)array B is activated. Not only the PLB but also the bit line BL is precharged to Vcc to reversely operate the (sub)array B with respect to the (sub) array A, as shown in FIGS. 121A and 121B. With this operation, the plate electrode can be easily set at (½)Vcc. FIGS. 122A and 122B are timing charts of the sense amplifier at this time. A Vss precharge circuit is mounted in a sense amplifier A, and a Vcc precharge circuit is mounted in a sense amplifier B. In FIGS. 123A and 123B, the former half of 2-bit cell data is read out while precharging both cell arrays to Vss, and the latter half of the 2-bit cell data is read out while precharging the array A to Vss and the array B to Vcc.

(82nd Embodiment)

Figure 124:
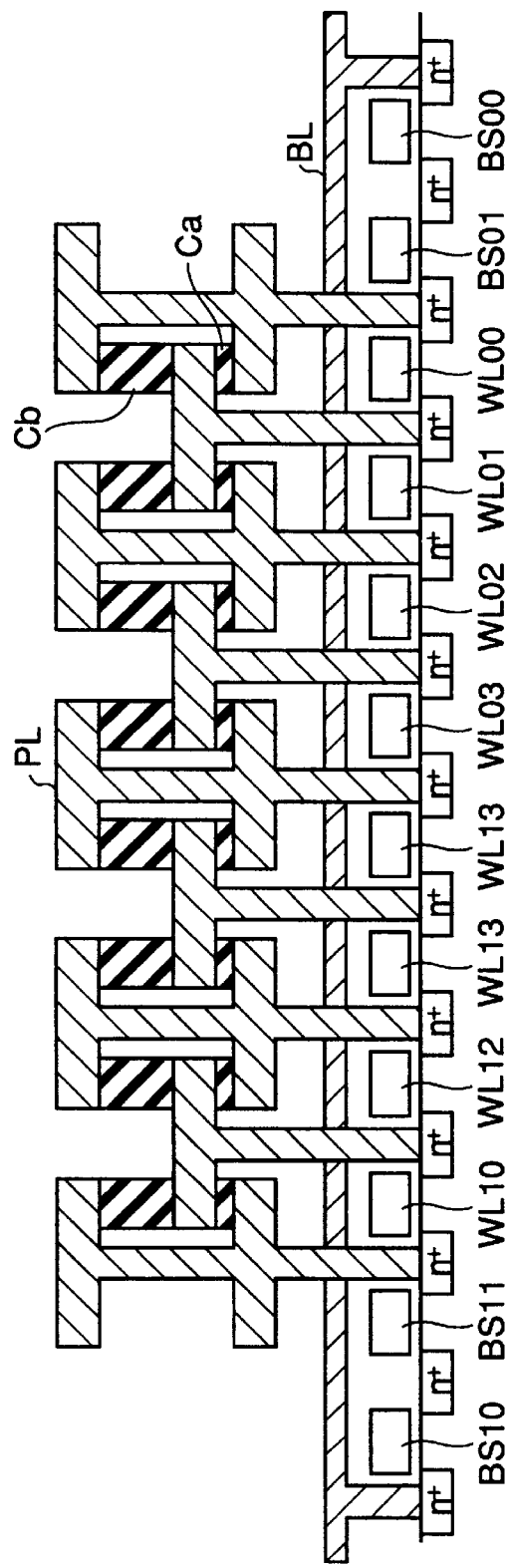

FIG. 124 is a sectional view showing a memory cell structure for realizing the equivalent circuit diagram of the memory cell shown in FIG. 101 so as to explain the 82nd embodiment of the present invention. FIG. 124 shows a modification of the structure shown in FIG. 102.

In this embodiment, ferroelectric capacitors having different thicknesses are stacked after formation of bit lines.

(83rd Embodiment)

Figure 125:
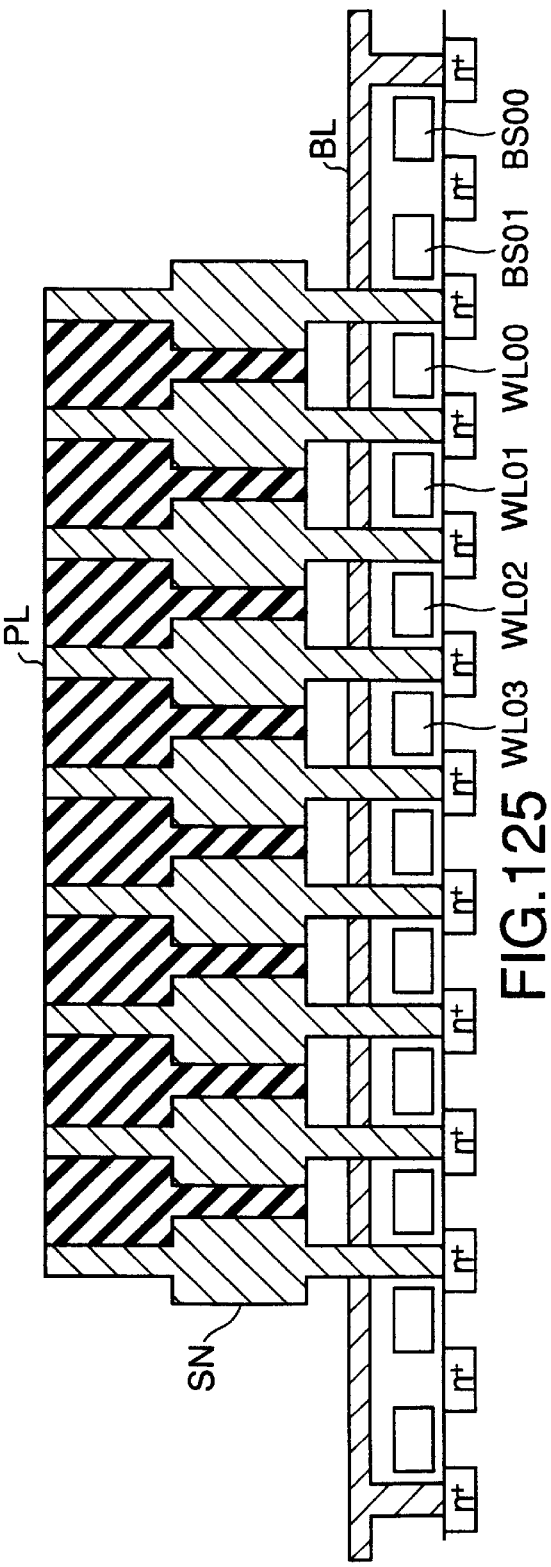

FIG. 125 is a sectional view showing a memory cell structure for realizing the equivalent circuit diagram of the memory cell shown in FIG. 101 so as to explain the 83rd embodiment of the present invention. FIG. 125 shows a modification of the structure shown in FIG. 102.

In this embodiment, ferroelectric capacitors having different thicknesses are vertically stacked on an Si surface after formation of bit lines. In this embodiment, the electrode need not be sandwiched between the ferroelectric capacitors, unlike FIG. 124, and an excess process is omitted. The electrodes of the storage nodes can be simultaneously extracted from the diffusion layer and formed. When the region between the storage nodes is divided into two regions, and the ferroelectric capacitors are formed between the storage nodes, two ferroelectric capacitors having different coercive voltages can be automatically formed.

(84th Embodiment)

Figure 126A:
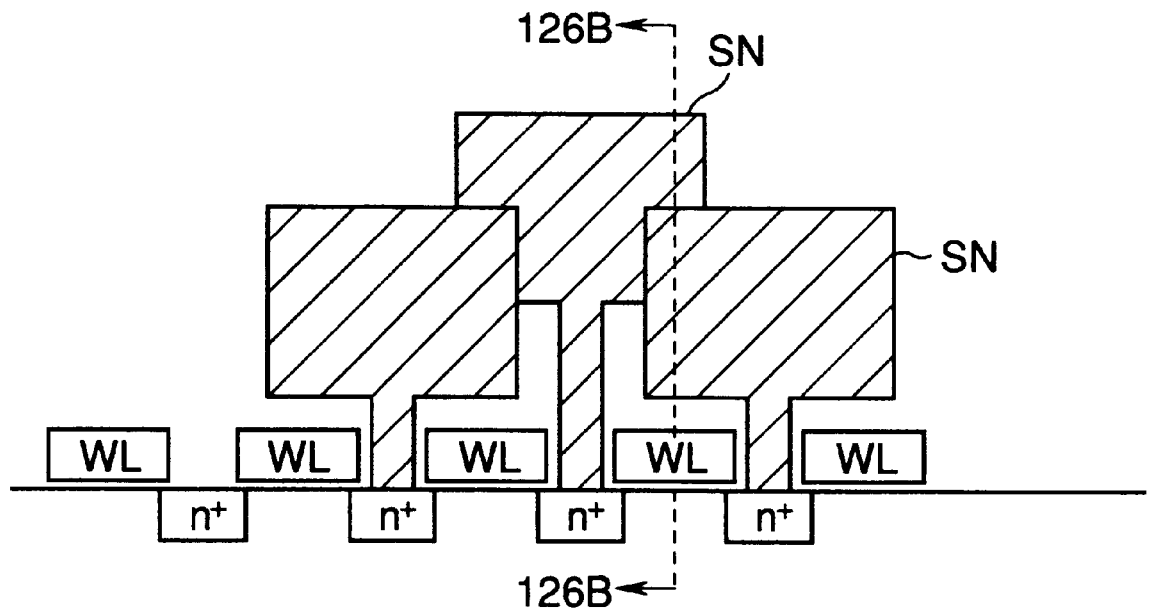
Figure 126B:
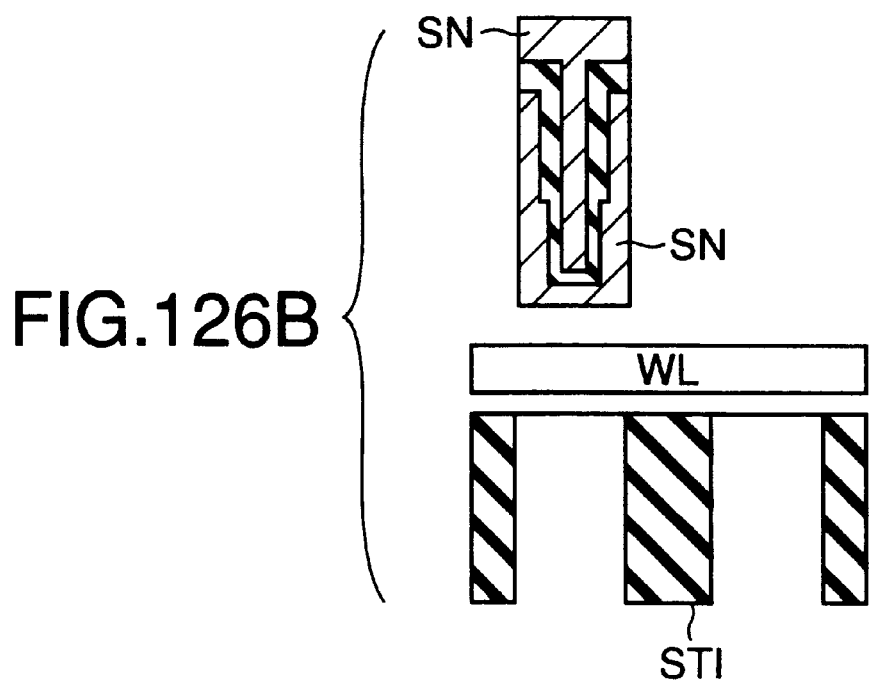

FIGS. 126A and 126B are sectional views showing a memory cell structure for realizing the equivalent circuit diagram of the memory cell shown in FIG. 101 so as to explain the 84th embodiment of the present invention. FIGS. 126A and 126B show a modification of the structure shown in FIG. 102.

Grooves or holes having two widths are formed in the lower electrode, ferroelectric capacitors are formed, and the upper electrode is formed. In this case, the ferroelectric capacitor area can be easily increased.

(85th Embodiment)

Figure 127A:
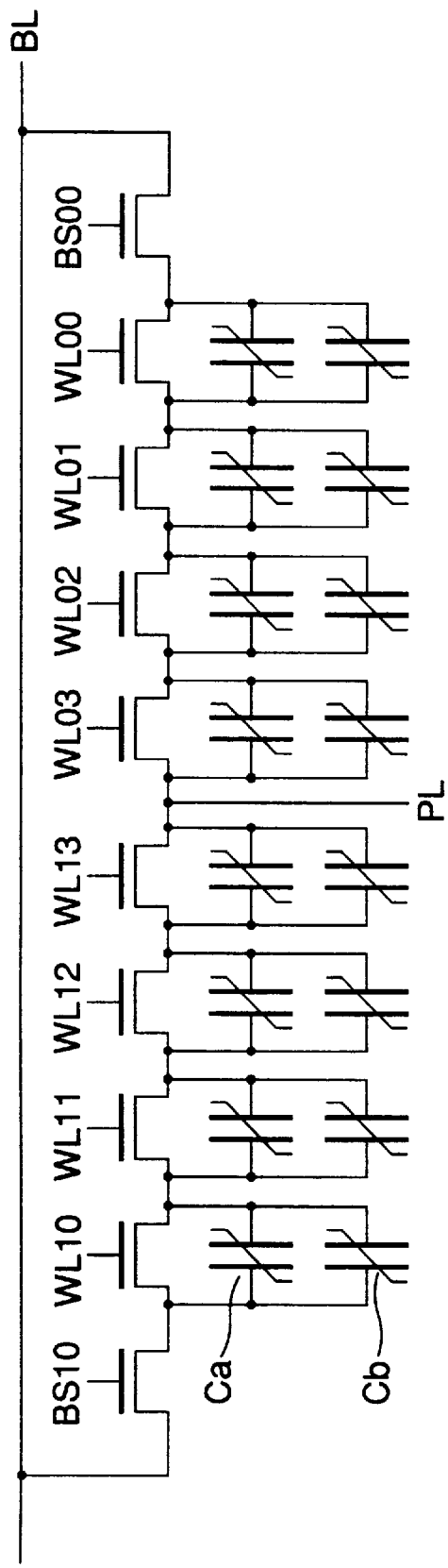
Figure 127B:
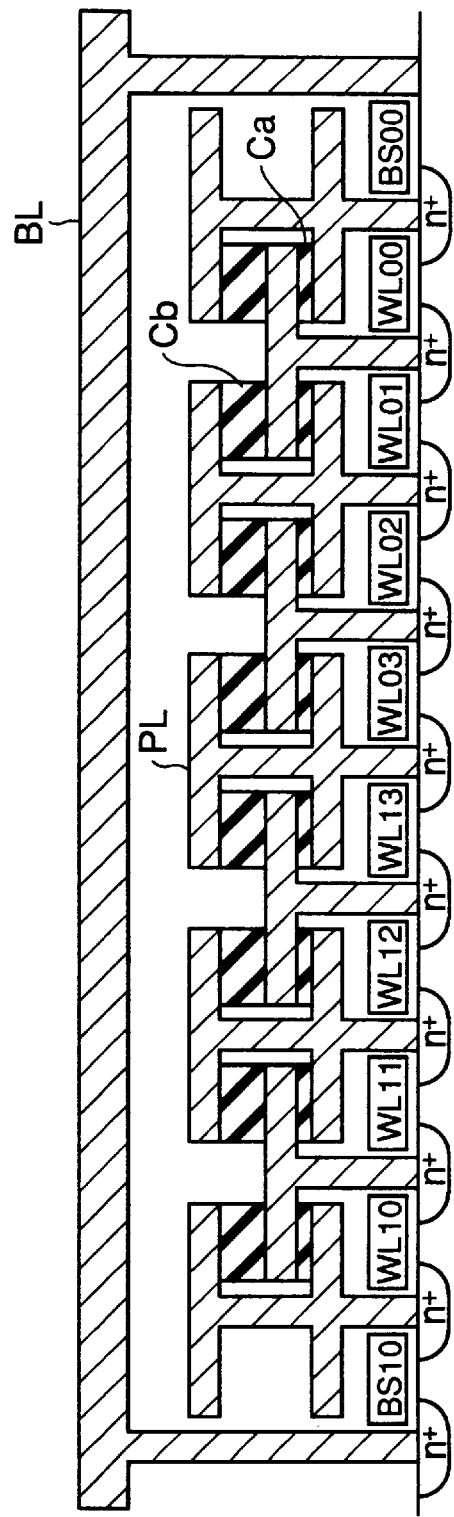

FIGS. 127A and 127B are an equivalent circuit diagram of a cell structure for an open bit line structure or 2-transistors/2-capacitors structure, although FIG. 101 shows a structure for a folded bit line structure, and a sectional view of the cell taken along a line 127B—127B, respectively.

In this case, the cell structure can be realized by connecting only one select transistor to the series connected cells.

(86th Embodiment)

Figure 128:
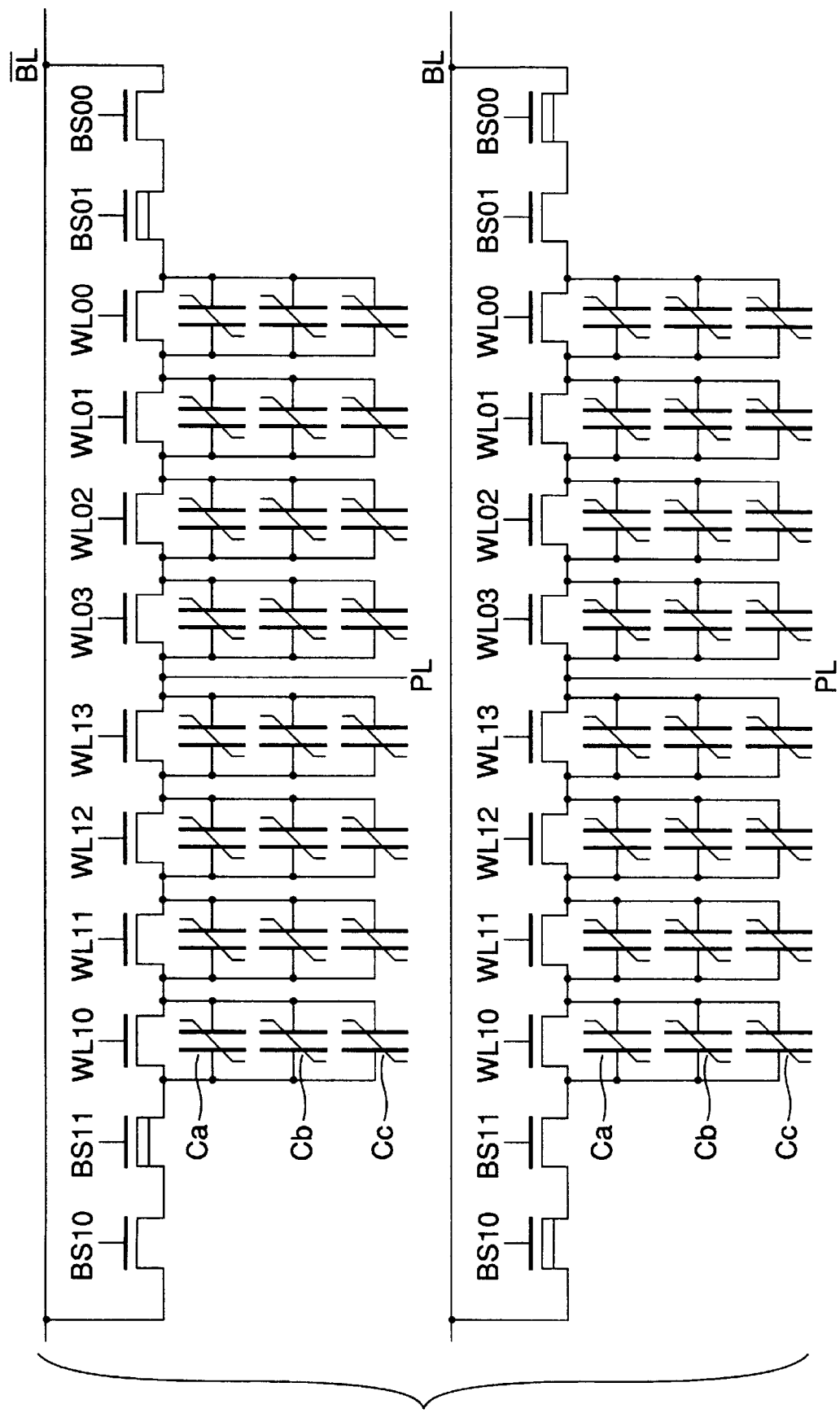

FIG. 128 is an equivalent circuit diagram for explaining the 86th embodiment of the present invention.

In FIG. 101, 2-bit cell data is held in a cell with a size of $4F^2$. In this embodiment, however, cells each having three ferroelectric capacitors having different coercive voltages and a cell transistor connected in parallel are connected in series. One terminal of the series connected cells is connected to a bit line through a select transistor, and the other terminal is connected to a plate electrode. Three-bit data can be held in one cell, so that the storage capacity can be increased.

(87th Embodiment)

Figure 129:
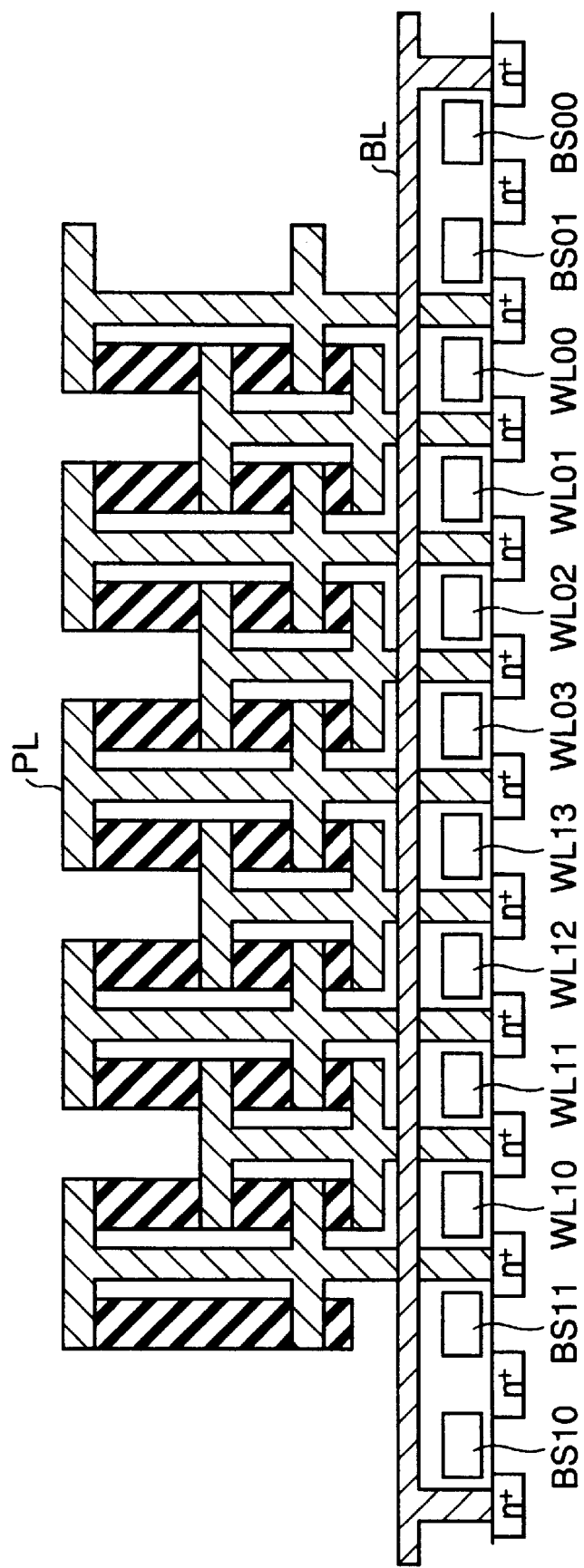

FIG. 129 is a sectional view showing a cell structure for realizing the equivalent circuit in FIG. 128 so as to explain the 87th embodiment of the present invention.

By staking a cell transistor and three ferroelectric capacitors having different coercive voltages and formed on the cell transistor in an area with a size of $4F^2$, 3-bit data can be held in a cell with a size of $4F^2$.

(88th Embodiment)

Figure 130:
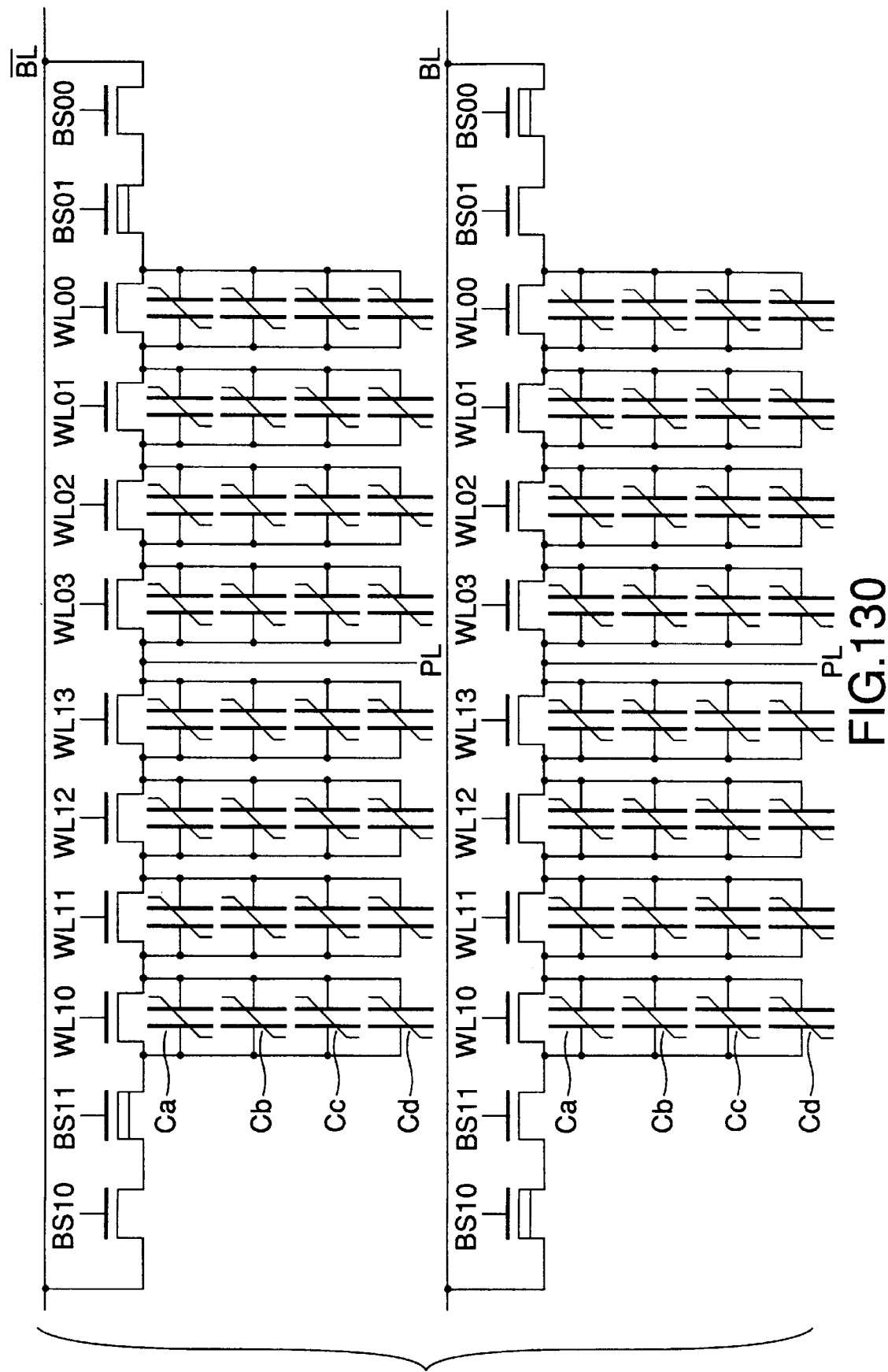

FIG. 130 is an equivalent circuit diagram for explaining the 88th embodiment of the present invention.

In FIG. 101, 2-bit cell data is held in a cell with a size of $4F^2$. In this embodiment, however, cells each having four ferroelectric capacitors having different coercive voltages and a cell transistor connected in parallel are connected in series. One terminal of the series connected cells is connected to a bit line through a select transistor, and the other terminal is connected to a plate electrode. Four-bit data can be held in one cell, so that the storage capacity can be increased. In addition, by increasing the number of parallel connected ferroelectric capacitors, the capacity can be increased.

(89th Embodiment)

Figure 131:
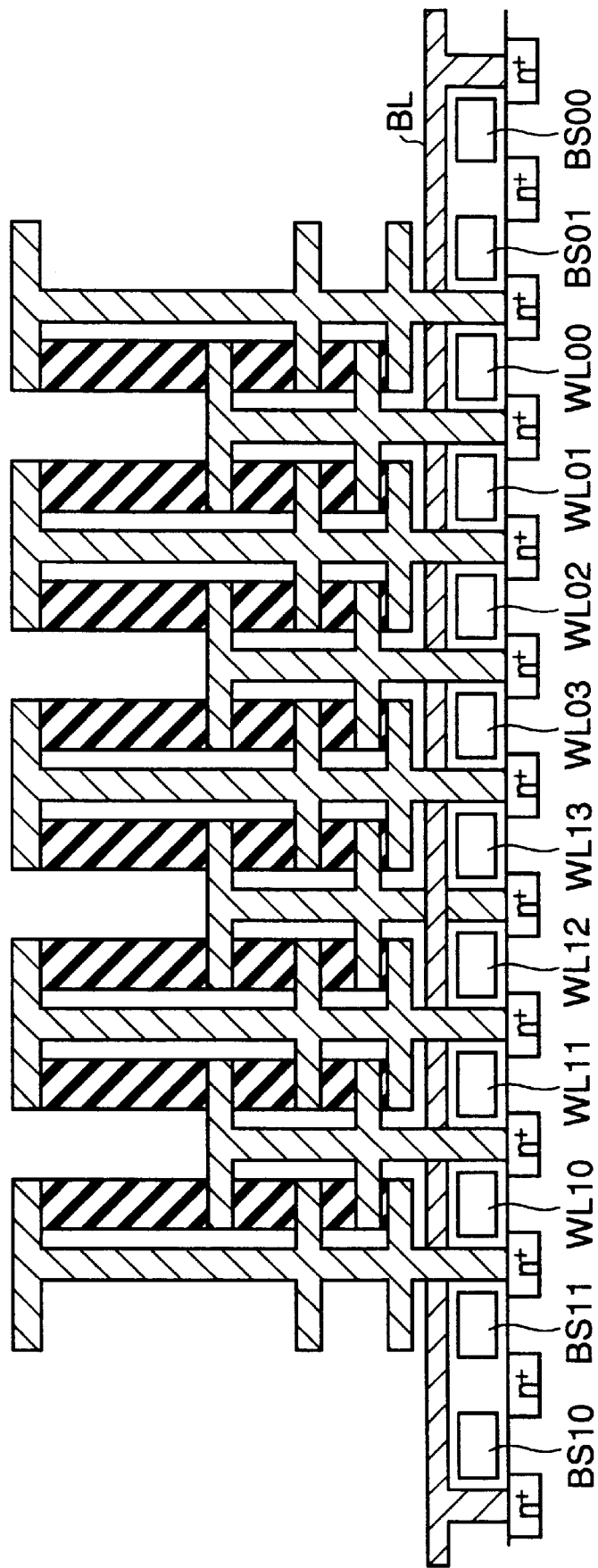

FIG. 131 is a sectional view showing a cell structure for realizing the equivalent circuit in FIG. 130 so as to explain the 89th embodiment of the present invention.

By stacking a cell transistor and four ferroelectric capacitors having different coercive voltages and formed on the cell transistor in an area with a size of $4F^2$, 4-bit data can be held in a cell with a size of $4F^2$. As a result, an integration 2×4=8-times that of the conventional FRAM having a size of $8F^2$ can be realized.

(90th Embodiment)

FIG. 132 is a circuit diagram showing a combination of the n-capacitors/1-transistor structure shown in FIG. 101 and the structure shown in FIG. 82 so as to explain the 90th embodiment of the present invention.

Information of at least two bits is stored in a cell with a size of $4F^2$. In the folded bit line structure, the noise is reduced, the bit line pitch is relaxed, and the number of sense amplifiers is decreased, thereby reducing the chip size.

(91st Embodiment)

FIGS. 133A and 133B are an equivalent circuit diagram and a graph of characteristics, respectively, for explaining the 91st embodiment of the present invention.

Unlike the n-capacitors/1-transistor cell structure shown in FIG. 101, in which ferroelectric capacitors having different coercive voltages are connected in parallel, cells having the same coercive voltage are connected. The ferroelectric capacitor close to the cell transistor is directly connected in parallel to the ferroelectric capacitor, although the ferroelectric capacitor far from the cell transistor is connected in series to a voltage drop element, and then connected in parallel to the cell transistor.

As shown in FIG. 133B, as the voltage drop element, a device which exhibits characteristics representing that a current flows in both directions when the bias value exceeds a predetermined value is used. With this structure, the cell far from the cell transistor is applied with a low voltage obtained by subtracting a predetermined voltage from the voltage applied to the cell transistor. Apparently, the cell exhibits almost the same behavior as that observed when the ferroelectric capacitor far from the cell transistor has a high coercive voltage.

(92nd Embodiment)

FIG. 134A is a sectional view showing a device structure for realizing the equivalent circuit shown in FIG. 133A so as to explain the 92nd embodiment of the present invention. With this structure, the coercive voltage of a ferroelectric transistor=the coercive voltage of a ferroelectric transistor Cb can be realized.

For the voltage drop element (Da), various structures shown in FIGS. 134B to 134E are available. In FIG. 134B, the voltage drop element is constituted by a pnp or npn junction and realized by a punch-through structure from p to p through n or n to n through p. In FIG. 134C, the voltage drop element is realized by a Zener diode using a heavily doped p-n junction. In FIG. 134D, the voltage drop element is realized by connecting a p-n junction and an n-p junction in parallel. In FIG. 134E, a fact that, when a paraelectric capacitor and a ferroelectric capacitor are connected in parallel, the apparent coercive voltage rises in accordance with the capacity ratio. Especially, in FIG. 134E, a structure can be realized by inserting a paraelectric capacitor in a part of the ferroelectric capacitor shown in FIGS. 27A and 27B unlike the structure shown in FIG. 134A.

(93rd Embodiment)

FIG. 135 is an equivalent circuit diagram for explaining the 93rd embodiment of the present invention.

Unlike the n-capacitors/1-transistor cell structure shown in FIG. 101, in which ferroelectric capacitors having different coercive voltages are connected in parallel, cells having the same coercive voltage are connected. The ferroelectric capacitor (Ca) close to the cell transistor is directly connected in parallel to the ferroelectric capacitor, although the ferroelectric capacitor (Cb) far from the cell transistor is connected in series to a resistor (Ra), and then connected in parallel to the cell transistor. With this structure, when the resistance of the resistor Ra is set to be sufficiently large, data of the ferroelectric transistor Ca can be immediately read/written in reading/writing. However, data of the ferroelectric transistor Cb is slowly read/written in accordance with the RC time constant determined by the resistor Ra and the capacity of the ferroelectric transistor Cb itself.

For the operation, after the data of the ferroelectric transistor Ca is read out and stored in the temporary memory register, the data of the ferroelectric transistor Cb is sufficiently slowly read/written, and finally, the data stored in the temporary memory register is rewritten in the ferroelectric transistor Ca. With this operation, 2-ferroelectric capacitors/1-cell transistor cell can be realized.

(94th Embodiment)

FIG. 136 is a sectional view showing a device structure for realizing the equivalent circuit shown in FIG. 135 so as to explain the 94th embodiment of the present invention.

When resistance elements are formed at positions shown in FIG. 136, the equivalent circuit shown in FIG. 135 can be realized. Assume that data is read/written in a ferroelectric transistor Ca in a time shorter than 50 ns. When the capacity of the ferroelectric transistor Ca is 100 fF, R=C/t=100 fF/50 ns=2 M Ω because t=RC. Accordingly, a resistance element having a large resistance value with a sufficient margin to 20 M Ω may be used as a resistance element Ra.

(95th Embodiment)

FIG. 137 is an equivalent circuit diagram for explaining the 95th embodiment of the present invention. In this embodiment, a sense amplifier and a temporary memory register for temporarily storing data read out from a ferroelectric transistor Ca are added to the structure of the embodiment shown in FIG. 135. In this embodiment, a folded bit line structure is formed.

(96th Embodiment)

FIG. 138 is a timing chart showing an operation of the structure shown in FIG. 137 so as to explain the 96th embodiment of the present invention. In this case, the plate (PL) voltage is fixed.

In case A, the plate electrode is set at (½)Vcc. The bit lines are precharged to Vss. When a word line WL02 is set at "L", and a block selection line BS00 is set at "H", data of a ferroelectric capacitor C300 is read out to a bit line $\overline{BL}$. At this time, data of a ferroelectric capacitor C301 is not immediately read out because of a resistance element R30. Thereafter, the sense amplifier is activated to store the data of the ferroelectric capacitor C300 in the temporary memory register. The potentials of bit lines $\overline{BL}$ and BL are lowered to Vss to eliminate the difference in polarization amount between data "1" and data "0" of the ferroelectric capacitor C300. The word line WL02 is set at "H", and the block selection line BS00 is set at "L" to make the potential between the ferroelectric capacitors 0V. The bit lines $\overline{BL}$ and BL are precharged to Vss. The word line WL02 is set at "L", an the block selection line BS00 is set at "H" again to read out the data of the ferroelectric capacitor C301. At this time, a sufficient time is set until activation of the sense amplifier. The data is amplified by the sense amplifier and rewritten. This rewrite time is also set to be sufficiently long.

Next, the bit lines $\overline{BL}$ and BL are equalized. The data stored in the temporary memory register is rewritten in the ferroelectric capacitor C301. Next, the bit lines $\overline{BL}$ and BL are equalized. A block selection line BS02 is set at "L", and the word line WL02 is set at "H" to precharge the bit lines $\overline{BL}$ and BL to Vss. One cycle is ended. After the bit lines are equalized, the word line WL01 is set at "L", and the block selection line BS02 is set at "H" to connect the bit line and the cell. The data stored in temporary memory register is rewritten in the ferroelectric capacitor C300. The block selection line BS00 is set at "L", and the word line WL02 is set at "H" to precharge the bit lines $\overline{BL}$ and BL to VBLL. Accordingly, one cycle is ended.

In case B, after the data of the ferroelectric capacitor C301 is read out, a signal φ t0 is set at "L" and amplified by the sense amplifier. For this reason, no excess rewrite in the bit lines $\overline{BL}$ and BL occurs. When the potentials of the bit lines $\overline{BL}$ and BL are lowered to VBLL, the signal φ t0 is set at "H".

In case C, after the data of the ferroelectric capacitor C301 is read out, the signal ft0 is set at "L" in case B. In this case, two temporary memory registers are prepared for the ferroelectric capacitors C300 and C301, respectively. This is suitable for a case wherein, after the data of the ferroelectric capacitors C300 and C301 are stored in the temporary memory registers, the data of the ferroelectric capacitors C300 and C301 are read out externally through the temporary memory registers, and the data are externally written in the temporary memory registers. This method is suitable for High-Bnad FRAM which transmits a large quantity of data to an external device.

(97th Embodiment)

FIGS. 139A and 139B are an equivalent circuit diagram and a sectional view, respectively, for explaining the 97th embodiment of the present invention.

The equivalent circuit in FIG. 135 and the device structure in FIG. 136 have a folded bit line structure. FIGS. 139A and 139B show an open bit line structure.

(98th Embodiment)

FIGS. 140A and 140B are an equivalent circuit diagram and a sectional view, respectively, for explaining the 98th embodiment of the present invention.

The electrodes of nodes are formed on opposite sides of those in FIGS. 139A and 139B. Resistance elements are formed on ferroelectric capacitors. In addition, the order of series connection of the resistance elements and the ferroelectric capacitors is reversed to that in FIGS. 139A and 139B. This structure can also be realized by the folded bit line structure shown in FIGS. 135 and 136.

(99th Embodiment)

FIGS. 141A and 141B are an equivalent circuit diagram and a sectional view, respectively, for explaining the 99th embodiment of the present invention.

Resistance elements are connected to both sides of a ferroelectric transistor Cb, unlike FIGS. 140A and 140B. This structure can also be realized by the folded bit line structure shown in FIGS. 135 and 136.

(100th Embodiment)

FIG. 142 is an equivalent circuit diagram for explaining the 100th embodiment of the present invention.

Three ferroelectric capacitors (Ca, Cb, Cc) are arranged for one memory cell transistor. A resistance element Rb and the ferroelectric capacitor Cc are connected in series. A resistance element Ra and the ferroelectric transistor Cb are connected in series. Reading is performed in the order of the ferroelectric capacitors Ca, Cb, and Cc. Rewriting is performed in the order of the ferroelectric capacitors Cc, Cb, and Ca.

(101st Embodiment)

FIG. 143 is a sectional view showing a cell structure for realizing the equivalent circuit of the cell structure shown in FIG. 142 so as to explain the 101st embodiment of the present invention.

A bulk cell transistor, and three layers of ferroelectric capacitors and two resistance elements which are formed on the cell transistor are stacked in a region with a size of $4F^2$, thereby holding 3-bit data. This is a folded bit line structure. An open bit line structure can also be easily realized. In addition, a bit line rule relaxation type structure in which the bit line rule is relaxed to twice can also be realized.

(102nd Embodiment)

FIG. 144 is an equivalent circuit diagram for explaining the 102nd embodiment of the present invention.

Some of the resistance element insertion positions are different from those of the equivalent circuit of the cell structure shown in FIG. 142. Although not illustrated, when a plurality of capacitors are connected in parallel in the structures shown in FIGS. 135 to 144, the structures shown in FIGS. 101 to 132 are combined, so that the storage capacity can be further increased.

In all the above-described embodiments, the word line capacity increases relative to that of the conventional structure having a size of $8F^2$. This means that the RC delay of the block selection line increases because, in the present invention, cell transistors exist at all intersections of the word lines and the bit lines. In the present invention, however, the refresh operation is omitted, unlike the DRAM. Accordingly, a stack word line structure as shown in FIGS.

32A and 32B can be used to divide a cell array along the word line to make the active region as small as possible. That is, the subword line can be made short. With this structure, the word line delay can be made small.

When the stack word line structure is employed for the conventional cell having a size of $8F^2$, this stack word line structure adversely affects the word line delay. In the conventional stack word line structure, a metal interconnection is used for the main word line. The main word line is connected to a subrow decoder. A subword line is formed from the subrow decoder to a sub-cell array using a gate interconnection, thereby constituting the gate electrode of each memory cell transistor. One main word line is connected to four or eight subrow decoders. With this structure, the metal pitch of the main word lines can be relaxed to four to eight times that of a conventional shunt structure. Therefore, the metal rule which is difficult in process can be relaxed, and DOF of metal process by cell steps can be relaxed.

In this case as well, a high-resistance interconnection of polysilicon, WSi, MSi, TiSi, or the like is used for the subword line. For this reason, when the number of cells connected to the subword line increases, the RC delay becomes large. Particularly, in the above-described embodiments of the present invention, this RC delay becomes about twice.

In the following embodiments, this problem is solved.

(103rd Embodiment)

FIG. 145 is a block diagram showing the basic structure of an FRAM according to the 103rd embodiment of the present invention. This structure can be applied to all the above-described embodiments.

In this embodiment, the RC delay can be reduced to ¼. Consequently, the word line delay of the present invention can be reduced to ½ (=¼×2) that of the conventional cell structure with a size of $8F^2$. In this embodiment, this structure is applied to an FRAM.

M×R/D denotes a main row decoder; S×R/D, a subrow decoder; and MWL, a main word line, i.e., a metal interconnection. This structure is different from the conventional stack word line structure in the following point. In the conventional subword line, the gate interconnection is directly extracted. In this embodiment, however, the subword line of the metal interconnection is formed to the central point of the sub-cell array and shunted with the gate interconnection at that portion. The metal interconnection for the subword line does not cross even when it is extracted from both sides of the subarray. Since the metal resistor has a much smaller resistance than that of a gate interconnection resistor, the RC delay of the subword line in the sub-cell array can be reduced to ¼ because R is ½, and C is ½ that of the conventional structure.

When this structure is applied to the ferroelectric capacitor of the present invention, the RC delay can be ½ because R is ½, and C does not substantially change. In the example shown in FIG. 145, since four subword lines are arranged for a main word line, the main word line and two metal interconnections for subword lines, i.e., a total of three word lines are formed for four subword lines. Accordingly, the metal interconnection rule can be relaxed to 4/3 as that of the shunt structure, as shown in the sectional view of the lower right portion of FIG. 145.

(104th Embodiment)

FIG. 146 is a block diagram showing the basic structure of an FRAM according to the 104th embodiment of the present invention. This structure can be applied to all the above-described embodiments.

In this embodiment, the metal pitch is further relaxed while keeping the small RC delay, unlike FIG. 145. Since eight subword lines are formed for one main row word line, one interconnection for the subrow main word line and four interconnections for the subword lines, i.e., a total of five interconnections are formed. As is shown in the sectional view of the right lower portion of FIG. 146, the metal interconnections rule can be relaxed to 8/5 that of the shunt structure.

(105th Embodiment)

FIGS. 147A and 147B are block diagrams showing the basic structure of an FRAM according to the 105th embodiment of the present invention. This structure can be applied to all the above-described embodiments.

In the structure shown in FIG. 145, the metal pitch is relaxed while keeping the small RC delay. However, the gate interconnection is formed to the very limit of the pitch (2F) in the subword line shunt region, so the shunt contact from the metal interconnection must be obtained on this gate interconnection. Basically, the contact size is F, and the underlayer margin of the gate interconnection with respect to the contact is zero.

The structure shown in FIGS. 147A and 147B solves this problem. As shown in FIG. 147A, the connection form of the subword line changes every other line. One subword line is shunted near the metal interconnection and the driving circuit for the subrow decoder, switched to the bit line at the central portion of the subarray, and shunted to the gate interconnection far from the subrow decoder. With this structure, the gate interconnection can be separated at the central portion of the subarray. For the other subword line, the metal interconnection for the subword line is extended to the center of the subarray and shunted to the gate interconnection at a portion where the gate interconnection has a margin. In FIG. 147B, the positions of the two connection structures are replaced with each other.

(106th Embodiment)

FIGS. 148A and 148B are plan views showing two examples of the layout at the central portion of the sub-cell array having the structure shown in FIG. 147A or 147B so as to explain the 106th embodiment of the present invention.

FIG. 148A corresponds to FIG. 147A, and FIG. 148B corresponds to FIG. 147B. FIGS. 148A and 148B show metal interconnections, gates, bit lines, contacts between the metal and bit lines, and contacts between the bit lines and the gates.

In this embodiment, the margin between the gate interconnection and the contact and the contact size are large. In addition, the remaining interconnections, the contact size, and the margin of the contact size are large.

FIGS. 149A and 149B show only the gates and the contacts between the bit lines and the gates in FIGS. 148A and 148B. FIGS. 150A and 150B show only the gates, the bit lines, and the contacts between the bit lines and the gates in FIGS. 148A and 148B. FIGS. 151A and 151B show only the metal, the bit lines, and the contacts between the metal interconnections and the bit lines in FIGS. 148A and 148B.

(107th Embodiment)

FIG. 152 is a circuit diagram showing a CMOS circuit as a subrow decoder so as to explain the 107th embodiment of the present invention. This embodiment can also be applied to all the above-described embodiments.

When a block selection line BS00 is to set at "H", an signal MBS may be set at "L", and a bit line $\overline{BL}$ may be set at "L". When a word line WL01 is to be set at "L", a main word line MWL0 may be set at "H", a signal $\overline{WSL00}$ may be set at "L", and a signal WSL00 may be set at "H".

(108th Embodiment)

FIG. 153 is a block diagram showing an example of the cell array arrangement and a spare cell array arrangement so as to explain the 108th embodiment of the present invention. This embodiment can also be applied to all the above-described embodiments.

One of disadvantages of the present invention is that, the structure of one cell block is larger than that of the conventional perfect 1-transistor/1-capacitor structure. When a spare cell block array is arranged for every cell array, the area is largely adversely affected. The structure shown in FIG. 153 solves this problem. In FIG. 153, spare cell arrays including spare blocks are arranged only at terminals of the cell array of one chip in the row and columns directions. The spare cell is replaced in large units. With this structure, the unit of the spare cell array can be freely set, thus increasing the remedy efficiency.

(109th Embodiment)

FIG. 154 is a block diagram including a redundancy spare circuit in a chip so as to explain the 109th embodiment of the present invention.

A row spare memory and a column spare memory are arranged for defective rows and columns, respectively. A row address and column address are stored in the row spare memory and the column spare memory, respectively, and compared to the spare memories. For an address without any redundancy, an enable signal is issued from the spare memory to the normal row decoder or column decoder.

For an address with a redundancy, a disable signal is issued from the spare memory to the normal row decoder or column decoder, so the normal row decoder or column decoder does not operate. The enable signal and mapped spare rows and spare columns are selected in the spare row decoder and spare column decoder. The spare memory may be a conventional memory using a fuse, or a memory using a ferroelectric capacitor.

(110th Embodiment)

FIG. 155 is a circuit diagram showing a method of repairing a defect memory cell in the 110th embodiment of the present invention.

When the circuit shown in FIG. 154 is used, a cell block shown in FIG. 155 can be directly replaced. In this case, an upper address larger than that of the cell block can be used to designate mapping of the spare block. Although the remedy efficiency lowers, the spare memory capacity can be small. This replacement can cope with a plurality of defective cells, or a DC defect such as a short-circuit between a word line and a cell node.

(111th Embodiment)

FIG. 156 is a circuit diagram showing a method of repairing a defect memory cell in the 111th embodiment of the present invention.

This method can be realized by the block structure shown in FIG. 154. For a defect such as destruction of a ferroelectric capacitor connected to a word line WL03 of a normal cell, the cell transistor may be short-circuited while always keeping the word line WL03 at "H". When a spare word line SWL03 is selected to select the word line WL03, replacement can be performed without influencing reading/writing of remaining cell data in the same cell block. In this case, only the address of the selected block which is to be replaced need be stored in the spare memory corresponding to the spare word line SWL03.

(112th Embodiment)

FIG. 157 is a circuit diagram showing a method of repairing a defect memory cell in the 112th embodiment of the present invention.

This method can be realized by the block structure shown in FIG. 154. A plurality of word lines are set into a group. For a defect such as destruction of ferroelectric capacitors across word lines WL03 and WL02, or only for the word line WL02 or WL03 of a normal cell, the word line group is directly replaced with a corresponding spare word line group (SWL03 and SWL02). In this case, only the address of the selected block which is to be replaced need be stored in the spare memory corresponding to the spare word line group. Because the spare word lines are handled as a group, the number of spare memories can be reduced, as compared to the structure shown in FIG. 156.

(113th Embodiment)

FIG. 158 is a circuit diagram showing a method of repairing a defect memory cell in the 113th embodiment of the present invention.

This method can be realized by the block structure shown in FIG. 154. A plurality of word lines are set into a group. For a defect such as destruction of ferroelectric capacitors across word lines WL04 and WL05, or only for the word line WL04 or WL05 of a normal cell, the word line group is replaced with an arbitrary spare word line group (e.g., spare word lines SWL03 and SWL02). In this case, only the address of the selected block which is to be replaced and the address representing the group in the cell block need be stored in the spare memory corresponding to the spare word line group. The number of spare memories increases, as compared to FIGS. 156 and 157. However, the remedy efficiency largely increases because, when a number of cells at the same position in different cell blocks become defective, the cells can be remedied.

The spare cell array shown in FIGS. 155 to 158 may be arranged in the same cell array as that of normal cells, or arranged in another cell array to increase the remedy efficiency.

(114th Embodiment)

FIG. 159 is a sectional view showing a cell structure so as to explain the 114th embodiment of the present invention.

In the above-described structures, when the cell size is $4F^2$, the capacitor size is also $4F^2$. In conversion of this size into a planar area, the ferroelectric capacitor area inevitably decreases. In the cell structure shown in FIG. 159, the ferroelectric capacitor area can be increased to $3F^2$, i.e., equal to or larger than that of the conventional cell with a size of $8F^2$. The ferroelectric capacitor area can also be increased in the structures shown in FIGS. 60 and 61. In these structure, however, three layers of ferroelectric capacitors are stacked. The structure of this embodiment, in which two layers of ferroelectric capacitors are stacked, can be more easily manufactured. Even in the multilayered structures shown in FIGS. 54C and 54D, the capacity can be increased. However, the ferroelectric capacitor must be divided into small pieces.

In the structure shown in FIG. 159, one ferroelectric capacitor can be formed without being separated and can be easily manufactured. In a modification shown in FIG. 160, bit lines are formed before formation of ferroelectric capacitors.

FIG. 161 is an equivalent circuit diagram of FIGS. 159 and 160. This structure is different from the above-described structures. Two block select transistors are connected in series because of the folded bit line structure. For the operation, the random access properties partially degrade. For example, when word lines WL3 and WL4 are to be selected, the word line WL4 is selected to read out cell data and stored in a temporary memory register. At this time, the cell of the word line WL5 is short-circuited, so the cell data is not destroyed. Next, the word line WL5 is selected to read/write cell information of the word line WL5. Finally, the word line WL4 is selected to write the information in the temporary memory register in the cell of the word line WL4.

Similarly, when word lines WL0 and WL1, WL2 and WL3, WL6 and WL7 are selected, data is read out from the word line WL0, WL3, or WL7. With this operation, arbitrary cell data can be read/written. FIG. 162 shows the operation in units of 2 bits. The plate electrode may be fixed at (½)Vcc or changed within the range of Vss to Vcc.

(115th Embodiment)

FIGS. 163A to 163D are plan views showing the cell structures of an FRAM according to the 115th embodiment of the present invention. FIGS. 163A to 163D show the layouts of four cells having different cell structures, although the equivalent circuit does not change, i.e., cells each constituted by connecting a ferroelectric capacitor and a cell transistor in parallel are connected in series.

Each of these structures has a size larger than $4F^2$, and can be applied to inexpensive low-integration FRAMs including a 1-Mbit FRAM and a 16-Mbit FRAM. Although the cell size is large, the characteristic features of the present invention, i.e., a high-speed operation in the scheme of fixing the plate electrode at (½)Vcc and the omission of the refresh operation can be held.

FIGS. 163A to 163D show word line layers, bit line layers, diffusion layers, contacts between the diffusion layers and the bit line layers, contacts between the bit line layers and metal layers, contacts between the bit line layers and lower electrodes, contacts between the metal layers and upper electrodes, contacts between the metal layers and the lower electrodes, and upper bit line layers.

Of FIGS. 163A to 163D, FIGS. 164A to 164D show only the word line layers, the bit line layers, the diffusion layers, and the contacts between the diffusion layers and bit line layers. FIGS. 165A to 165D show only the contacts between the bit line layers and the metal layers, the contacts between the bit line layers and the lower electrodes, the contacts between the metal layers and the upper electrodes, the contacts between the metal layers and the lower electrodes, and the upper bit line layers.

Figure 163C:
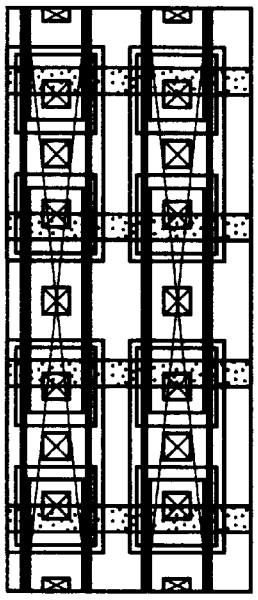
Figure 163D:
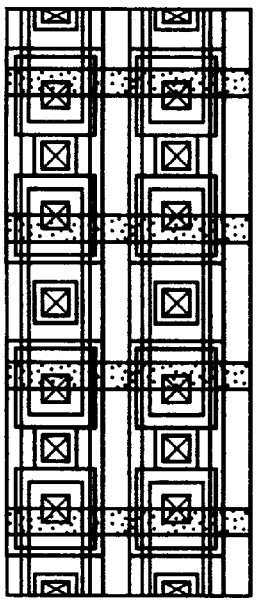
Figure 163B:
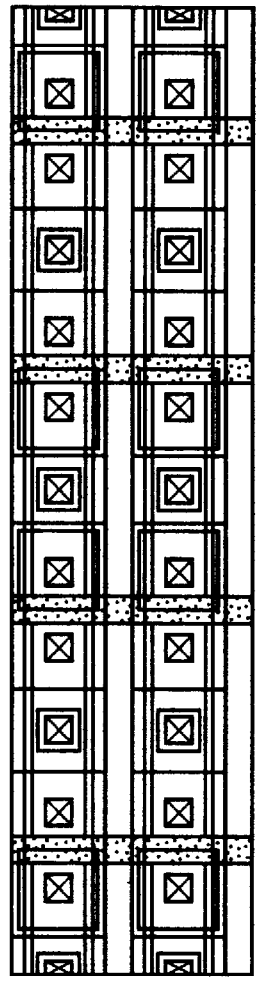
Figure 163A:
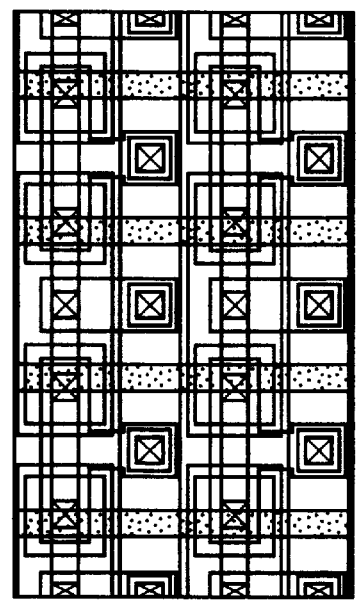

In FIG. 163A, ferroelectric capacitors and cell transistors are shifted by a ½ pitch along the word line, and the bit line layers as bit lines are formed under the ferroelectric capacitors. The node of the diffusion layer of the source or drain of the cell transistor is temporarily extracted above the bit line layer (the bit line layer is not a bit line although it is formed of the same layer as the bit lines) through the contact between the diffusion layer and the bit line layer and connected to the metal layer through the contact between the bit line layer and the metal layer. The metal layer is extended along the word line and connected to the upper and lower electrodes through the contact between the metal layer and the upper electrode and the contact between the metal layer and the lower electrode.

Figure 166A:
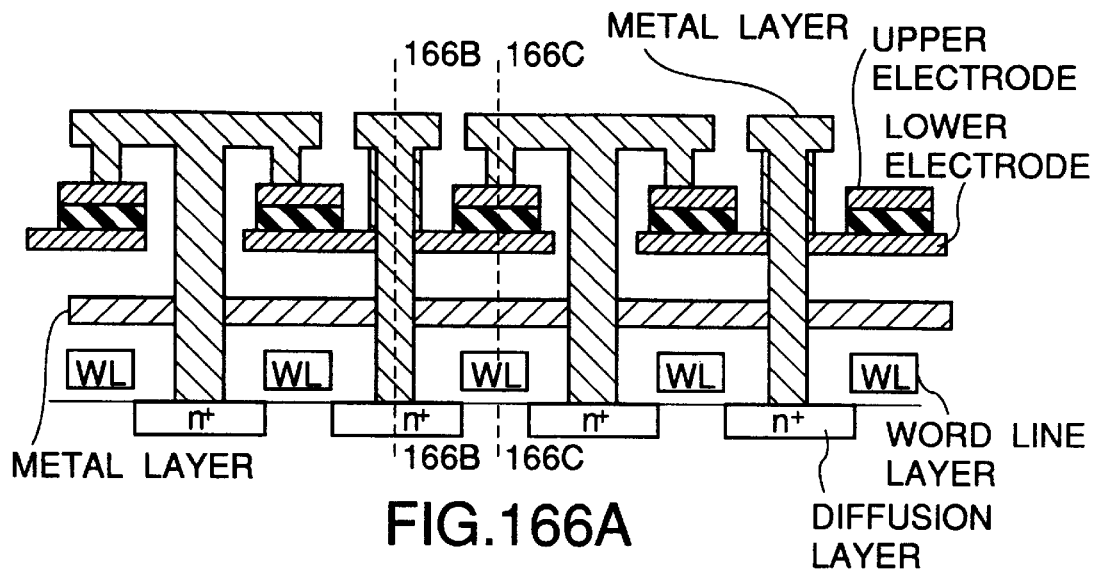
Figures 166B, 166C:
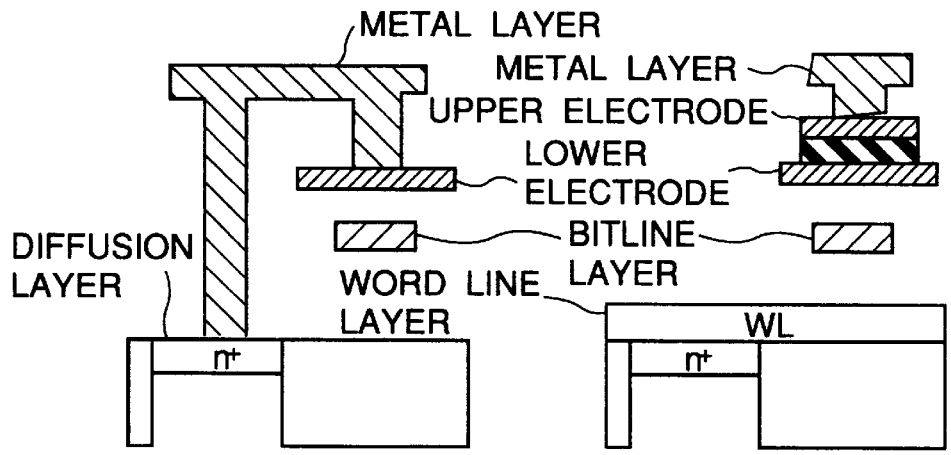
Figure 166D:
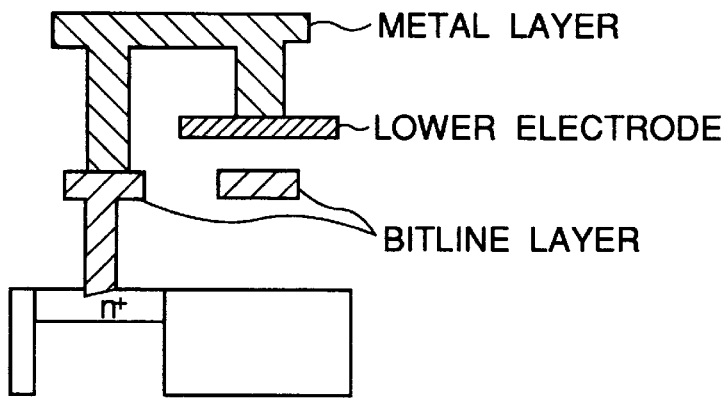

FIGS. 166A is a plan view of the cell in FIG. 163A viewed along the word line. FIG. 166B is a sectional view taken along a line 166B—166B, and FIG. 166C is a sectional view taken along a line 166C—166C. FIG. 166B shows connection from the node of the diffusion layer to the lower electrode. FIG. 166C shows connection from the node of the diffusion layer to the upper electrode. As shown in FIG. 166D, the diffusion layer may be directly connected to the metal layer via the bit line layer, unlike FIG. 166B.

The cell structure in FIG. 163A is characterized in that the lower electrode need not be directly formed on an Si plug, a Ti layer, or a TiN layer from the diffusion layer, and the electrode node is connected from the upper side through a metal layer or the like after formation of the lower electrode. With this structure, problems of planarization of the Si plug, formation of silicide due to reaction of the lower electrode of Pt and Si in annealing, and formation of an oxide film between the Si plug and the Ti or TiN film due to oxidation of Ti in formation of ferroelectric capacitors can be avoided. In addition, since the bit lines are covered with cells, coupling noise between the bit lines due to the capacity between the bit lines can be reduced.

In the cell shown in FIG. 163B, the cell transistor is arranged under the ferroelectric capacitor. Bit lines are formed between the ferroelectric capacitor and the cell transistor while being shifted by a ½ pitch along the word line. FIG. 167 is a sectional view of the structure shown in FIG. 163B. The node of the source or drain of the cell transistor is connected to the metal layer directly or through the bit line layer. The metal layer is extended along the bit line and brought into contact with the upper or lower electrode of the ferroelectric capacitor from the upper side.

The cell shown in FIG. 163C has almost the same structure as that shown in FIG. 7, in which the ferroelectric capacitor and the cell transistor are formed on the upper and lower sides, and the bit line is formed under the ferroelectric capacitor while being shifted by a ½ pitch. The structure in FIG. 163C is different from that shown in FIG. 7 in that the diffusion layer is connected to the electrode through the same interconnection (bit line layer) as that of the bit line, and the ferroelectric capacitor size is set to be relatively large. By interposing the bit line layer, the depth of the contact is reduced.

The cell shown in FIG. 163D has almost the same structure as that shown in FIGS. 6A and 6B, in which the ferroelectric capacitor and the cell transistor are formed on the upper and lower sides, and the bit line (upper bit line layer) is formed on the ferroelectric capacitor. The structure in FIG. 163D is different from that shown in FIGS. 6A and 6B in that the diffusion layer is connected to the electrode through the bit line layer, and the ferroelectric capacitor size is set to be relatively large. By interposing the bit line layer, the depth of the contact is reduced. When the ferroelectric capacitor is increased, the bit line capacity increases. However, since, in the present invention, the bit line capacity is large, the increase in bit line capacity poses no serious problem.

(116th Embodiment)

FIG. 168A is a plan view showing the cell structure of an FRAM according to the 116th embodiment of the present invention.

FIG. 168A shows word line layers, bit line layers, diffusion layers, contacts between the diffusion layers and the bit line layers, contacts between the bit line layers and metal layers, contacts between the bit line layers and lower electrodes, contacts between the metal layers and upper electrodes, contacts between the metal layers and the lower electrodes, and upper bit line layers, as in FIGS. 163A to 163D. FIG. 168B shows, of this structure, only the word line layers, the bit line layers, the diffusion layers, and the contacts between the diffusion layers and the bit line layers. FIG. 168C shows only the contacts between the bit line layers and the metal layers, the contacts between the bit line layers and the lower electrodes, the contacts between the metal layers and the upper electrodes, the contacts between the metal layers and the lower electrodes, and the upper bit line layers. An advantage of the cell shown in FIGS. 163A to 168C is to be able to operate in a high speed in the PL driving scheme. The reason is why a delay of the RC is suppressed because a contact to the electrode of the PL portion can be formed from upper portion by using the metal. In the conventional cell, when the upper electrode is connected to the storage node by using the metal, since the lower electrode of the PL side can not be connected to the metal in the array, the RC is large.

(117th Embodiment)

FIGS. 168A and 168B are an equivalent circuit diagram and a sectional view, respectively, showing the memory structure according to the 117th embodiment of the present invention.

This embodiment is an improvement of FIG. 54A, in which the surface of the lower electrode is formed into a tapered shape, and an upper electrode having a V-shaped section is formed between adjacent lower electrodes. More specifically, in all cell nodes, the ferroelectric capacitors are formed after formation of the lower electrodes, and adjacent cells are connected through the upper electrodes.

This structure is also equivalent to a structure in which two ferroelectric capacitors are connected in series, as shown in FIG. 169A. Although the cell capacity is halved, the upper electrode need be connected only to the ferroelectric capacitor, resulting in easy manufacturing process. Particularly, this structure can be easily manufactured by MOCVD.

The present invention is not limited to the above-described embodiments, and various changes and modifications can be made within the spirit and scope of the invention.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

I claim:

1. A computer system comprising:

a microprocessor;

an input/output device connected to said microprocessor to send/receive data to/from an external device; and a semiconductor memory device connected to said microprocessor to store data;

wherein said semiconductor memory includes a memory cell array including a plurality of series connected memory cells each having a transistor having a source terminal and a drain terminal and a ferroelectric capacitor having a first terminal connected to said source terminal and a second terminal connected to said drain terminal.

2. A computer system according to claim 1, further comprising a controller for said semiconductor memory device.

3. A memory device according to claim 1, further comprising a select transistor connected to at least one terminal of said plurality of memory cells.

4. An IC card comprising an IC chip having a semiconductor memory, wherein said semiconductor memory includes a plurality of memory cells each having a transistor having a source terminal and a drain terminal and a ferroelectric capacitor having a first terminal connected to said source terminal and a second terminal connected to said drain terminal;

a predetermined number of said memory cells are connected in series to constitute a memory cell block; and a plurality of memory cell blocks are arranged to constitute a cell array.

5. A digital image input system comprising:

an image input device for inputting image data;

a data compression device for compressing the input image data;

a semiconductor memory for storing the compressed image data;

an output device for outputting the compressed image data; and a display device for displaying one of the input image data ani the compressed image data;

wherein said semiconductor memory includes a plurality of memory cells each having a transistor having a source terminal and a drain terminal and a ferroelectric capacitor having a first terminal connected to said source terminal and a second terminal connected to said drain terminal;

a predetermined number of said memory cells are connected in series to constitute a memory cell block; and a plurality of memory cell blocks are arranged to constitute a cell array.

6. A memory system comprising:

a semiconductor memory for storing data; and an input/output device connected to said semiconductor memory to send/receive data to/from an external device;

wherein said semiconductor memory includes a plurality of memory cells each having a transistor having a source terminal and a drain terminal and a ferroelectric capacitor having a first terminal connected to said source terminal and a second terminal connected to said drain terminal;

a predetermined number of said memory cells are connected in series to constitute a memory cell block; and a plurality of memory cell blocks are arranged to constitute a cell array.

7. A memory system according to claim 6, further comprising a controller for controlling said semiconductor memory device.

8. A memory system according to claim 6, wherein said semiconductor memory stores at least one of cinematic data, music and instruction data, game software, OA software, OS software, dictionaries, and map information.

9. A system LSI chip comprising:

a core section for performing various processing operations; and a semiconductor memory for storing data;

wherein said semiconductor memory includes a plurality of memory cells each having a transistor having a source terminal and a drain terminal and ferroelectric capacitor having a first terminal connected to said source terminal and a second terminal connected to said drain terminal;

a predetermined number of said memory cells are connected in series to constitute a memory cell block; and a plurality of memory cell blocks are arranged to constitute a cell array.

10. A system LSI chip according to claim 9, wherein said core section is an MPU.

11. A system LSI chip according to claim 10, wherein said semiconductor memory device is used as a data memory.

12. A system LSI chip according to claim 9, wherein said core section is an image processing section for performing image processing.

13. A system LSI chip according to claim 9, wherein said core section is a logic section for performing various logic calculations.

14. A system LSI chip according to claim 9, wherein said system LSI chip is a logic variable LSI chip.

15. A system LSI chip according to claim 14, wherein said semiconductor memory device stores logic connection information.

16. A mobile computer system comprising:

a microprocessor;

an input device connected to said microprocessor to input data;

a radio wave sending/receiving device connected to said microprocessor to send/receive data to/from an external device;

an antenna connected to said sending/receiving device;

a display device connected to said microprocessor to display necessary information; and a semiconductor memory device connected to said microprocessor to store data;

wherein said semiconductor memory includes a plurality of memory cells each having a transistor having a source terminal and a drain terminal and a ferroelectric capacitor having a first terminal connected to said source terminal and a second terminal connected to said drain terminal;

a predetermined number of said memory cells are connected in series to constitute a memory cell block; and a plurality of memory cell blocks are arranged to constitute a cell array.

17. A semiconductor memory comprising:

a memory cell array comprising a plurality of memory cells each having a transistor having a source terminal and a drain terminal and a ferroelectric capacitor having a first terminal connected to said source terminal and a second terminal connected to said drain terminal;

wherein said plurality of memory cells are connected in series.

18. A memory device according to claim 17, wherein a dummy cell in a dummy cell block corresponding to a memory cell block has a transistor, and a ferroelectric or paraelectric capacitor connected between a source and drain terminals of said transistor, said dummy cell block is constituted by connecting a plurality of dummy cells in series and connecting at least one first and at least one second select transistors connected in series to one terminal of said series connected portion, the other terminal of said first select transistor is connected to a first bit line, and the other terminal of said second select transistor is connected to a second bit line.

19. A memory device according to claim 17, wherein said memory cell block includes at least one select transistor connected to at least one terminal of said plurality of series connected memory cells.

20. A memory device according to (claim 19, wherein two terminals of said memory block are connected to adjacent bit lines, respectively.

21. A memory device according to claim 20, wherein said the adjacent bit lines constitute a bit line pair and are connected to a sense amplifier.

22. A memory device according to claim 17, wherein said plurality of memory cells include a first memory cell, a second memory cell, a third memory cell, and a fourth memory cell, and said drain terminal of said first memory cell is connected to said source terminal of said second memory cell, said drain terminal of said second memory cell is connected to said source terminal of said third memory cell, and drain terminal of said third memory cell is connected to said source terminal of said fourth memory cell.

23. A semiconductor memory comprising:

a plurality of series connected memory cells each having a transistor having a source terminal and a drain terminal and a ferroelectric capacitor having a first terminal connected to said source terminal and a second terminal connected to said drain terminal; and one or more select transistors connected to at least one terminal of said plurality of series connected memory cells to constitute a memory cell block, said memory cell block having one terminal connected to a bit line and another terminal connected to a plate electrode.

24. A memory device according to claim 23, wherein a dummy cell in a dummy cell block corresponding to a memory cell block has a transistor, and a ferroelectric or paraelectric capacitor connected between a source and drain terminals of said transistor, said dummy cell block is constituted by connecting a plurality of dummy cells in series and connecting at least one first and at least one second select transistors in series to one terminal of said plurality of series connected dummy cells, an other terminal of said first select transistor is connected to a first bit line, and an other terminal of said second select transistor is connected to a second bit line.

25. A memory device according to claim 23, wherein an open bit line structure is formed by a bit line pair of adjacent cell arrays.

26. A memory device according to claim 23, wherein one-bit information is stored in two memory cells connected to two bit lines of the same cell array, and a folded bit line structure is formed by a bit line pair.

27. A memory device according to claim 23, wherein in the stand-by state after power-ON, all the plurality of transistors in the memory cell block are in ON state, and the select transistor is in OFF state.

28. A memory device according to claim 23, wherein in selecting an arbitrary memory cell in the memory cell block, the select transistor is turnei on while turning off the transistor of the selected ceLl, and keeping the transistors of the remaining cells ON.

29. A memory device according to claim 23, wherein a plate electrode potential is fixed at ($\frac{1}{2}$)Vcc or a constant voltage after power-ON in both the stand-by state and active state, and no cell data refresh operation is performed.

30. A memory device according to claim 23, wherein a plate electrode potential is set at 0V in the stand-by state after power-ON and changed within the range of 0V and Vcc in reading/writing data from/into selecting a cell.

31. A memory device according to claim 23, wherein said bit line is precharged to 0V before cell data is read out.

32. A memory device according to claim 23, wherein said bit line is precharged to Vcc before cell data is read out.

33. A memory device according to claim 23, wherein said dummy cell has the same circuit structure as that of the memory cell in the memory block.

34. A memory device according tc claim 23, wherein a capacitor area of said dummy cell is 1.5 to 3 times larger than that of a normal cell.

35. A memory device according to claim 23, wherein said dummy cell uses a paraelectric capacitor.

36. A memory device according to claim 23, wherein a ferroelectric capacitor of each of said memory cells is constituted by connecting a plurality of ferroelectric capacitors in parallel.

37. A memory device according to claim 36, comprising a sense amplifier having a temporary storage memory connected to said memory cell block.

38. A memory device according to claim 23, wherein a ferroelectric capacitor of each of said memory cells is constituted by connecting a plurality of ferroelectric capacitors having different thicknesses in parallel.

39. A memory device according to claim 38, comprising a sense amplifier having a temporary storage memory connected to said memory cell block.

40. A memory device according to claim 38, wherein the difference in thickness among the ferroelectric capacitors is preferably 3 or more tines.

41. A memory device according to claim 23, wherein a ferroelectric capacitor of each of said memory cells is constituted by connecting a plurality of ferroelectric capacitors having different coercive voltages in parallel.

42. A memory device according to claim 41, each of the plurality of ferroelectric capacitors of each memory cell stores 1-bit information, and 1-bit data is read out from or written in each of the plurality of ferroelectric capacitors by changing the voltage to be applied to the ferroelectric capacitor.

43. A memory device according to claim 41, each of the plurality of ferroelectric capacitors of each memory cell stores 1-bit information, in reading, a low voltage is applied to the ferroelectric capacitor to read out polarization charges of one of the plurality of ferroelectric capacitors, and the readout information is stored outside the cell array, successively, the applied voltage is raised to read out polarization charges of one of the remaining ferroelectric capacitors, and, in writing, the voltage is sequentially lowered and applied to the ferroelectric capacitors in an opposite order to that in reading, thereby performing writing.

44. A memory device according to claim 41, comprising a sense amplifier having a temporary storage memory connected to said memory cell block.

45. A memory device according to claim 41, wherein the difference in coercive voltage among the ferroelectric capacitors is preferably 3 or more times.

46. A memory device according to claim 23, wherein a ferroelectric capacitor of each of said memory cells is constituted by connecting a plurality of ferroelectric capacitors and at least one capacitor and voltage drop element.

47. A memory device according to claim 46, each of the plurality of ferroelectric capacitors of each memory cell stores 1-bit information, and 1-bit data is read out from or written in each of the plurality of ferroelectric capacitors by changing the voltage to be applied to the ferroelectric capacitor.

48. A memory device according to claim 46, each of the plurality of ferroelectric capacitors of each memory cell stores 1-bit information, in reading, a low voltage is applied to the ferroelectric capacitor to read out polarization charges of one of the plurality of ferroelectric capacitors, and the readout information is stored outside the cell array, successively, the applied voltage is raised to read out polarization charges of one of the remaining ferroelectric capacitors, and in writing, the voltage is sequentially lowered and applied to the ferroelectric capacitors in an opposite order to that in reading, thereby performing writing.

49. A memory device according to claim 46, comprising a sense amplifier having a temporary storage memory connected to said memory cell block.

50. A memory device according to claim 23, wherein a ferroelectric capacitor of each of said memory cells is constituted by connecting a plurality of ferroelectric capacitors and at least one resistance element.

51. A memory device according to claim 50, comprising a sense amplifier having a temporary storage memory connected to said memory cell block.

52. A memory device according to claim 23, wherein a ferroelectric capacitor of each of said memory cells is constituted by connecting a first ferroelectric capacitor and a resistance element in series, and connecting a second ferroelectric capacitor to the series connected elements in parallel.

53. A memory device according to claim 52, comprising a sense amplifier having a temporary storage memory connected to said memory cell block.

54. A memory device according to claim 23, wherein said select transistors includes first and second select transistors connected in series.

55. A memory device according to claim 54, wherein an open bit line structure is formed by a bit line pair of adjacent cell arrays.

56. A memory device according to claim 54, wherein a bit line pair of the same cell array has a folded bit line configuration by turning on only the first and second select transistors connected to one of the bit line pairs in reading/writing operation.

57. A memory device according to claim 54, wherein in the stand-by state after power-ON, all the plurality of transistors in the memory blocks are ON, and one of the first and second select transistors is OFF.

58. A memory device according to claim 54, wherein in selecting an arbitrary memory cell in the memory block, both the first and second select transistor are turned on while turning off the transistor of the selected cell, and keeping the transistors of the remaining cells ON.

59. A memory device according to claim 54, wherein a plate electrode potential is fixed at (½)Vcc or a constant voltage after power-ON in both the stand-by state and active state, and no cell data refresh operation is performed.

60. A memory device according to claim 54, wherein a plate electrode potential is set at 0V in the stand-by state after power-ON and changed within the range of 0V and Vcc in reading/writing data in selecting a cell.

61. A memory device according to claim 54, wherein a dummy cell in a dummy cell block corresponding to a memory cell block has a transistor, and a ferroelectric or paraelectric capacitor connected between a source and drain terminals cf said transistor, said dummy cell block is constituted by connecting a plurality of dummy cells in series and connecting at least one first and at least one second select transistors connected in series to one terminal of said series connected portion, the other terminal of said first select transistor is connected to a first bit line, and the other terminal of said second select transistor is connected to a second bit line.

62. A memory device according to claim 19, comprising first to fourth select transistor connected in series and two memory cell blocks, wherein one terminal of each of said two memory cell blocks is connected to the same bit line, and an other terminal is connected to a plate electrode.

63. A memory device according to claim 62, comprising a folded bit line structure in which a bit line pair of a same cell array are used to turn on all of four series connected select transistors only in one of four memory cell blocks connected to the bit line pair in reading/writing cell data.

64. A memory device according to claim 62, wherein in the stand-by state after power-ON, all the plurality of transistors in the memory block are ON, and one of the first to fourth select transistors are OFF.

65. A memory device according to claim 62, wherein in selecting an arbitrary memory cell in the memory block, all the first to fourth select transistors are turned on while turning off the transistor of the selected cell, and keeping the transistors of the remaining cells ON.

66. A memory device according to claim 62, wherein a plate electrode potential is fixed at (½)Vcc or a constant voltage after power-ON in both the stand-by state and active state, and no cell data refresh operation is performed.

67. A memory device according to claim 62, wherein a plate electrode potential is set at 0V in the stand-by state after power-ON and changed within the range of 0V and Vcc in reading/writing data in selecting a cell.

68. A memory device according to claim 62, wherein a bit line pitch is twice a cell pitch.

69. A memory device according to claim 62, wherein a dummy cell in a dummy cell block corresponding to a memory cell block has a transistor, and a ferroelectric or paraelectric capacitor connected between a source and drain terminals of said transistor, said dummy cell block is constituted by connecting a plurality of dummy cells in series and connecting at least one first and at least one second select transistors in series to one terminal of said plurality of dummy cells connected in series, an other terminal of said first select transistor is connected to a first bit line, and an other terminal of said second select transistor is connected to a second bit line.

70. A memory device according to claim 23, wherein ferroelectric capacitors are formed after formation of cell transistors, and thereafter, bit lines are formed.

71. A memory device according to claim 23, wherein bit lines are formed after formation of cell transistors, and thereafter, ferroelectric capacitors are formed.

72. A memory device according to claim 23, wherein in formation of the ferroelectric capacitor, a ferroelectric film is formed on a lower electrode, and an upper electrode is formed on the resultant structure.

73. A memory device according to claim 23, wherein said ferroelectric capacitor contains Bi, Sr, Ta, O, and the like, Pb, Zr, Ti, O, and the like, or Ba, Sr, Ti, O, and the like.

74. A memory device according to claim 23, wherein electrode nodes at two terminals of the ferroelectric capacitor are simultaneously formed, a ferroelectric film is formed between the two electrode nodes, and the ferroelectric film is formed by CVD or MOCVD.

75. A memory device according to claim 23, wherein the ferroelectric film is formed in a direction perpendicular or parallel to the wafer surface.

76. A memory device according to claim 23, wherein a plurality of ferroelectric capacitor layers are stacked on the Si surface.

77. A memory device according to claim 23, wherein a substrate bias generation circuit for applying a negative potential to the substrate in turning on the power supply is formed on the chip.

78. A memory device according to claim 23, wherein in turning on the power supply, the word line potential is applied, and then the plate potential is raised to (½)Vcc.

79. A memory device according to claim 23, wherein in turning off the power supply, the plate potential is lowered to 0V, and then the word line potential is lowered to 0V, thereafter, the power supply is turned off.

80. A memory device according to claim 23, comprising a bit line pair connected to said memory cell block and having a folded bit line configuration by turning on said one or more select transistors in said memory cell block connected to one bit line of said bit line pair.

81. A semiconductor memory comprising:
a plurality of memory cells, said memory cell comprising a first transistor having a source terminal and a drain terminal, a first ferroelectric capacitor which has a first terminal connected to said source terminal of said first transistor and a second terminal connected to said drain terminal and stores first data, a second transistor terminal which has a source terminal connected to said drain terminal of said first transistor and a drain terminal, and a second ferroelectric capacitor which has a first terminal connected to said source terminal of said first transistor and a second terminal connected to the drain terminal of said second transistor and stores second data, said memory cell storing 2-bit data;
wherein said plurality of memory cells are connected in series, and one or more select transistors are connected to at least one terminal of said plurality of memory cells to constitute a memory cell block, and a plurality of memory cell blocks are arranged to constitute a cell array.

82. A memory device according to claim 81, wherein a dummy cell in a dummy cell block corresponding to a memory cell block has a transistor, and a ferroelectric or paraelectric capacitor connected between a source and drain terminals of said transistor, said dummy cell block is constituted by connecting a plurality of dummy cells in series and connecting at least one first and at least one second select transistors in series to one terminal of said plurality of dummy cells connected in series, an other terminal of said first select transistor is connected to a first bil line, and an other terminal of said second select transistor is connected to a second bit line.

83. A method of driving a semiconductor memory which comprises a plurality of memory cells each having a transistor having a source terminal and a drain terminal and a ferroelectric capacitor having a first terminal connected to said source terminal and a second terminal connected to said drain terminal, a predetermined number of memory cells being connected in series to constitute a memory cell block, an(i has a random access function, comprising the steps of:
the first step of turning on transistors of said plurality of memory cells in said memory cell block; and
the second step of setting a trarsistor of any one of said plurality of memory cells in said memory cell block in an OFF state to select the memory cell, and writing/reading data in/from said selected cell.

84. A method of driving a semiconductor memory which comprises a plurality of memory cells each having a transistor having a source terminal and a drain terminal and a ferroelectric capacitor having a first terminal connected to said source terminal and a second terminal connected to said drain terminal, a predetermined number of memory cells being connected in series to constitute a memory cell block, and has a random access function, comprising the steps of:
the first step of turning on transistors of said plurality of memory cells in said memory cell block;
the second step of setting a transistor of any one of said plurality of memory cells in said memory cell block in an OFF state to select the memory cell, and applying, to said selected memory cell, a voltage higher than a first minimum coercive voltage of coercive voltages of said ferroelectric capacitors, thereby reading out information stored in said ferroelectric capacitor having the first coercive voltage;

the third step of writing a voltage higher than the first coercive voltage in said selected memory cell;

the fourth step of applying a voltage higher than a second coercive voltage higher than the first coercive voltage to said selected memory cell, thereby reading out information stored in said ferroelectric capacitor having the second coercive voltage; and the fifth step of writing a voltage higher than the second coercive voltage in said selected memory cell.

85. A method according to claim 84, wherein reading/writing of data is performed in the order of the first step, the second step, the fourth step, the fifth step, the third step, and the first step.

86. A method according to claim 84, wherein writing of data is performed in the order of the first step, the fifth step, the third step, and the first step.

* * * * *

UNITED STATES PATENT AND TRADEMARK OFFICE
CERTIFICATE OF CORRECTION

PATENT NO. : 5,903,492
DATED : May 11, 1999
INVENTOR(S) : Daisaburo TAKASHIMA

It is certified that error appears in the above-identified patent and that said Letters Patent is hereby corrected as shown below:

On the title apge, item [30], the Foreign Application Priority Data should be:

--[30]   Foreign Application Priority Data
    Jun. 10, 1996 [JP] Japan ............. 8-147452
    Jan.  8, 1997 [JP] Japan ............. 9-001115
    May 28, 1997 [JP] Japan ............. 9-153137--

Signed and Sealed this

Eighteenth Day of April, 2000

Attest:

Q. TODD DICKINSON

*Attesting Officer*    *Director of Patents and Trademarks*